US005381026A

United States Patent [19]

Shinohe et al.

[11] Patent Number: 5,381,026

[45] Date of Patent: Jan. 10, 1995

[54] INSULATED-GATE THYRISTOR

[75] Inventors: Takashi Shinohe, Yokohama; Kazuya Nakayama, Sagamihara; Minami Takeuchi, Tokyo; Masakazu Yamaguchi, Tokyo; Mitsuhiko Kitagawa, Tokyo; Ichiro Omura, Kawasaki; Akio Nakagawa, Hiratsuka, all of Japan

[73] Assignee: Kabushiki Kaisha Toshiba, Kawasaki, Japan

[21] Appl. No.: 760,344

[22] Filed: Sep. 16, 1991

[30] Foreign Application Priority Data

| | | | |
|---|---|---|---|
| Sep. 17, 1990 | [JP] | Japan | 2-243956 |
| Sep. 17, 1990 | [JP] | Japan | 2-243957 |
| Sep. 17, 1990 | [JP] | Japan | 2-243958 |
| Sep. 28, 1990 | [JP] | Japan | 2-259063 |
| Feb. 4, 1991 | [JP] | Japan | 3-13593 |
| Apr. 16, 1991 | [JP] | Japan | 3-109602 |
| Jun. 14, 1991 | [JP] | Japan | 3-143449 |
| Jul. 31, 1991 | [JP] | Japan | 3-213226 |

[51] Int. Cl.[6] .................... H01L 27/08; H01L 29/74; H01L 29/743

[52] U.S. Cl. .................................. 257/147; 257/148; 257/154

[58] Field of Search ............... 257/139, 140, 147, 137, 257/148, 149, 154

[56] References Cited

U.S. PATENT DOCUMENTS

| | | | |
|---|---|---|---|
| 4,502,070 | 2/1985 | Leipold et al. | 257/148 |
| 4,717,940 | 1/1988 | Shinohe et al. | 257/147 |
| 4,760,431 | 7/1988 | Nakagawa et al. | 257/147 |
| 4,914,496 | 4/1990 | Nakagawa et al. | 257/147 |
| 4,990,975 | 2/1991 | Hagino | 257/139 |

FOREIGN PATENT DOCUMENTS

| | | | |
|---|---|---|---|
| 57-43461 | 3/1982 | Japan . | |
| 57-78172 | 5/1982 | Japan | 257/152 |
| 63-0209171 | 8/1988 | Japan | 257/152 |
| 1109769 | 4/1989 | Japan | 257/149 |
| 1265569 | 10/1989 | Japan | 257/139 |
| 215677 | 1/1990 | Japan . | |
| 221661 | 1/1990 | Japan . | |

OTHER PUBLICATIONS

IEDM Technical Digest, pp. 293–296 (1989); H-R Chang, et al. Dec. 3–6, 1989.

IEEE Electron Device Letters, vol. 11, No. 2, Feb., 1990; B. J. Baliga, pp. 75–77.

IEEE Transactions on Electron Devices, vol. ED-33, No. 10, Oct., 1986; Victor A. K. Temple; pp. 1609–1618.

Power Conversion, Oct., 1989 Proceedings; V. A. K. Temple, pp. 544–554.

*Primary Examiner*—Rolf Hille
*Assistant Examiner*—Wael M. Fahmy
*Attorney, Agent, or Firm*—Oblon, Spivak, McClelland, Maier & Neustadt

[57] ABSTRACT

Disclosed herein is an insulated-gate thyristor comprising a base layer of a first conductivity type, having first and second major surfaces, a first main-electrode region of the first conductivity type, formed in the first major surface of the base layer, a second main-electrode region of a second conductivity type, formed in the second major surface of the base layer, at least a pair of grooves extending from the first main-electrode region into the base layer, and opposing each other and spaced apart by a predetermined distance, insulated gate electrodes formed within the grooves, and a turn-off insulated-gate transistor structure for releasing carriers of the second conductivity type from the base layer.

8 Claims, 159 Drawing Sheets

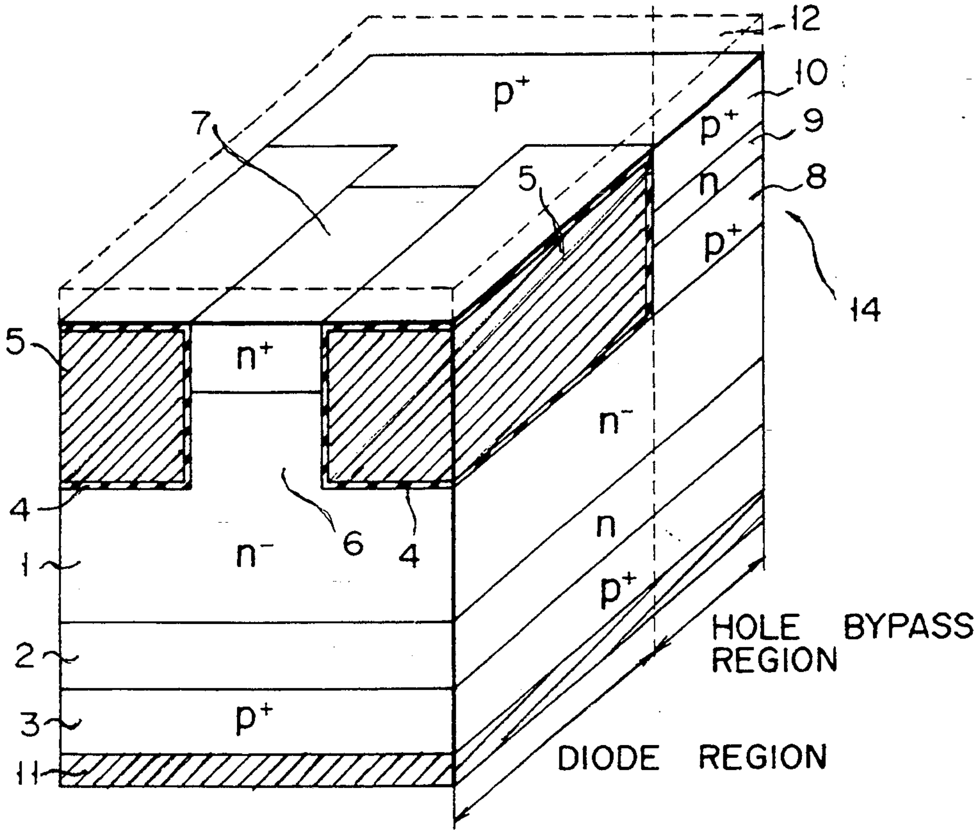
F I G. 1
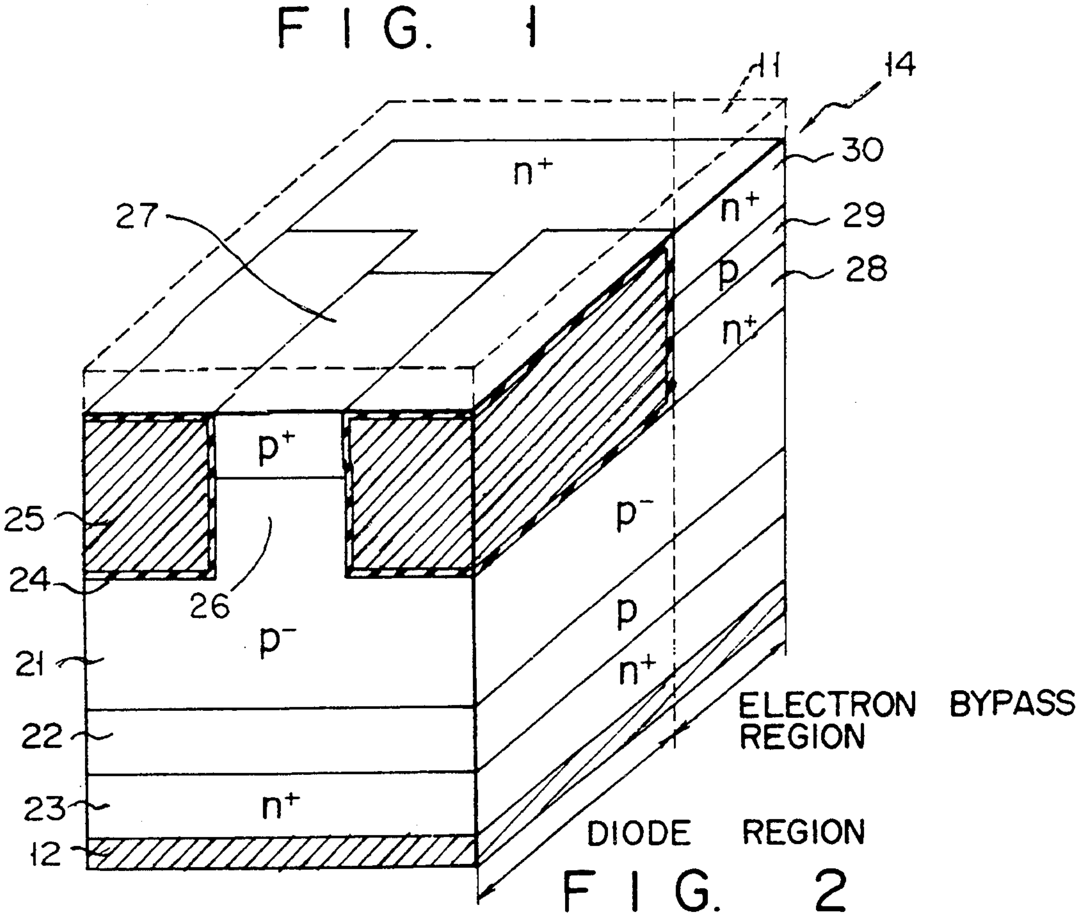
F I G. 2

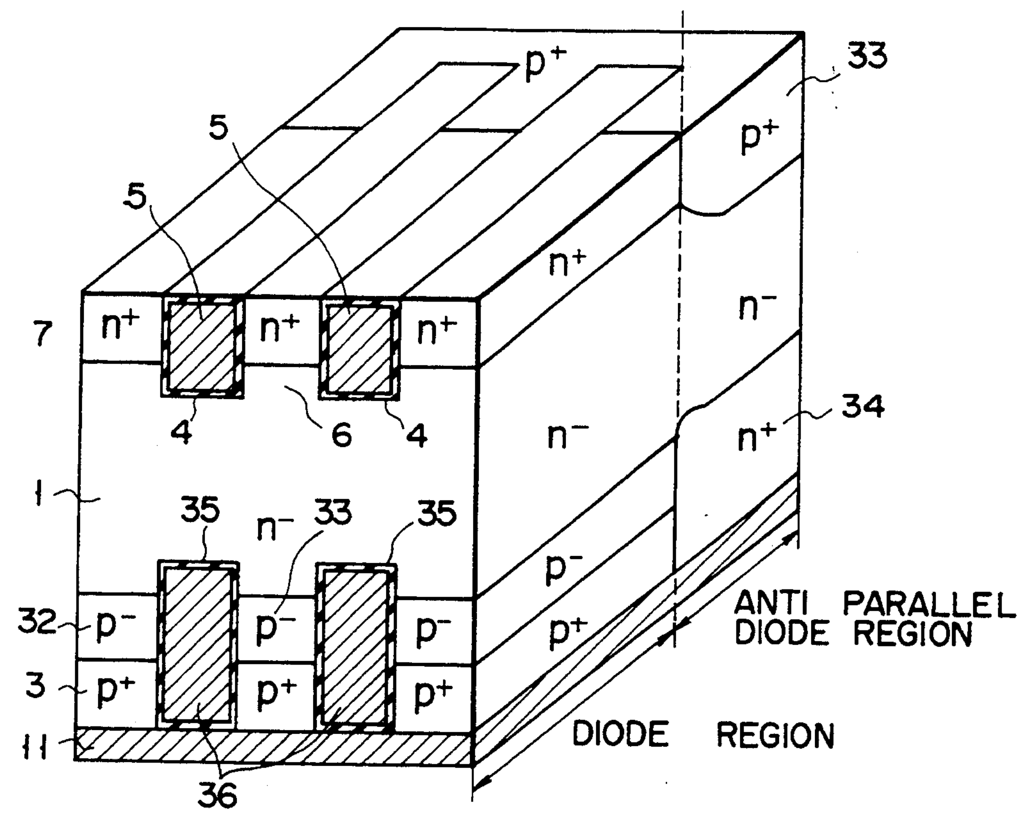
F I G. 3
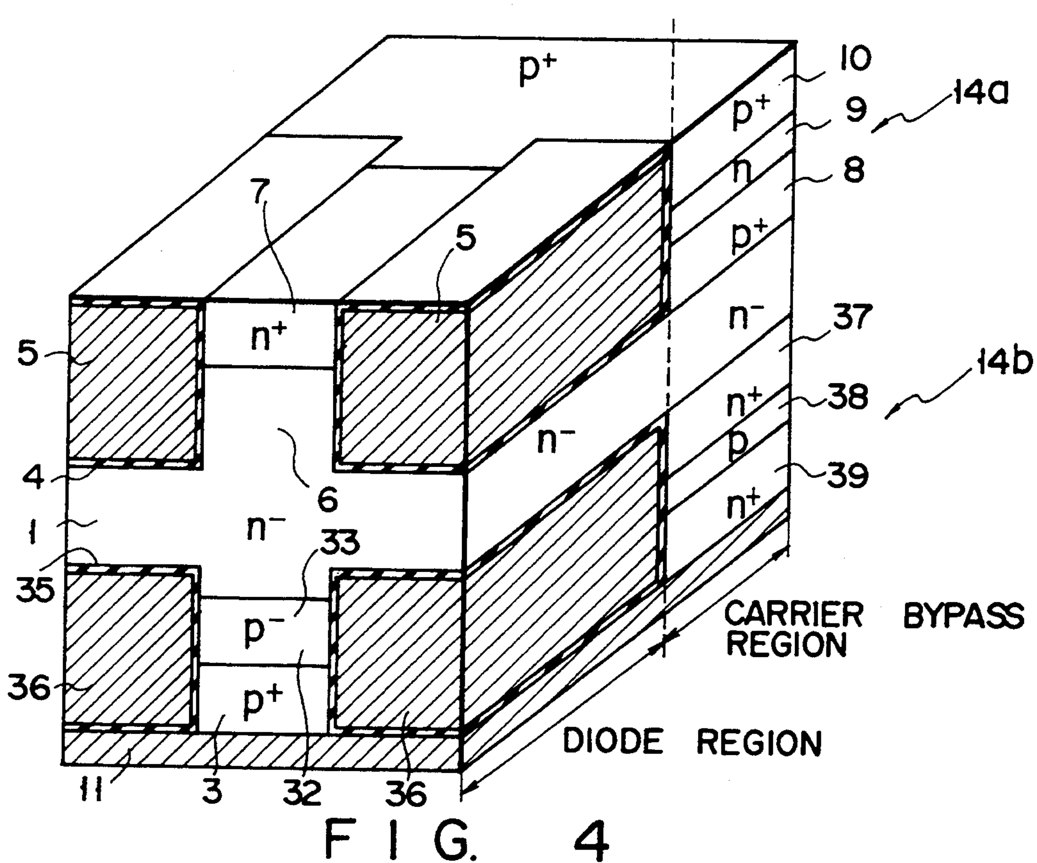
F I G. 4

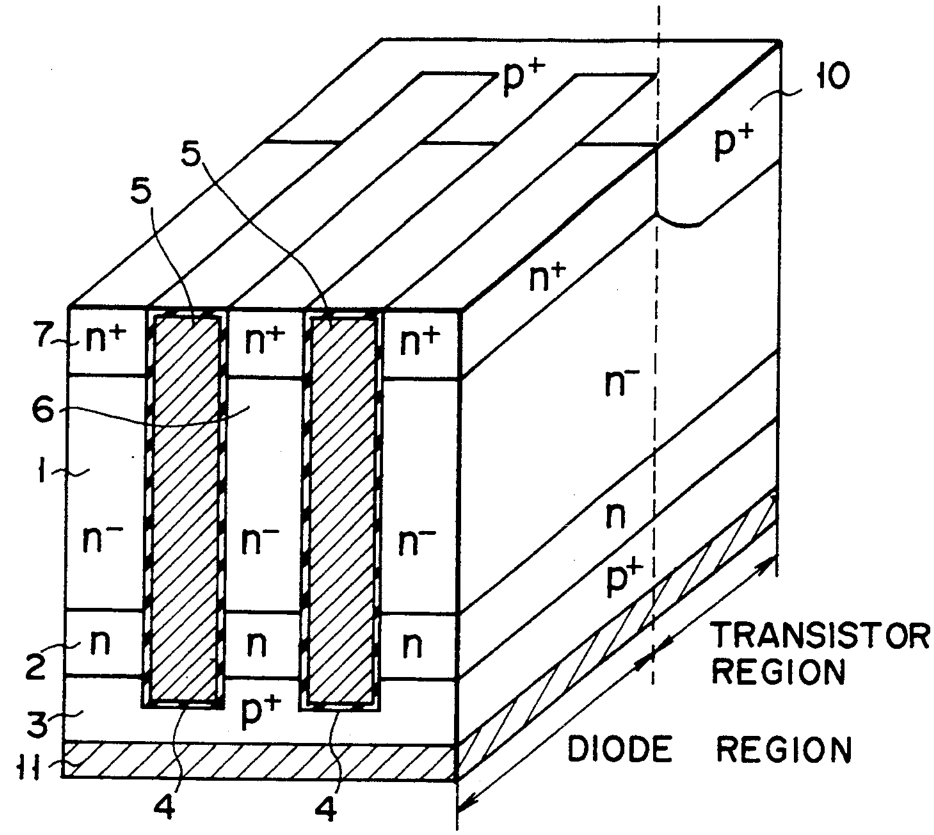
F I G. 5
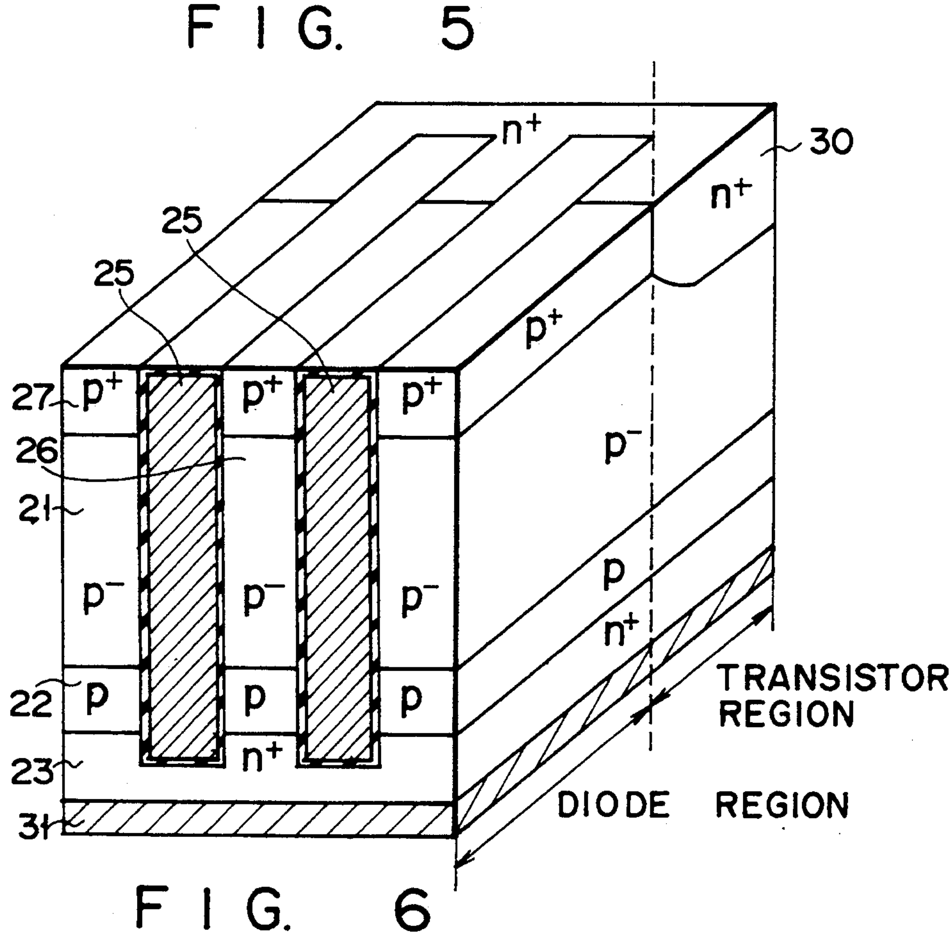
F I G. 6

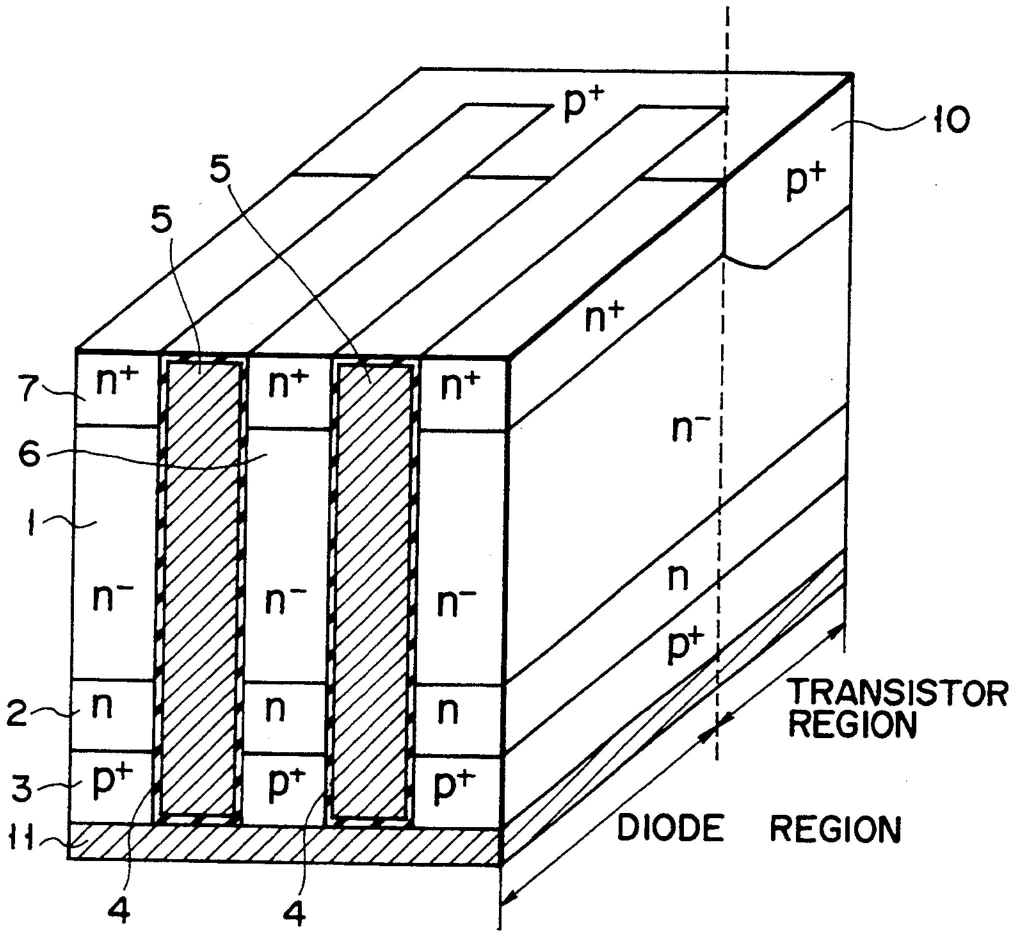
F I G. 7

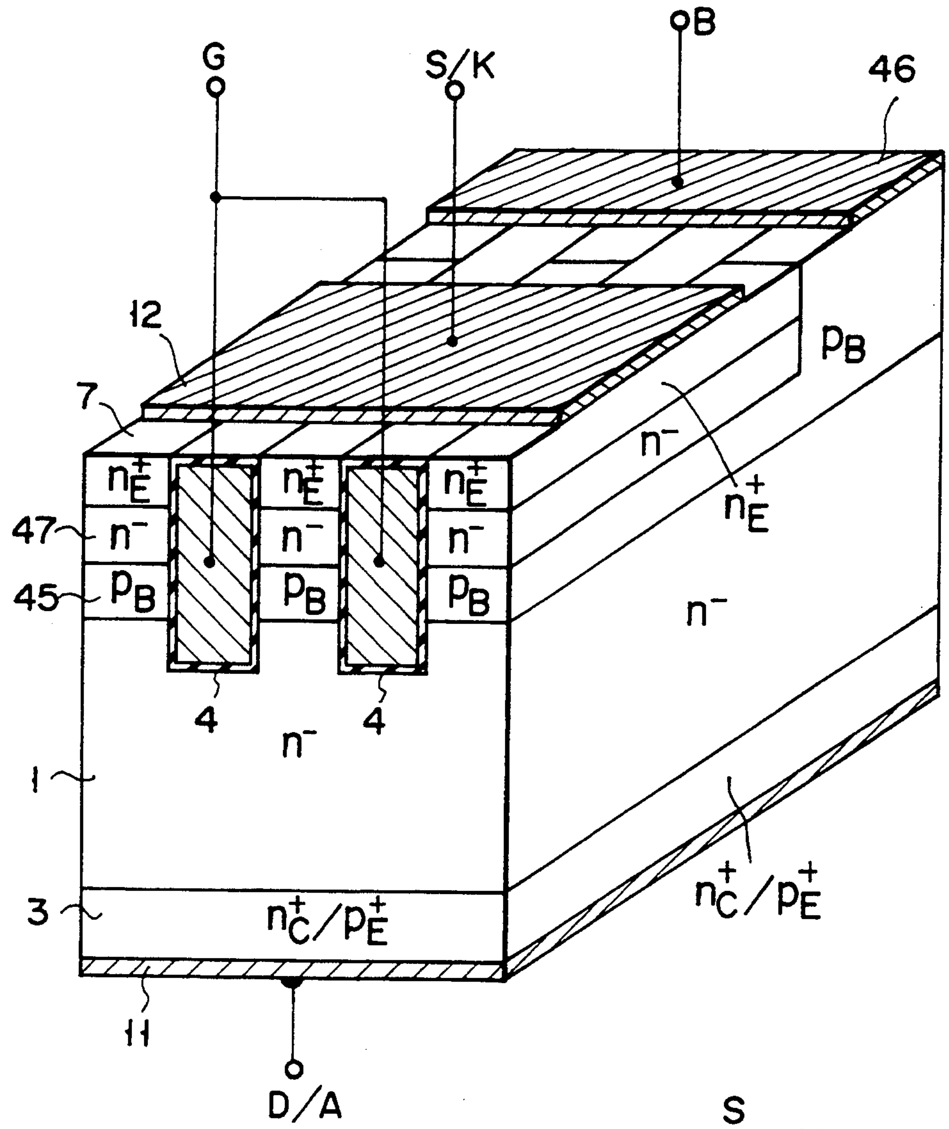
F I G. 17A
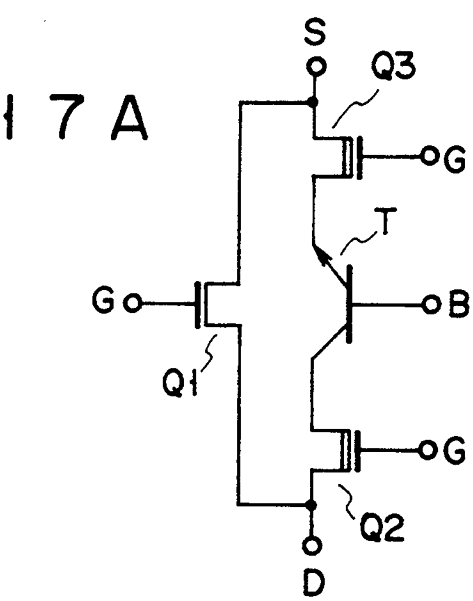
F I G. 17B

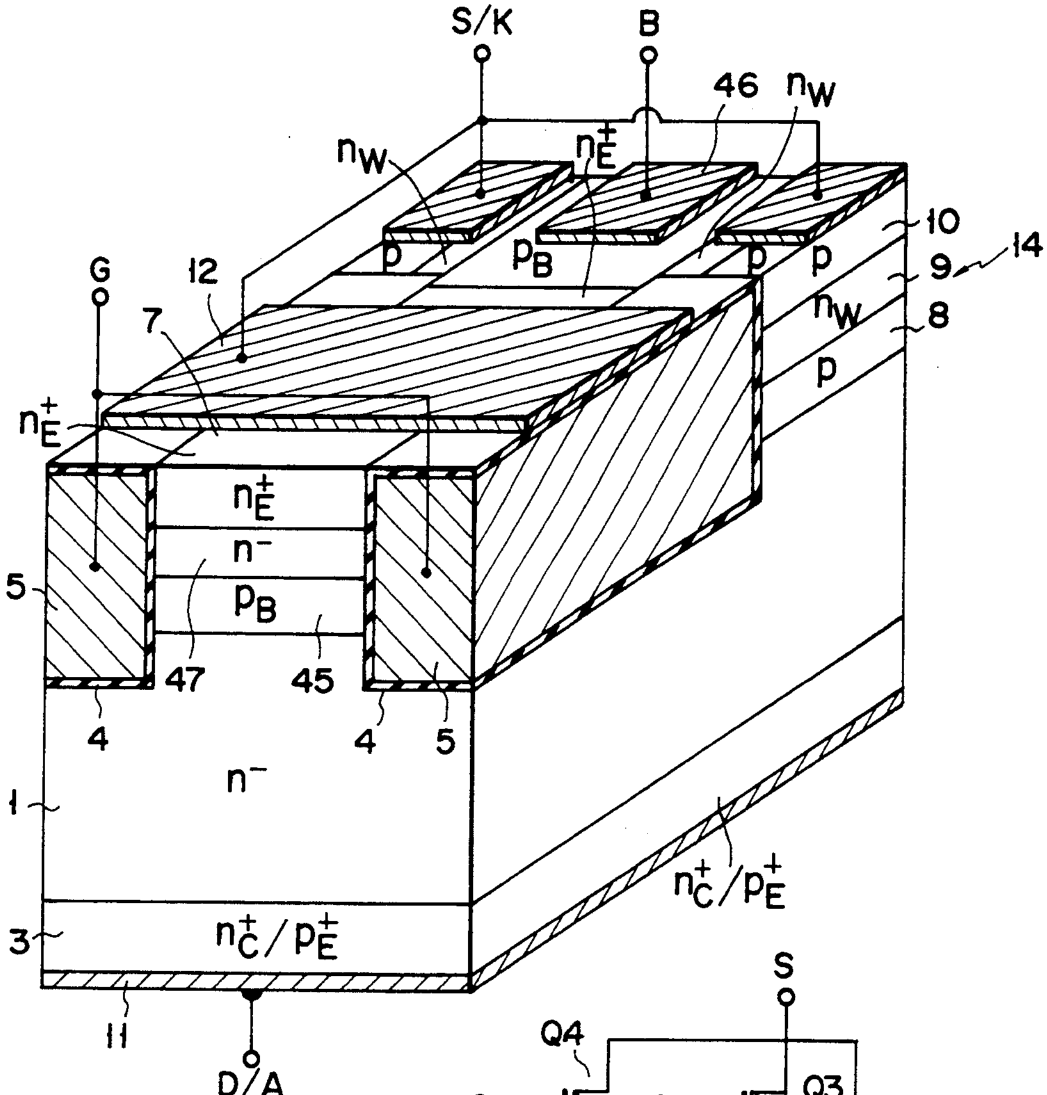
F I G. 19A
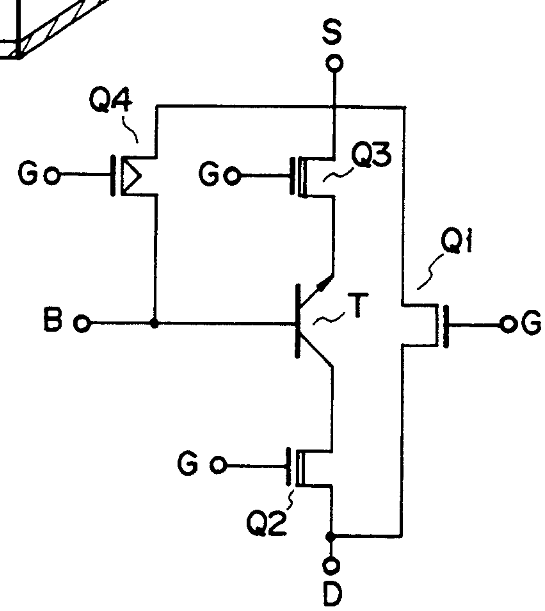
F I G. 19B

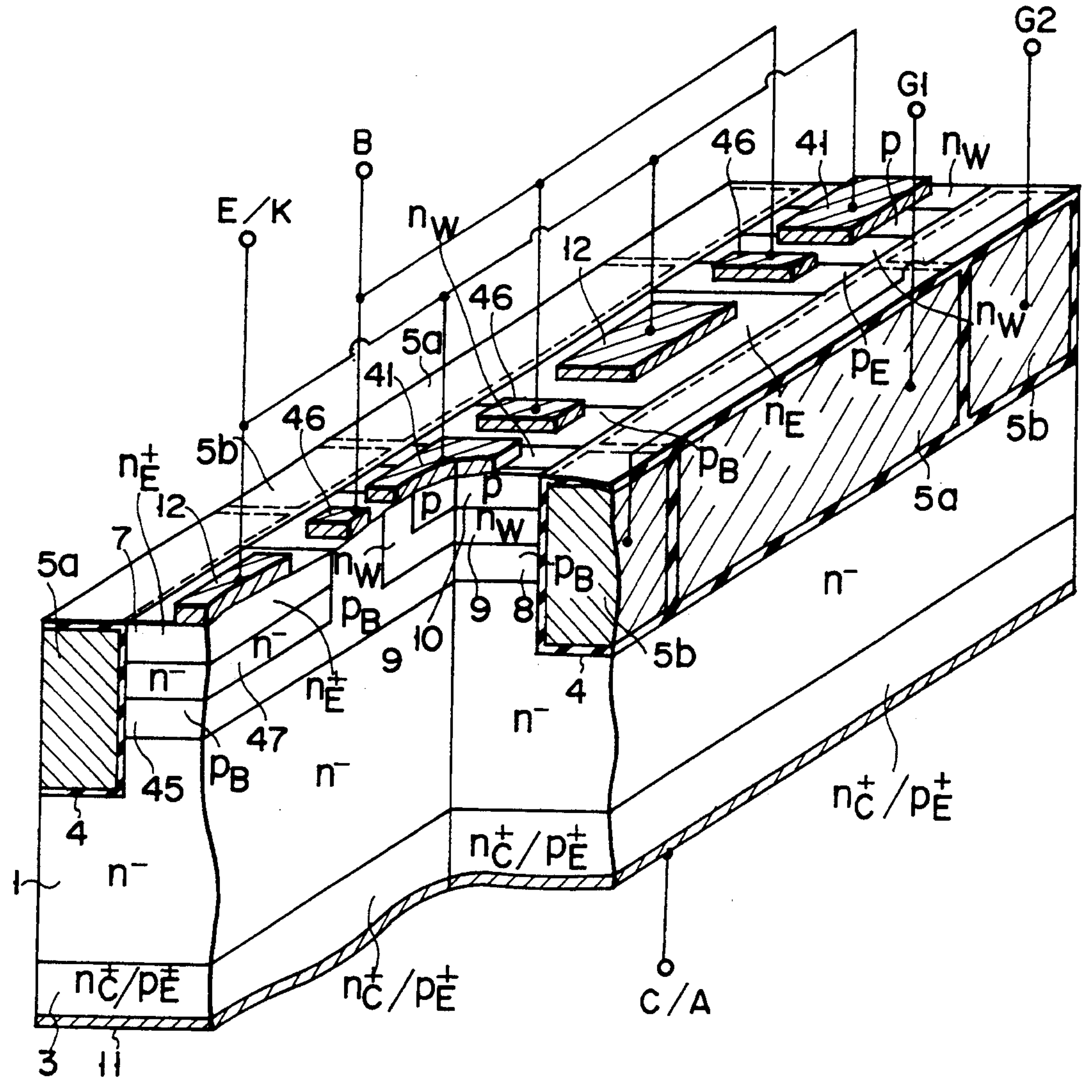
F I G. 21A
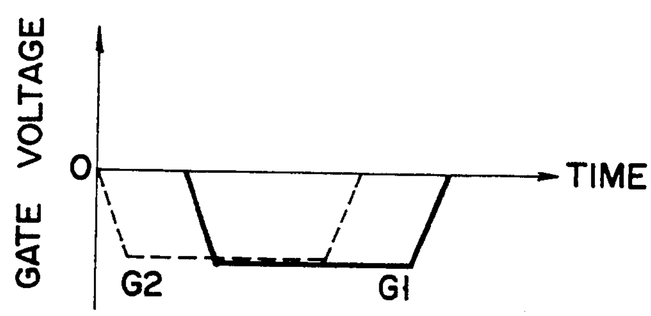
F I G. 21B

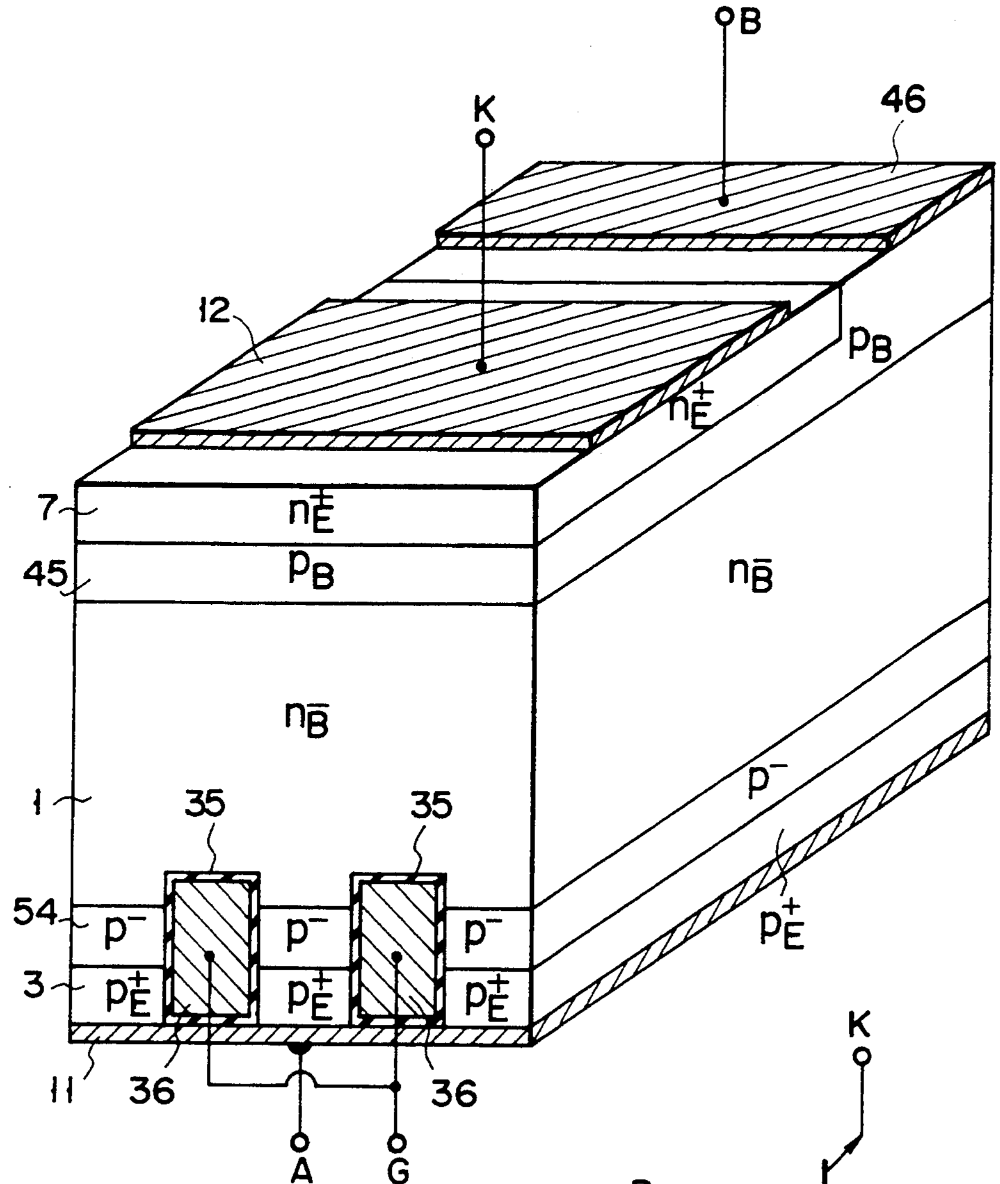
F I G. 29A
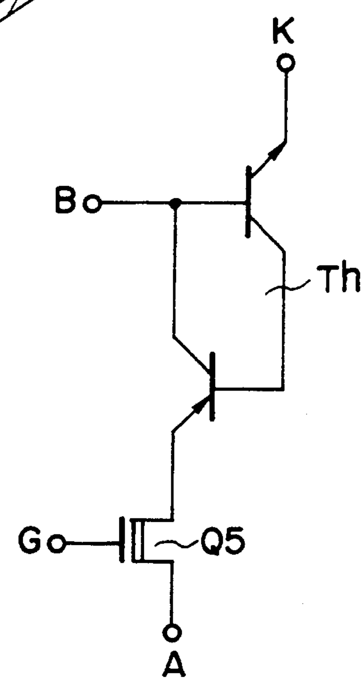
F I G. 29B

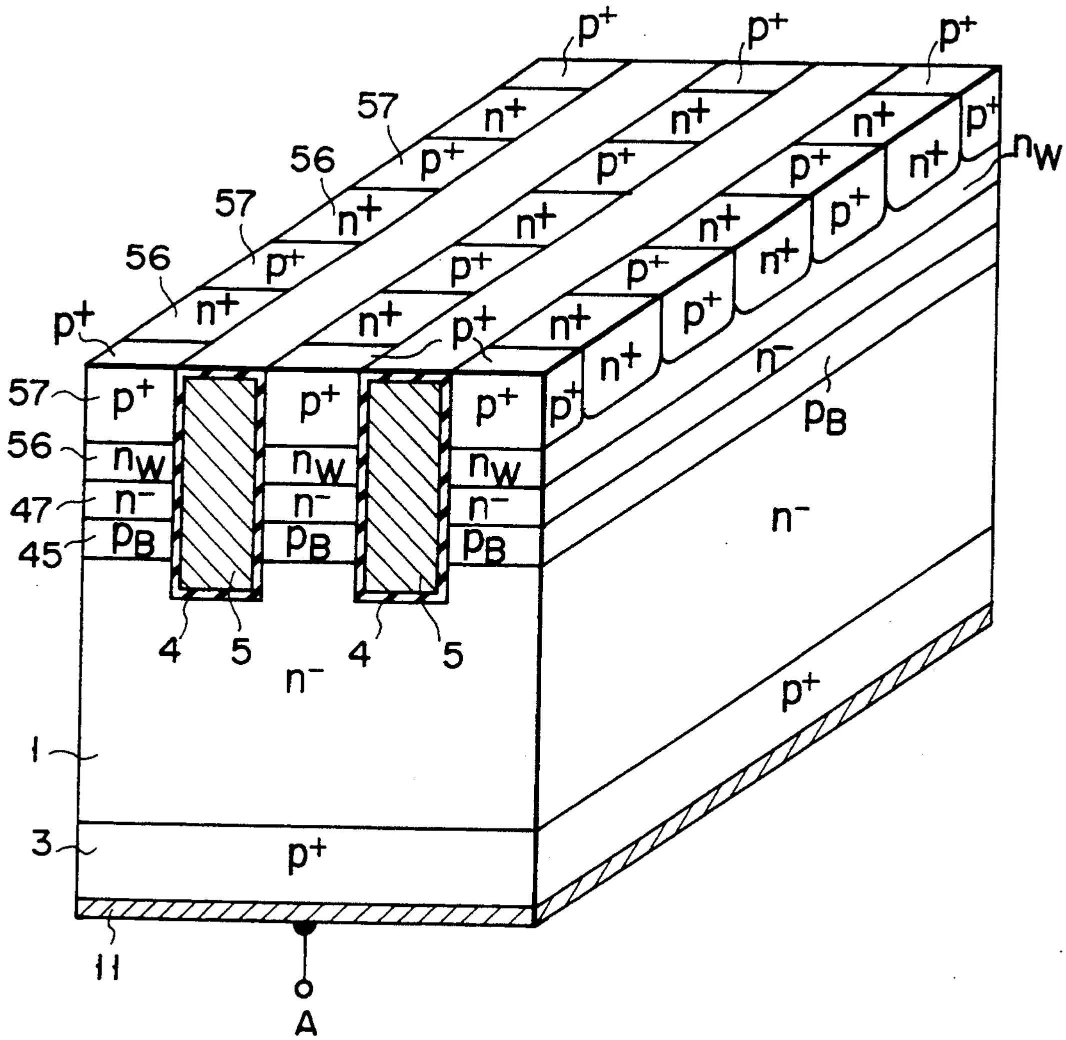
F I G. 35

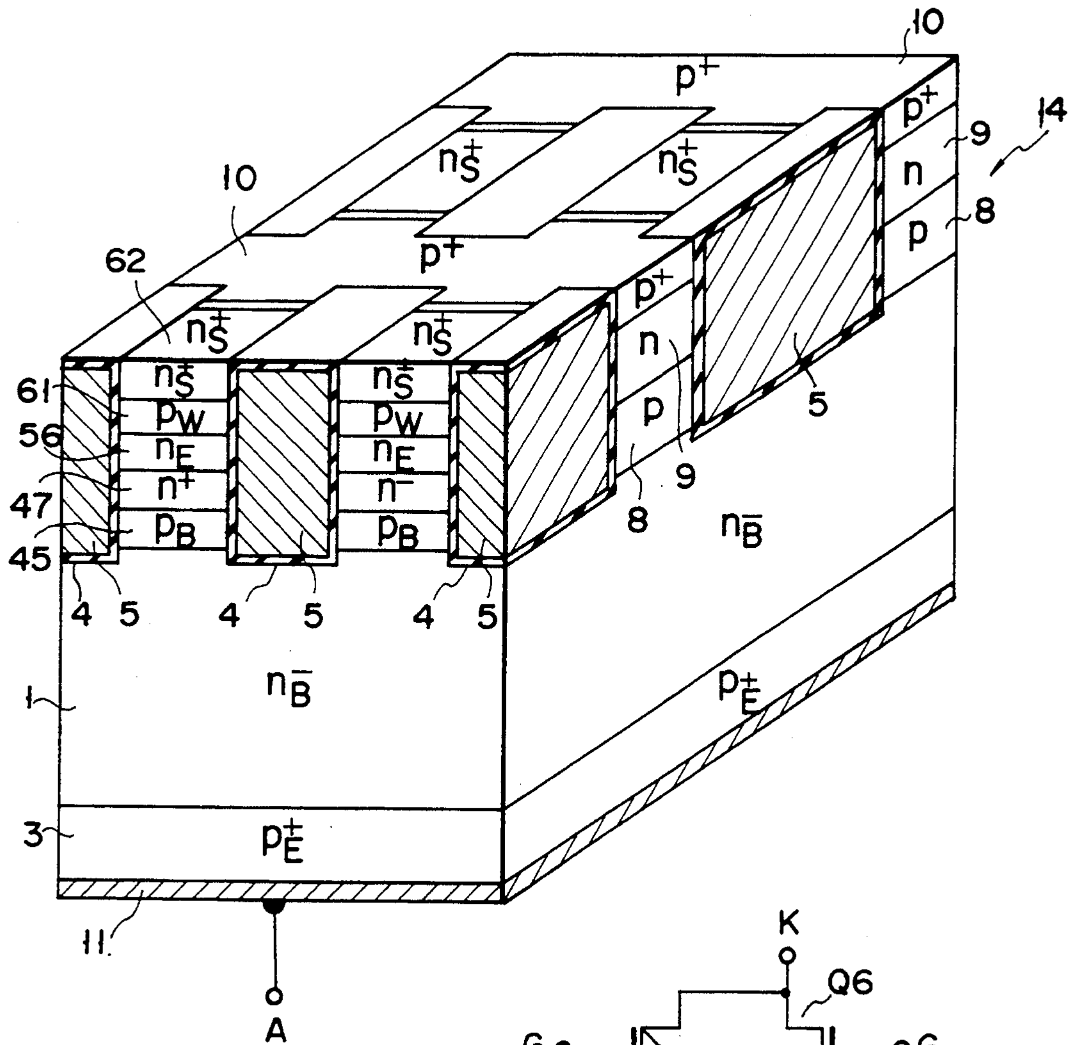
F I G. 39A
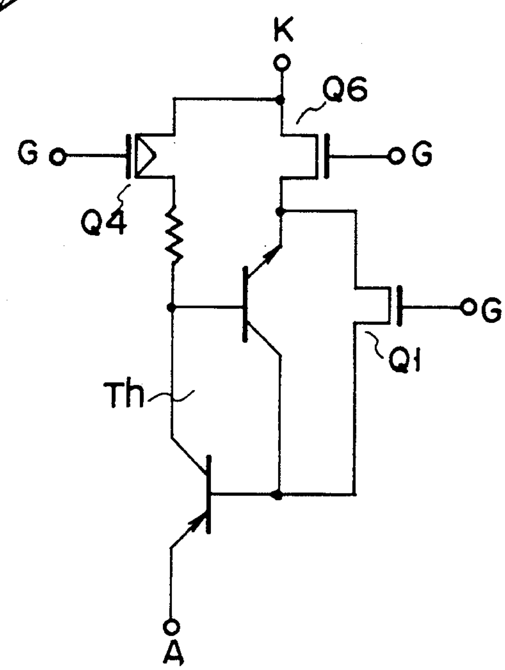
F I G. 39B

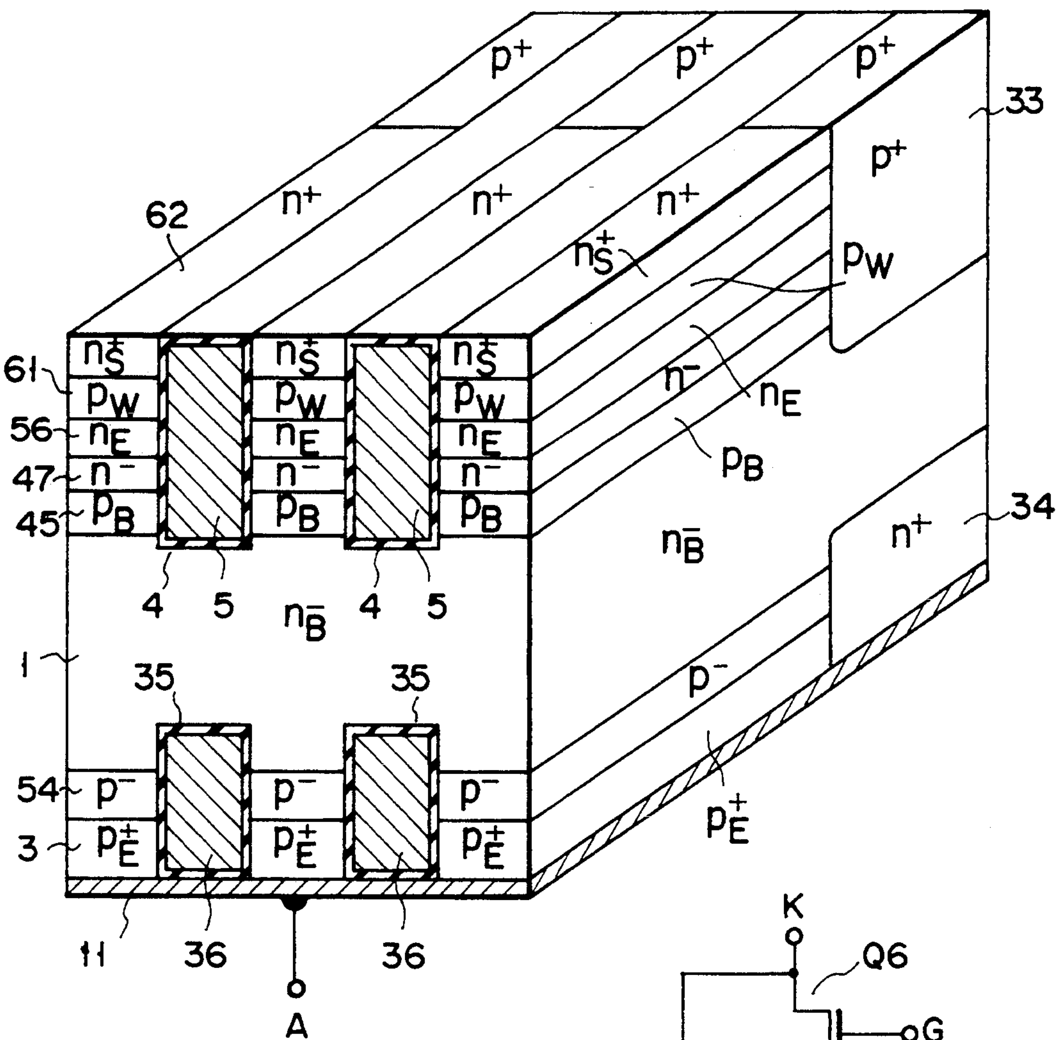
F I G. 40A
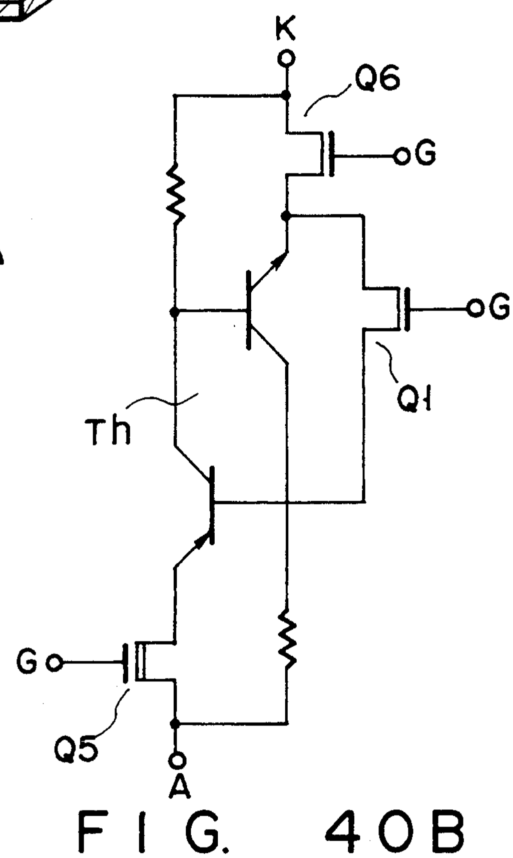
F I G. 40B

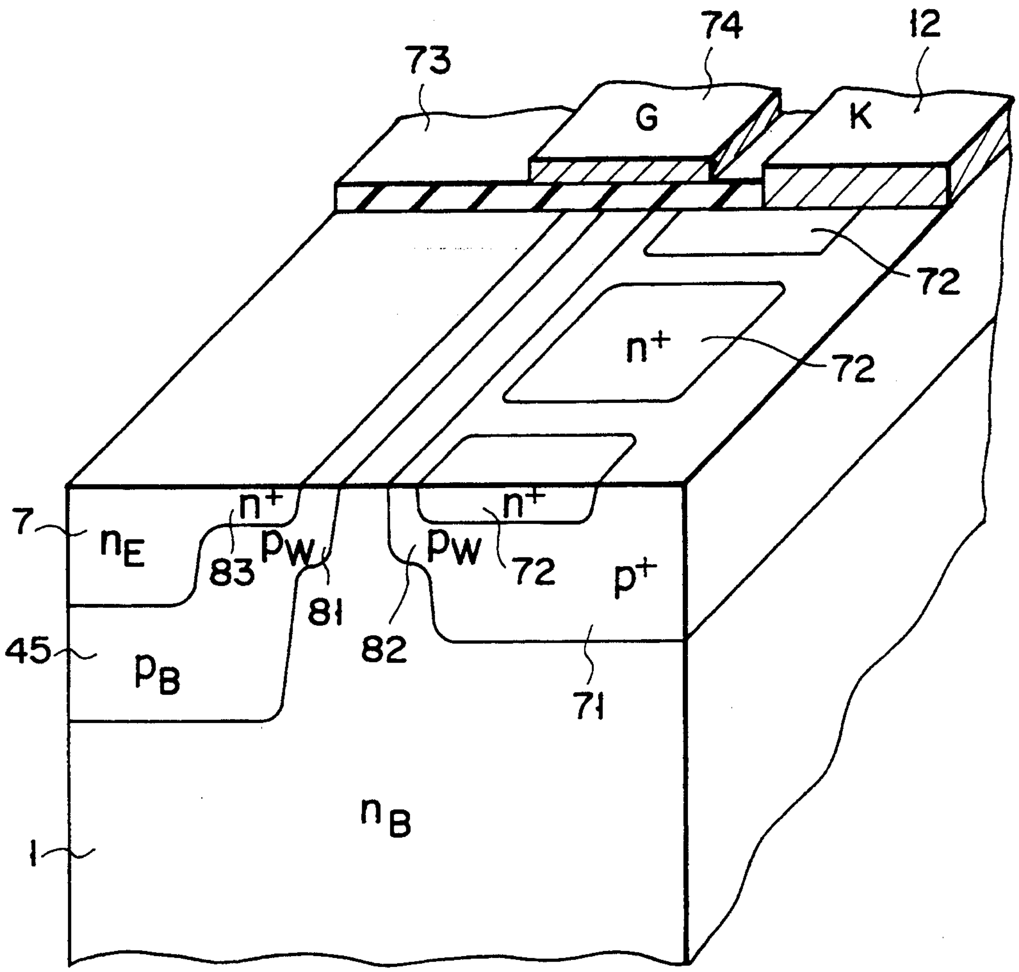
F I G. 49

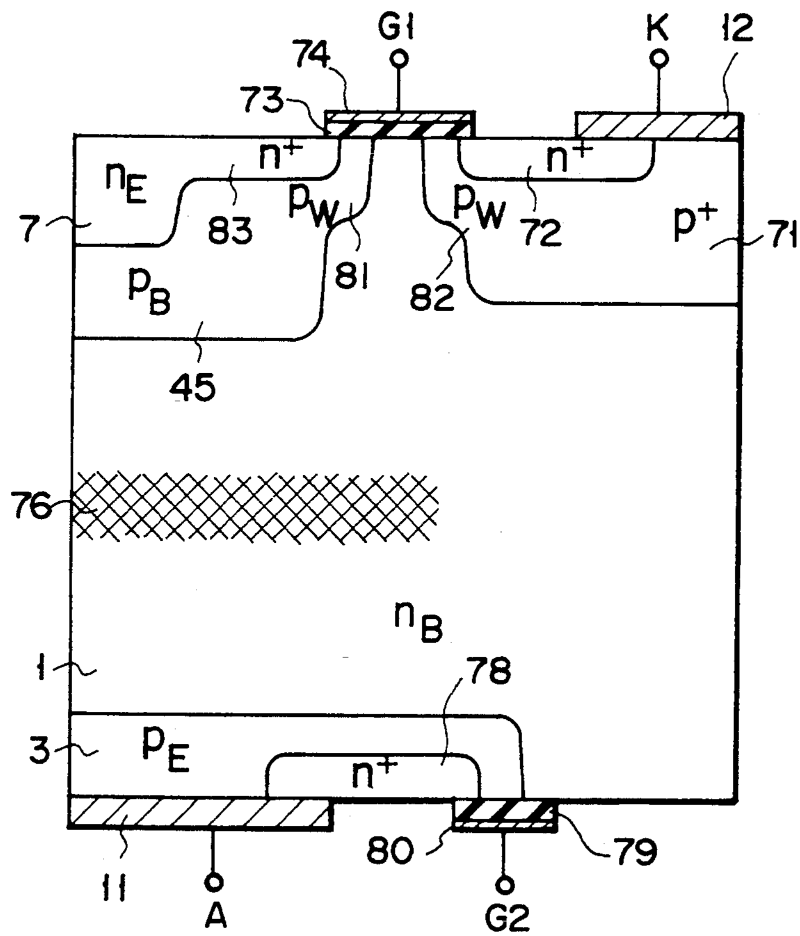
F I G. 54

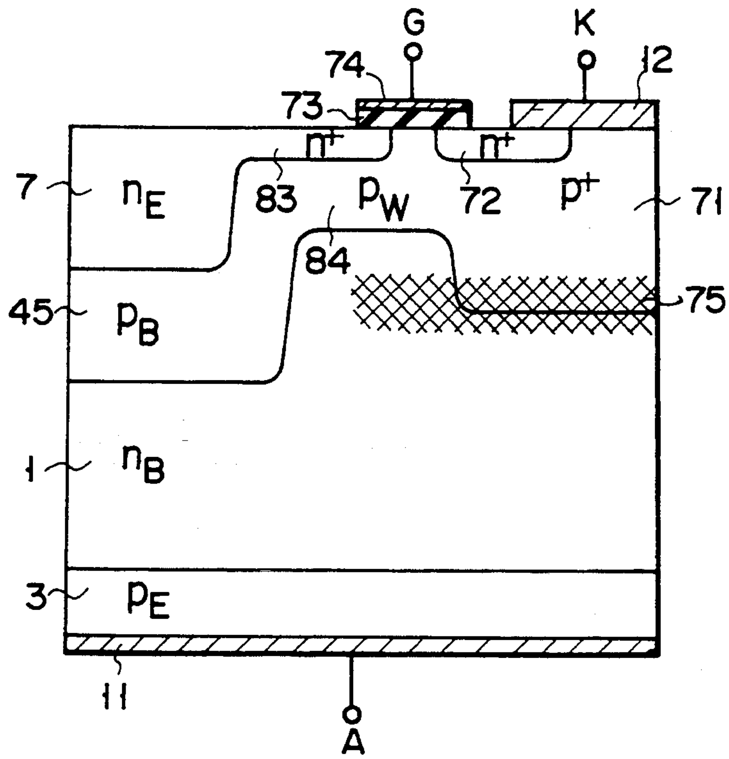
F I G. 58
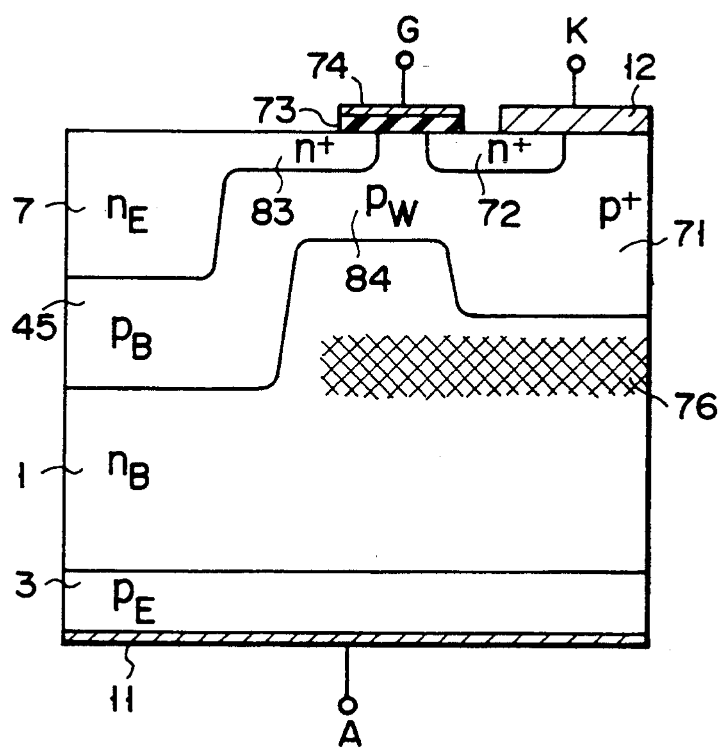
F I G. 59

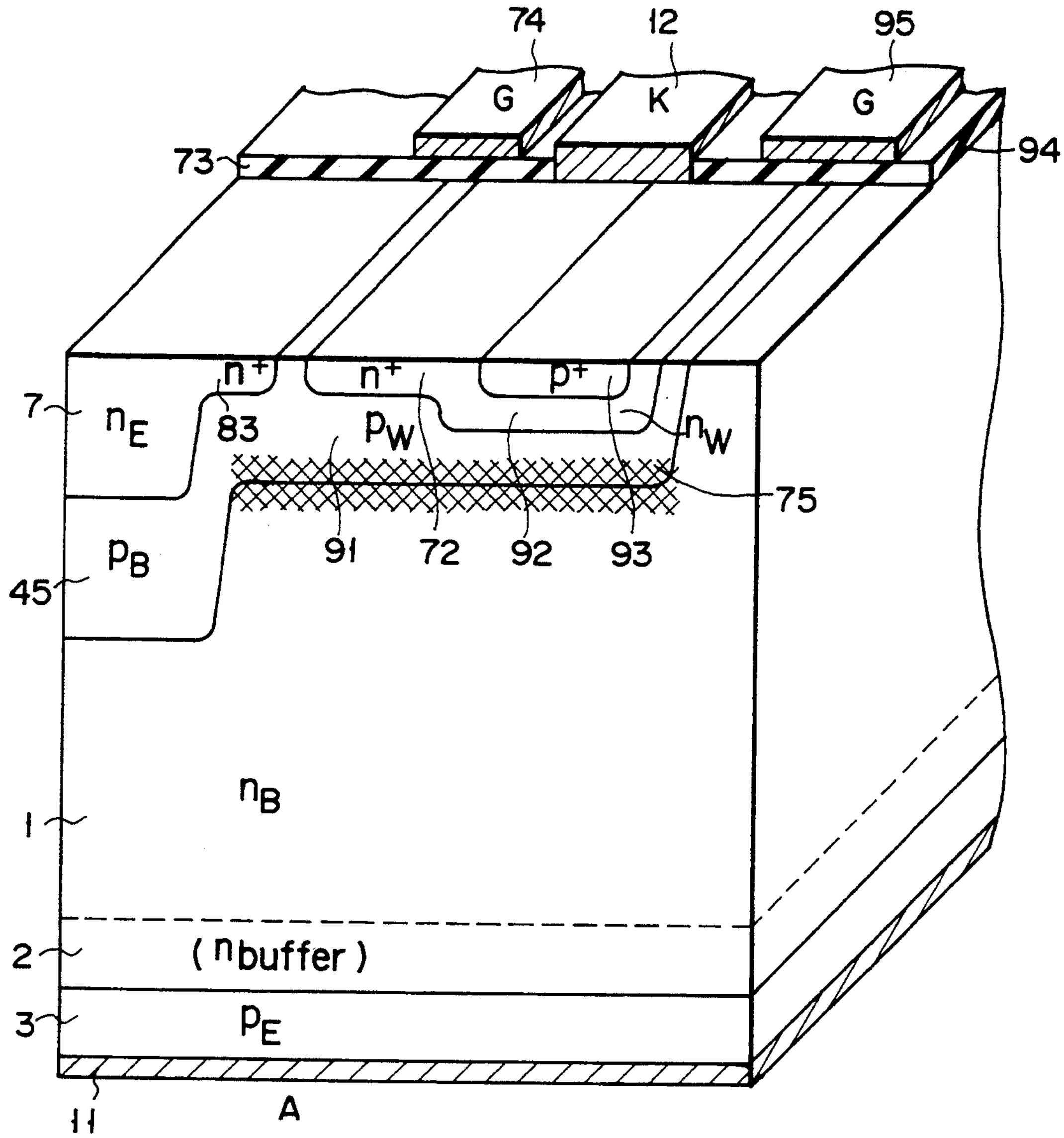
F I G. 63

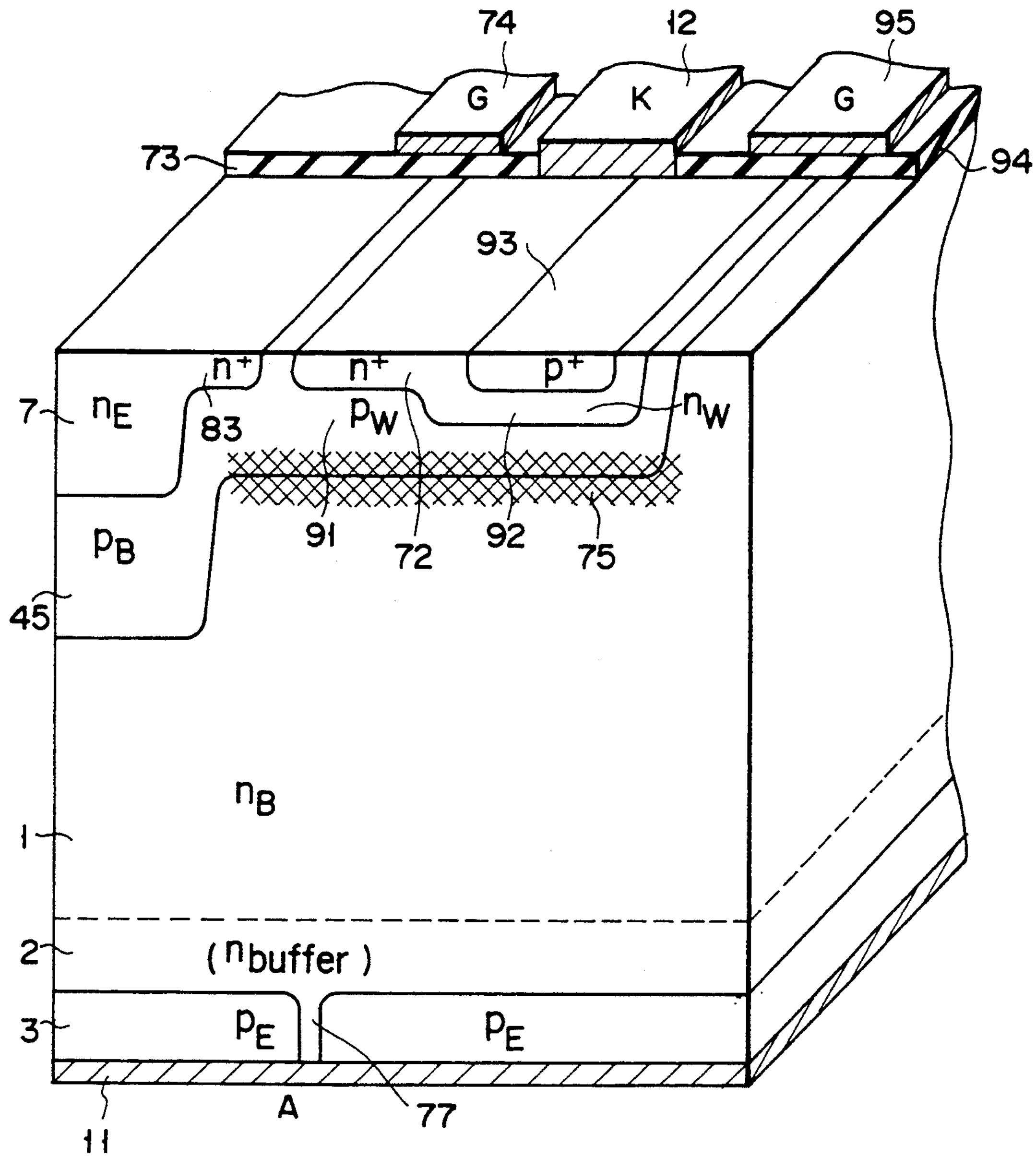
F I G. 65

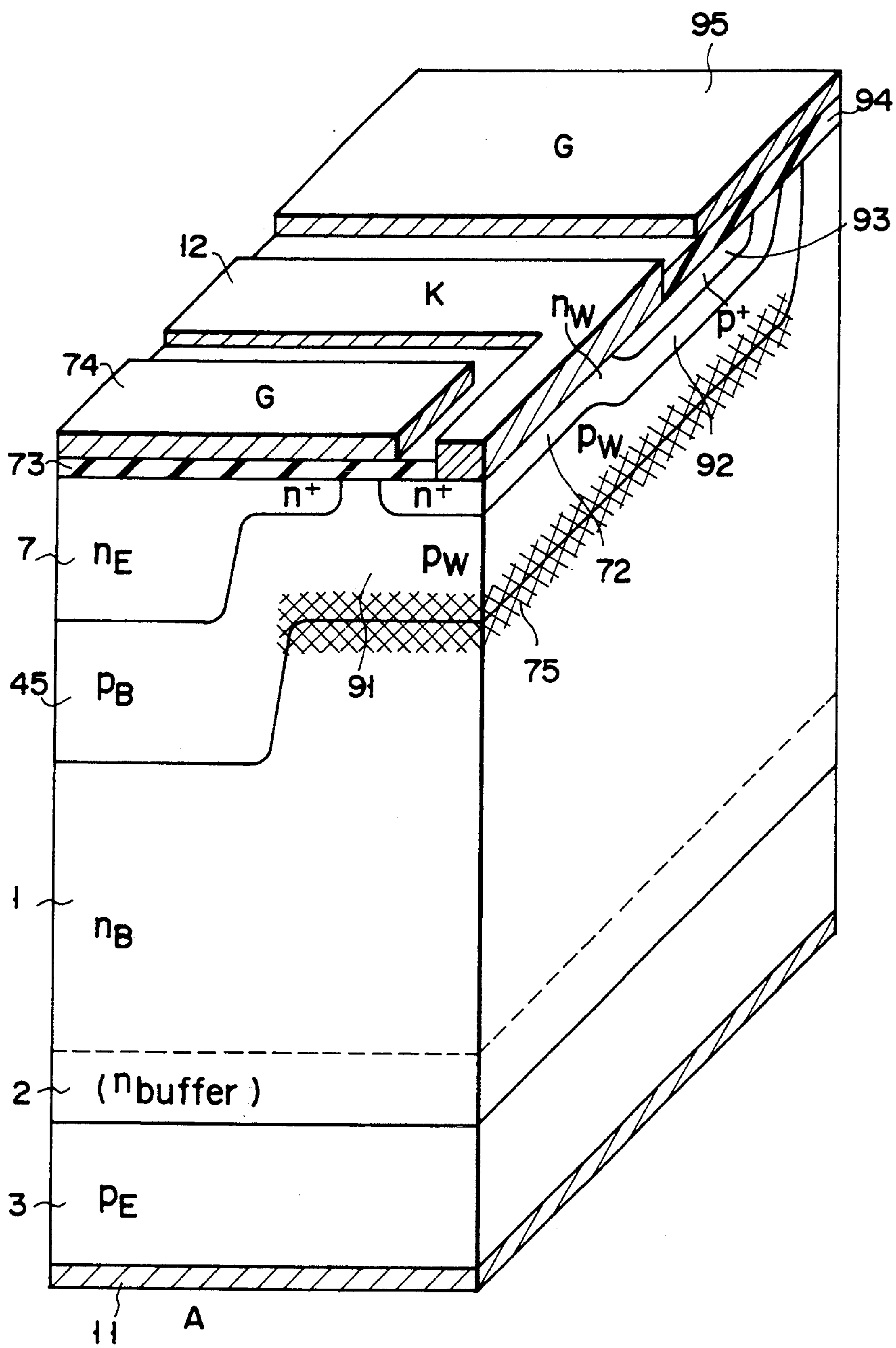
F I G. 68

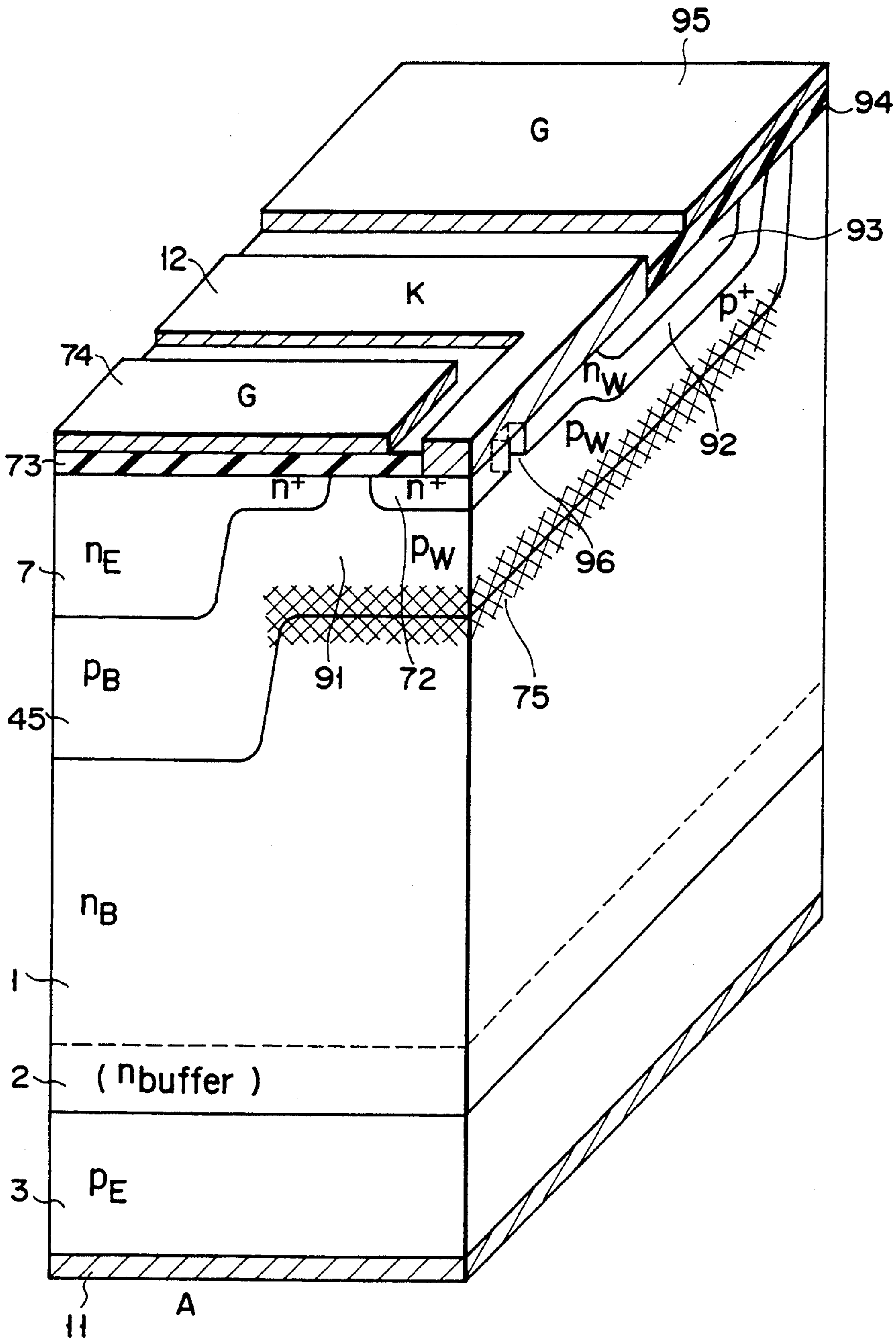
F I G. 69

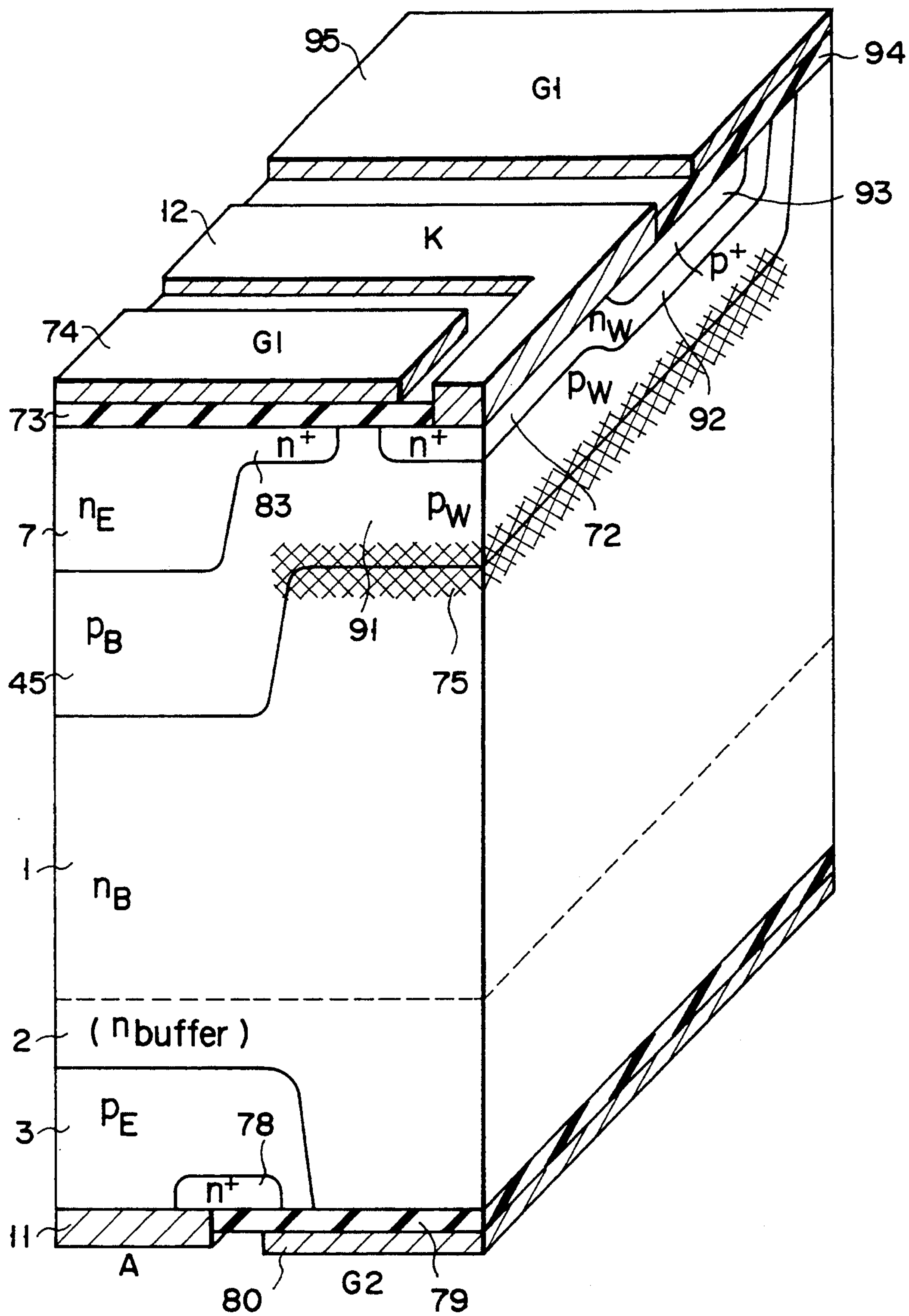
F I G. 71

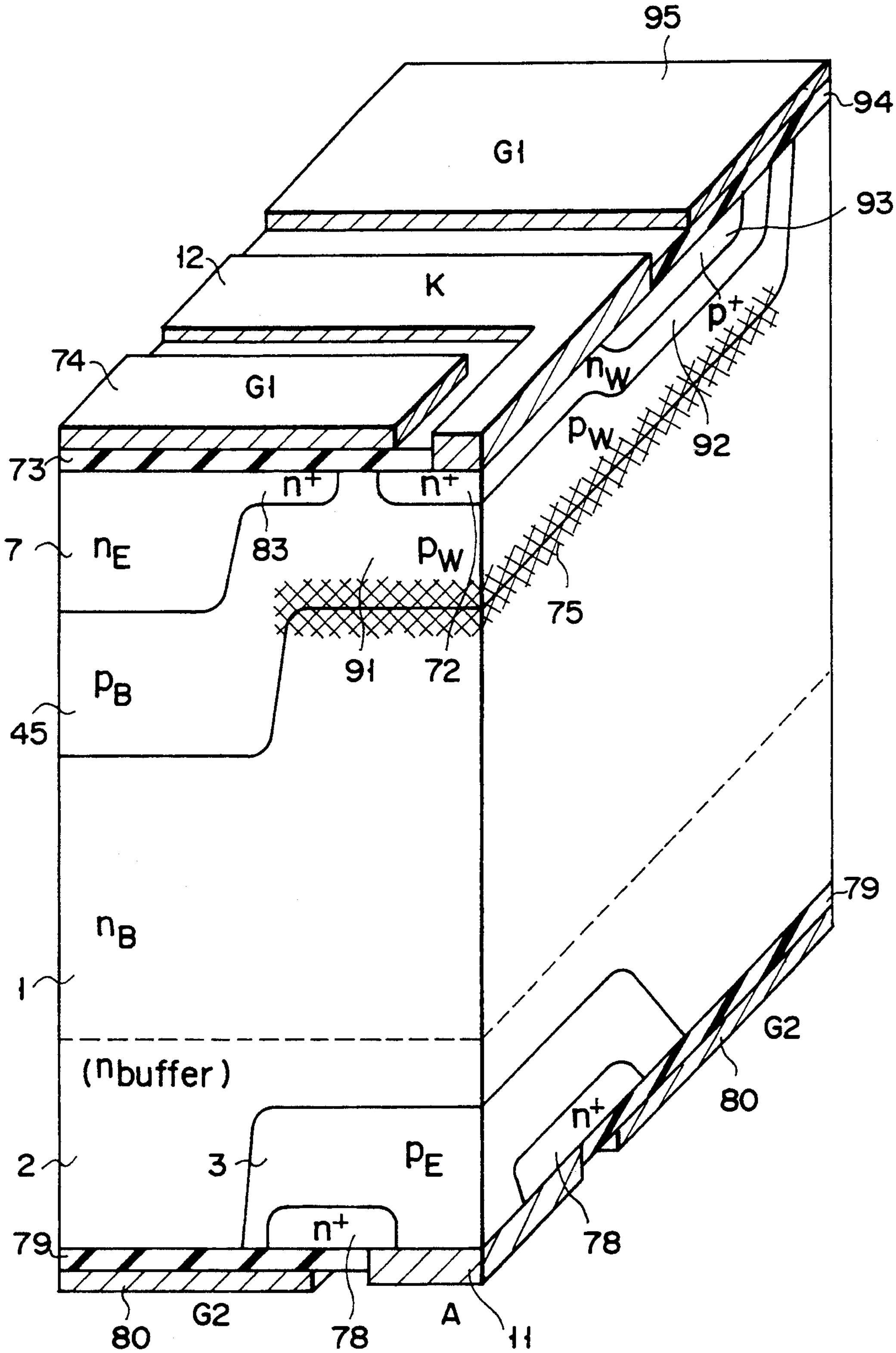
F I G. 72

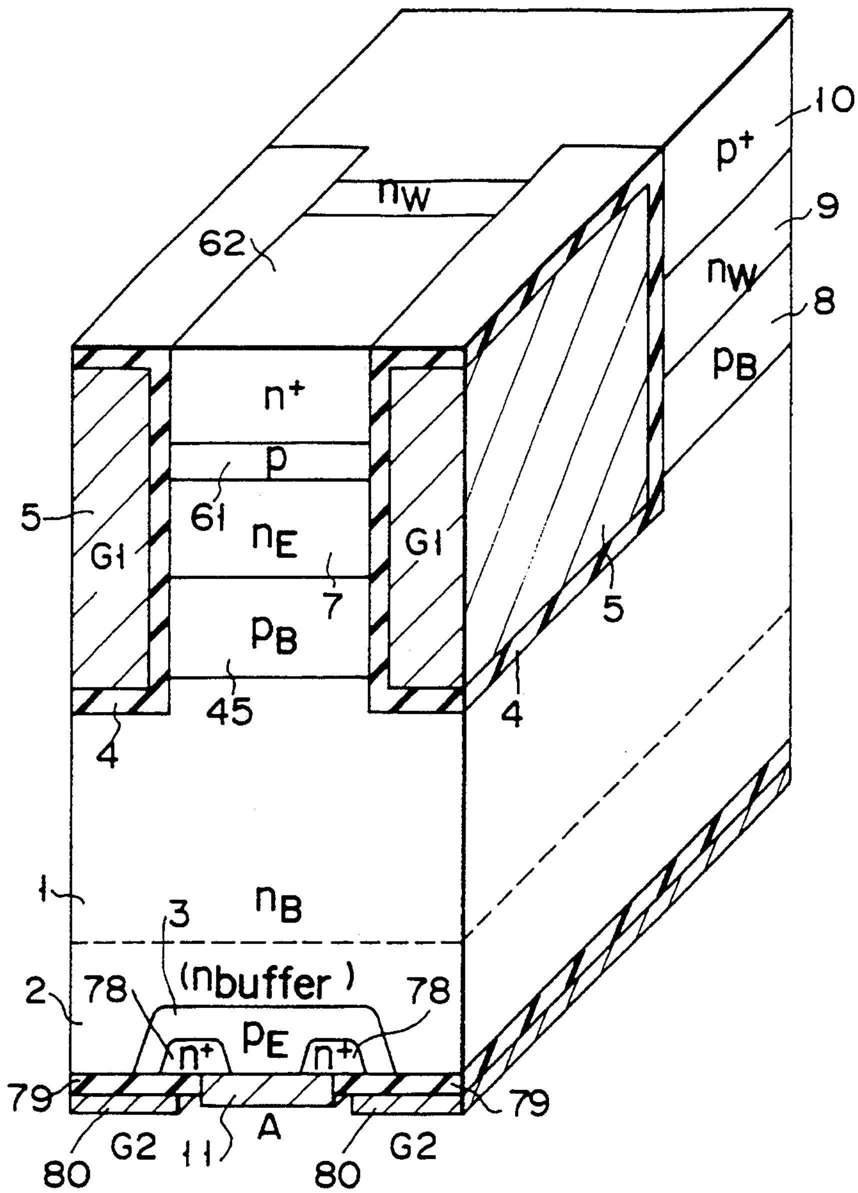
F I G. 84

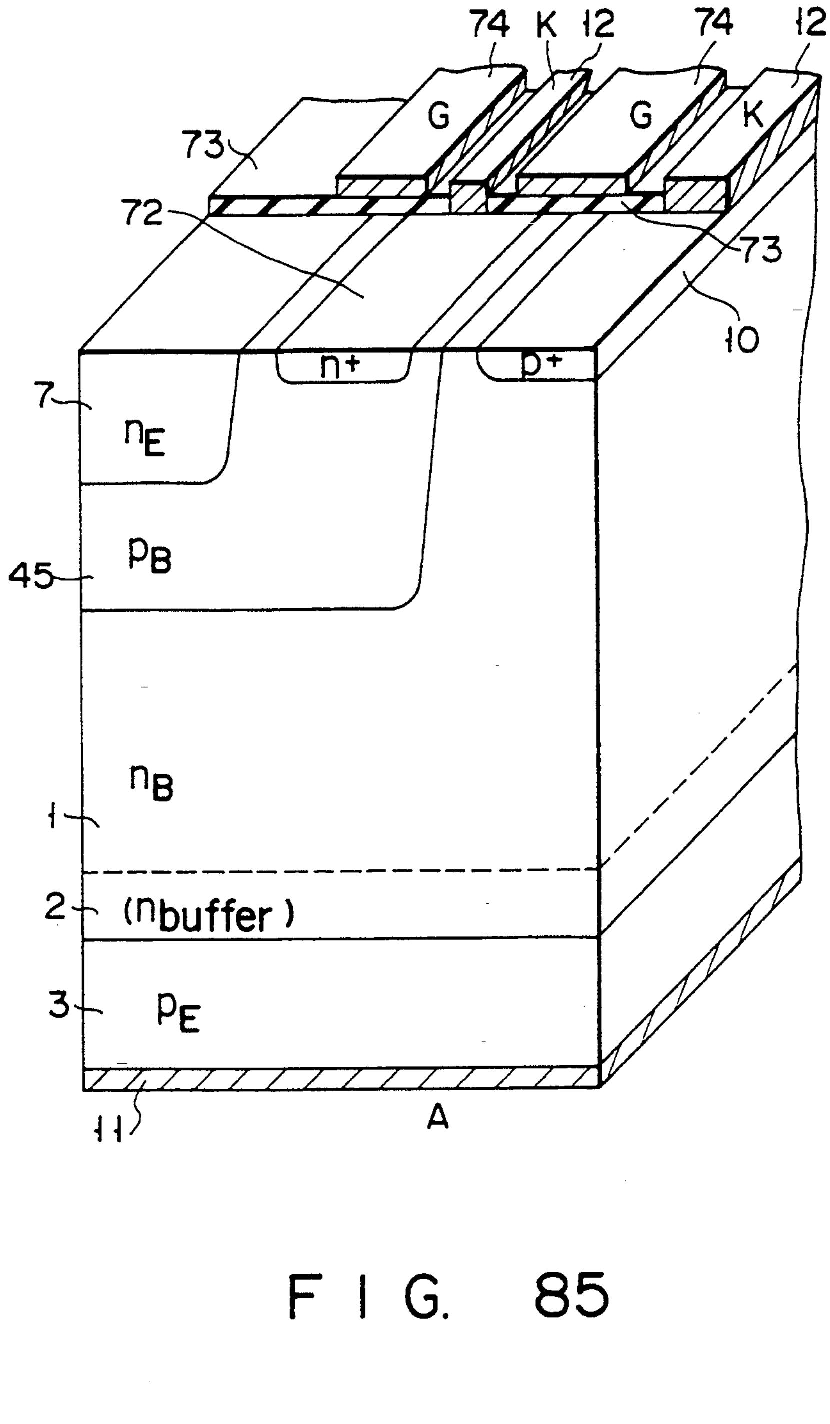
F I G. 85

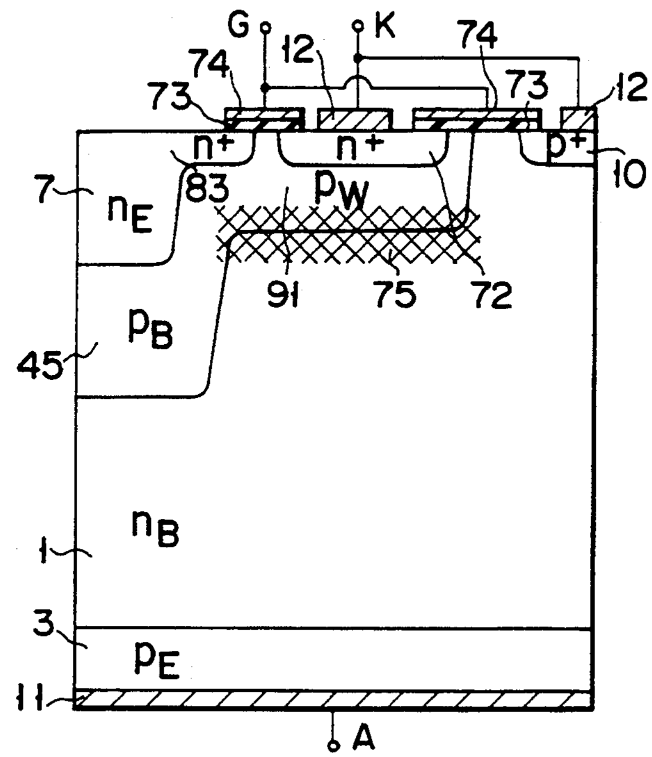
F I G. 86
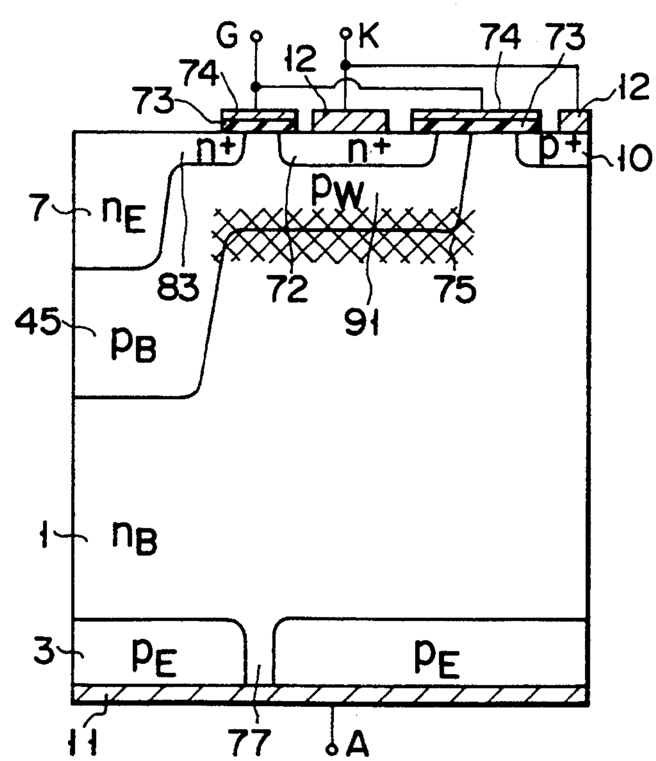
F I G. 87

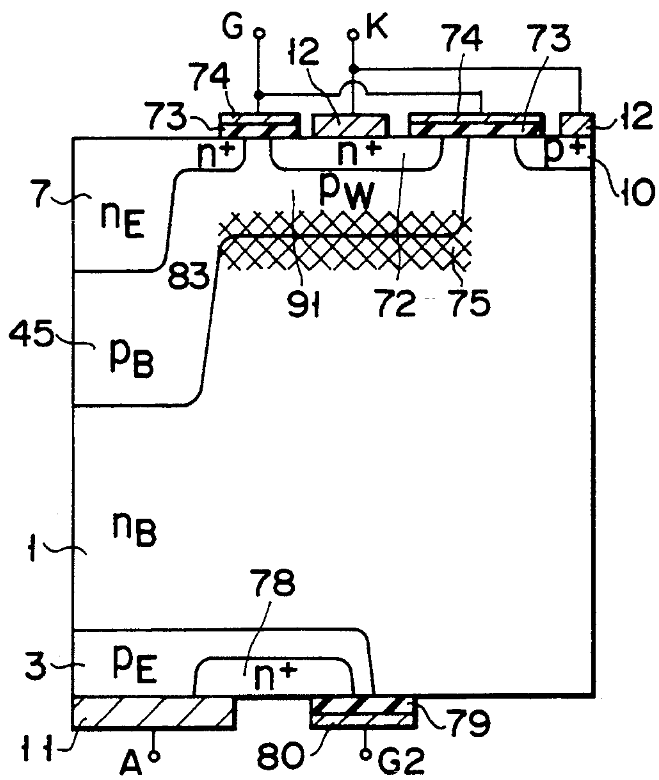
F I G. 88
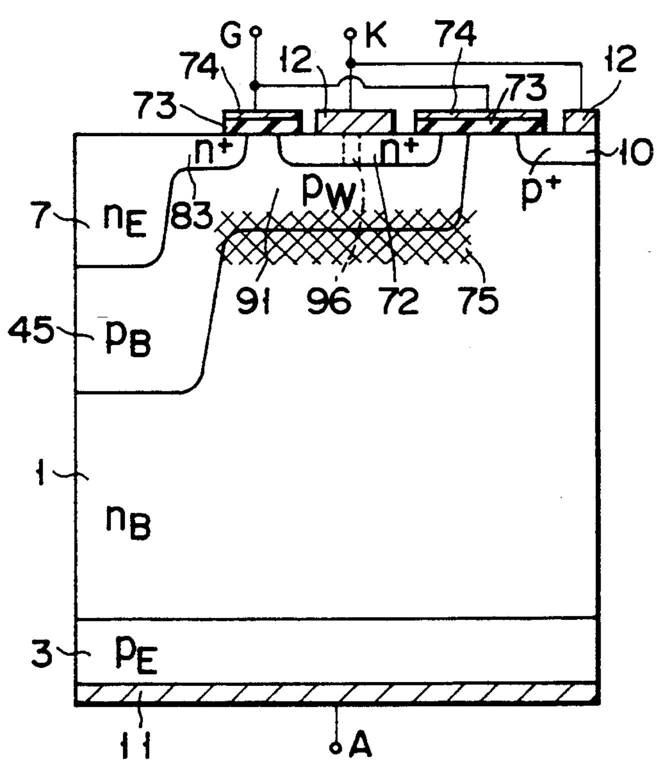
F I G. 89

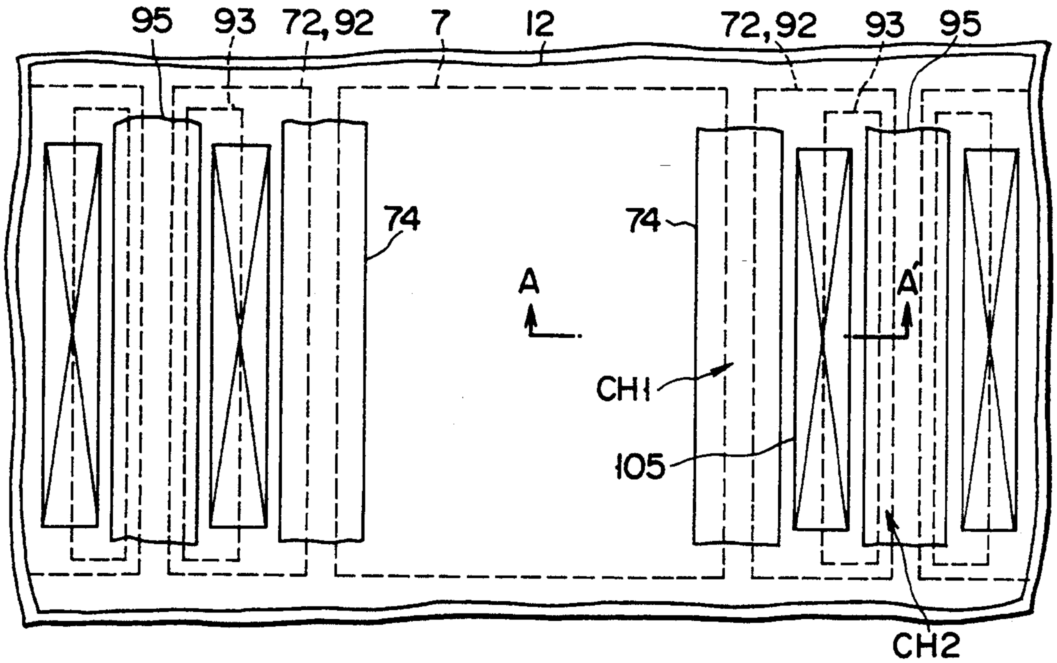
F I G. 95
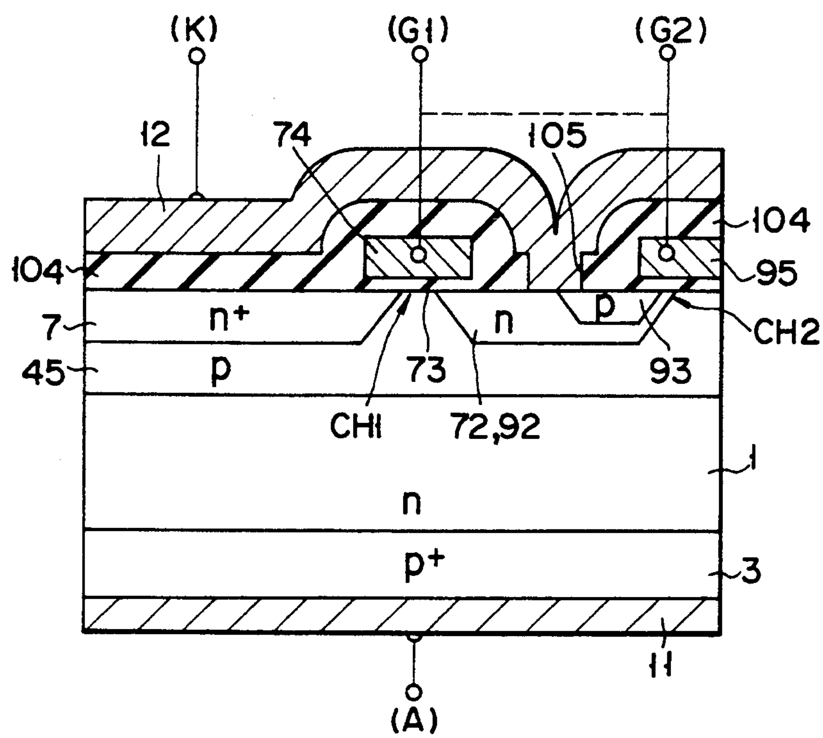
F I G. 96

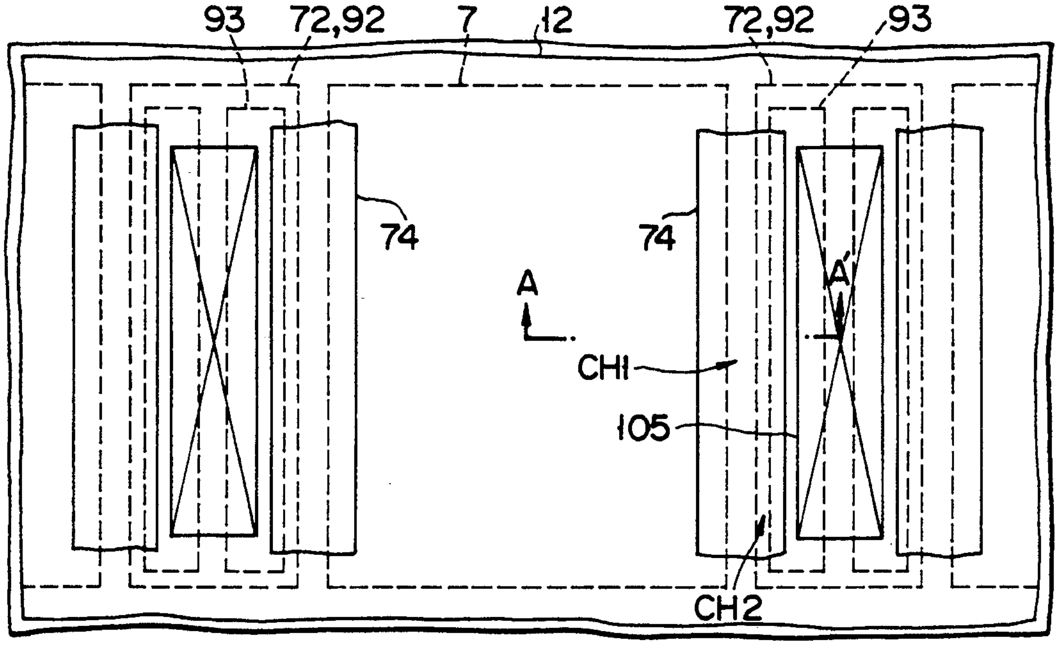
F I G. 102
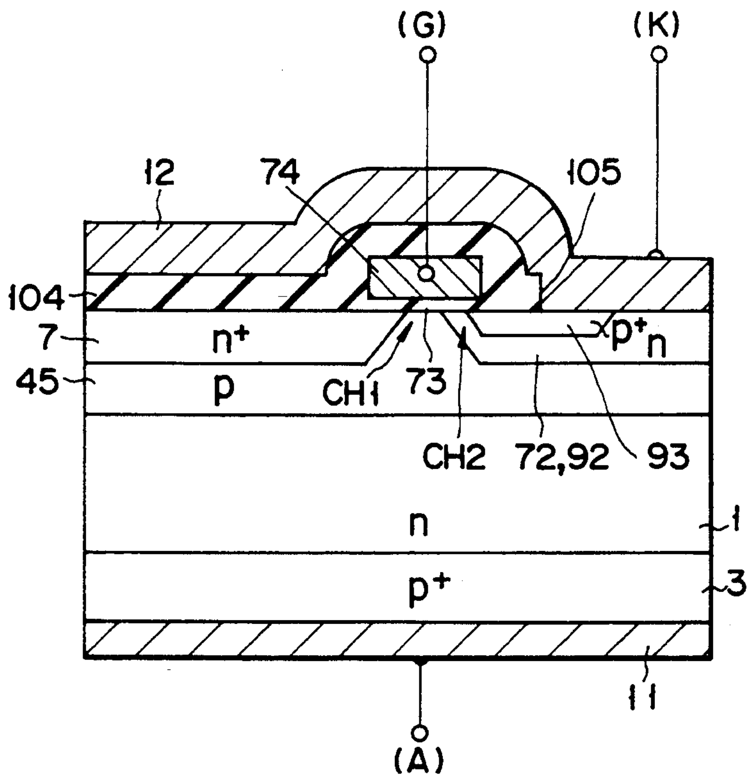
F I G. 103

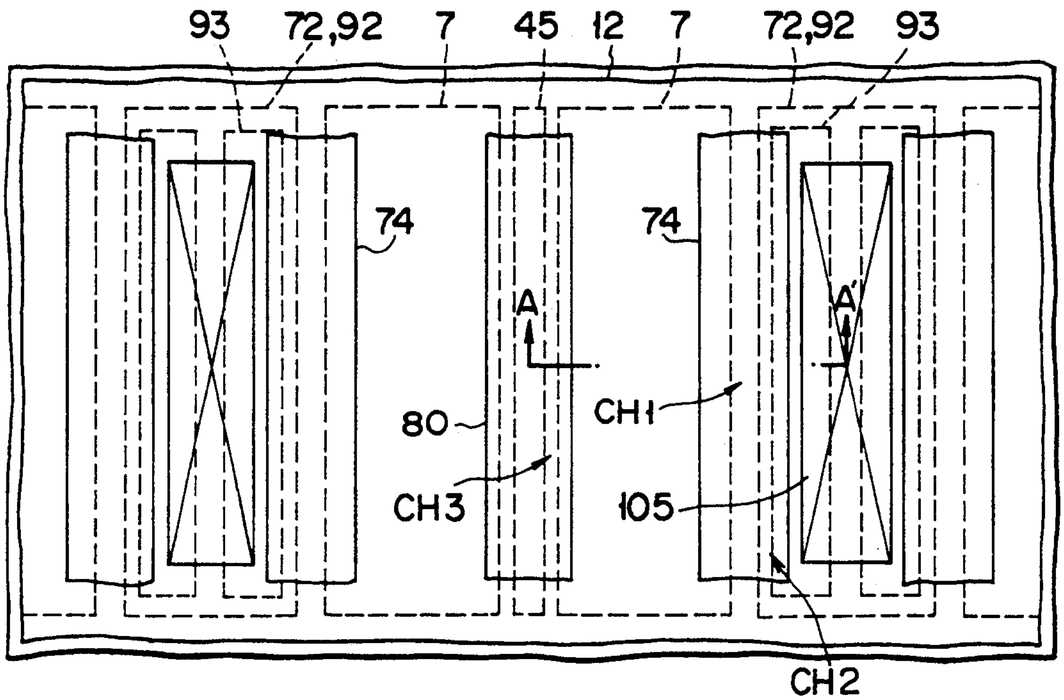
F I G. 104
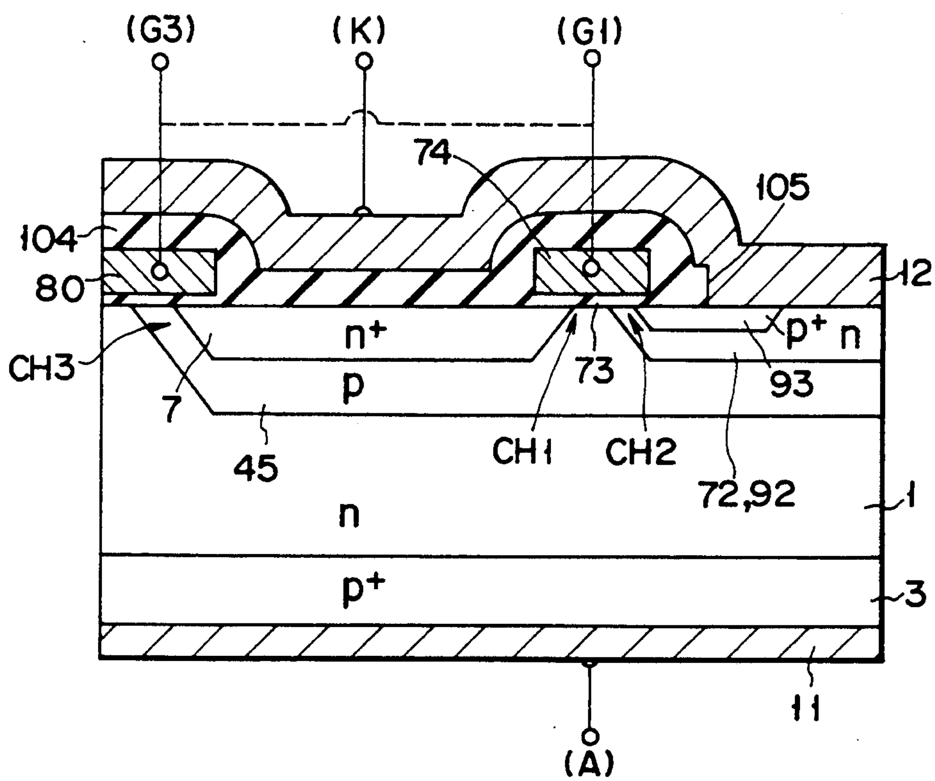
F I G. 105

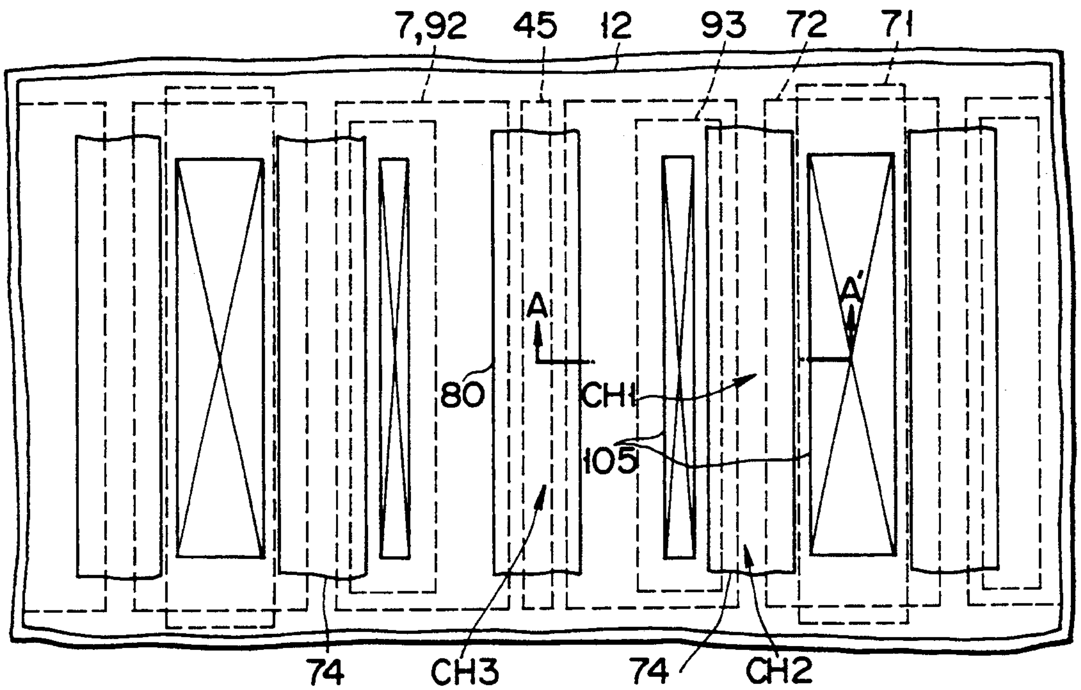
F I G. 111
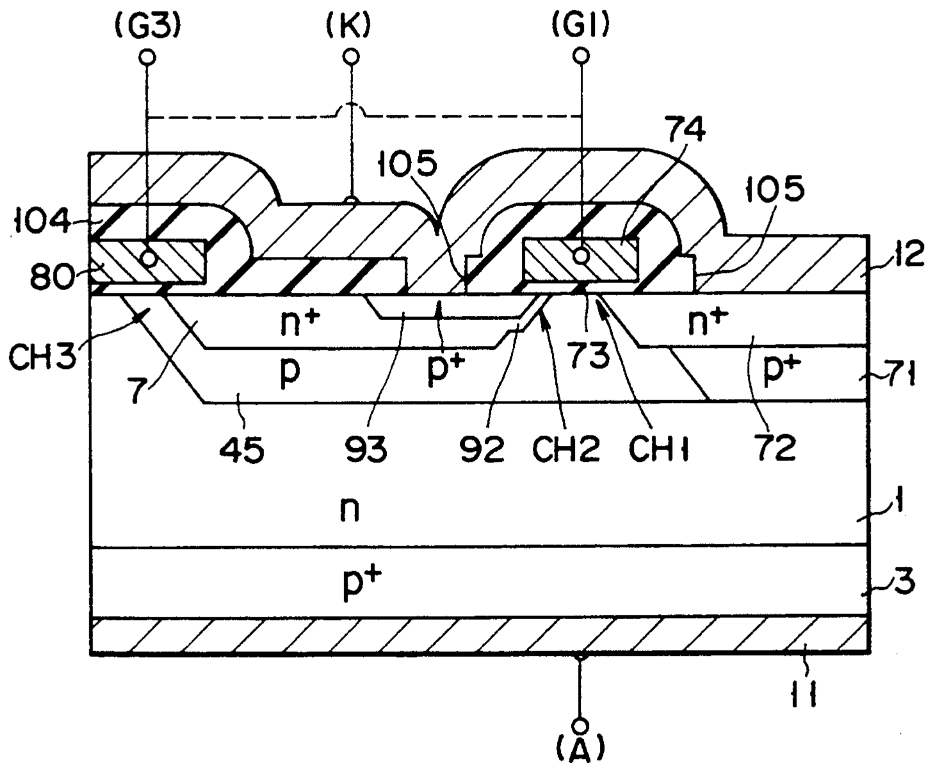
F I G. 112

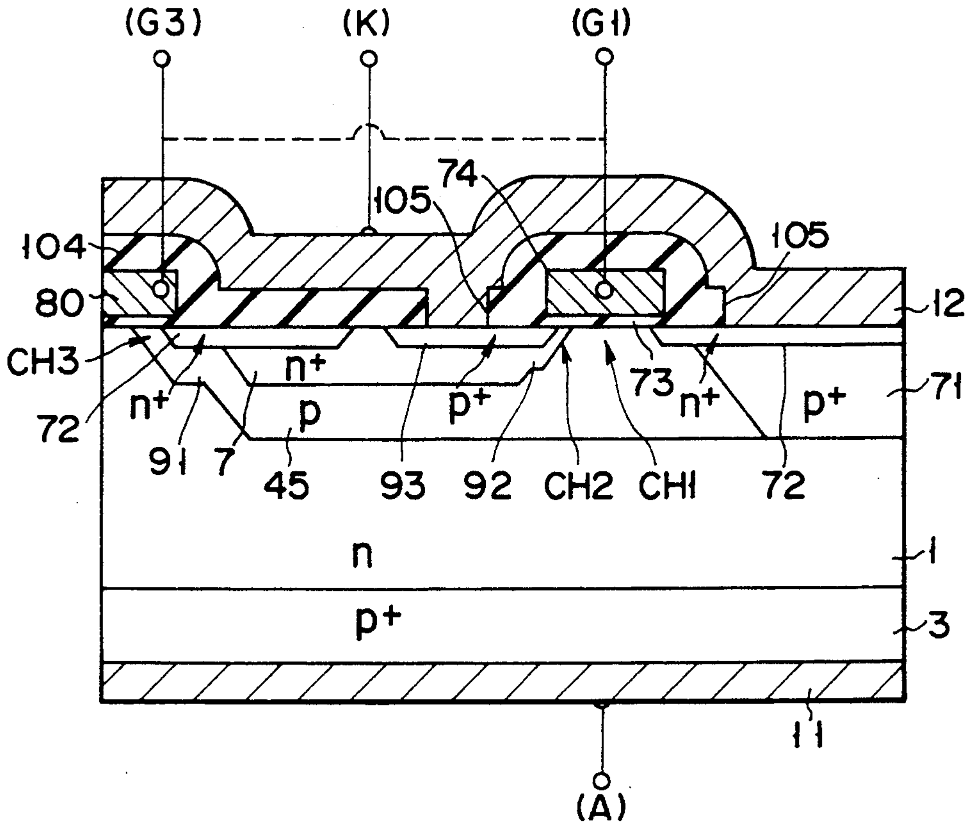
F I G. 115

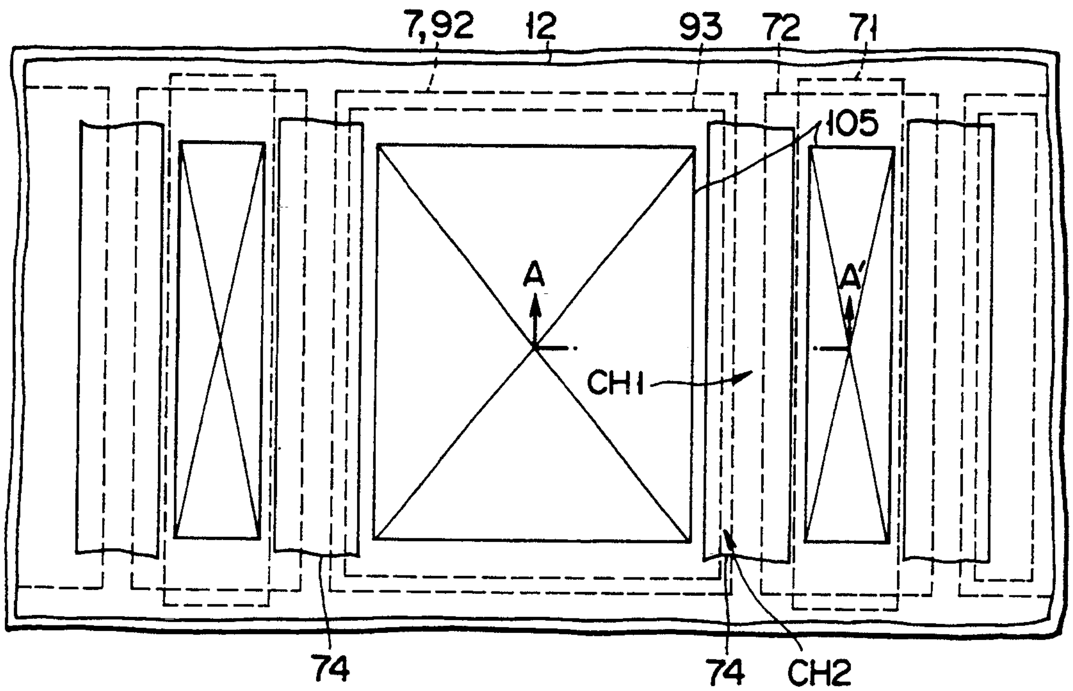
F I G. 116
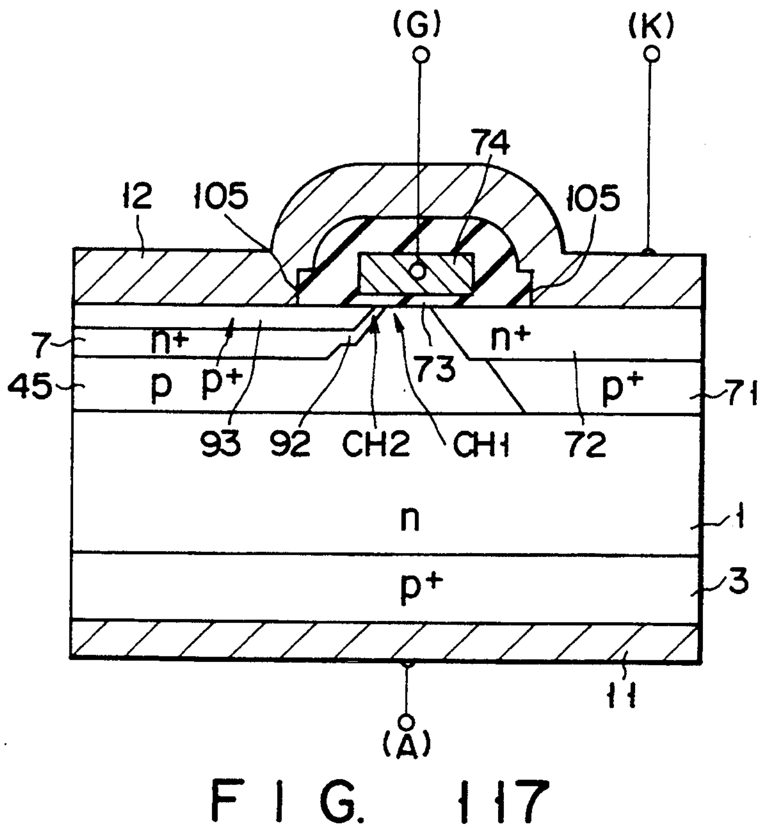
F I G. 117

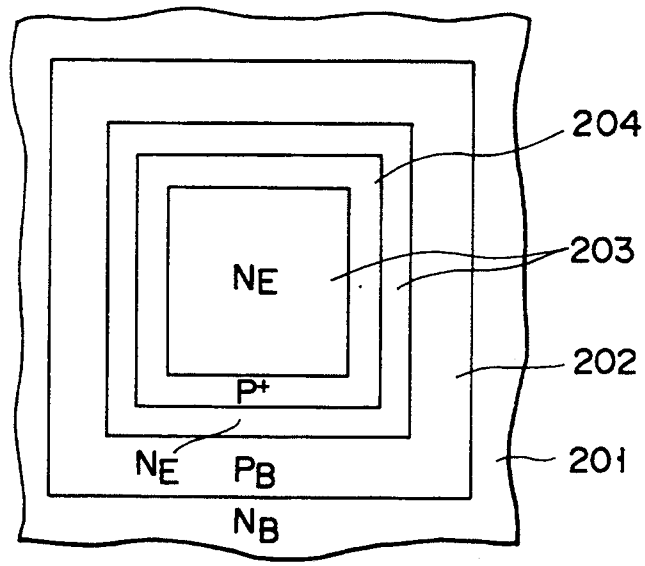
F I G. 131
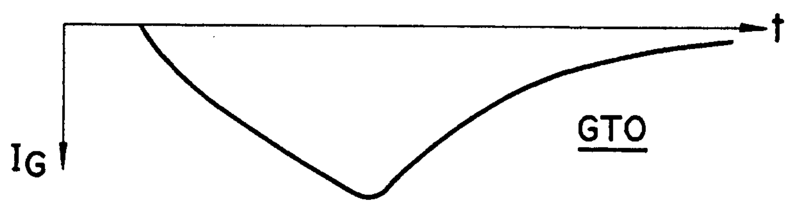
F I G. 132A
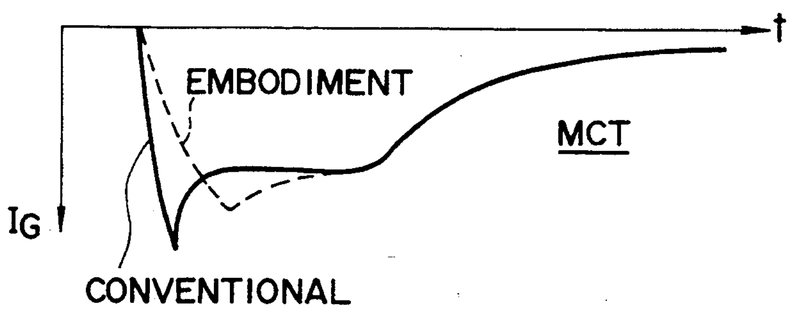
F I G. 132B

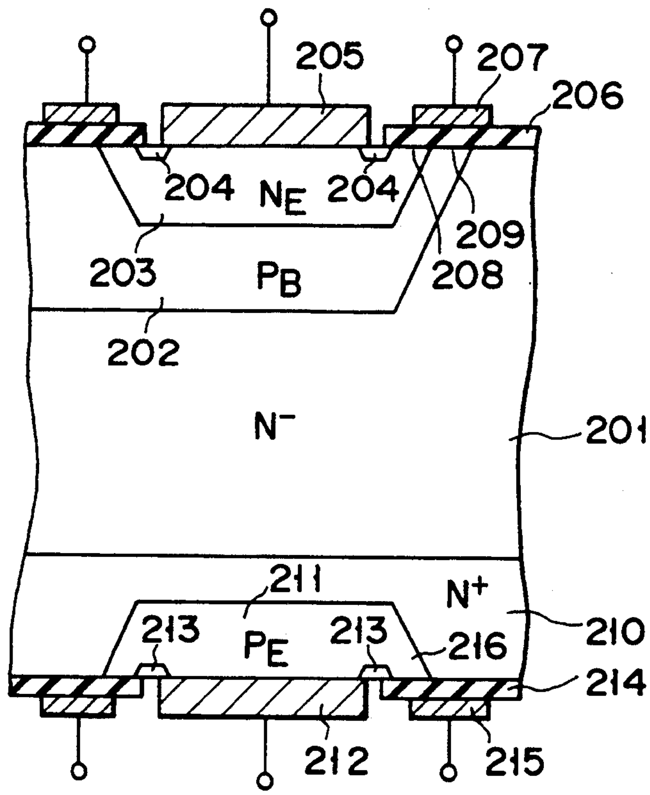
F I G. 140

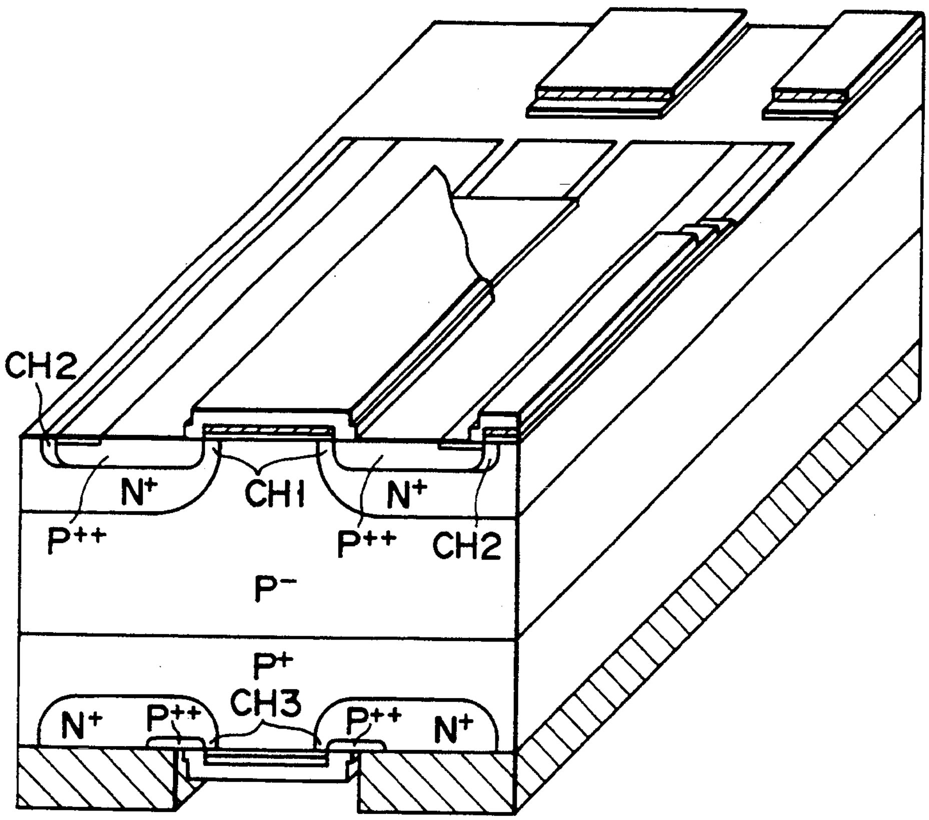
F I G. 141

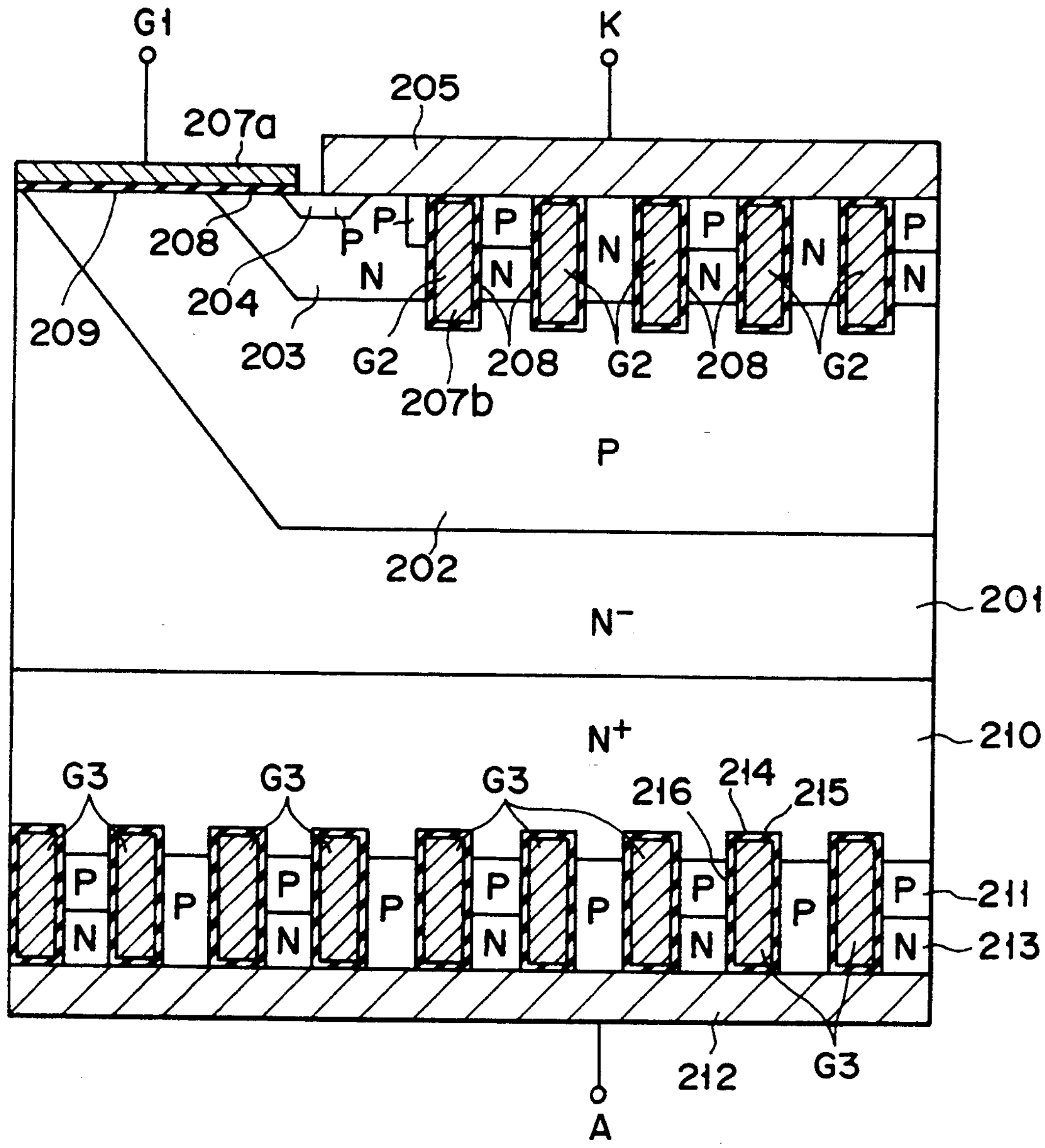
F I G. 143

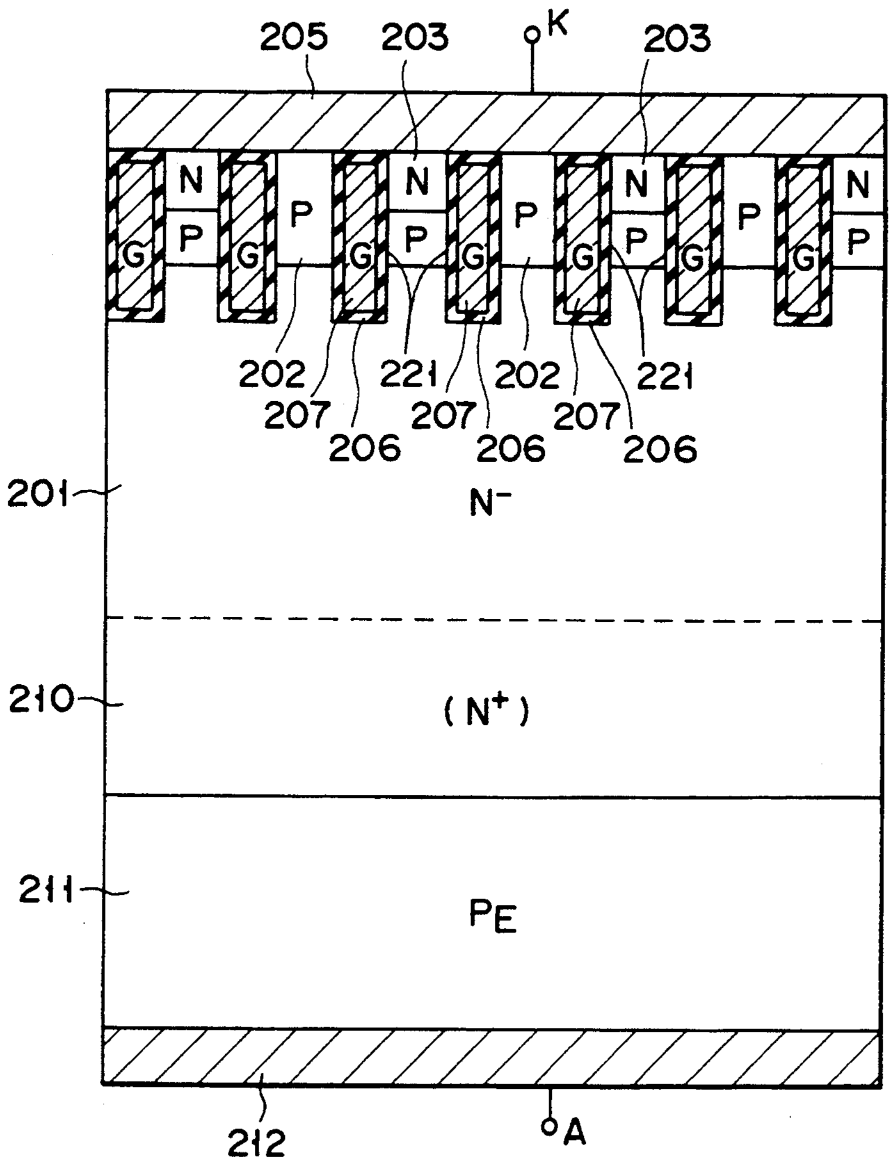
F I G. 152

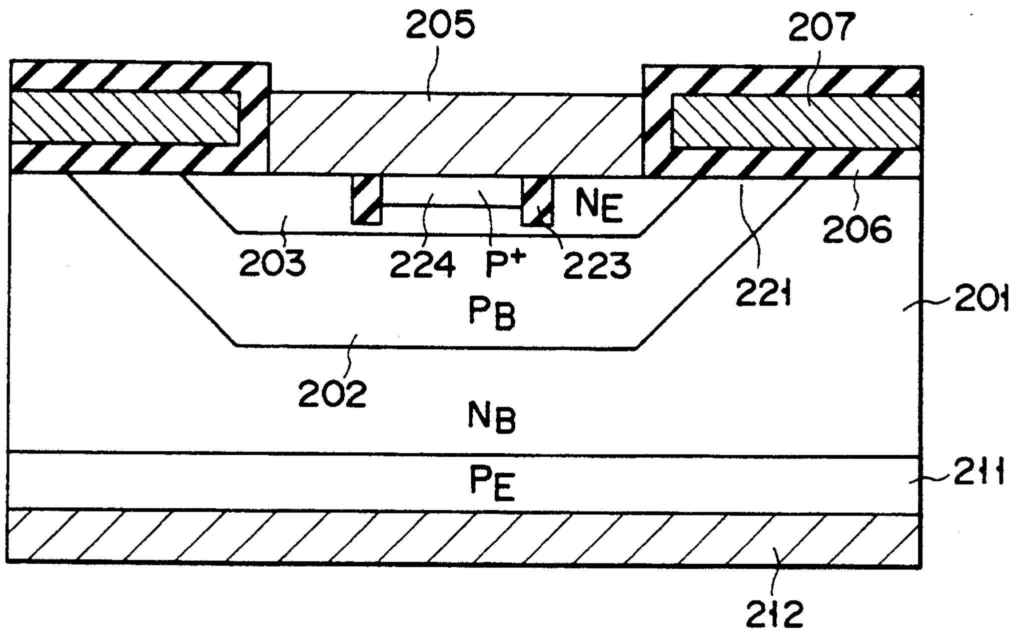
F I G. 155
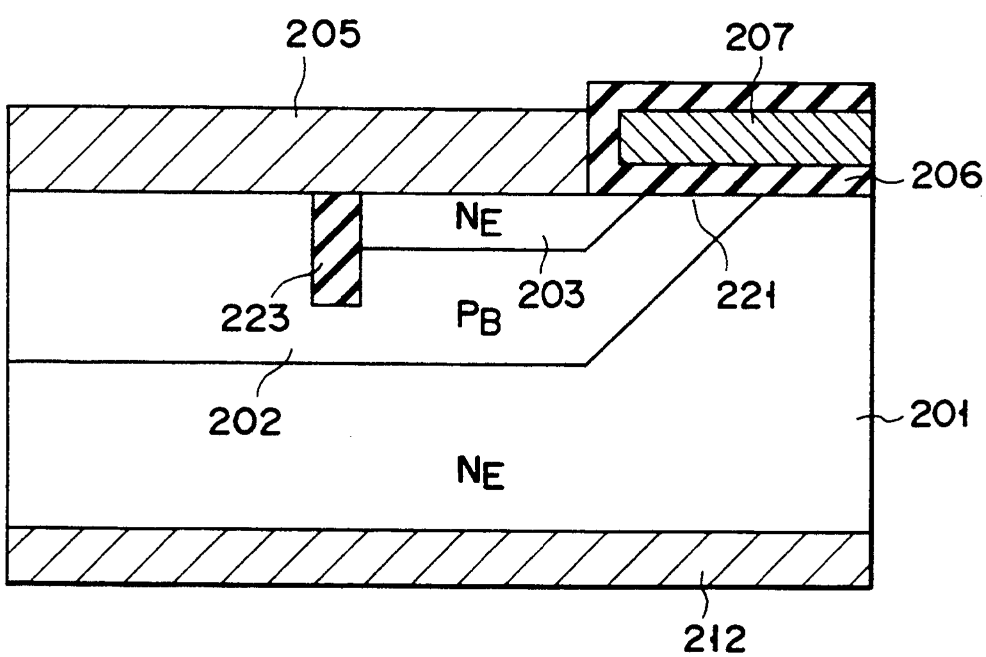
F I G. 156

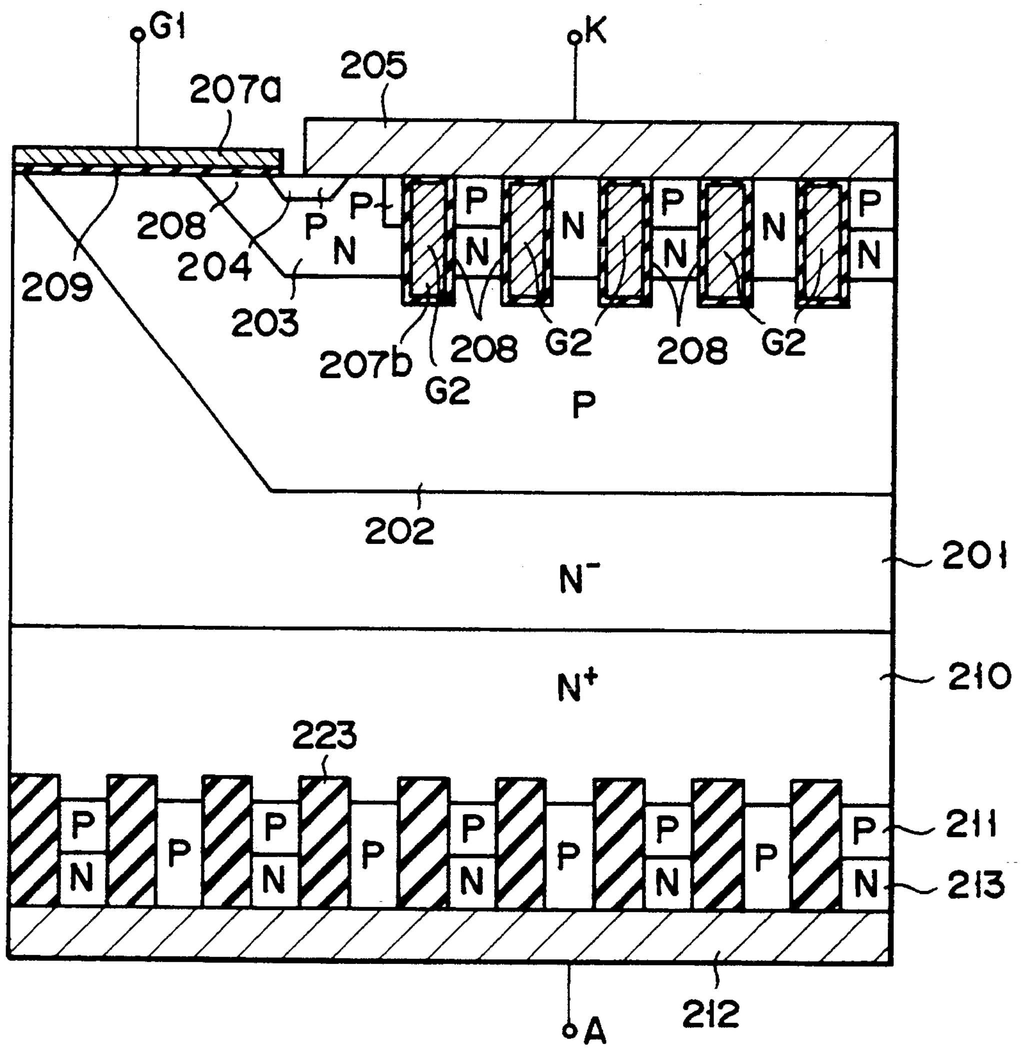
F I G. 157

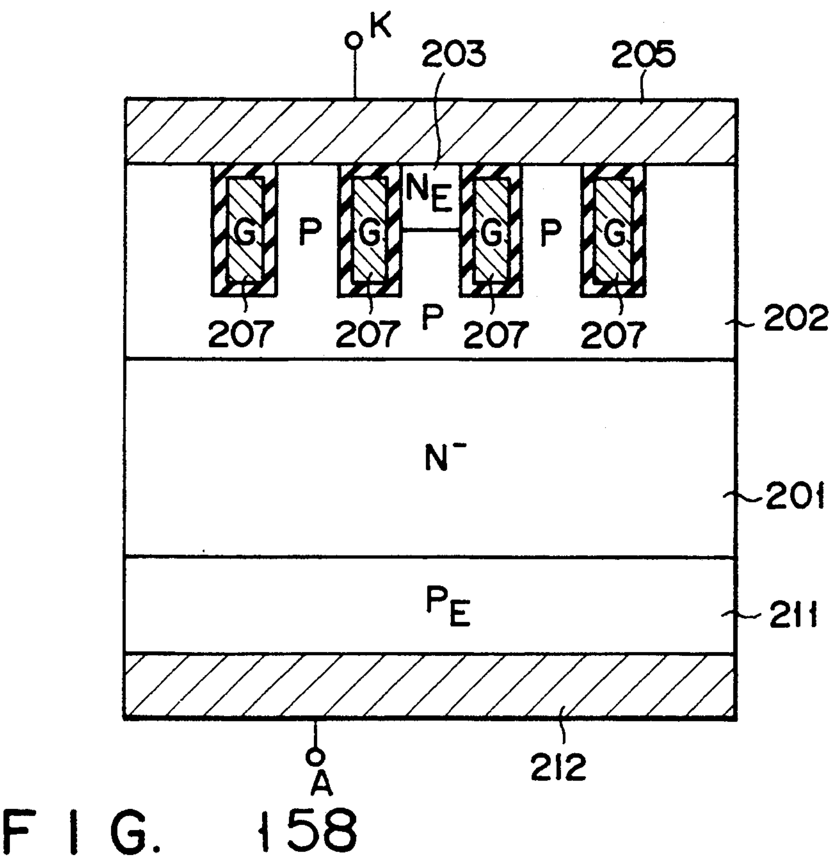
FIG. 158
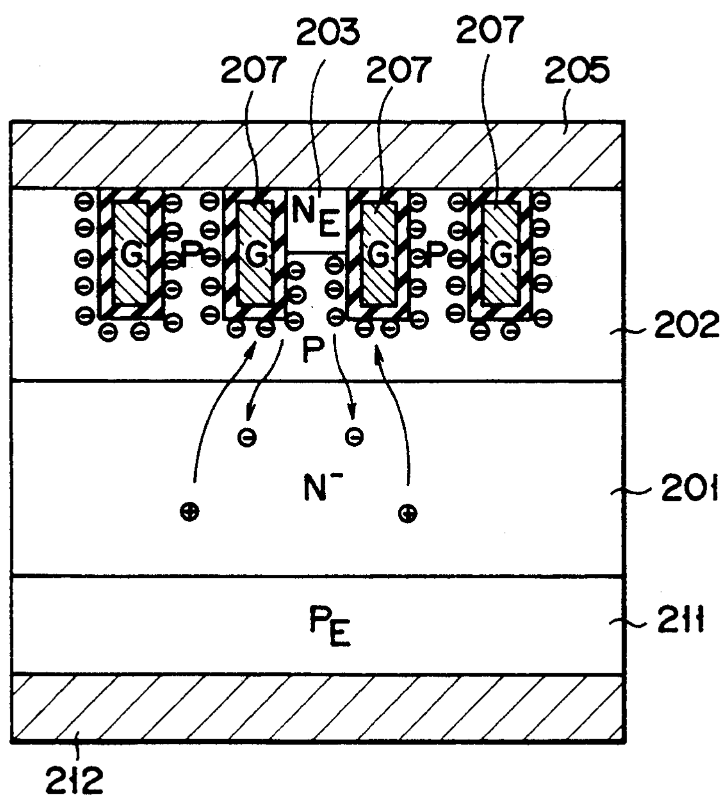
FIG. 159 $V_G$=+15V

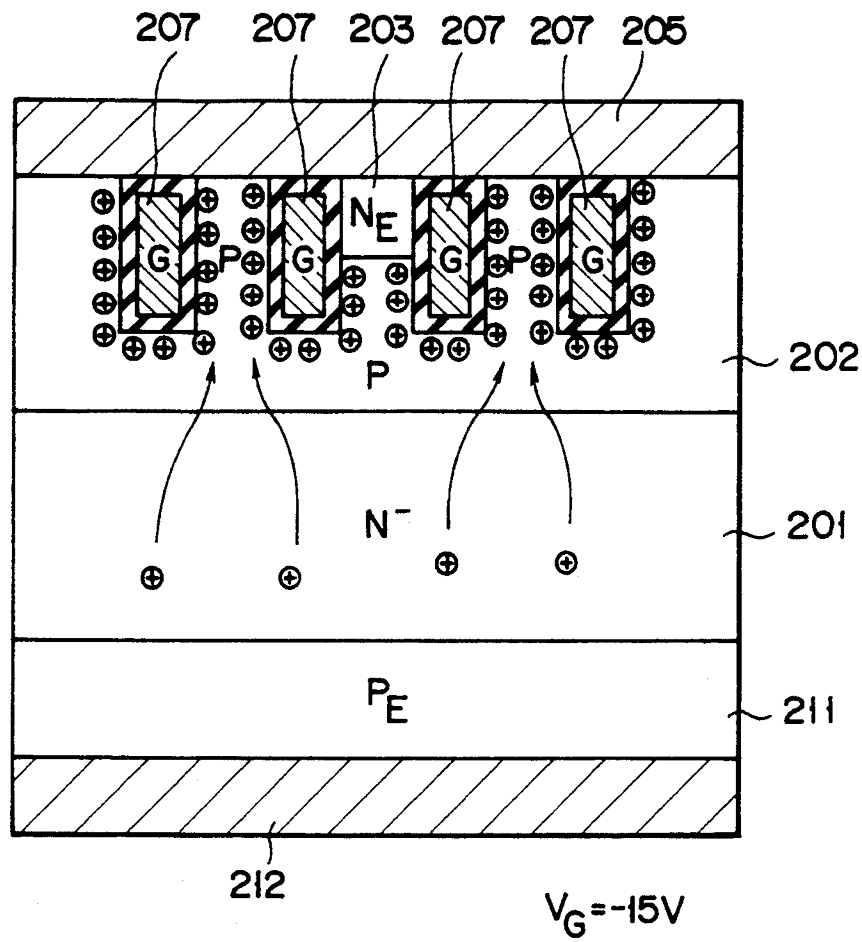
F I G. 160

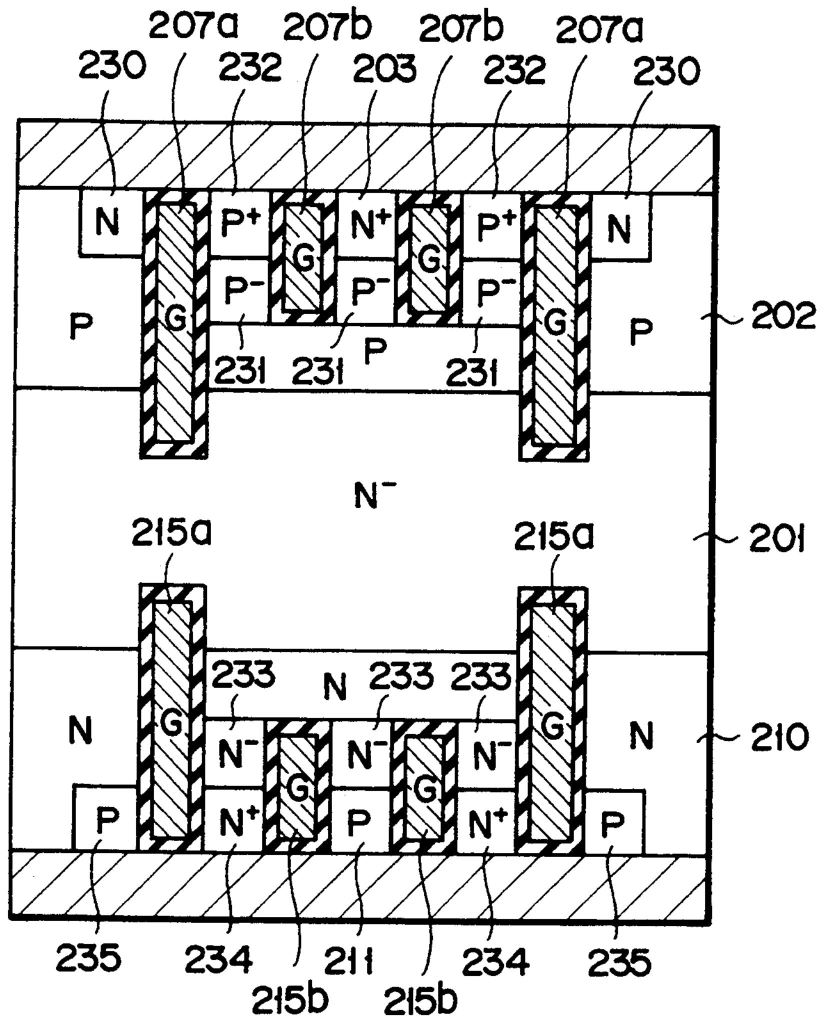
F I G. 166

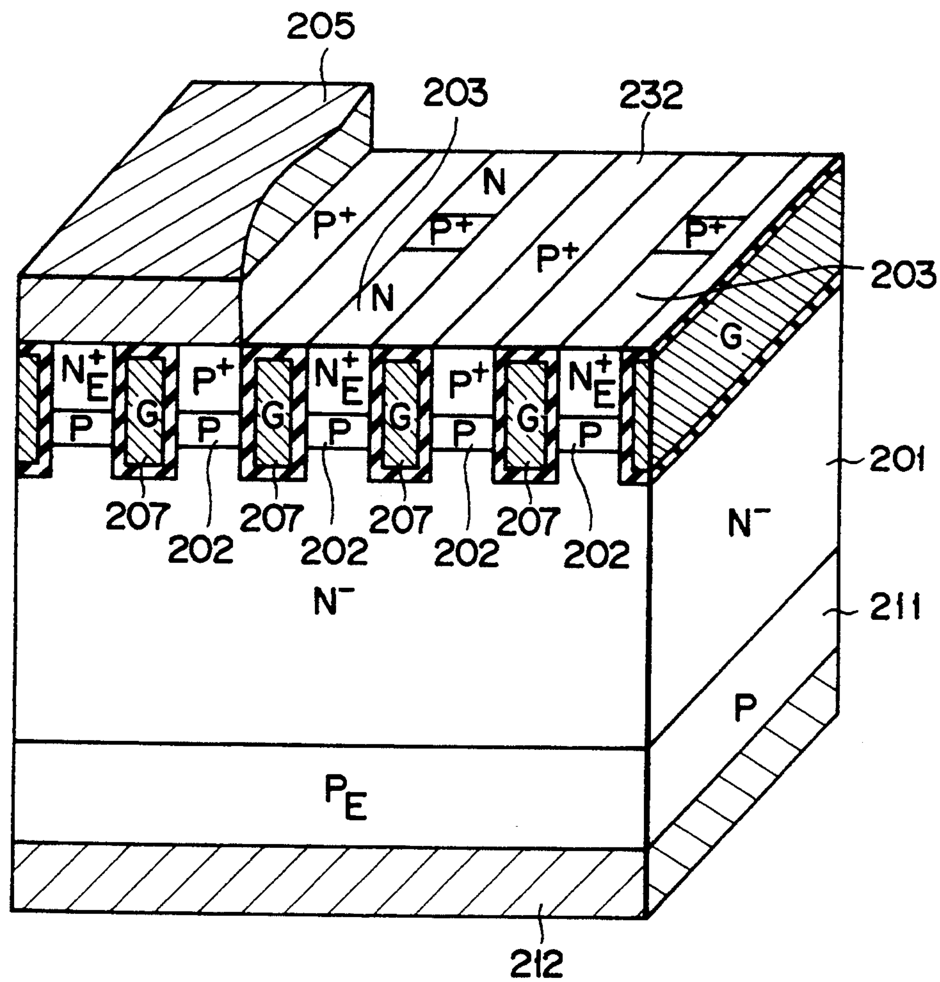
F I G. 170

A-A' CROSS SECTION

B-B' CROSS SECTION

C-C' CROSS SECTION

D-D' CROSS SECTION

A–A' CROSS SECTION

B–B' CROSS SECTION

C-C' CROSS SECTION

D-D' CROSS SECTION

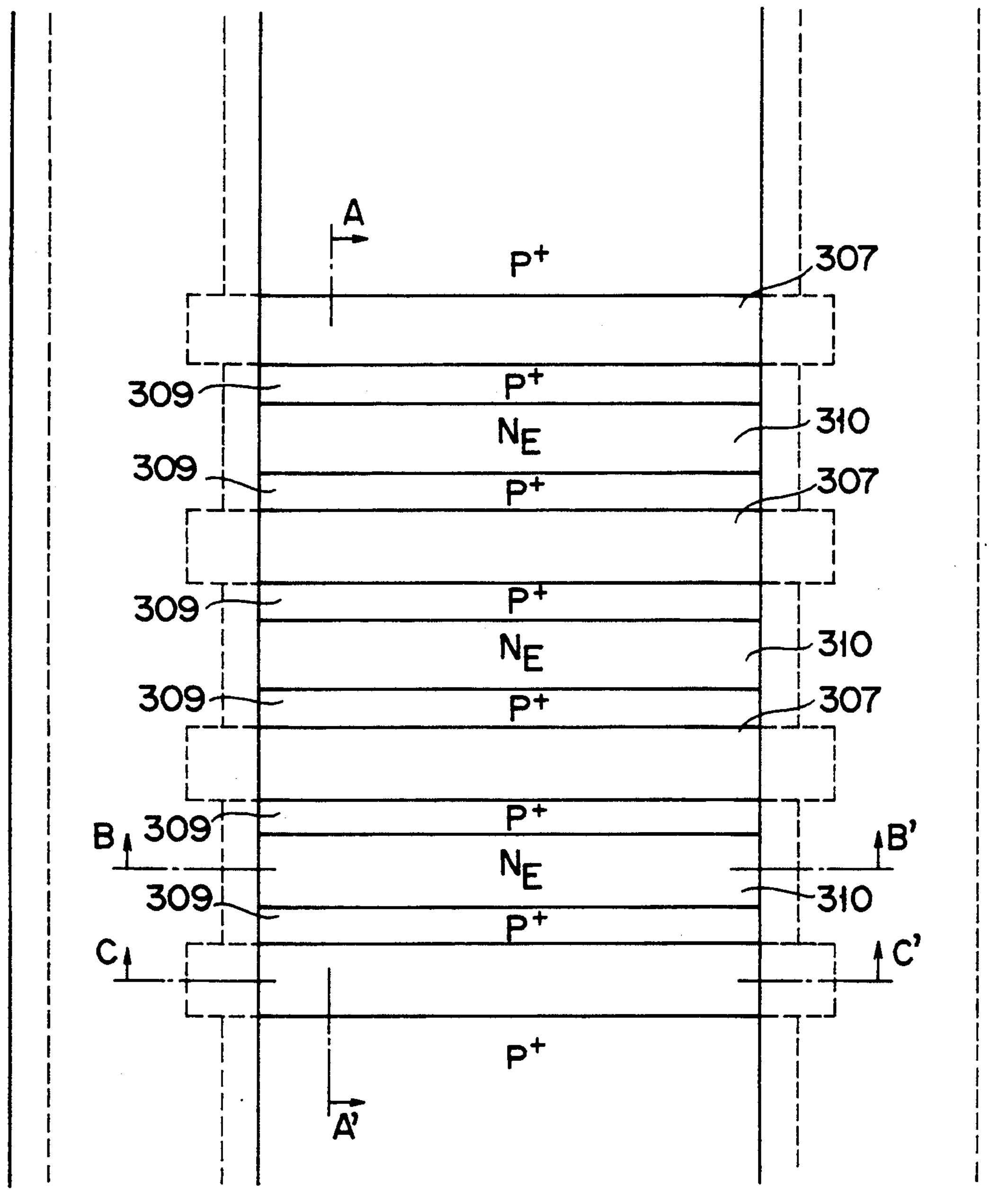
F I G. 181

A-A' CROSS SECTION

B-B' CROSS SECTION

C-C' CROSS SECTION

A-A' CROSS SECTION

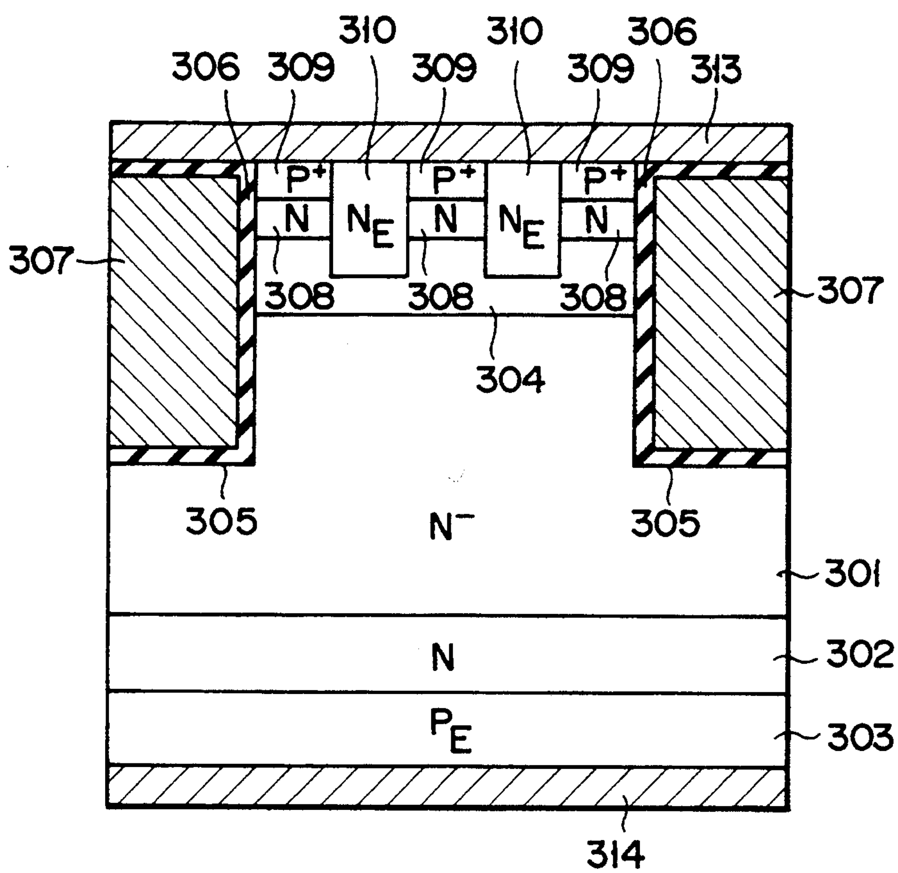
B-B' CROSS SECTION
F I G. 188

A-A' CROSS SECTION

B-B' CROSS SECTION

A-A' CROSS SECTION

B-B' CROSS SECTION

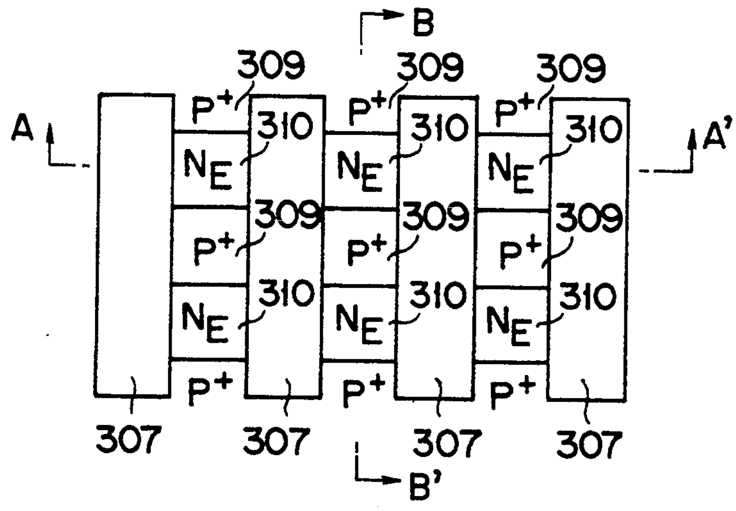
F I G. 195
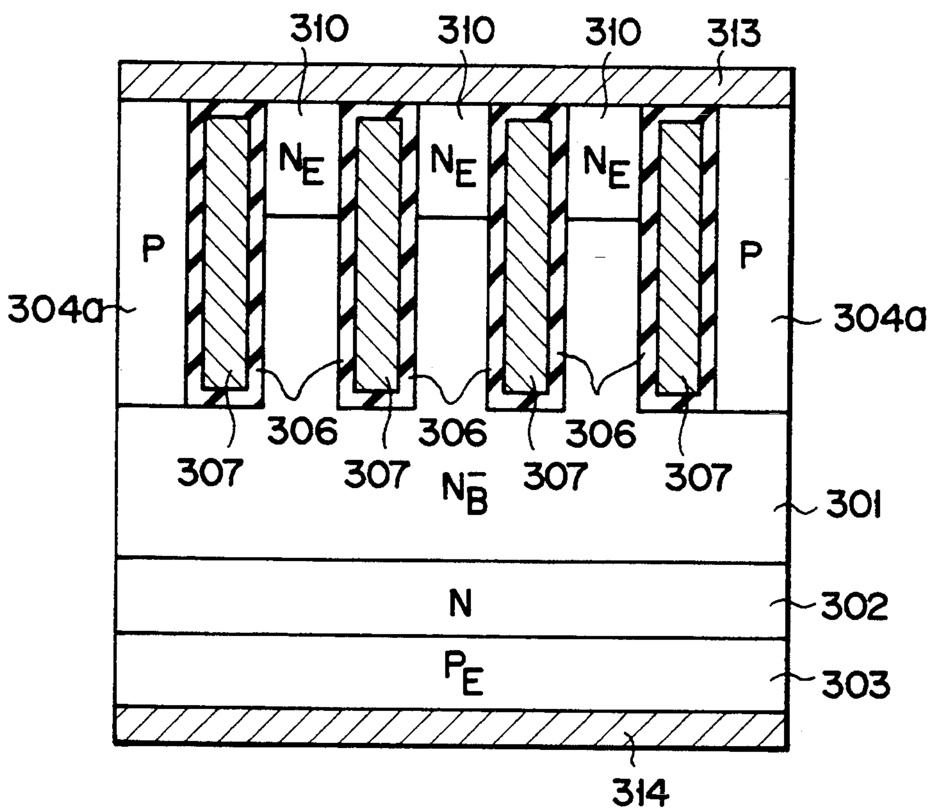
A–A' CROSS SECTION
F I G. 196

B-B' CROSS SECTION

A – A' CROSS SECTION

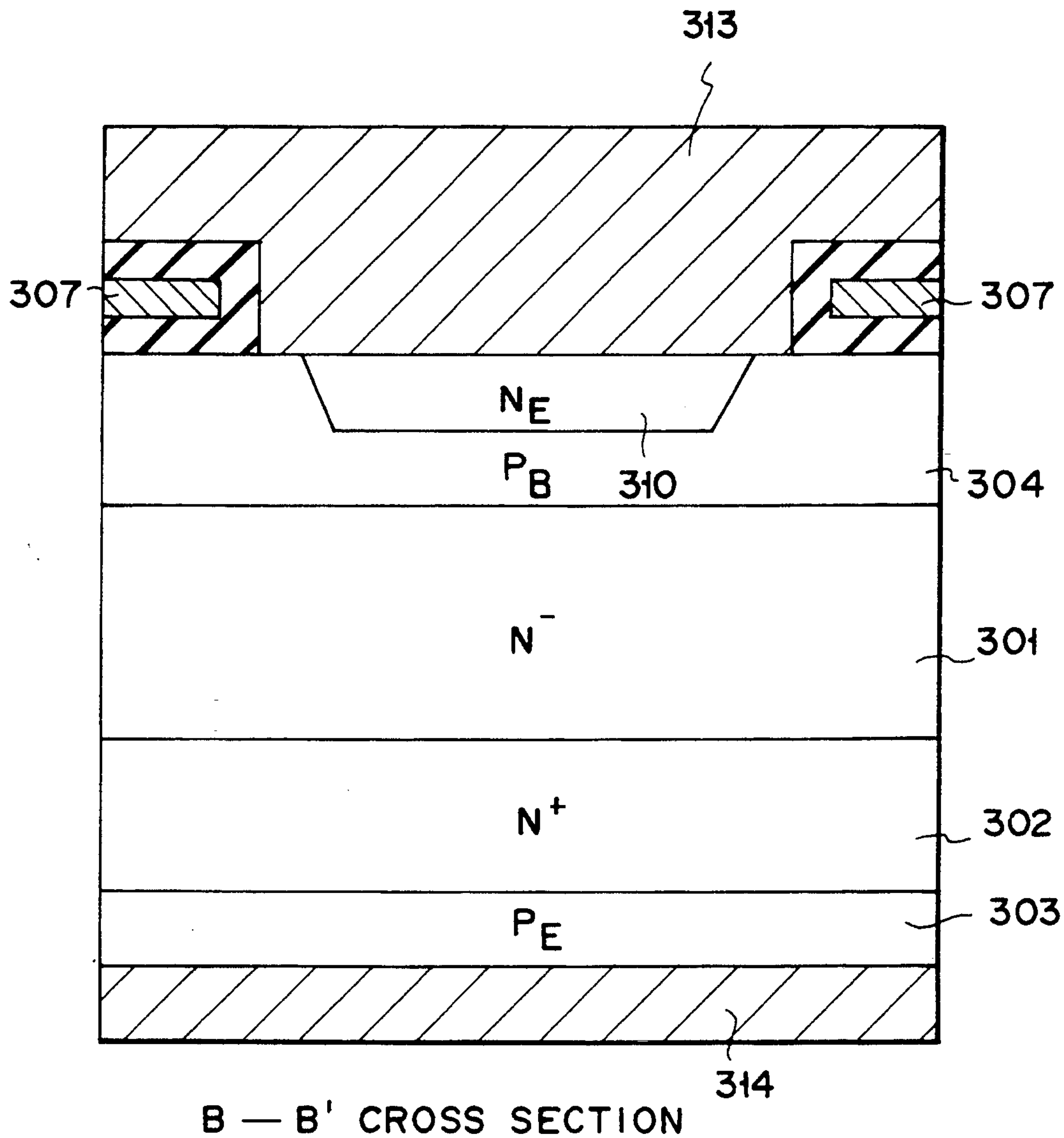
B — B' CROSS SECTION
F I G. 200

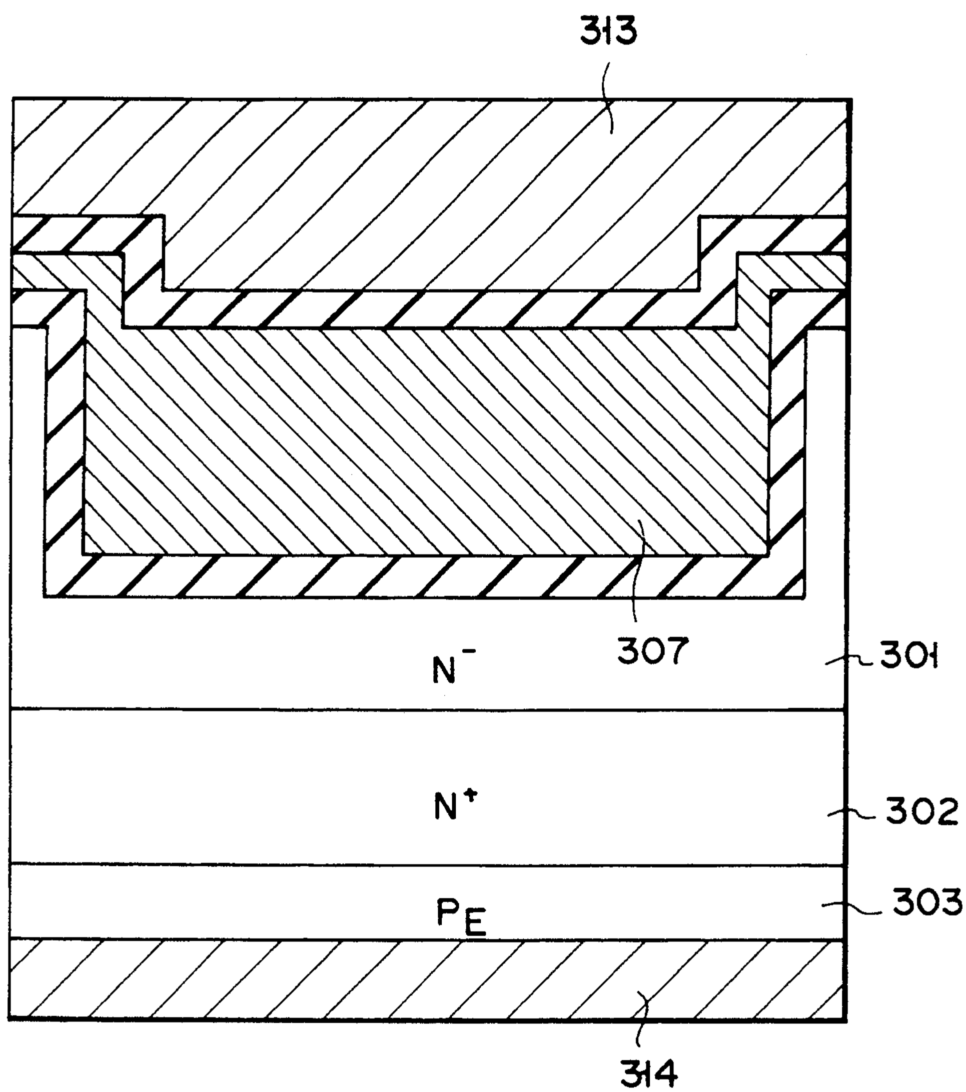
C—C' CROSS SECTION
F I G. 201

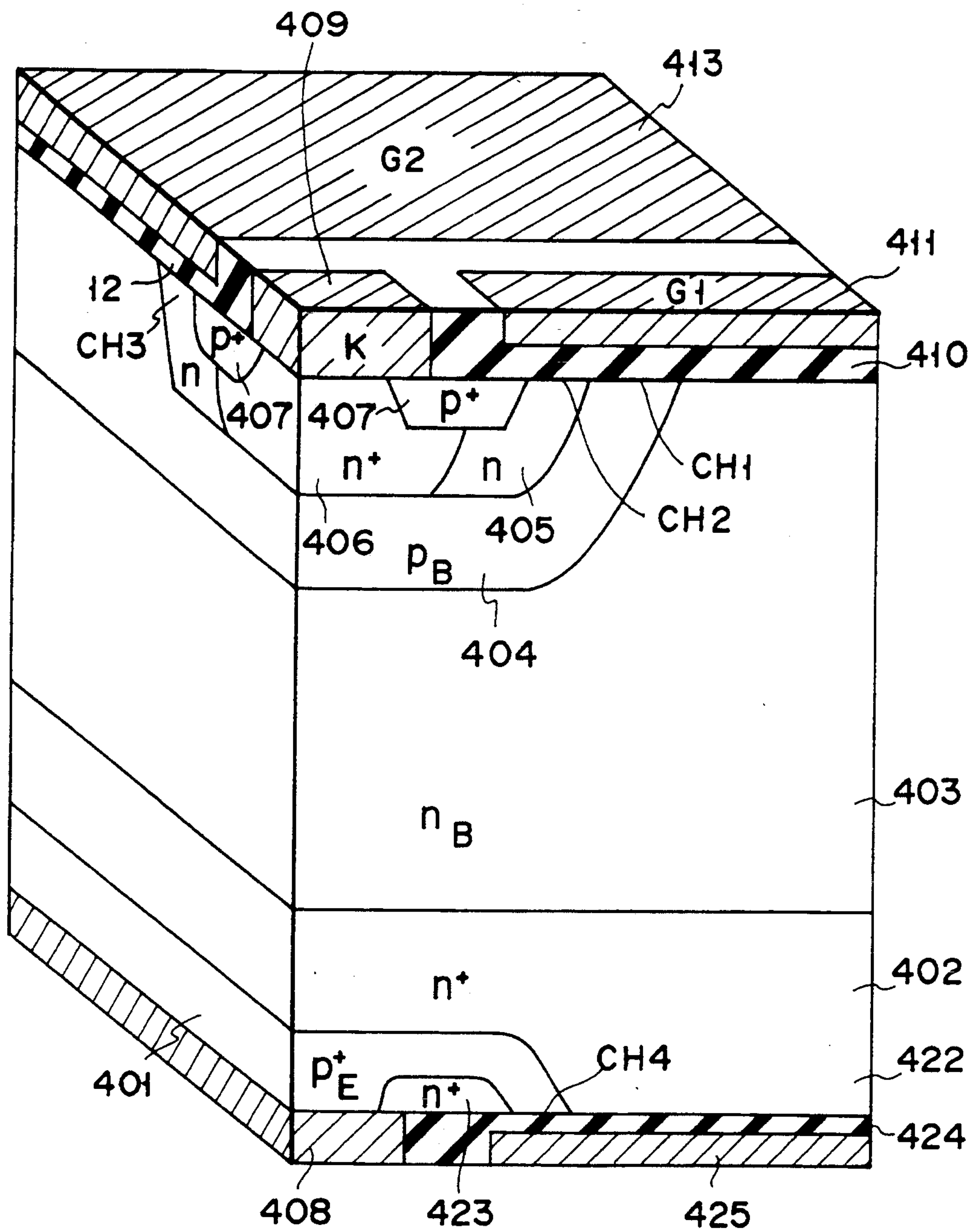
F I G. 207

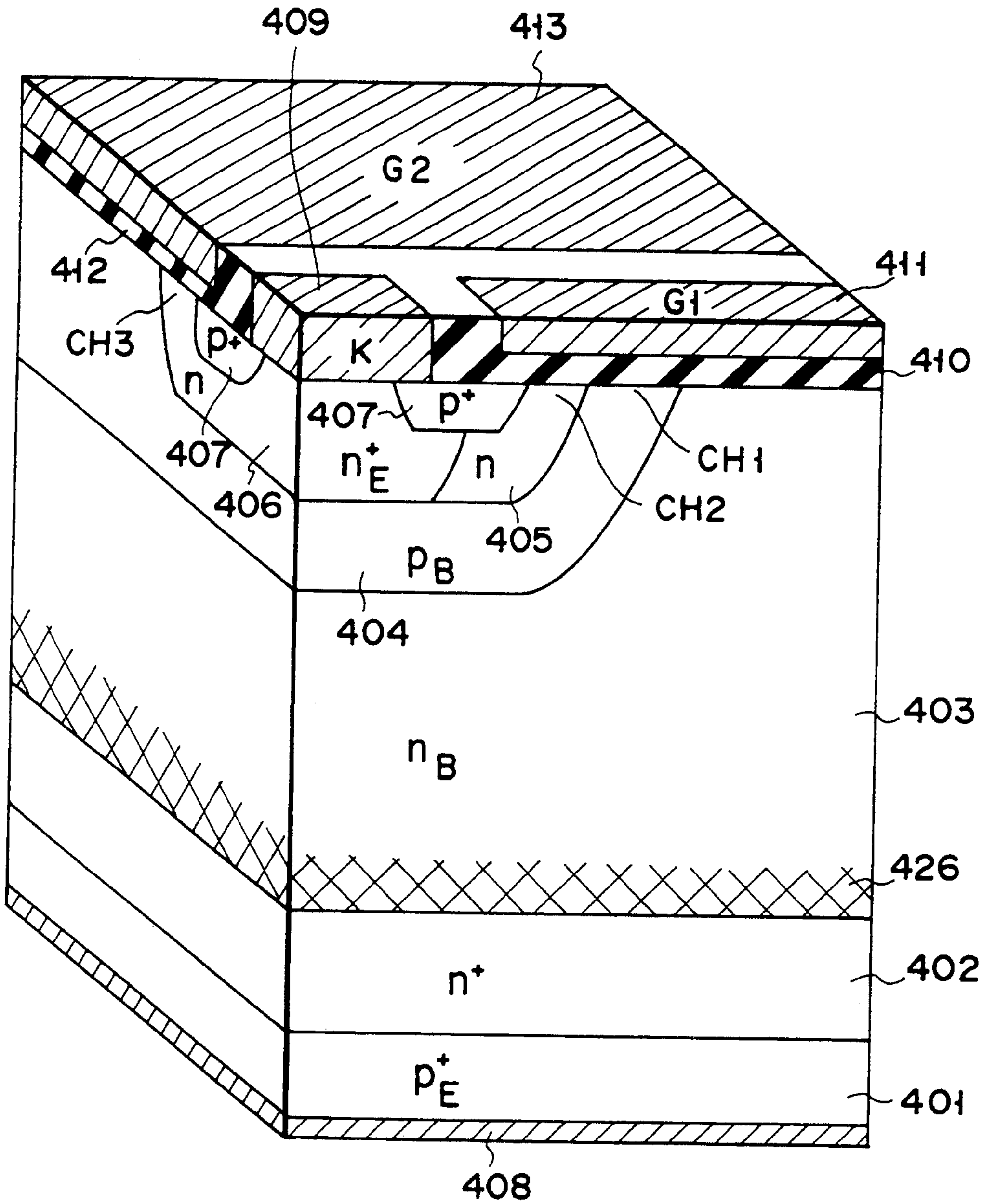
F I G. 208

INSULATED-GATE THYRISTOR

BACKGROUND OF THE INVENTION

1. Field of the Invention

The present invention relates to an insulated-gate thyristor which has improved turn-off efficiency.

2. Description of the Related Art

Various types of insulated-gate thyristors have been developed which are designed to reduce the power consumption at their gates.

B. Jayant Valiga, *The MOS-Gated Emitter Switched Thyristor,* IEEE Electron Device Letters, Vol. 11, No. 2, February 1990, pp. 75–77 discloses an insulated-gate thyristor of such a type. This thyristor is of pnpn structure (i.e., a 4-layered structure), having a p-type anode layer, an n-type base layer, a p-type base layer, and an n-type emitter layer. The thyristor further comprises an n-type source layer, a high-impurity p-type layer, a gate electrode, a cathode, and an anode.

The n-type source layer is formed in the p-type base layer, adjacent to the n-type emitter layer. It functions as emitter of a parasitic thyristor. To prevent the latch-up of the parasitic thyristor, the high-impurity p-type layer is formed, contacting the n-type source layer. The gate electrode is formed on an insulating film, which in turn is formed on the p-type base layer interposed between the n-type emitter layer and the n-type source layer. The cathode is arranged, contacting both the n-type source layer and the high-impurity p-type layer, not contacting the n-type emitter layer. The anode is formed on the p-type emitter layer.

This insulated-gate thyristor is turned on and off by changing the voltage applied to the gate electrode, thereby turning on and off the channel extending between the n-type source layer and the n-type emitter layer.

Since the p-type base layer is electrically connected to the cathode by the high-impurity p-type layer, phenomenon generally known as "cathode short-circuit" takes place. Due to the cathode short-circuit, the thyristor has low electron-injection efficiency. Consequently, the on-voltage of the thyristor becomes to be high.

The pnpn structure comprised of the p-type emitter layer, the n-type base layer, the p-type base layer and the n-type source layer, constitutes a parasitic thyristor, whereas the npn structure comprised of the n-type emitter layer, the p-type base layer and the n-type source layer constitutes a parasitic bipolar transistor. Once these parasitic elements start operating, it is no longer possible to control the gate electrode correctly. Inevitably, the turn-off efficiency of the insulated-gate thyristor is very low.

An insulated-gate thyristor of another type is disclosed in H. R. Chang, et al., *MOS Trench Gate Field-Controlled Thyristor,* IEDM 89, pp. 293–295, 1989. This insulated-gate thyristor has a buried insulated gate, and is a kind of a so-called "static induction (SI) thyristor."

This thyristor comprises an n-type base layer and a p-type anode (drain) layer formed on one major surface of the n-type base layer. A pair of grooves are formed in the other major surface of the n-type base layer and spaced apart from each other, by a predetermined distance. An insulated gate is formed in these grooves. That part of the n-type base layer which extends between the grooves is the channel region of the thyristor. An n-type cathode (source) layer is formed on the channel region. A high-impurity p-type well layer for releasing holes is formed in that part of the n-type base layer which is outside of one of the grooves. A cathode is located, contacting both an n-type emitter layer and the high-impurity p-type well layer. An anode is formed on the p-type anode layer.

This thyristor is a normally-on type one, which remains on unless or until a bias is applied to its gate electrode. To turn off this thyristor, a voltage which is negative with respect to the cathode is applied to the gate electrode. A hole-accumulating layer is thereby formed, extending along the gate electrode. Hence, holes are released from the n-type base layer to the cathode through this hole-accumulating layer and p-type well layer. The hole-releasing part form a pnp transistor. Then, that part of the n-type base layer which extends between the grooves is depleted, and electrons stop moving from the n-type cathode layer into said part of the n-type base layer.

Also disclosed in H. R. Chang, et al., *MOS Trench Gate Field-Controlled Thyristor,* IEDM 89, pp. 293–295, 1989, is an insulated-gate SI thyristor of still another type. This thyristor is expanded three-dimensionally. In other words, diode regions, which collectively function as a current path when turned on, comprise each a stripe-shaped anode region and a stripe-shaped gate region. A carrier-releasing transistor region is located at one end of the diode regions.

The SI thyristor further comprises a bipolar transistor region for releasing carriers when the thyristor is turned off. The bipolar transistor region, serving as a parasitic transistor, is located parallel to the diode regions. This bipolar transistor remains on when the SI thyristor is on, and its base accumulates carriers. Hence, it takes a long time to release the carriers when the SI transistor is turned off. It is only either electrons or holes that the insulated gate controls when the thyristor is turned off. This is another reason why it takes a long time to release the carriers when the thyristor is turned off. Consequently, the turn-off efficiency of this insulated-gate SI thyristor is low.

Moreover, since this SI thyristor is also a normally-on type one, it remains on if no gate bias can be applied by some cause or another. It is disadvantageous from a fail-safe point of view.

As has been described, the conventional insulated-gate thyristors have but a low turn-off efficiency. In other words, it is difficult to turn off them at a sufficiently high speed, in particular while maintaining their good on-state characteristics.

Victor A. K. Temple, *MOS-Controlled Thyristor—A New Class of Power Device,* IEEE Transaction on Electron Devices, Vol. ED-33, No. 10, October 1989, pp. 1609–1618, discloses a so-called MCT (MOS-Controlled Thyristor). This MCT, which is a turn-off thyristor, has an n-type emitter in which a high-impurity p-type layer is formed, extending along the edge of an n-type emitter layer. That surface region of the n-type emitter layer which is located outside the p-type layer is used as turn-off channel region. That surface region of the p-type base layer which is located outside this turn-off channel region is used as turn-on channel region. A gate electrode common to both channel regions is formed on an insulating film which is formed on the turn-on and turn-off channel regions. In practice, a great number of MCTs of this type are arranged on a semiconductor pellet, in substantially uniform distribution.

This turn-off thyristor is advantageous in that a single gate electrode achieves both turn-on operation and turn-off operation. However, the threshold voltage of the turn-off channel region is higher than that of the turn-on channel region. This is because the turn-on channel region is formed in the p-type base layer, and the turn-off channel region is formed in the n-type emitter layer formed in the p-type base region by diffusing impurity into the p-type base region. Hence, the thyristor can hardly has a sufficiently high turn-off efficiency.

In the MCT, the current which flows through turn-off channel when the thyristor is turned off depends on the voltage applied to the gate electrode and the resistance of the channel. The dig/dt-controlling margin is narrower than that for current-controlled elements; it is determined by the design parameters of the MCT. Because of the narrow dig/dt-controlling margin, the maximum turn-off current cannot be sufficiently large, inevitably increasing the turn-off loss of power.

As has been pointed out, the conventional insulated-gate turn-off thyristor has a turn-off channel region whose threshold voltage is high, and inevitably has an insufficient maximum turn-off current, resulting in a great turn-off loss of power.

SUMMARY OF THE INVENTION

The first object of the present invention is to provide an insulated-gate thyristor which can be turned off at high speed, while maintaining its good on-state characteristic.

The second object of the invention is to provide an insulated-gate thyristor which has high turn-off efficiency, by suppressing the operation of the parasitic bipolar transistor and the parasitic thyristor, both formed in the thyristor.

The third object of this invention is to provide an insulated-gate thyristor of normally-off type, which remains off when the gate bias is zero.

The fourth object of the invention is to provide an insulated-gate thyristor which has high turn-off efficiency, while maintaining relatively large effective conduction area.

The fifth object of the present invention is to provided an insulated-gate thyristor which has a high maximum turn-off current, while having a sufficient emitter injection efficiency.

The sixth object of the invention is to provide an insulated-gate thyristor which has a high maximum turn-off current, due to its unit-cell size made small by accurate mask-alignment technique.

To achieve the first to fourth objects described above, a first insulated-gate thyristor according to the invention has a carrier-releasing section for releasing carriers when the thyristor is turned off, and an insulated-gate transistor formed in the carrier-releasing section.

The first insulated-gate thyristor of the present invention can be turned off at high speed, while maintaining good on-state characteristics, since it has an insulated-gate transistor located at the carrier-releasing section. Although the thyristor has a parasitic bipolar transistor and a parasitic thyristor, it has a high turn-off efficiency since the operation of the parasitic transistor and thyristor are suppressed well.

To attain the first object described above, a second insulated-gate thyristor according to this invention has a turn-on gate section and a turn-off gate section, at least one of which is insulated. In practice, a number of the insulated-gate thyristors of this type are mounted on a semiconductor pellet, with their insulated gate sections spaced apart from one another. Further, the turn-on gate sections or the turn-off gate sections, or the gate sections of both types have at least two different threshold values.

Also, to attain the first object of the present invention, a third insulated-gate thyristors has a plurality of buried, stripe-shaped insulated gate electrodes arranged on a semiconductor pellet. Carrier-releasing channel regions and emitter regions, all parallel to the gate electrodes, are alternately arranged and spaced apart by a short distance.

In order to accomplish the first object, too, a fourth insulated-gate thyristor of the invention has a turn-on gate section and a turn-off gate section. At least the turn-off gate section is insulated. The insulated gate electrode is comprised of a plurality of insulated parts which are arranged on a semiconductor pellet. This thyristor also has emitter layers for injecting carriers to turn on the thyristor, and base layers for releasing carriers to turn off the thyristor. The emitter layers and the base layers are alternately arranged, each emitter layer spaced apart from the adjacent base layer by a short distance. Insulating films are buried in the surface of the pellet, each isolating an emitter layer from the adjacent base layer.

Further, to achieve the first object described above, a fifth insulated-gate thyristor according to the invention has a turn-on gate section and a turn-off gate section, wherein at least the turn-off gate section is insulated. The insulated gate electrode is comprised of a plurality of insulated parts which are arranged on a semiconductor pellet. This thyristor also has a plurality of buried, stripe-shaped turn-off gate electrodes. A base region and an emitter region extend along the sides of each turn-off gate electrode. Hence, a plurality of base regions and a plurality of emitter regions are alternately arranged. Further, the thyristor has a plurality of base layers, each located between two adjacent gate electrodes. These base layers have such an impurity concentration and such a width that carrier-leading resistance is controlled when a gate voltage is applied to the gate electrodes.

In the second insulated-gate thyristor of this invention, the turn-off channels can have at least two different threshold values. Hence, when a gate voltage having a specific waveform is applied to the turn-off gate electrodes, the turn-off channels are turned on with a time lag, one with respect to another. As a result, the thyristor has a broad margin of controlling the changes dig/dr in the off-gate current flowing through all turn-off channels formed in the pellet. The turn-on channels can have at least two different threshold values, too. In this case, the turn-off channels are turned off, and then the turn-on channels having the different threshold values is successively turned off, whereby concentration of current is suppressed effectively. (Since the channels formed in the pellet are designed to be different threshold values, the characteristics degradation is reduced by the threshold value distribution due to process fluctuations). Therefore, in the second thyristor according to the invention, current concentration is suppressed in the turn-off period, and the maximum turn-off current is maintained at a sufficient value. Thus, the insulated-gate thyristor (e.g. MCT) have not only high turn-on efficiency but also high turn-off efficiency.

In the third insulated-gate thyristor of this invention, a number of emitter regions are spaced apart by a short distance since the insulated gate electrodes are buried in the substrate. The third thyristor can, therefore, have high emitter injection efficiency, and also high turn-off efficiency, without the expense of its turn-on efficiency.

In the fourth insulated-gate thyristor of the invention, p-type layers and n-type layers are alternately arranged by a short pitch, thereby forming an emitter short-circuiting structure. Insulating films are buried, at the pn junctions formed by the p-type layers and the n-type layers. Hence, carriers can be released at high speed in the turn-off period without the expense of the emitter injection efficiency. This thyristor can have high turn-off efficiency, as well as high turn-on efficiency.

In the fifth insulated-gate thyristor according to the invention, the base layers in the emitter short-circuiting section have such a specific impurity concentration and a specific width. Hence, the base layer of the emitter short-circuiting section has a small width (thus, having an increased resistance) when the thyristor is turned on, whereby the emitter injection efficiency is enhanced. When the thyristor is turned off, the base layer in the emitter short-circuiting section has its resistance decreased, and can release carriers efficiently.

Further, according to the present invention, there is provided a sixth insulated-gate thyristor which comprises a first emitter layer of a first conductivity type, and a first base layer of a second conductivity type located adjacent to the first emitter layer, and a second base layer of a first conductivity type located adjacent to the first base layer. The second base layer has a plurality of grooves. A gate-insulating film is formed on the inner surface of each groove, and a gate electrode is formed on this film. Turn-off channel layers of the second conductivity type are formed in the surface of the second base layer, and extend along the grooves and, hence, along the gate electrodes. Drain layers of the first conductivity type are formed on the turn-off channel layers, respectively. Second Emitter layers of the second conductivity type are formed in the surface of the second base layer. The second emitter layers are thicker than the drain layers. The second emitter layers and the drain layers are arranged alternately. A first main electrode is formed on the drain layers and also on the second emitter layers. A second main electrode is formed on the first emitter layer.

The sixth thyristor has high maximum turn-off current since the gate electrodes formed in the grooves are spaced apart by a very short distance. Although the second emitter layers have a very small width, the sixth thyristor has a sufficient emitter injection efficiency. This is because the second emitter layers are thicker than the turn-off channel layers.

According to the invention, there is provided a seventh insulated-gate turn-off thyristor which has a pnpn structure. To be more specific, this thyristor comprises a p-type emitter layer, an n-type base layer formed on the p-type emitter layer, a p-type base layer formed on the n-type base layer, and an n-type emitter layer formed on the p-type base layer. The seventh thyristor further comprises a p-type semiconductor layer, two main electrodes, a turn-on gate electrode, and a plurality of turn-off gate electrodes. The p-type semiconductor layer is formed on the n-type emitter layer. The first main electrode is formed on the p-type emitter layer, and the second main electrode is formed, contacting both the n-type emitter layer and the p-type semiconductor layer. The turn-on gate electrode is formed on an insulating film formed on the p-type base layer which is interposed between the n-type emitter layer and the n-type base layer. The turn-off gate electrodes are formed on an insulating film which in turn is formed on the n-type emitter layer interposed between the p-type base layer and the p-type semiconductor layer.

The seventh thyristor according to this invention has a broad dig/dr-controlling margin, due to the use of a plurality of turn-off gate electrodes. More precisely, its dig/dr can be set to a desired value, merely by applying a gate bias to a selected combination of turn-off gate electrodes. Therefore, this insulated-gate thyristor can block a great current, with a small loss of power. Moreover, this thyristor can have high turn-off efficiency since the turn-off gate electrodes can have a threshold voltage different from that of the turn-on gate electrode.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a perspective view showing an insulated-gate thyristor according to the present invention, which has two buried gates;

FIG. 2 is a perspective view of an insulated-gate thyristor which is identical to the thyristor shown in FIG. 1, except that each components has the conductivity type opposite to that of its equivalent of the thyristor of FIG. 1;

FIG. 3 is a perspective view showing an insulated-gate thyristor according to this invention, which has four buried gates, the first two formed in one major surface, and the other two formed in the opposite surface;

FIG. 4 is a perspective view of a modification of the thyristor shown in FIG. 3;

FIG. 5 is a perspective view of an insulated-gate thyristor of the invention, which has two gates buried deep;

FIG. 6 is a perspective view of an insulated-gate thyristor of the invention, which is identical to the thyristor shown in FIG. 5, except that each components has the conductivity type opposite to that of its equivalent of the thyristor shown in FIG. 5;

FIG. 7 is a perspective view showing an insulated-gate thyristor of the invention, which has two buried gate electrodes extending from the upper surface of the cathode layer to the anode;

FIG. 17A is a perspective view of the thyristor/transistor shown in FIG. 14, and FIG. 17B is an equivalent circuit diagram of the thyristor/transistor;

FIG. 19A is a perspective view showing a modification of the thyristor/transistor shown in FIG. 17A, and 19B is an equivalent circuit diagram of the modification;

FIG. 21A is a perspective view of a modification of the insulated-gate thyristor/transistor shown in FIG. 19A, and FIG. 21B is a timing chart explaining how the gates of the modified thyristor/transistor are driven when the thyristor is turned off;

FIG. 29A is a perspective view of the thyristor shown in FIG. 28A, and FIG. 29B is an equivalent circuit diagram of this thyristor;

FIG. 35 is a perspective view showing a modification of the insulated-gate thyristor shown in FIG. 33;

FIG. 39A is a perspective view illustrating a modification of the thyristor shown in FIG. 37A, and FIG. 39B is an equivalent circuit diagram of the modified thyristor.

FIG. 40A is a sectional view showing a modification of the thyristors shown in FIG. 37A, and FIG. 40B is an equivalent circuit diagram of the modified thyristor;

FIG. 49 is a perspective view showing a modification of the thyristor shown in FIG. 48;

FIG. 54 is a sectional view showing a modification of the thyristor shown in FIG. 53;

FIGS. 58, 59, 60, and 61 are sectional views showing four modifications of the thyristors shown in FIGS. 55 to 57, respectively;

FIG. 63 is a perspective view showing a modification of the thyristor shown in FIG. 62;

FIGS. 65 and 66 are sectional views illustrating two thyristors designed by slightly modifying the insulated-gate thyristor shown in FIG. 63;

FIGS. 67, 68, 69, 70, and 71 are perspective views showing five modifications of the insulated-gate thyristors of FIGS. 62, 63, 64, 65, and 66, respectively;

FIG. 72 is a perspective view illustrating an modification of the insulated-gate thyristor shown in FIG. 71;

FIGS. 83 and 84 are perspective views showing two modifications of the thyristor shown in FIG. 82;

FIG. 85 is a perspective view illustrating an insulated-gate thyristor which has a planar MOS transistor;

FIG. 86 is a sectional view showing a modification of the insulated-gate thyristor illustrated in FIG. 85;

FIGS. 87, 88, and 89 are sectional views showing three modifications of the thyristor shown in FIG. 86, respectively;

FIG. 95 is a plan view showing another insulated-gate thyristor according to the invention, and FIG. 96 is a sectional view, taken along line A—A' in FIG. 95;

FIG. 102 is a plan view of another type of an insulated-gate thyristor according to the invention, and FIG. 103 is a sectional view, taken along line A—A' in FIG. 102;

FIG. 104 is a plan view showing a modification of the thyristor illustrated in FIG. 102, and FIG. 105 is a sectional view, taken along line A—A' in FIG. 104;

FIG. 111 is a plan view showing a modification of the thyristor shown in FIG. 109, and FIG. 112 is a sectional view, taken along line A—A' in FIG. 111;

FIG. 115 is a sectional view, taken along line B—B' in FIG. 113;

FIG. 116 is a plan view showing still another modification of the thyristor shown in FIG. 109, and FIG. 117 is a sectional view, taken along line A—A' in FIG. 116;

FIG. 131 is a plan view showing one of the elements forming the MCT illustrated in FIGS. 130A and 130B;

FIG. 132A is a diagram showing the waveform of a gate current of a current-driven GTO;

FIG. 132B is a diagram showing the waveform of a gate current of a conventional voltage-driven MCT, and also that of the MCT shown in FIGS. 130A and 130B;

FIG. 140 is a sectional view showing part of another MCT according to this invention, wherein each element has an gate electrode formed also in the anode-side;

FIG. 141 is a perspective view showing another MCT according to the invention;

FIG. 143 is a sectional view showing a modification of the MCT shown in FIG. 142;

FIGS. 152 and 153 show an IGBT according to the invention, which has buried gate electrodes of the same type incorporated in the MCT of FIG. 143;

FIG. 155 is a sectional view showing a thyristor having a buried insulating film;

FIG. 156 is a sectional view showing a MOSFET having a buried insulation film;

FIG. 157 is a sectional view showing an MCT which has an emitter short-circuiting section designed not to reduce emitter injection efficiency;

FIG. 158 is a sectional view showing an MCT having an emitter short-circuiting section designed not to reduce emitter injection efficiency;

FIG. 159 is a sectional view of the MCT, explaining how carriers move in the MCT in the process of turning on the MCT;

FIG. 160 is a sectional view of the MCT, explaining how carriers move in the MCT in the process of turning off the MCT;

FIG. 162 is a sectional view showing a modification of the MCT shown in FIG. 161, which has turn-on buried insulated gate electrodes;

FIG. 163 is a sectional view showing an MCT having a planer turn-on insulated gate electrode;

FIG. 164 is a sectional view showing a modification of the MCT of FIG. 158, which has low-impurity channel layers;

FIG. 165 is a sectional view showing a modification of the MCT shown in FIG. 161 having buried insulated gate electrodes formed in both sides, and high-resistance channel layers in both sides;

FIG. 166 is a sectional view showing an MCT which is a combination of the MCTs of FIGS. 162 and 165;

FIG. 167 is a sectional vies showing a transistor having buried insulated gate electrodes;

FIG. 168 is a sectional view showing an SI thyristor having buried insulated gate electrodes;

FIG. 169 is a sectional view showing a modification of the SI thyristor shown in FIG. 168, which buried insulated gate electrodes in both the cathode-side surface and the anode-side surface;

FIG. 170 is a perspective view showing an MCT of the present invention;

FIG. 171 is a plan view showing an MCT having turn-off insulated gate electrodes and turn-on insulated gate electrodes;

Figure 171:
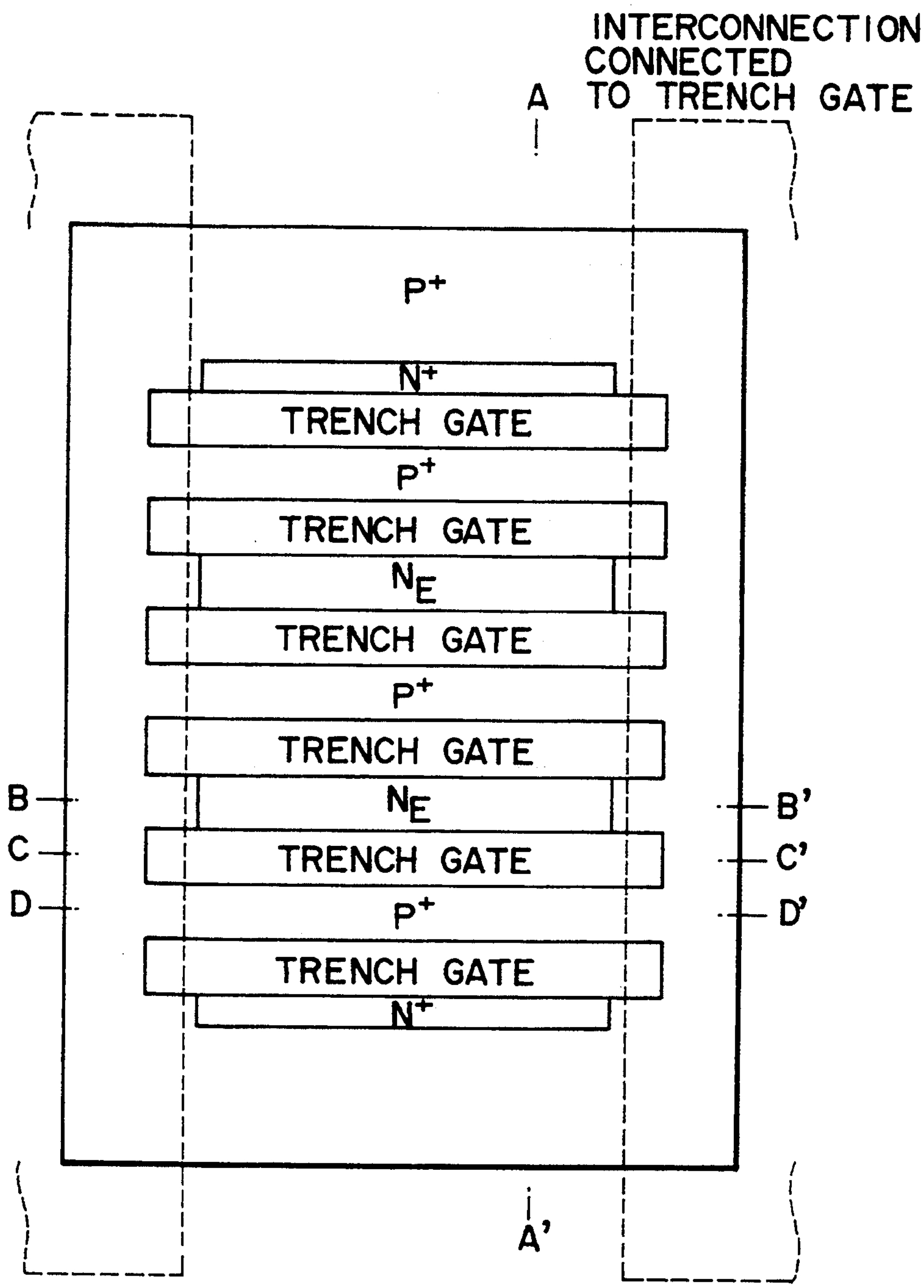
Figure 176:
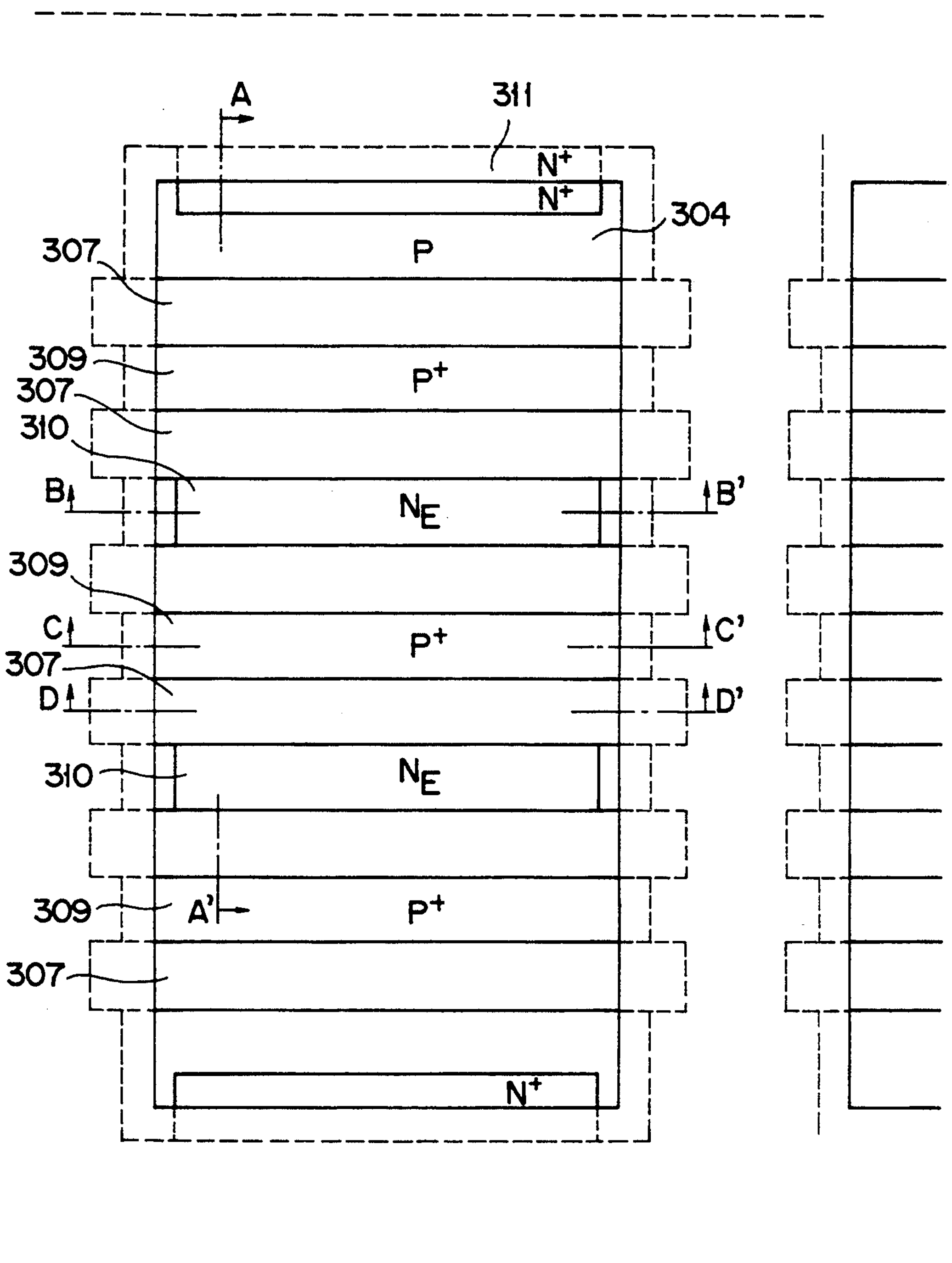
Figure 182:
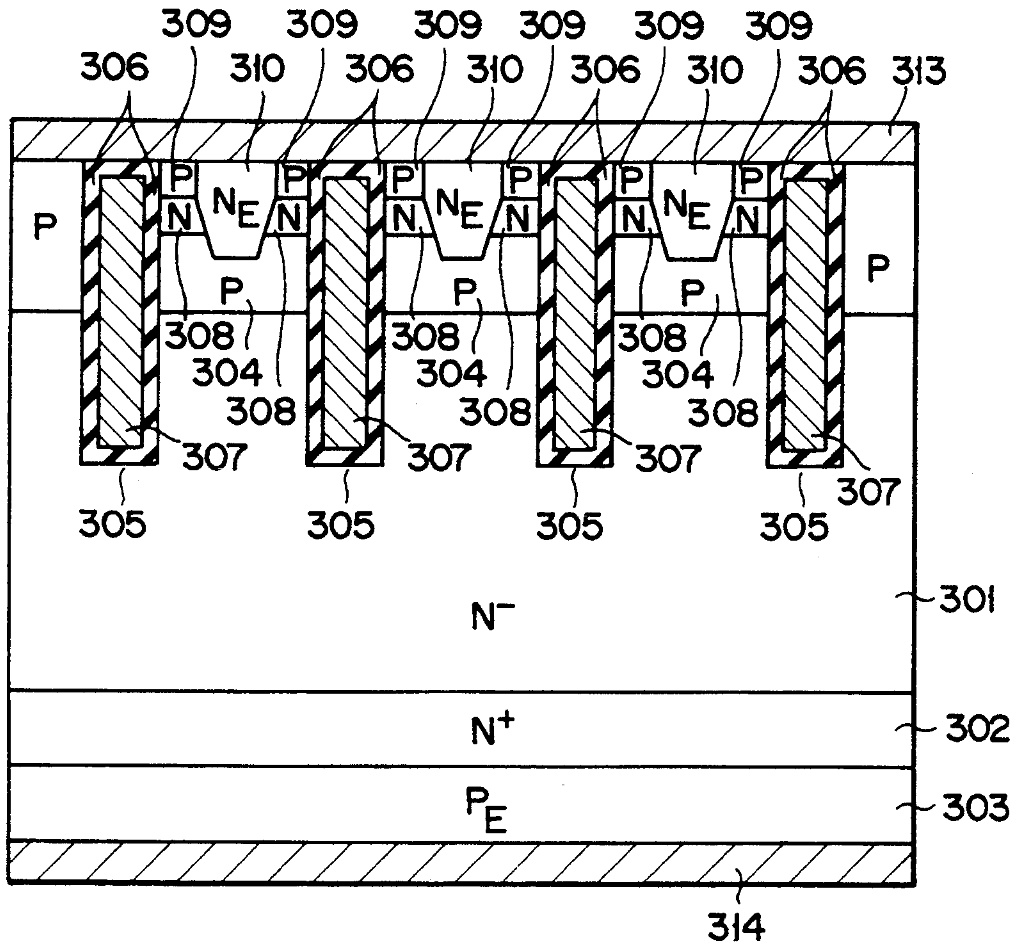
Figure 183:
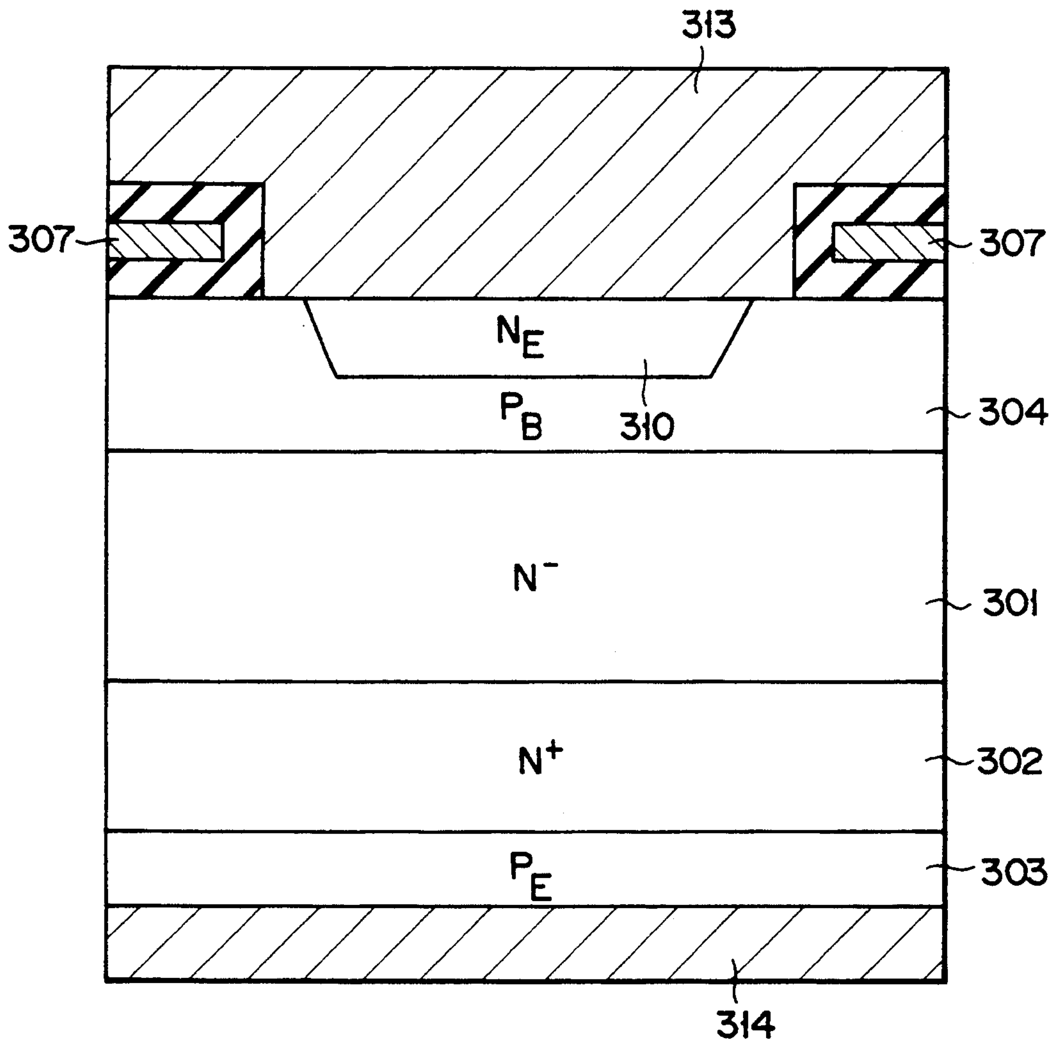
Figure 184:
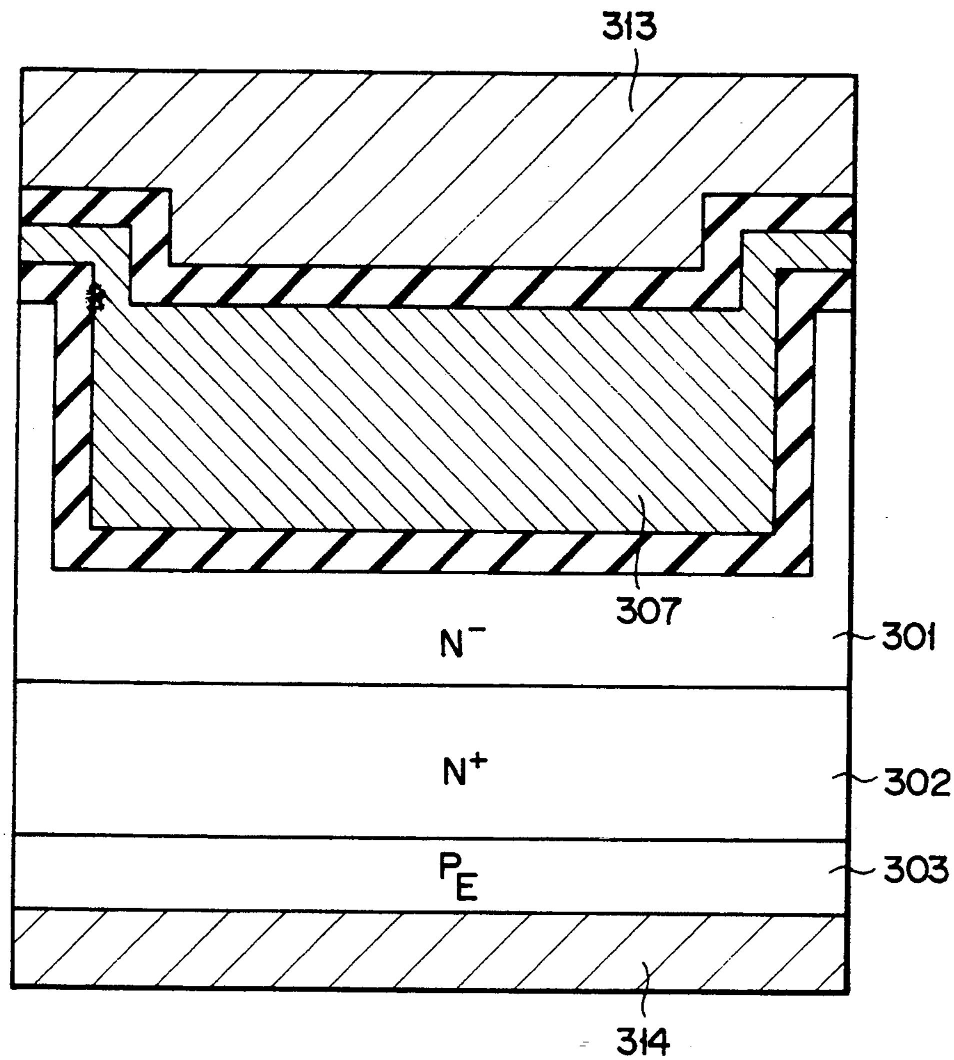
Figure 185:
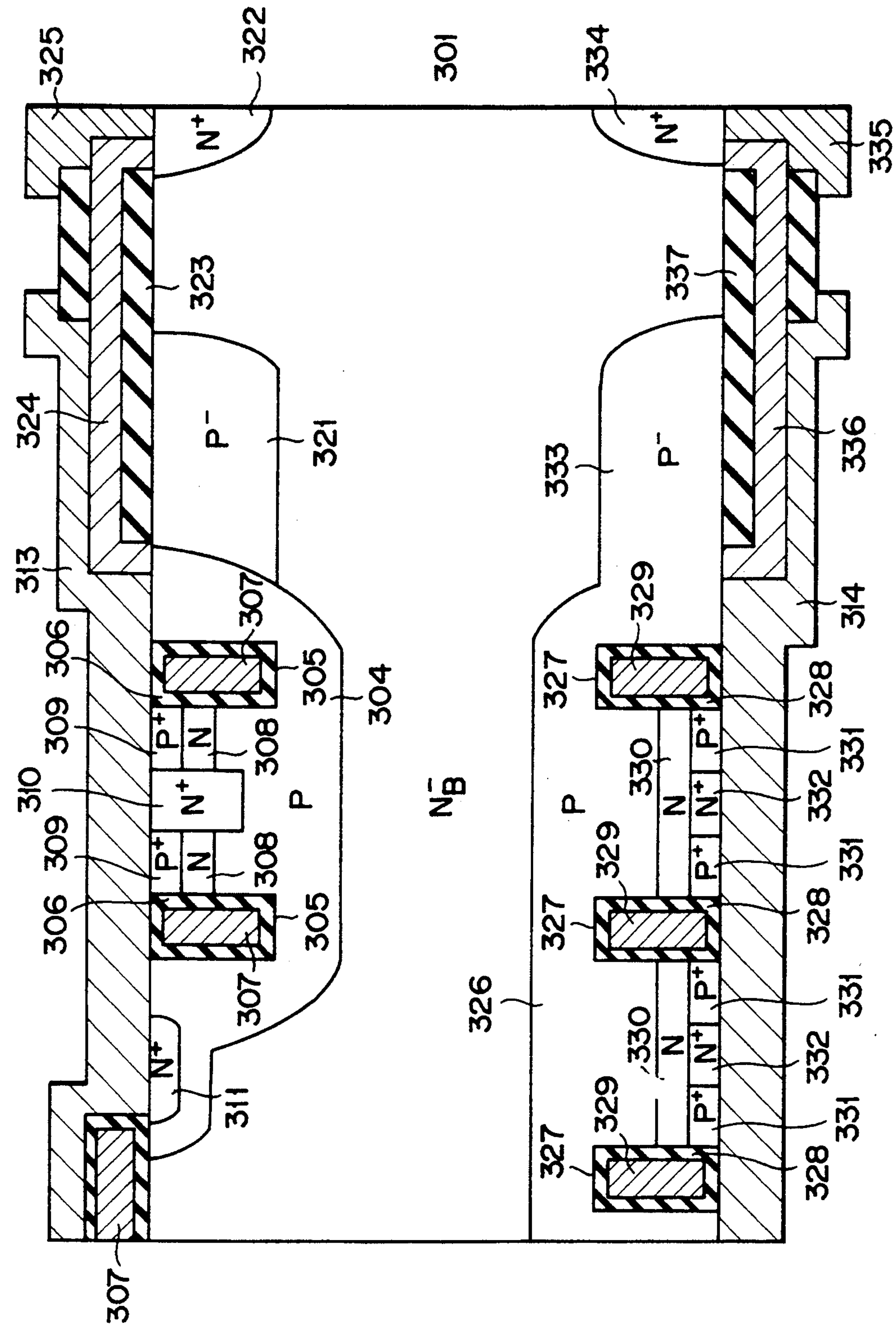
Figure 186:
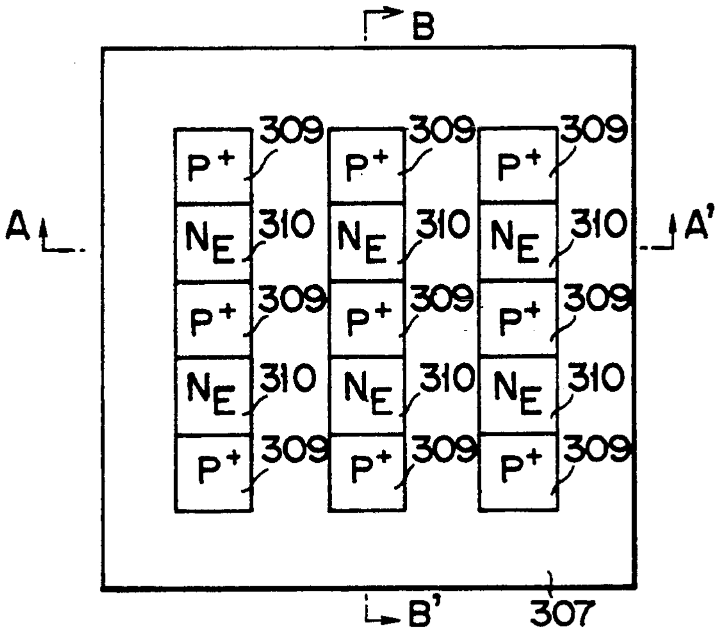
Figure 187:
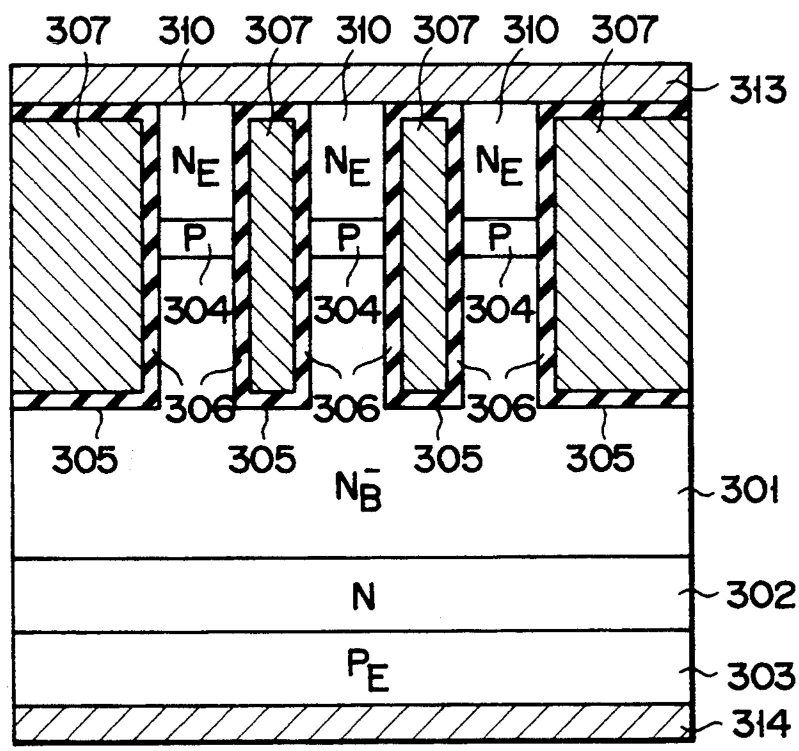
Figure 189:
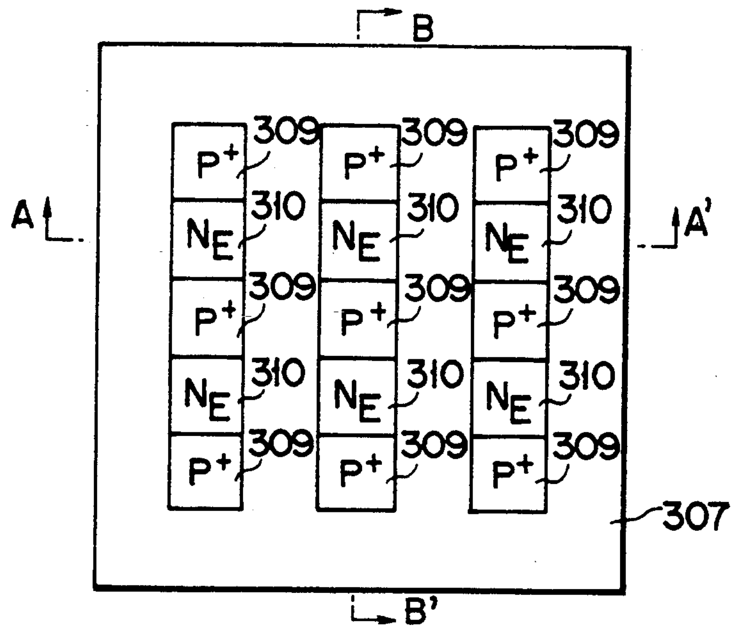
Figure 190:
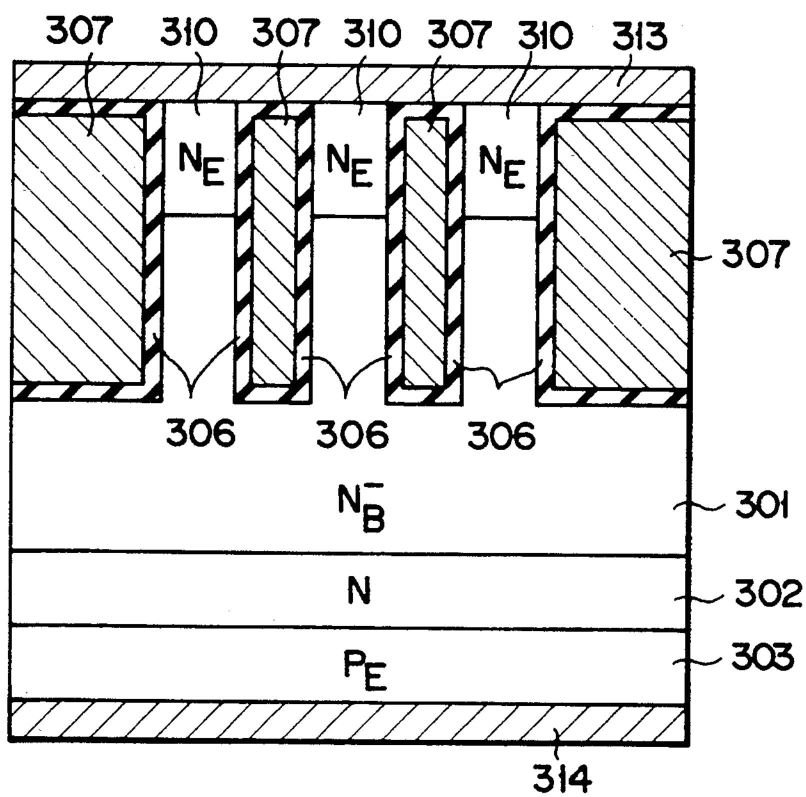
Figure 191:
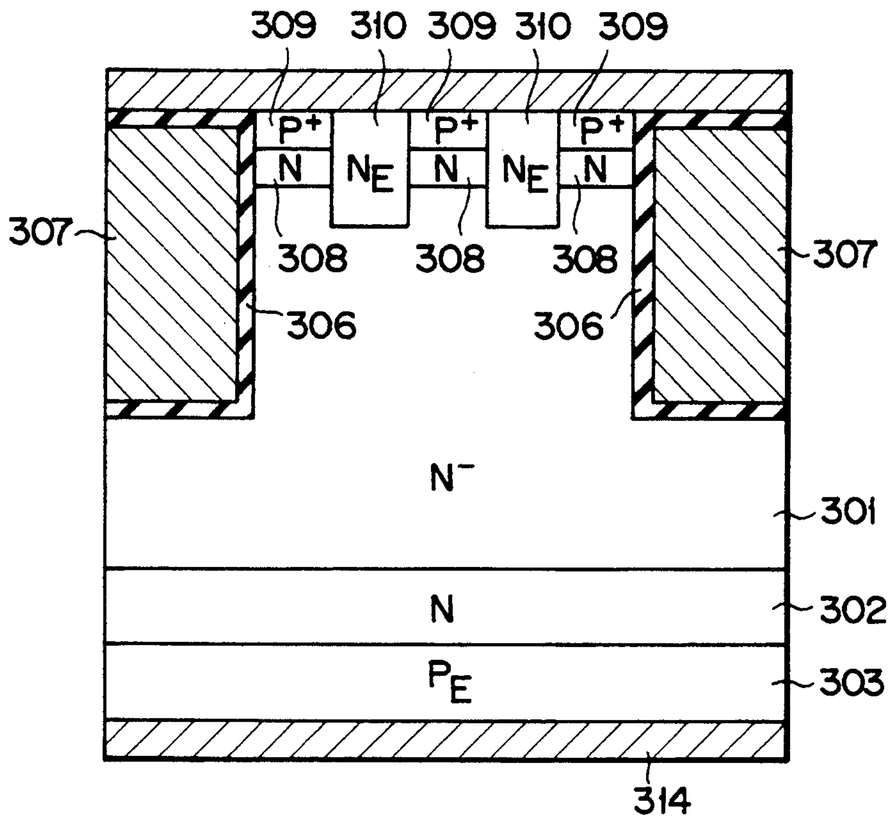
Figure 192:
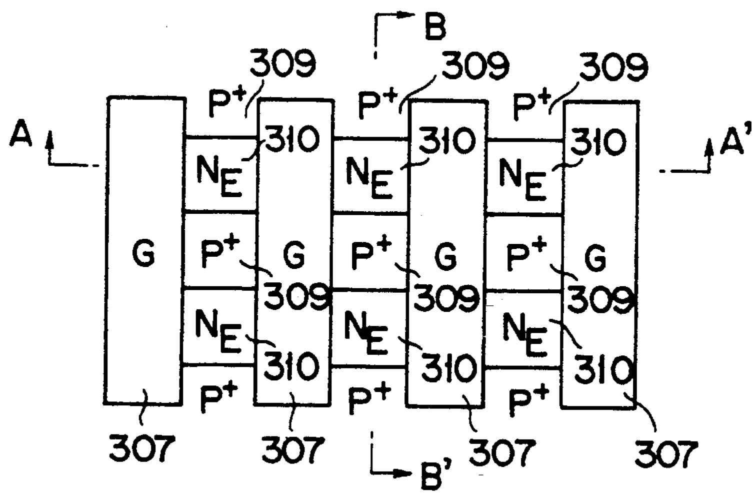
Figure 193:
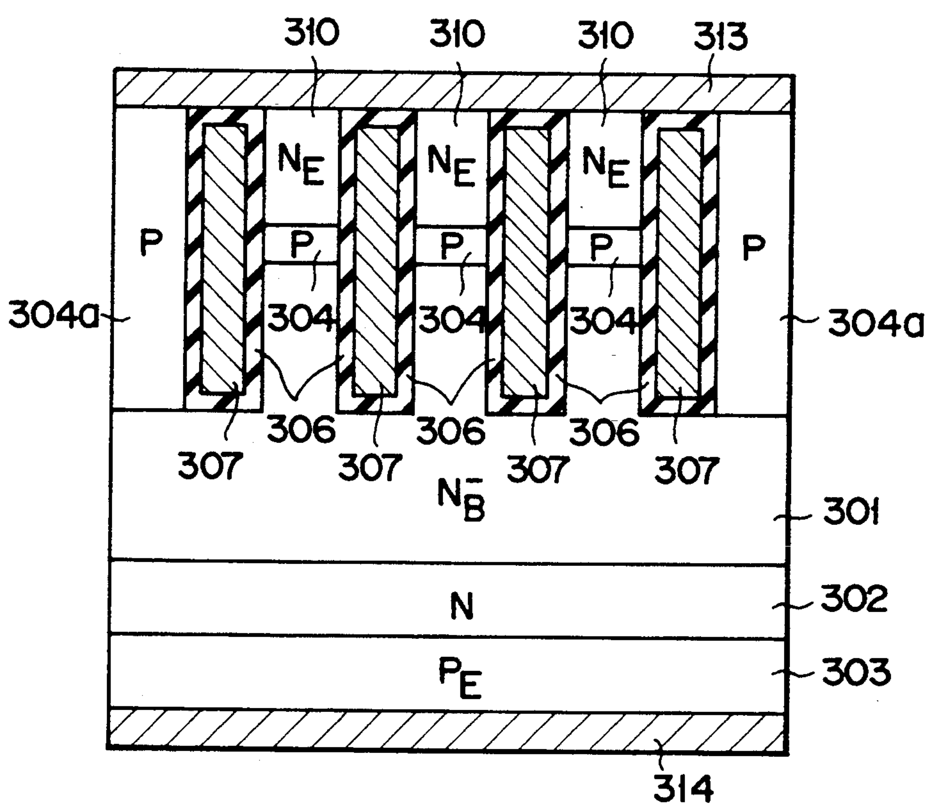
Figure 194:
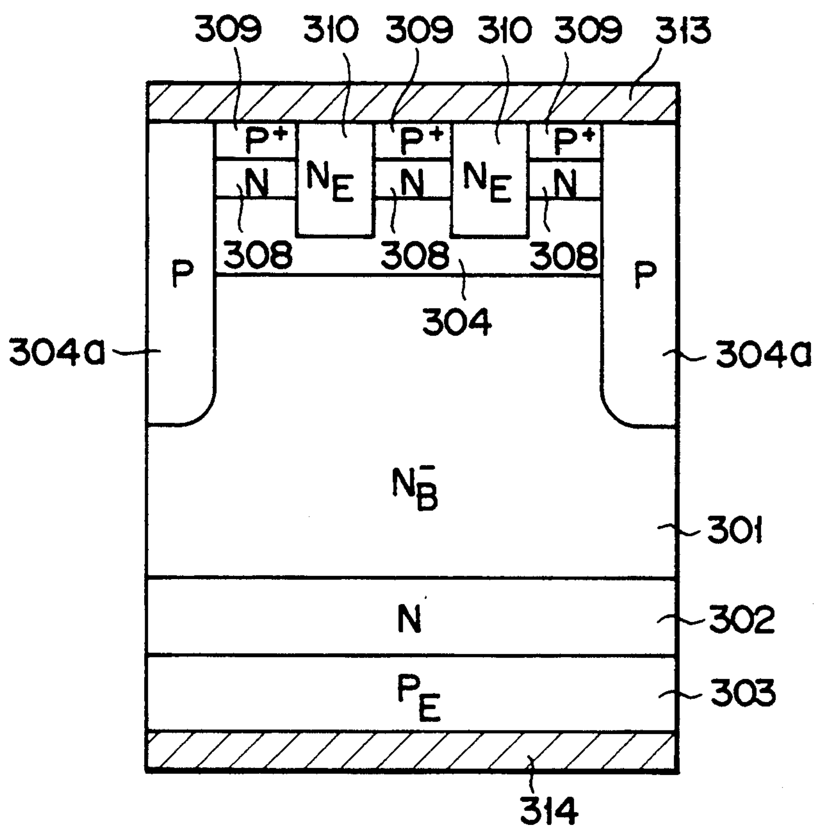
Figure 197:
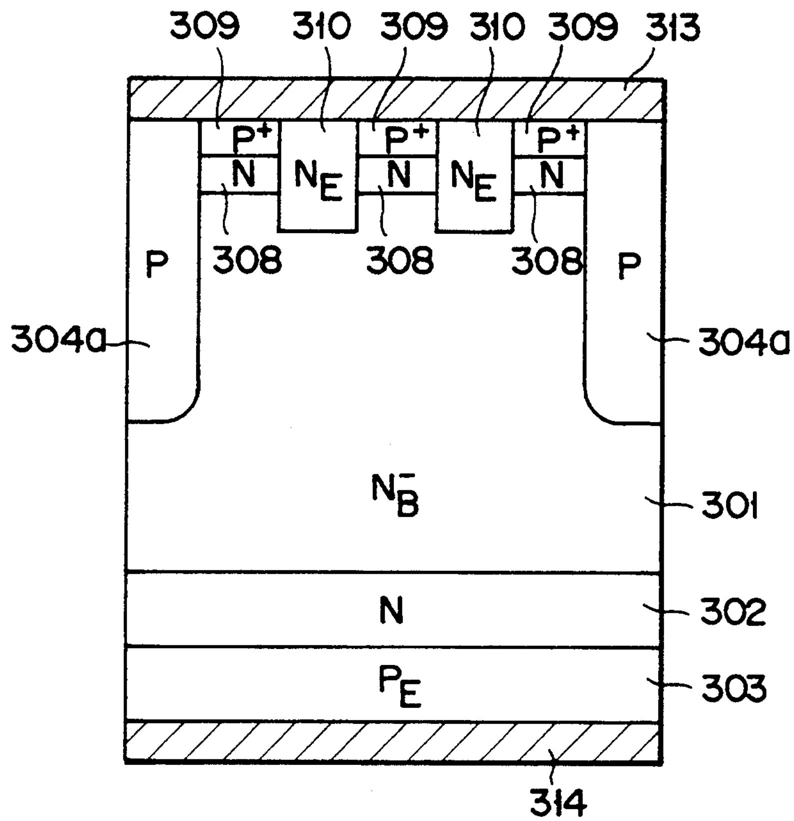
Figure 198:
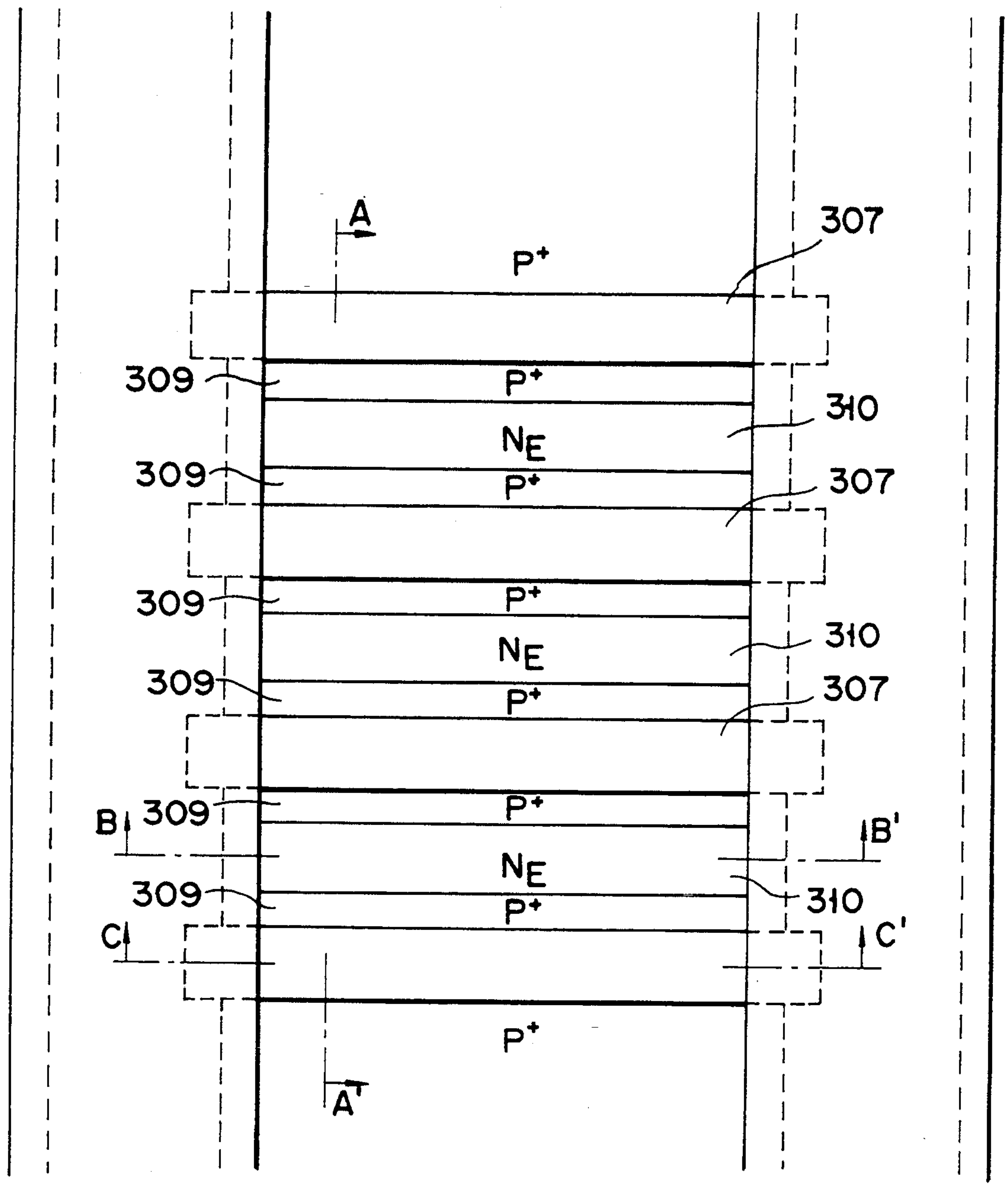
Figure 199:
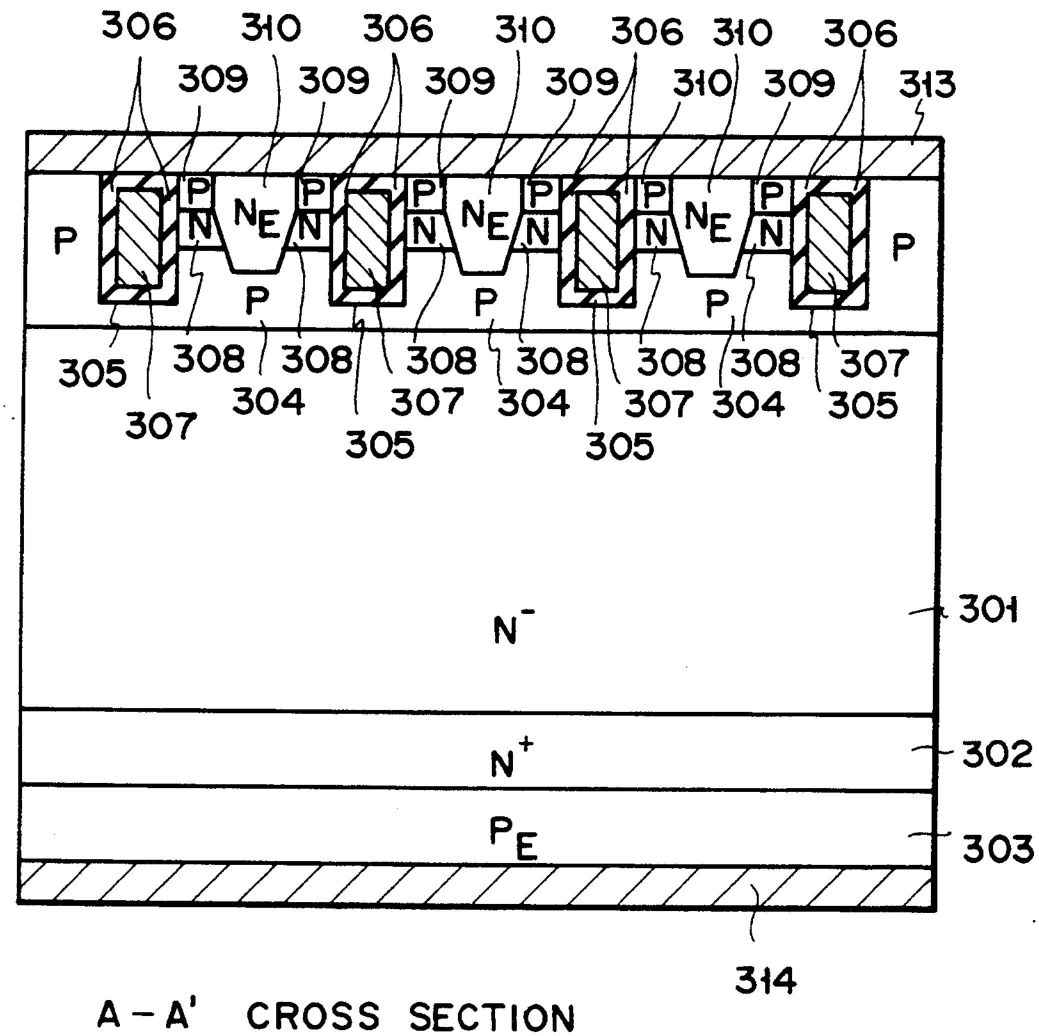
Figure 202:
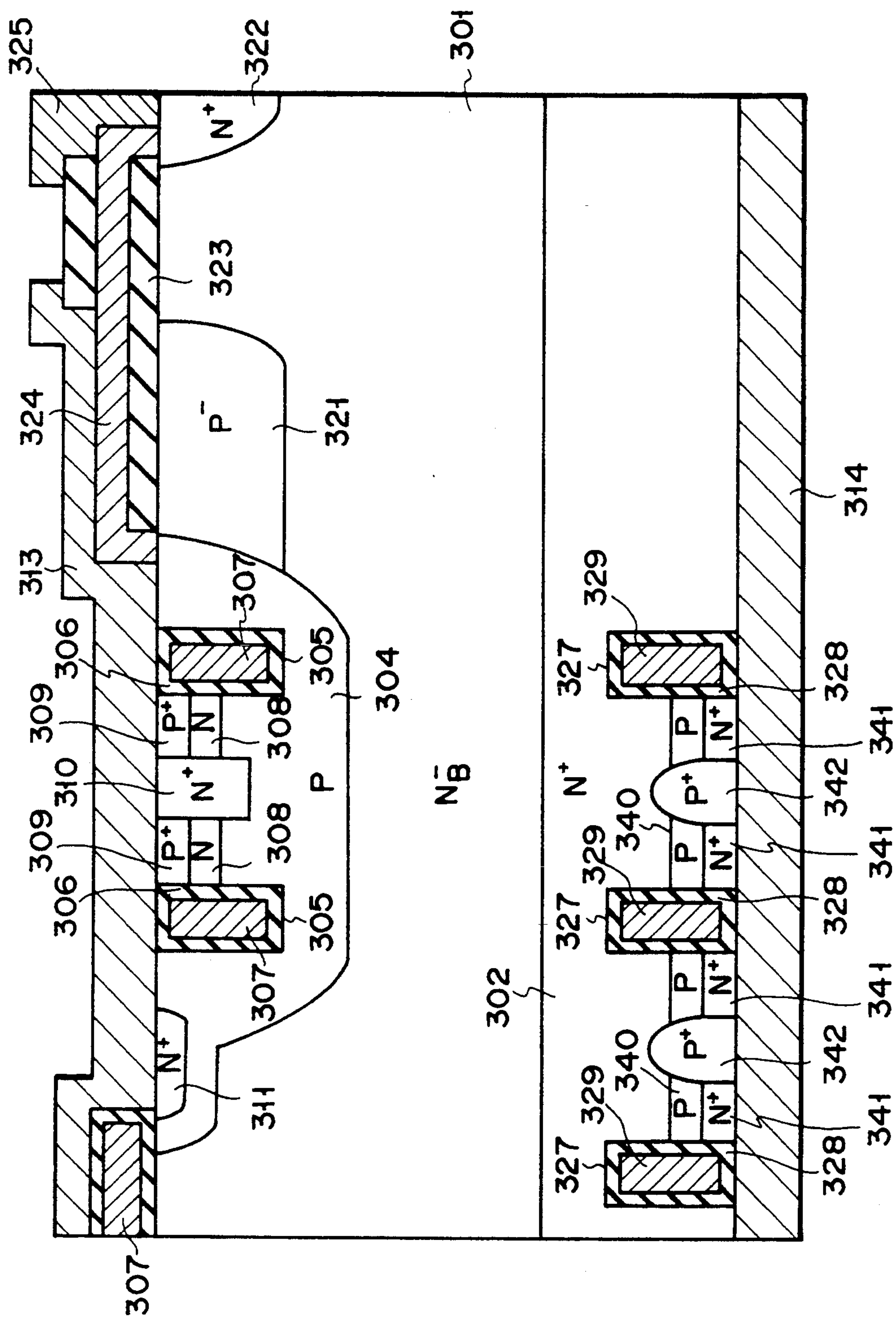
Figure 203:
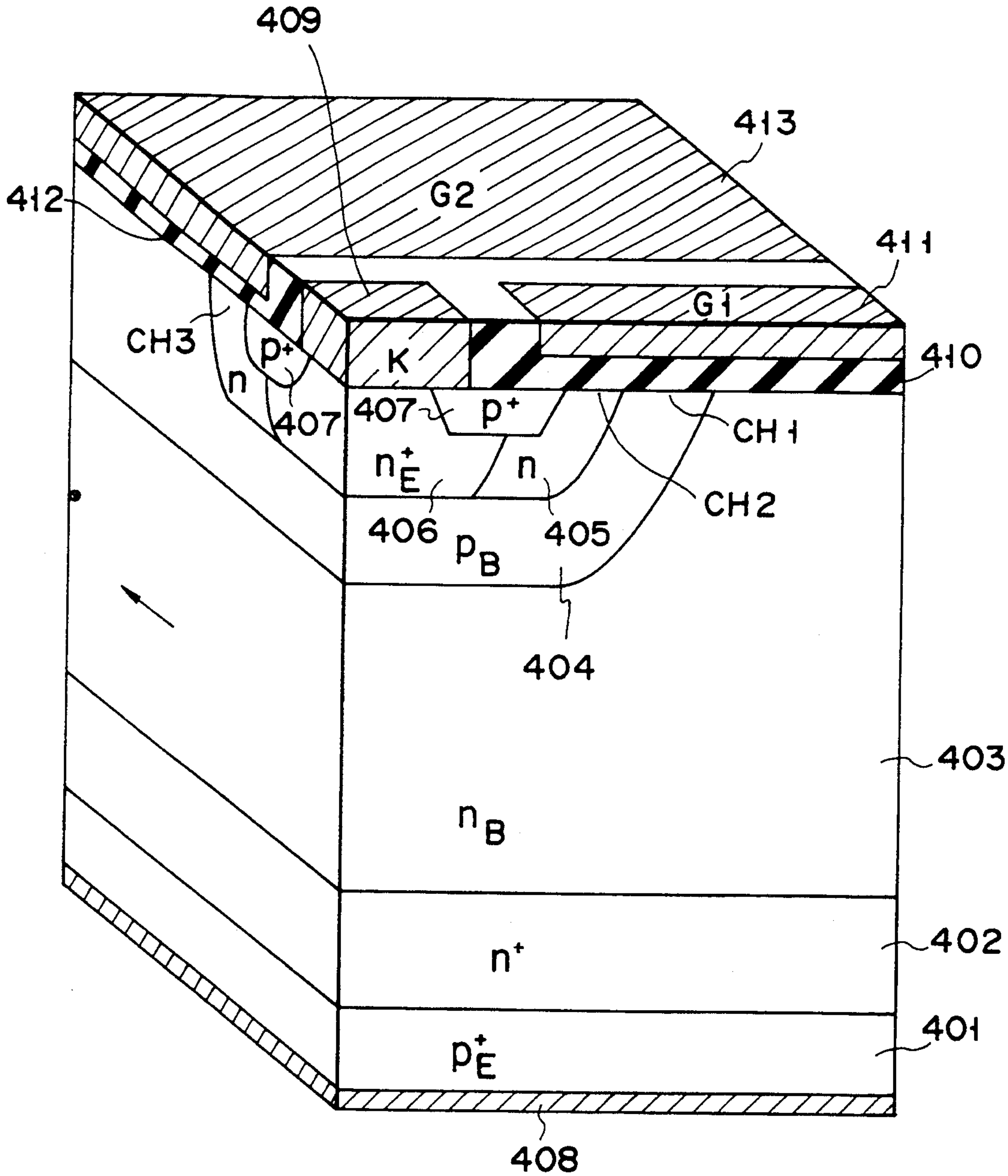
Figure 204:
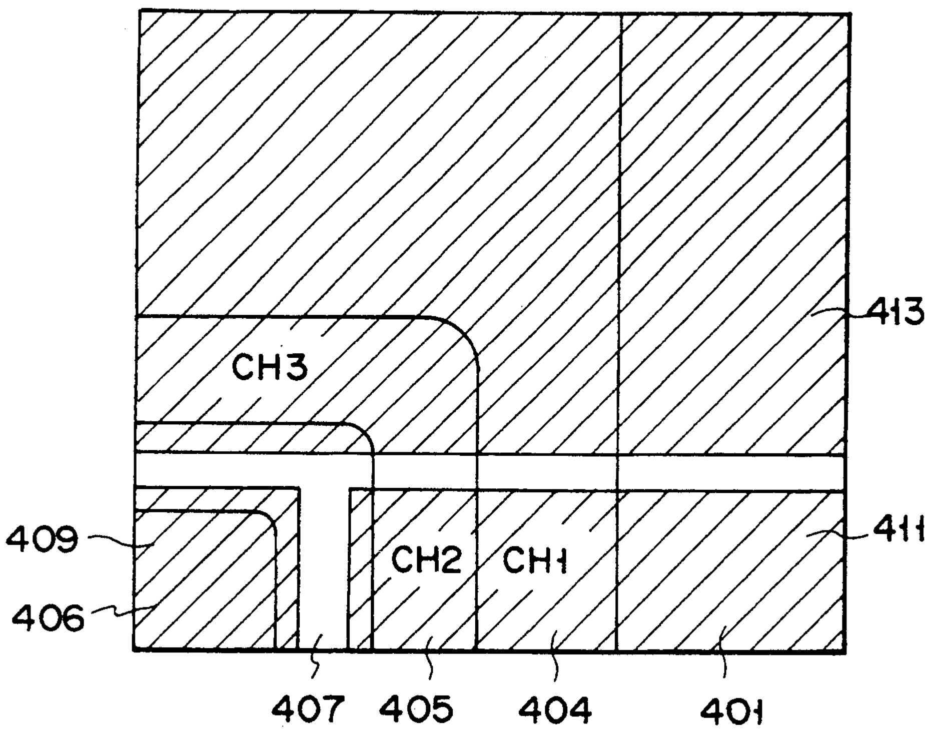
Figure 205:
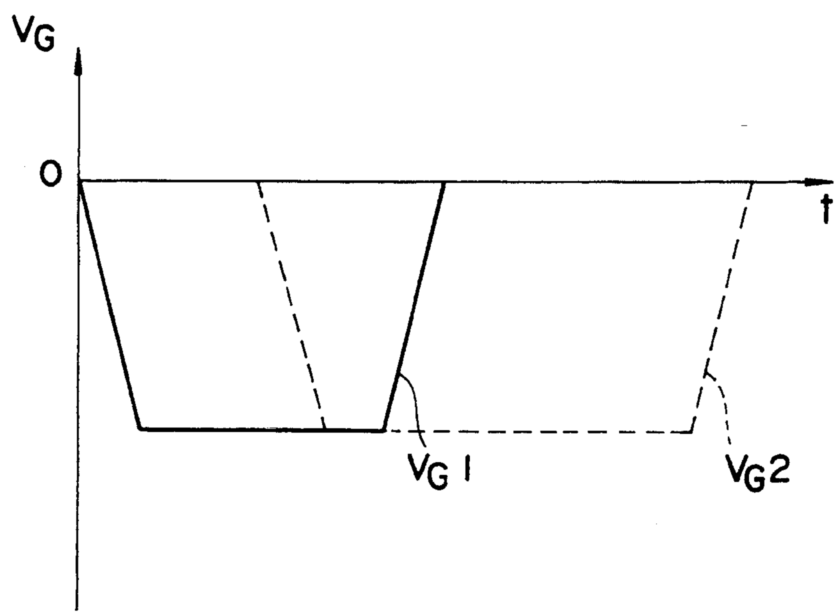

FIGS. 172, 173,174, and 175 are sectional views, taken along line A—A', line B—B', C—C', and D—D' in FIG. 171, respectively;

FIG. 176 is a plan view representing the layout of the insulated gate electrodes of a thyristor according to the invention;

FIGS. 177,178, 179, and 180 are sectional views, taken along line A—A', line B—B', line C—C, and line D—D' in FIG. 176, respectively;

FIG. 181 shows the layout of the insulated gate electrodes of another thyristor according to the invention;

FIGS. 182, 183, and 184 are sectional views, taken along line A—A', line B—B', and line C—C' in FIG. 181, respectively;

FIG. 185 is a sectional view illustrating still another thyristor according to the invention;

FIG. 186 is a plan view showing another insulated-gate thyristor according to the invention;

FIGS. 187 and 188 are sectional views, taken along line A—A' and line B—B' in FIG. 186, respectively;

FIG. 189 is a plan view showing the layout of the insulated gate electrodes of another thyristor according to this invention;

FIGS. 190 and 191 are sectional views, taken along line A—A' and line B—B', respectively;

FIG. 192 is a plan view illustrating the layout of the insulated gate electrodes of still another thyristor according to this invention;

FIGS. 193 and 194 are sectional views, taken along line A—A' and line B—B' in FIG. 192, respectively;

FIG. 195 is shows the layout of the insulated gate electrodes of another thyristor according to the invention;

FIGS. 196 and 197 are sectional views, taken along line A—A' and line B—B' in FIG. 195, respectively;

FIG. 198 is shows the layout of the insulated gate electrodes of another thyristor according to the invention;

FIGS. 199, 200, and 201 are sectional views, taken along line A—A', line B—B' and line C—C' in FIG. 198. respectively;

FIG. 202 shows an insulated-gate thyristor which is a modification of the embodiment shown in FIG. 185;

FIG. 203 is a perspective view showing the main part of a turn-off thyristor according to the invention;

FIG. 204 is a plan view representing the layout of the electrodes of the turn-off thyristor;

FIG. 205 is a diagram explaining the timing of applying voltages to the gate electrodes of the thyristor shown in FIG. 204, in order to turn off the thyristor.

Figure 206:
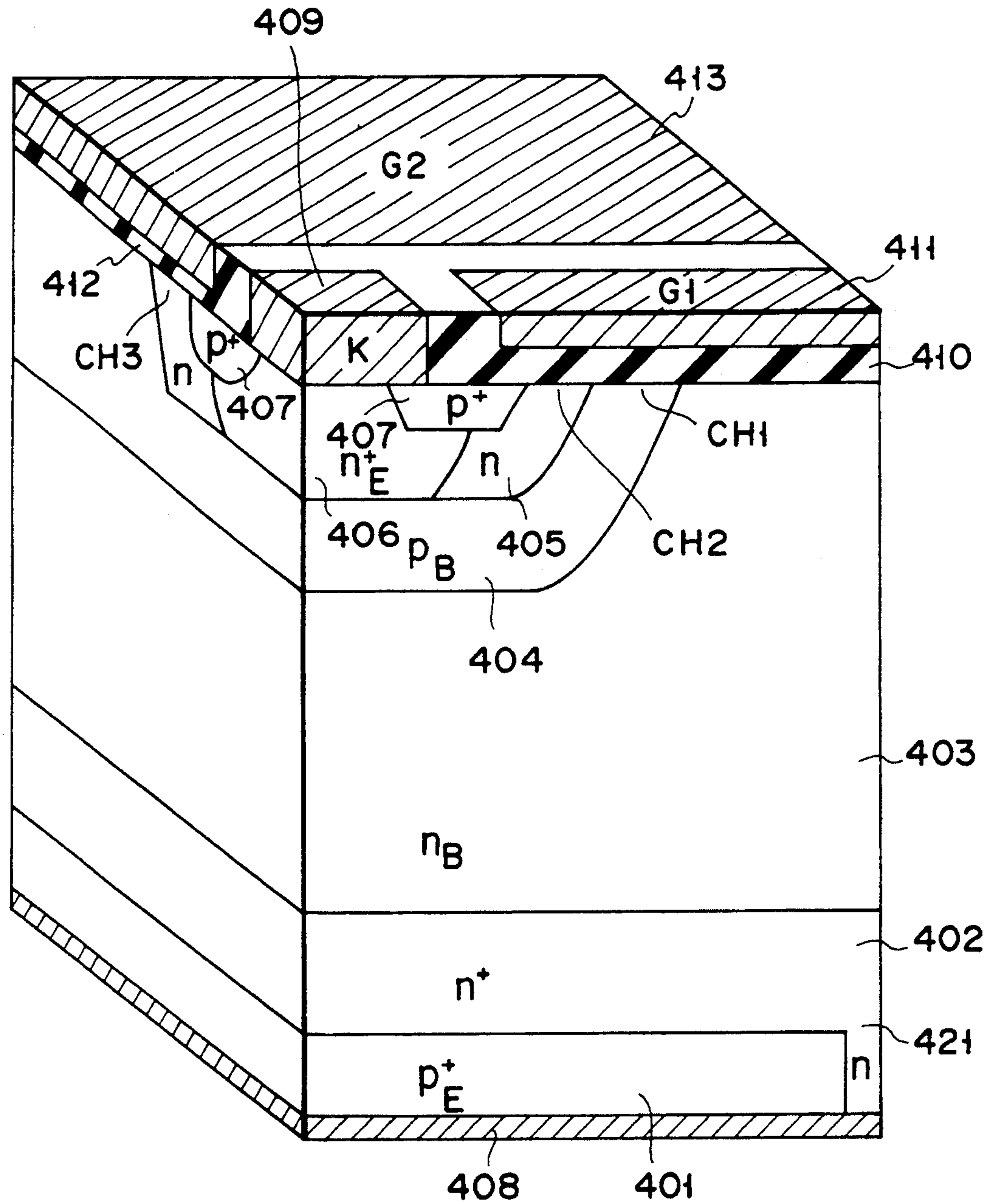
Figure 209:
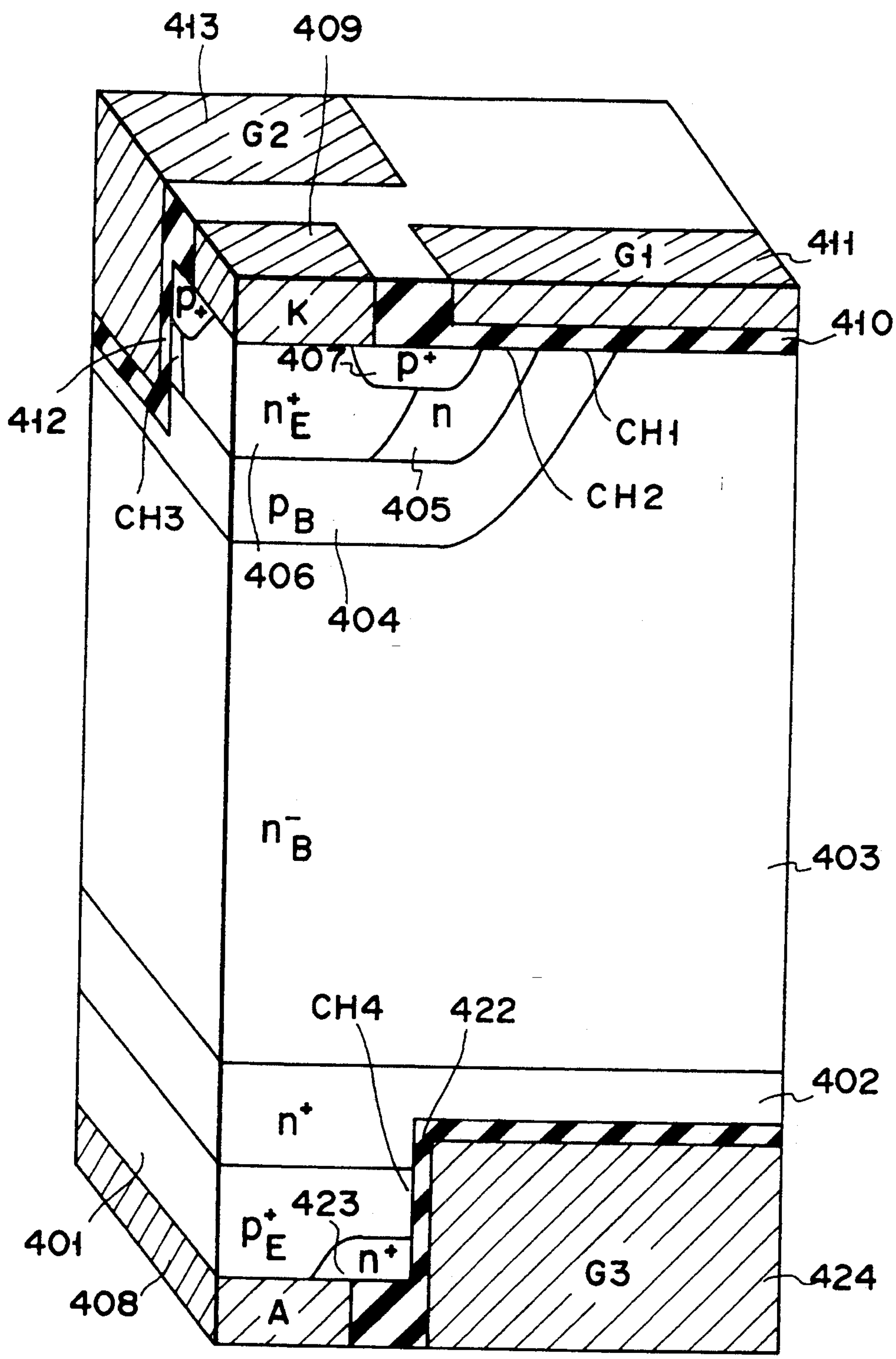
Figure 210:
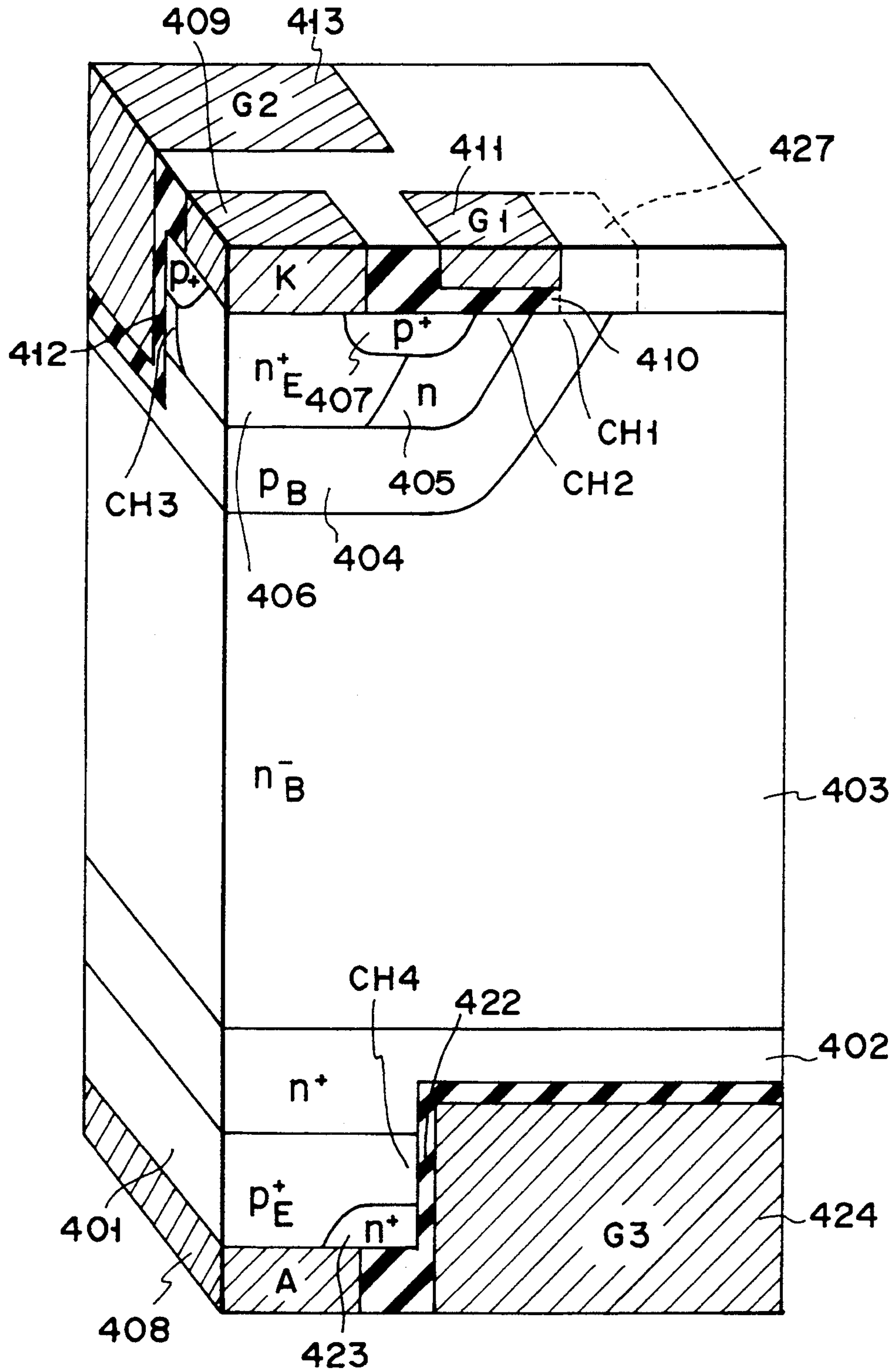
Figure 211:
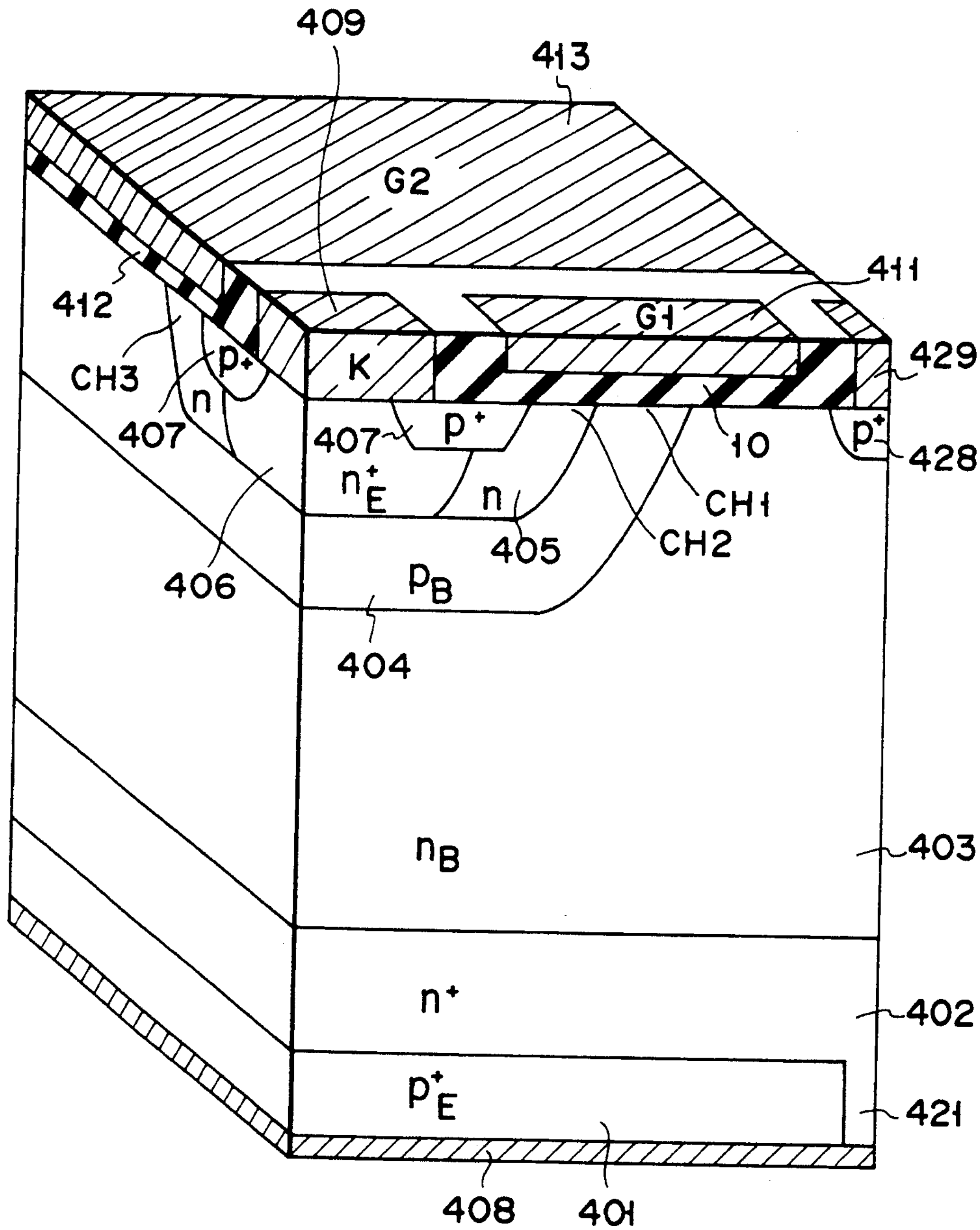
Figure 212:
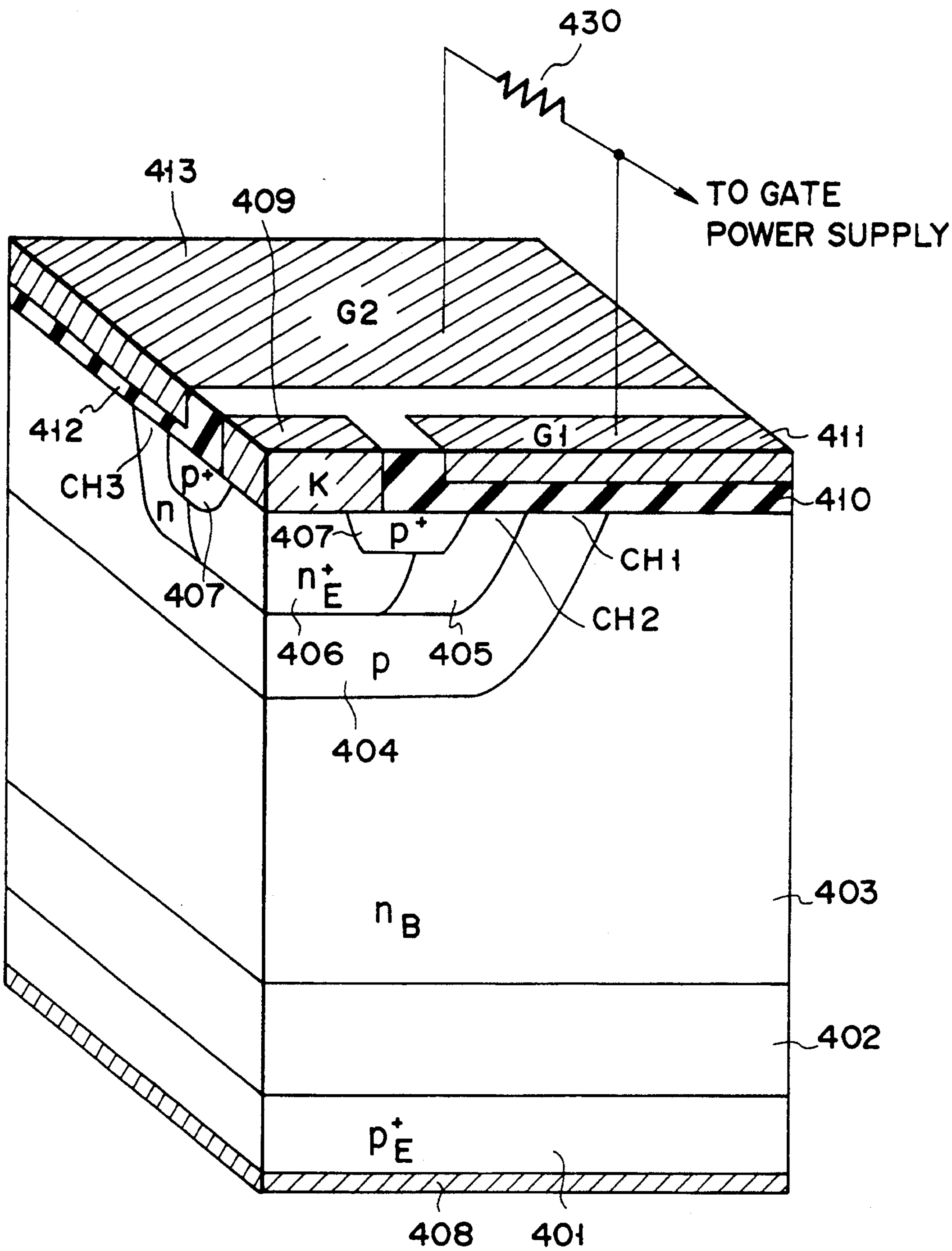
Figure 213:
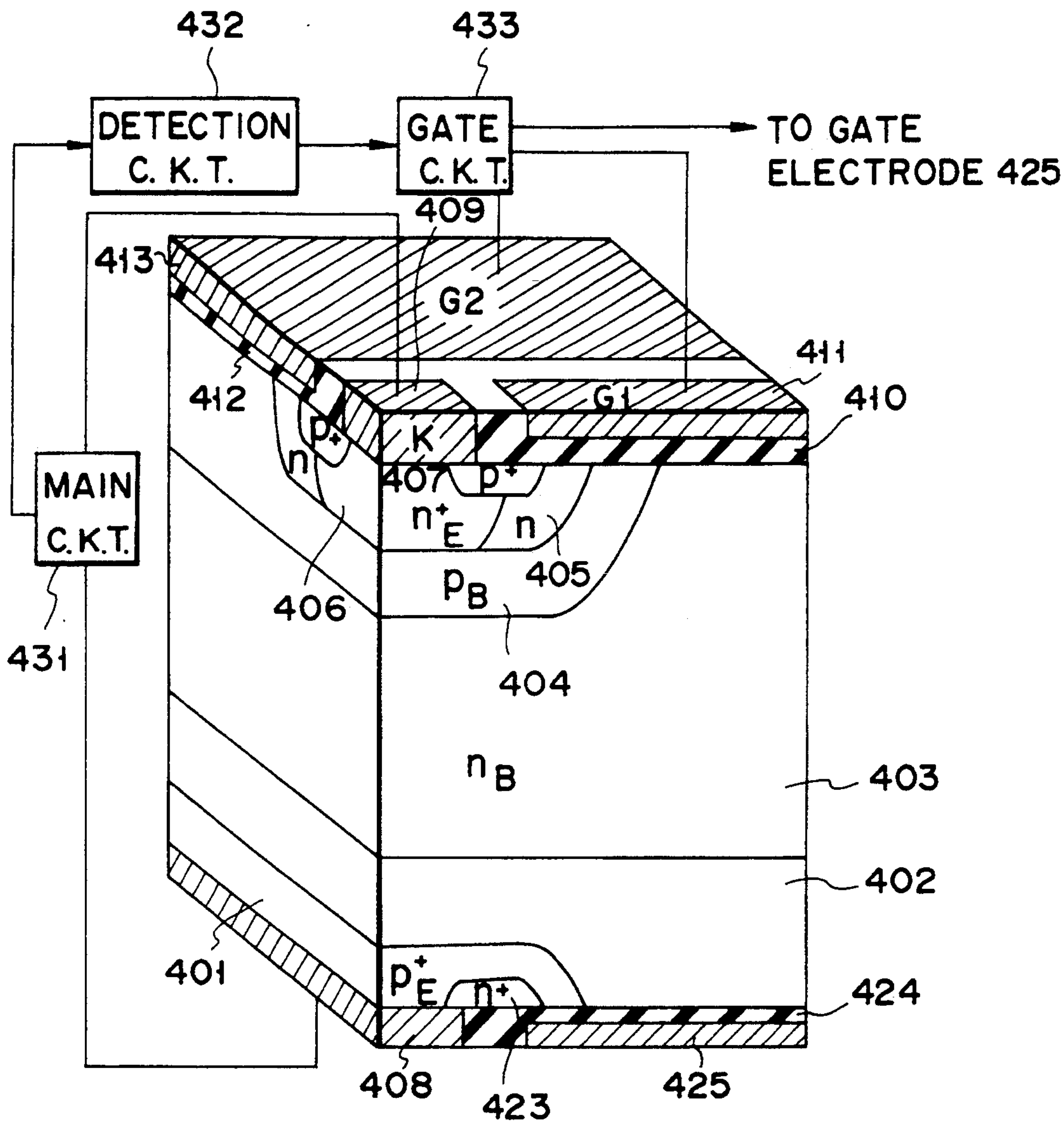
Figure 214:
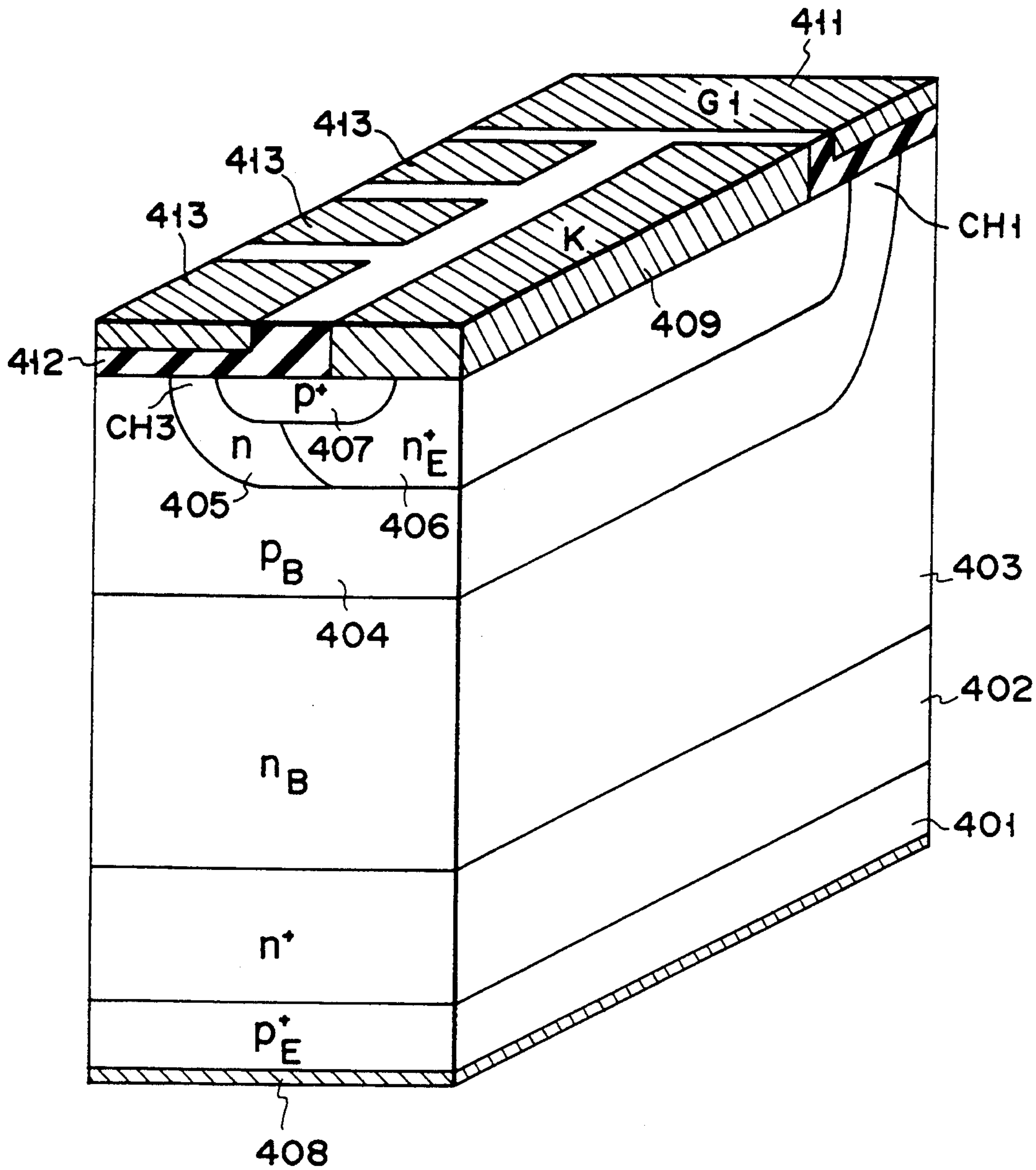
Figure 215:
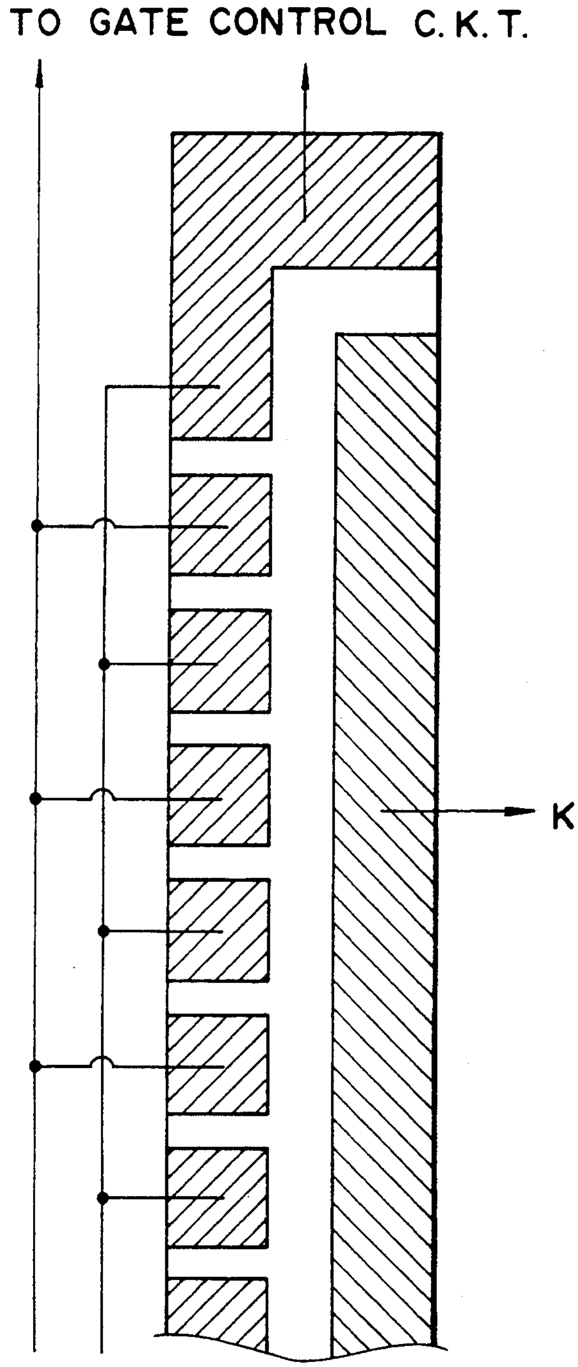
Figure 216:
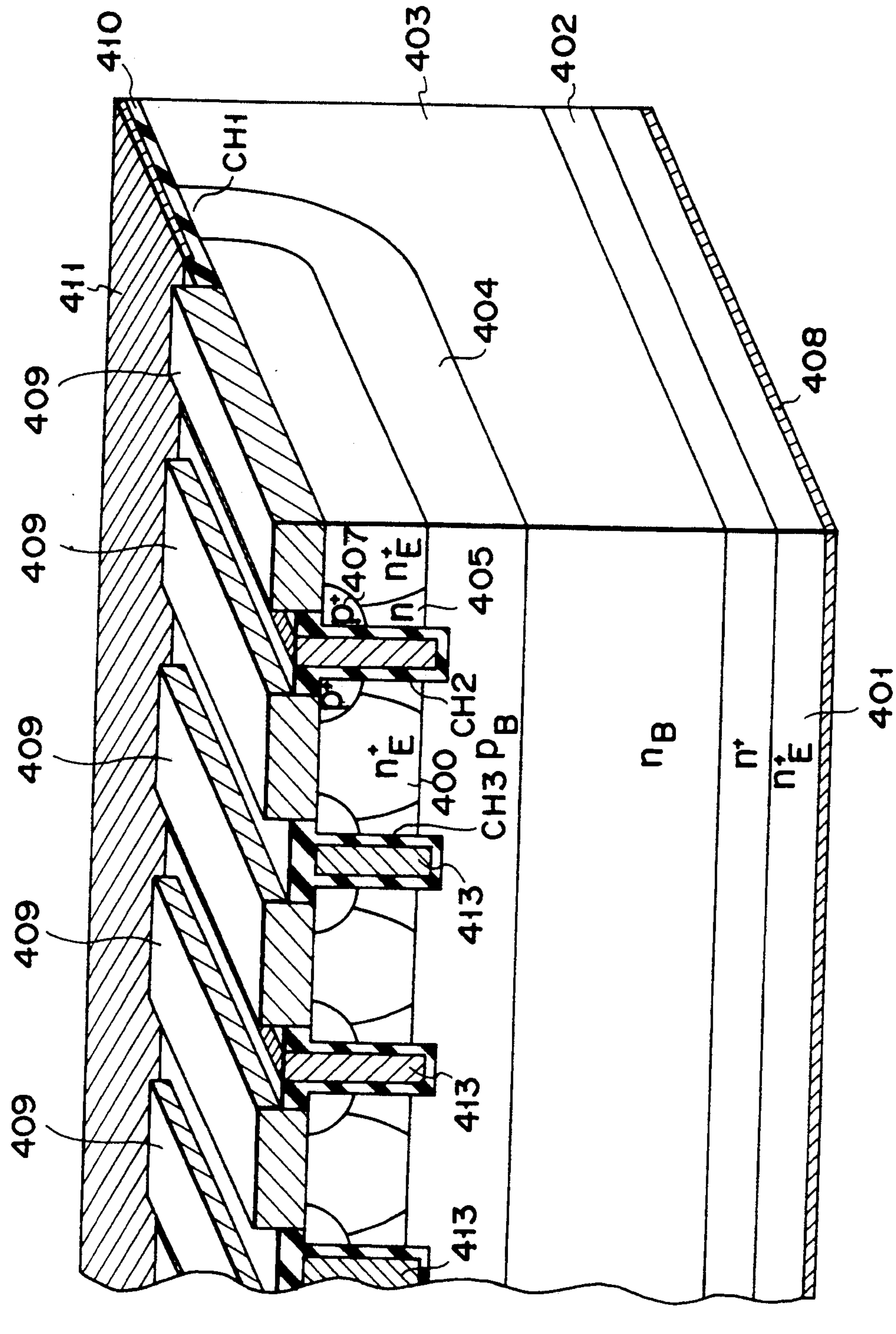
Figure 217:
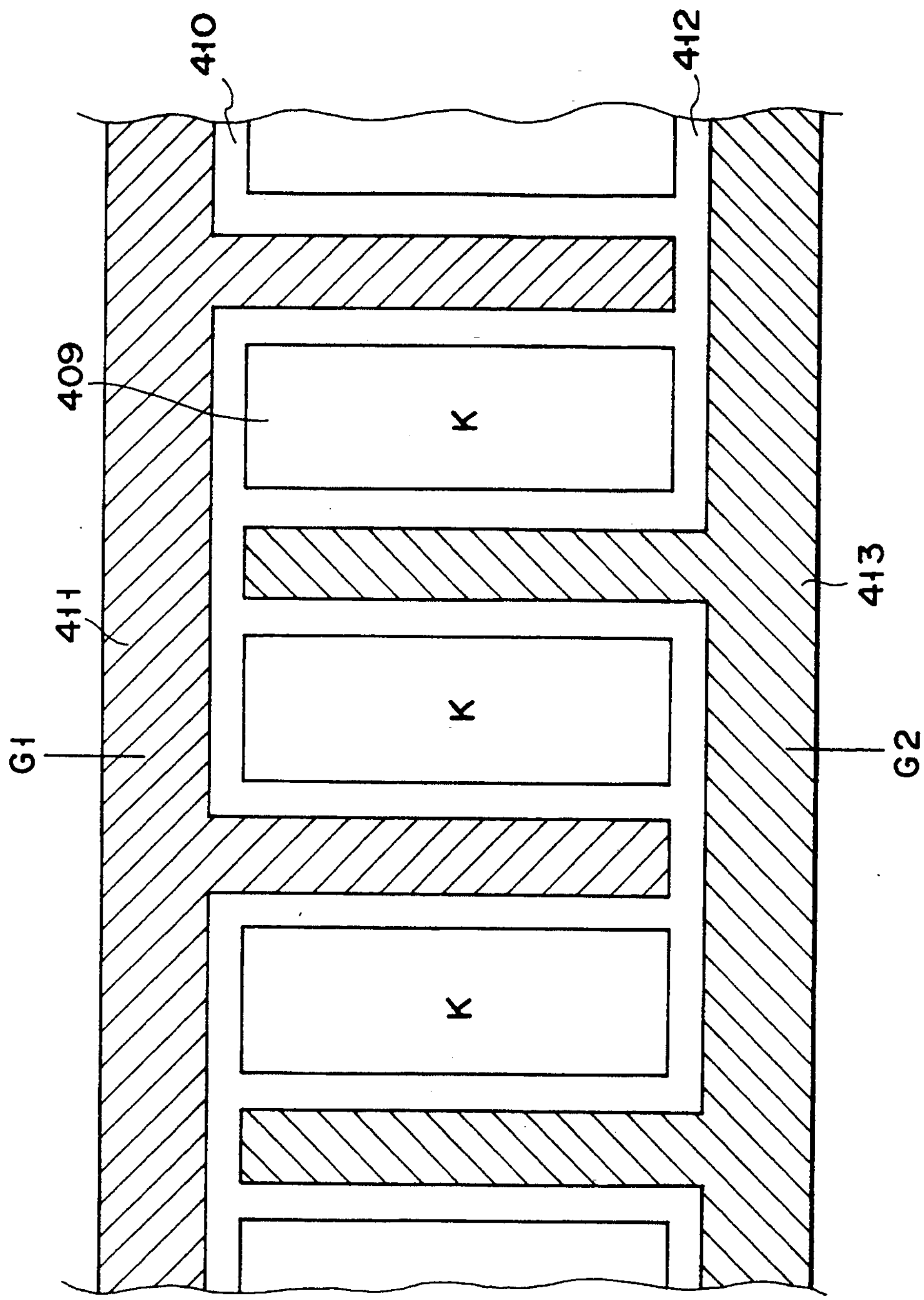

FIG. 206 is a perspective view showing another turn-off thyristor having insulated gate electrodes;

FIG. 207 is a perspective view showing still another insulated-gate turn-off thyristor, according to the invention;

FIG. 208 is a perspective view illustrating an insulated-gate turn-off thyristor according to the invention;

FIG. 209 is a perspective view illustrating an insulated-gate turn-off thyristor according to the invention;

FIG. 210 is a perspective view illustrating another insulated-gate turn-off thyristor according to the invention;

FIG. 211 is a perspective view illustrating still another insulated-gate turn-off thyristor according to the invention;

FIG. 212 is a perspective view illustrating an insulated-gate turn-off thyristor according to the invention;

FIG. 213 is a diagram showing a system having a turn-off thyristor of the type shown in FIG. 207;

FIG. 214 is a perspective view showing a turn-off thyristor of this invention, which has a plurality of gate electrodes provided exclusively for turning off the thyristor;

FIG. 215 is a plan view of the cathode side of the thyristor shown in FIG. 214;

FIG. 216 is a perspective view showing the main part of another turn-off thyristor according to the invention; and FIG. 217 is a plan view of the thyristor shown in FIG. 216.

DETAILED DESCRIPTION OF THE PREFERRED EMBODIMENTS

Embodiments of the present invention will now be described, with reference to the accompanying drawings. Unless otherwise specified, each of the figures shows only one of the thyristor unit cells which are formed and arranged on a substrate in a specific pattern.

FIG. 1 shows an insulated-gate thyristor according to the invention, which is, in practice, formed in great numbers on a substrate. A pair of stripe-shaped grooves 4 are made in one surface of a high-resistivity, $n^-$-type base layer 1, and are spaced apart from each other by a predetermined distance. Two gate-insulating films are formed on the surfaces of either groove 4. Gate-electrode materials fills up the grooves 4, forming two insulated gate electrodes 5. An $n^+$-type cathode (source) layer 7 is formed on that portion of the $n^-$-type base layer 1 which extends between the grooves 4. An n-type buffer layer 2 is formed on the other surface of the base layer 1. Further, a $p^+$-type anode (drain) layer 3 is formed on the n-type buffer layer 2. Thus, an SI thyristor is made, having a channel region 6 made of that portion of the cathode layer 7 which extends between the grooves 4 and located below the cathode layer 7.

That portion of the SI thyristor which includes the insulated gate electrodes 5 and the cathode layer 7 is a diode region. The remaining portion of the SI thyristor which contacts the ends of the stripe-shaped gate electrodes 5 is a hole bypass region for releasing holes from the $n^-$-type base layer 1 when the SI thyristor is turned off. The hole bypass region has a $p^+$-type source layer 8, an n-type channel layer 9, and a $p^+$-type drain layer 10. The $p^+$-type drain layer 10 is formed on the $n^-$-type base layer 1, the n-type channel layer 9 is formed on the drain layer 10, and the $p^+$-type source layer 8 is formed on the channel layer 9. The layers 8, and 10 and the insulated gate electrodes 5 constitute a vertical p-channel MOS transistor 14 for releasing holes.

An anode 11 is formed on the $p^+$-type anode layer 3. A cathode 12 is formed on the $n^+$-type cathode layer 7 and the $P^+$-type drain layer 10, as is indicated by broken lines.

In operation, the $n^+$-type cathode layer 7 is turned on when a voltage positive with respect to the cathode 12 is applied to the insulated gate electrodes 5. This is because no depletion layers are formed in the channel region 6 and, hence, electrons are injected into the region 6 from the $n^+$-type cathode layer 7 when the voltage is applied to the gate electrodes 5.

When a voltage negative with respect to the cathode is applied to the insulated gate electrodes 5, hole-accumulating layers are formed, extending along the gate electrodes 5. As a result, holes move from the $n^-$-type base layer 1 through the hole-accumulating layers. At the same time, the vertical p-channel MOS transistor 14 formed at the rear of the electrodes 5 is turned on. Hence, the holes are released to the cathode 12 through this MOS transistor 14. In parallel with this operation, depletion layers develop in the channel region 6. These depletion layers extend parallel to the hole-accumulating layers, and therefore suppress the injection of electrons from the $n^+$-type cathode layer 7 into the channel region 6. The SI thyristor is thereby turned off.

As can be understood from FIG. 1, the insulated-gate SI thyristor has no parasitic bipolar transistors which will be turned on when the thyristor is turned on. Since the hole bypass region does not accumulate many holes, the vertical MOS transistor 14 releases holes from the $n^-$-type base layer 1 at high speed when the SI thyristor is turned off. Hence, the insulated-gate SI thyristor can be turned off within a short period of time.

FIG. 2 shows an insulated-gate thyristor of the invention, which is identical to the thyristor of FIG. 1, except that each of its components has the conductivity type opposite to that of its equivalent of the thyristor of FIG. 1. More specifically, a pair of stripe-shaped grooves 24 are made in one surface of a high-resistivity, p−-type base layer 21. Two insulated gate electrodes 25 are buried in the grooves 24, respectively. A p+-type anode layer 27 is formed on that portion of the base layer 21 which extends between the grooves 24. A p-type buffer layer 22 is formed on the other surface of the P−-type base layer 21. An n+-type cathode layer 23 is formed on the buffer layer 22. That portion of the base layer 21 which extends between the grooves 24 and is located below the anode layer 27 is a channel region 26.

That portion of the SI thyristor which includes the insulated gate electrodes 25 and the anode layer 27 is a diode region. The remaining portion of the SI thyristor which contacts the ends of the stripe-shaped gate electrodes 25 is a hole bypass region for releasing holes from the p−-type base layer 21 when the SI thyristor is turned off. The hole bypass region has an n+-type source layer 28, a p-type channel layer 29, and an n+-type drain layer 30. The n+-type drain layer 30 is formed on the p−-type base layer 21, the p-type channel layer 29 is formed on the drain layer 30, and the n+-type source layer 28 is formed on the channel layer 29. The layers 28, 29 and 30 and the insulated gate electrodes 25 constitute a vertical n-channel MOS transistor 14 for releasing holes.

An cathode 12 is formed on the n+-type cathode layer 23. An anode 11 is formed on the p+-type anode layer 27 and the n+-type drain layer 30.

The insulated-gate SI thyristor shown in FIG. 2 can be turned off within a short period of time, like the SI thyristor of FIG. 1.

FIG. 3 illustrates an insulated-gate thyristor according to this invention. This thyristor is characterized in that a pair of buried gate electrodes are formed in the cathode-side surface, and another pair of buried gate electrodes are formed in the anode-side surface. To be more precise, two insulated gate electrodes 5 and an n+-type cathode layer 7—all identical to those incorporated in the thyristor of FIG. 1—are formed in the cathode-side surface of an n−-type base layer 1. A p−-type channel layer 32 is formed on the anode-side surface of the n−-type base layer 1. A p+-type anode layer 3 is formed on the p−-type channel layer 32. Two stripe-shaped grooves 35 are made in the anode layer 3 and the p−-type channel layer 32 and extend into the base layer 1. Two insulated gate electrodes 36 are buried in these grooves 35, respectively.

That portion of the SI thyristor which includes the anode layer 3, the insulated gate electrodes 5, the cathode layer 7, the channel layer 32, and the insulated gate electrodes 36 is a diode region. The remaining portion of the SI thyristor which contacts the ends of the stripe-shaped gate electrodes 5 and 36 is an anti-parallel diode region. The anti-parallel diode region comprises part of the n−-type base layer 1, a p+-type layer 33 connected to the cathode layer 7, and an n+-type layer 34 connected to the anode layer 3 and the channel layer 32.

An anode 11 is formed on the p+-type anode layer 3 and the n+-type layer 34 functioning as cathode layer of the anti-parallel diode region. A cathode (not shown) is formed on the n+-type cathode layer 7 and the p+-type layer 33 functioning as the anode layer of the anti-parallel diode region.

To turn on the insulated-gate thyristor shown of FIG. 3, a voltage positive with respect to the cathode is applied to the gate electrodes 5, while applying no bias to the gate electrodes 36. Electrons are thereby injected from the n+-type cathode layer 7 into the n+-type channel region 6. As a result, the thyristor is turned on.

To turn off the thyristor, a voltage negative with respect to the cathode is applied to the insulated gate electrodes 5, while a voltage positive with respect to the anode 11 is applied to the insulated gate electrodes 36. The injection of electrons from the cathode layer 7 into the channel region 16 is thereby suppressed. At the same time, the potential of the p−-type channel layer 33 rises, and the channel layer 33 is depleted. Hence, the injection of holes from the p+-type anode layer 3 into the channel layer 33 is suppressed. Of the carriers accumulated in the n−-type base layer 1, the holes move to the cathode through the p+-type layer 33, and the electrons move to the anode 11 through the n+-type layer 34.

As has been described, when the insulated-gate thyristor of FIG. 3 is turned off, the injection of carriers is suppressed in both the cathode-side surface and the anode-side surface, and the anti-parallel diode region releases the carriers from the n−-type base layer 1. Therefore, the thyristor can be turned off at high speed.

FIG. 4 is a perspective view of a modification of the insulated-gate thyristor shown in FIG. 3. This thyristor is identical to the thyristor of FIG. 3, except that a vertical MOS transistor is used in place of the anti-parallel diode region. A p+-type source layer 8, an n-type channel layer 9, and a p+-type drain layer 10 are formed in the cathode-side surface of the thyristor and connected to insulated gate electrodes 5, in the same way as in the thyristor of FIG. 1. The layers 8, 9 and 10 constitute a vertical p-channel MOS transistor 14*a* for releasing holes. On the other hand, an n+-type source layer 37, a p-type channel layer 38, and an n+-type drain layer 39 are formed in the anode-side surface of the thyristor and connected to insulated gate electrodes 36. The layers 27, 38 and 39 constitute an n-channel vertical MOS transistor 14*b*.

To turn off this insulated-gate thyristor, a negative voltage is applied to the insulated gate electrodes 5, thereby turning on the p-channel MOS transistor 14*a* formed in the cathode-side surface, while a positive voltage is applied to the insulated gate electrodes 36, thereby turning on the n-channel MOS transistor 14*b*. Hence, both vertical MOS transistors 14*a* and 14*b* release the carriers from the n−-type base layer 1. Both vertical MOS transistors 14*a* and 14*b* remain off as long as the thyristor is on.

Therefore, the insulated-gate thyristor of FIG. 4 can be turned off at high speed, while maintaining its good turn-on characteristic.

FIG. 5 shows an insulated-gate thyristor of the invention, which has two gates buried deep, reaching a p+-type anode layer 3. This thyristor has a carrier-releasing region, or a pnp transistor, which comprises a p+-type layer 10 formed on an n−-type base layer 1.

To turn on this thyristor, a positive voltage is applied to the insulated gate electrodes 5. Two electron-accumulating layers are thereby formed, extending along the sides of either groove 4 from the n+-type cathode layer 7 to the n-type buffer layer 2. Hence, the n+-type cathode layer 7 is electrically connected to the n-type buffer layer 2 by these electron-accumulating layers. As a result, the voltage across the thyristor drops to the value at which the thyristor is normally on. To turn off the insulated-gate thyristor, a negative voltage is applied to the insulated gate electrodes 5. Two p-channels layers are thereby formed, extending along the sides of either groove 4. The holes in the $n^{--}$-type base layer 1 move to the cathode electrode through the p-type channel layers and the $p^+$-type layer 10.

Obviously, the thyristor shown in FIG. 5 can be turned on and off, at high speed.

FIG. 6 illustrates an insulated-gate thyristor which is identical to the thyristor of FIG. 5, except that each components has the conductivity type opposite to that of its equivalent of the thyristor shown in FIG. 5. As can be understood from the description of the thyristor shown in FIG. 5, the thyristor of FIG. 6 can also be turned on and off at high speed.

FIG. 7 shows an insulated-gate thyristor which is a modification of the thyristor shown in FIG. 5. This thyristor is characterized in that the two slits 4 are cut in an $n^{--}$-type layer 1, an n-type buffer layer 2, a $p^+$-type anode layer 3, and an $n^+$-type cathode layer 7, and two insulated gate electrodes 5 are formed in these slits 4 and extend from the upper surface of the cathode layer 7 to the anode 11.

Since the slits 4 pass through the substrate, a sufficient amount of oxygen is supplied into them while gate-insulating films are being formed on the inner surfaces of either slit. The resultant gate-insulating films can, therefore, has a uniform thickness. Also, a sufficient amount of fed gas can be supplied into the silts 4 while gate electrodes 5 of polycrystalline silicon are being formed in the slits 4 by means of CVD (Chemical Vapor Deposition). The resultant gate electrodes 5 are, thus, homogeneous.

In the insulated-gate thyristors illustrated in FIGS. 1 to 7, that portion of the base layer 1, which extends between the grooves 4 and functions channel region 6, must be completely depleted when a relatively low bias is applied to it. To this end, it is necessary to select the best possible values for the width and impurity concentration of said portion of the base layer 1. More precisely, according to the present invention, the channel region 6 has an impurity concentration of $5\times10^{13}/cm^3$. In this case, the saturated value for the width of the channel region 6 is 5 $\mu$m or more. Hence, the grooves 4 (or the slits 4 in the embodiment of FIG. 7) are formed by reactive ion etching, such that they are spaced apart by a distance of 5 $\mu$m or less. Then, the thyristors shown in FIGS. 1 to 7 can have a relatively low threshold voltage.

Figure 8A:
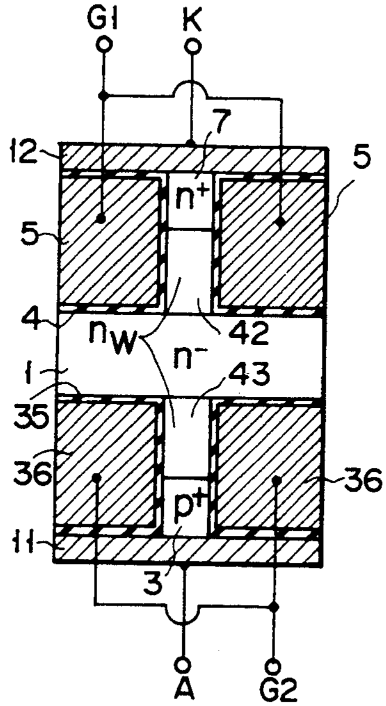
FIGS. 8A, 8B, and 8C are sectional views showing a thyristor of the invention, which has a narrow channel, and also explaining how the thyristor is turned on and off.
Figure 8B:
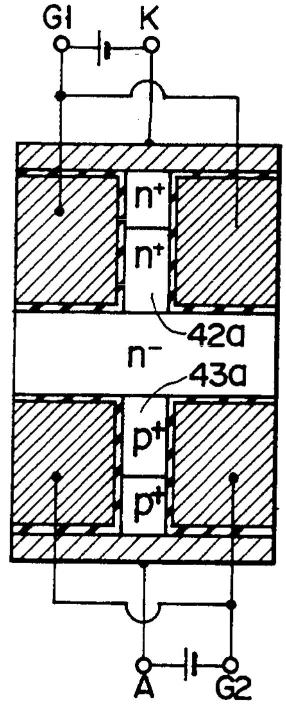
Figure 8C:
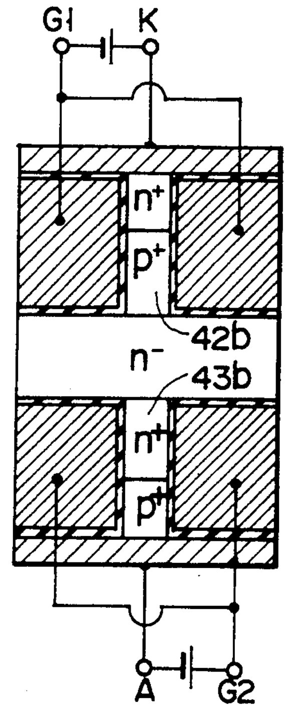

FIGS. 8A, 8B, and 8C show a thyristor having a narrow channel (buried gate electrodes spaced apart by a relatively small distance), and also explain how this thyristor is turned on and off. As is evident from FIG. 8A, a high-resistivity, $n^{--}$-type base layer 1 extends horizontally in the middle part of a semiconductor substrate. A pair of grooves 4 are formed in one major surface of the substrate, both reaching the $n^{--}$-type base layer 1 and spaced apart from each other by a distance as short as 1 $\mu$m or less. Two insulated gate electrodes 5 are buried in these grooves 4, respectively. Similarly, a pair of grooves 35 are formed in the opposite major surface of the substrate, both reaching the $n^{--}$-type base layer 1 and spaced apart from each other by a distance as short as 1 $\mu$m or less. Two insulated gate electrodes 36 are buried in these grooves 4, respectively.

An n-channel layer 42 is formed between the insulated gate electrodes 5 and contacts, at the lower end, the $n^{--}$-type base layer 1. An $n^+$-type cathode layer 7 is formed on the upper end of the n-channel layer 42. An n-channel layer 43 is formed between the insulated gate electrodes 36 and contacts, at the upper end, the $n^{--}$-type base layer 1. A $p^+$-type anode layer 3 is formed on the lower end of the n-channel layer 43. An anode 11 is formed on the anode layer 3 and also on the insulated gate electrodes 36. A cathode 12 is formed on the cathode layer 7 and also on the insulated gate electrodes 5.

To turn on this thyristor, a voltage positive with respect to the cathode 12 is applied to the insulated gate electrodes 5, and a voltage negative with respect to the anode 11 is applied to the insulated gate electrodes 36, as is illustrated in FIG. 8B. The n-type channel layer 42 interposed between the gate electrodes 5 accumulates electrons densely, becoming an electron-rich layer 42*a*. The layer 42*a* and the cathode layer 7 jointly form a "cathode layer" in the true sense of the words. The n-type channel layer 43 interposed between the gate electrodes 36 becomes $p^+$-type inversion layer 43*a*. The anode layer 3 with low impurity concentration becomes a hole-rich layer. The layer 43*a* and the anode layer 3 constitute an "anode layer" in the strict sense of the words. As a result, the effective distance between the cathode and the anode is decreased. As long as the thyristor is biased forwards, electrons are injected from the cathode 12 into the base layer 1, and holes are injected from the anode 11 into the base layer 1, at an increased efficiency. In other words, the thyristor is turned on with low on-state voltage.

To turn off the thyristor, a voltage negative with respect to the cathode 12 is applied to the insulated gate electrodes 5, and a voltage positive with respect to the anode 11 is applied to the insulated gate electrodes 36, as is illustrated in FIG. 8C. The n-type channel layer 42 interposed between the gate electrodes 5 becomes a p-type inversion layer 42*b*, whereas the n-type channel layer 43 interposed between the gate electrodes 36 becomes an electron-rich layer 43*b*. As a result, the layers arranged between the anode 11 and the cathode 12 form a pnpn structure, whereby an electron injection from the cathode 12 and a hole injection from the anode 11 stop. Hence, the thyristor is turned off.

With the thyristor shown in FIGS. 8A, the injection of carriers into the base layer 1 is achieved with high efficiency to turn on the thyristor, and is suppressed with high efficiency to turn off the thyristor. The thyristor can have the same carrier-releasing section as that used in each embodiment described above.

Figure 9A:
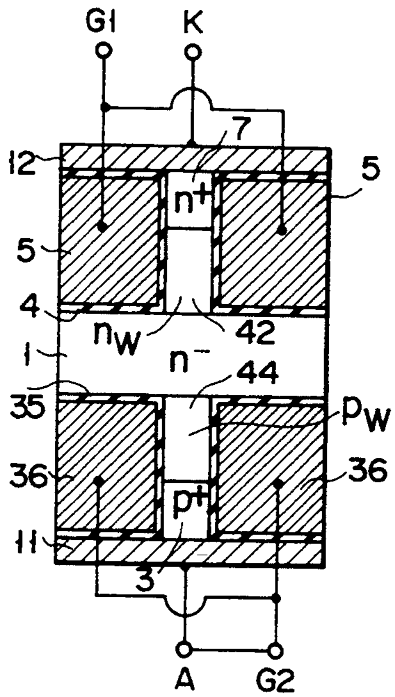
FIGS. 9A, 9B, and 9C are sectional views showing a thyristor according to the invention, which is a modification of the thyristor shown in FIG. 8A, and also explaining how the thyristor is turned on and off.
Figure 9B:
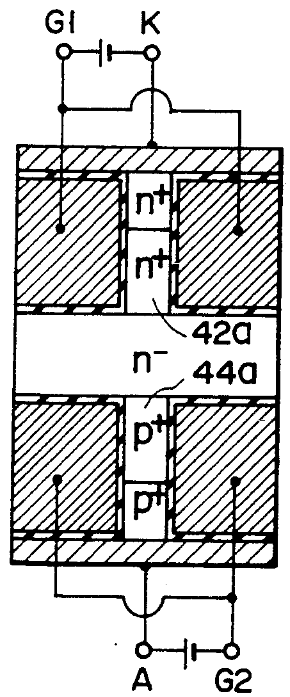
Figure 9C:
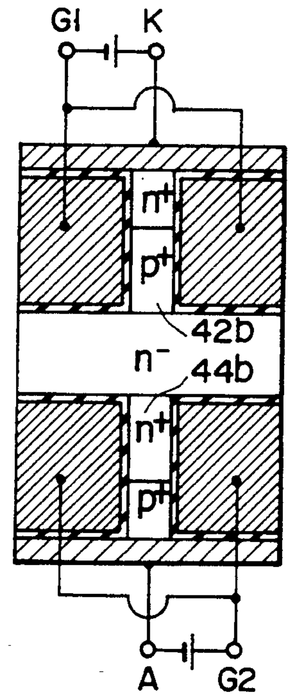

FIGS. 9A, 9B, and 9C shows a modification of the thyristor shown in FIG. 8A, and explain how the thyristor is turned on and off. This thyristor is characterized in that a p-type channel layer 44, not an n-type one, contacts the anode layer 3.

To turn on the thyristor of FIG. 9A, a voltage positive with respect to the cathode 12 is applied to the insulated gate electrodes 5, and a voltage negative with respect to the anode 11 is applied to the insulated gate electrodes 36, as is illustrated in FIG. 9B. The n-type channel layer 42 interposed between the gate electrodes 5 becomes an electron-rich layer 42*a*, whereas the p-channel layer 44 becomes a hole-rich layer 44*a*. As a result, as long as the thyristor is biased forwards, the distance between the anode 11 and the cathode 12 decreases, whereby electrons are injected from the cathode 12 into the base layer 1, and holes are injected from the anode 11 into the base layer 1, at an increased efficiency. Hence, the thyristor is turned on with low on-state voltage.

To turn off the thyristor, a voltage negative with respect to the cathode 11 is applied to the insulated gate electrodes 5, and a voltage positive with respect to the anode 11 is applied to the insulated gate electrodes 36, as is illustrated in FIG. 9C. The n-type channel layer 42 interposed between the gate electrodes 5 thereby becomes a p-type inversion layer 42*b*, whereas the n-type channel layer 44 interposed between the gate electrodes 36 becomes an n-type inversion layer 43*b*. As a result, the layers arranged between the anode 11 and the cathode 12 form a pnpn structure. Hence, electrons stop moving from the cathode 12 into the base layer 1, whereas holes stops moving from the anode 11 into the base layer 1, whereby the thyristor is turned off.

In the embodiments shown in FIGS. 4, 5, 7, 8A, and 9A, the conductivity type of each component can be reversed, as in the embodiment of FIG. 2 with respect of that of FIG. 1, and as in the embodiment of FIG. 6 with respect to that of FIG. 5. Also, in any embodiment described above, the emitter junction can be a heretojunction in order to improve the emitter-injection efficiency when the thyristor is turned on.

Figure 10:
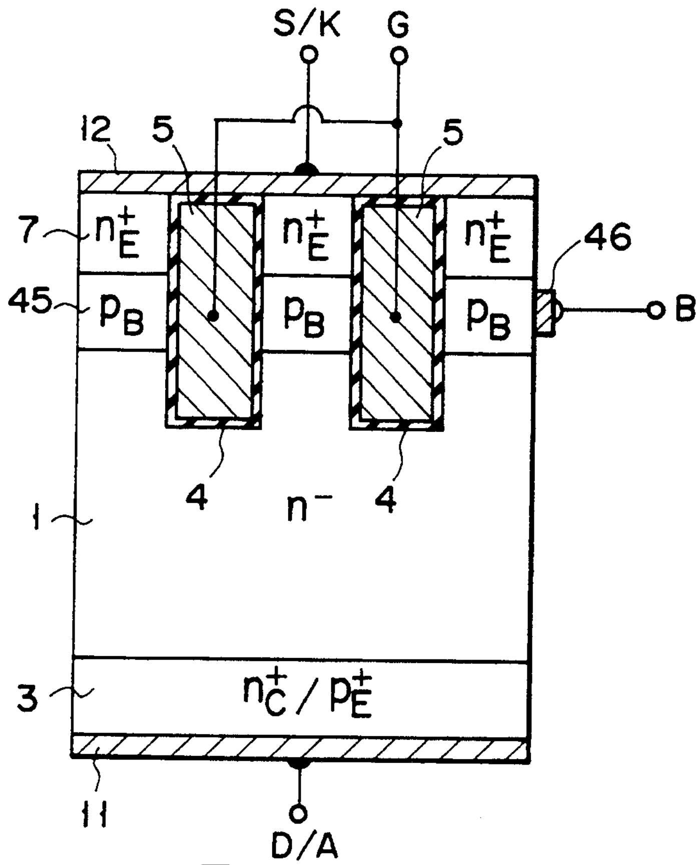
FIG. 10 is a sectional view showing an insulated-gate thyristor/transistor of the invention, which has two buried gates.

FIG. 10 shows an insulated-gate SI thyristor which has two buried gate electrodes spaced apart by a relatively long distance, and which can yet be a normally-off thyristor.

As shown in FIG. 10, this SI thyristor comprises a high-resistivity, $n^{--}$-type base layer 1, a p-type base layer 45 formed on the upper surface of the base layer 1, an $n^+$-type cathode (source) layer 7 formed on the p-type base layer 45, an $p^+$-type anode (drain) layer 3 formed on the lower surface of the base layer 1. Two grooves 4 are formed in the cathode-side surface of the thyristor, extending into the $n^{--}$-type base layer 1. Two insulated gate electrodes 5 are formed in the grooves 4, respectively.

The SI thyristor further comprises an anode 11, a cathode 12, and a gate electrode 46. The anode 11 is formed on the $p^+$-type anode layer 3. The cathode 12 is formed on the $n^+$-type cathode layer 7. The gate electrode 46 is directly connected to the p-type base layer 45.

As is evident from FIG. 10, the SI thyristor has a pnpn structure. Hence, the thyristor remains off as long as no gate bias is applied to it. In other words, it is a normally-off type thyristor. When a voltage positive with respect to the cathode 12 is applied to both insulated gate electrodes 5, an n-channel is formed in the p-type base layer 45, extending parallel to the gate electrodes 5. As a result, electrons move from the $n^+$-type cathode layer 7 into the $n^{--}$-type base layer 1. when these electrons reach the $p^+$-type anode layer 3, holes start moving from the $p^+$-type anode layer 3 into the $n^{--}$-type base layer 1. The SI thyristor is thereby turned on.

To turn off the SI thyristor, a voltage negative with respect to the cathode 12 or neither negative nor positive with respect thereto is applied to the gate electrodes 5, whereby electrons stop moving from the cathode layer 7 into the base layer 1. As a result, the SI thyristor is turned off. At the same time, the accumulated holes are released outside from the $n^{--}$-type base layer 1 through the gate electrode 46 directly connected to the p-type base layer 45. This enables the thyristor to be turned off at high speed.

The gate electrode 46 can be provided in the form of an independent output terminal, or in the form of a lead short-circuited with the cathode 12. It is desirable that the electrode 46 be connected to a zener diode, or to a MOS transistor which is turned on when the SI thyristor is turned off.

This SI thyristor is a normally-off type which can be turned on and off at high speed. When the thyristor is turned off, a depletion layer expands toward the $n^{--}$-type base layer 1, in the pn junction formed of the $n^{--}$-type base layer 1 and the p-type base layer 45. Hence, the SI thyristor has a high breakdown voltage, in particular when it is turned off.

If the $P^{++}$-type anode layer 3 is replaced by an $n^+$-type layer, the thyristor will change to an insulated-gate SI transistor. The same is true of the embodiments which are shown in FIG. 11 et seq.

Figure 11:
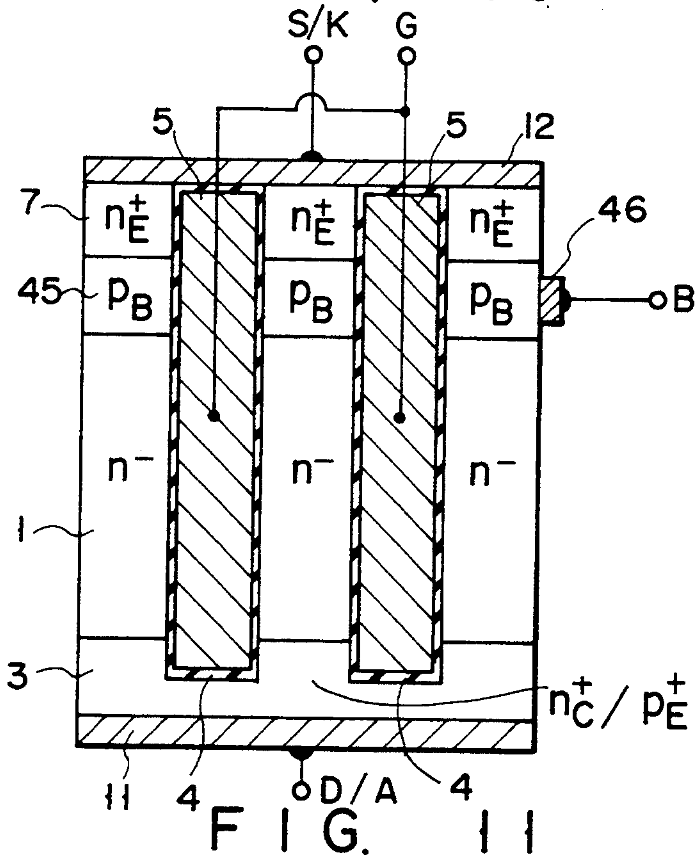
FIG. 11 is a sectional view showing a modification of the thyristor/transistor shown in FIG. 10.

FIG. 11 illustrates a modification of the thyristor shown in FIG. 10. As is evident from FIG. 11, this SI thyristor is characterized in that two insulated gate electrodes 5 extends deeper than in the thyristor of FIG. 10, both into the anode layer 3. When the SI thyristor is turned off, an electron-accumulating is formed in the $n^{--}$-type base layer 1, along the gate electrodes 5. The cathode-anode path can, therefore, be rendered conductive fast. Hence, the thyristor is turned off at higher speed than the SI thyristor of FIG. 10.

To turn off the SI thyristor of FIG. 11, a voltage negative with respect to the cathode 11 is applied to the insulated gate electrodes 5. As a result, a p-type inversion layer is formed in the n-type base layer 1, extending along the gate electrodes 5. Holes are released fast from the $n^{--}$-type base layer 1 through the p-type inversion layer and then through the p-type base layer 45. Therefore, the SI thyristor can be turned off at high speed, too.

FIGS. 12 to 15 show three modifications of the thyristor shown in FIG. 10, respectively, in which a low-impurity $n^{--}$-type channel layer 47 is interposed between the $n^+$-type cathode layer 7 and the p-type base layer 45. The thyristor of FIG. 12 has grooves 4 extending into the $n^{--}$-type channel layer 47; the thyristor of FIG. 13 has grooves 4 extending into the p-type base layer 54; the thyristor of FIG. 14 has grooves 4 extending to the $n^{--}$-type base layer 1; and the thyristor of FIG. 15 has grooves 4 extending into the anode layer 3. Like the thyristor of FIG. 10, the thyristors shown in FIGS. 12 to 15 can be turned off when a voltage negative with respect to the cathode 12 is applied to the insulated gate electrodes 5, decreasing the potential of the $n^{--}$-type channel layer 47 and suppressing the electron injection from the cathode layer 7. Further, since hole-accumulating layers are formed, which extend along the insulated gate electrodes 5, the hole-releasing resistance can be reduced up to the position of the gate electrode 46.

Figure 12:
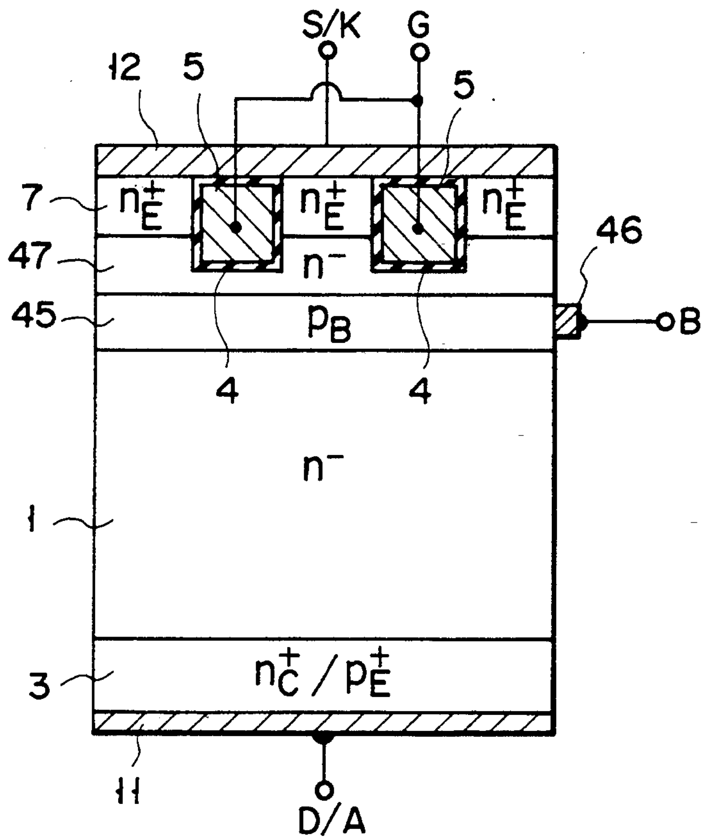
FIGS. 12 to 15 are sectional diagrams showing four modifications of the thyristor/transistor shown in FIG. 10, respectively.

In the thyristor of FIG. 12, neither insulated gate electrode 5 controls the potential of the p-type base layer 45. Thus, to turn on the thyristor, a voltage positive with respect to the cathode 12 is applied to the gate electrode 46 connected to the p-type base layer 45.

Figure 14:
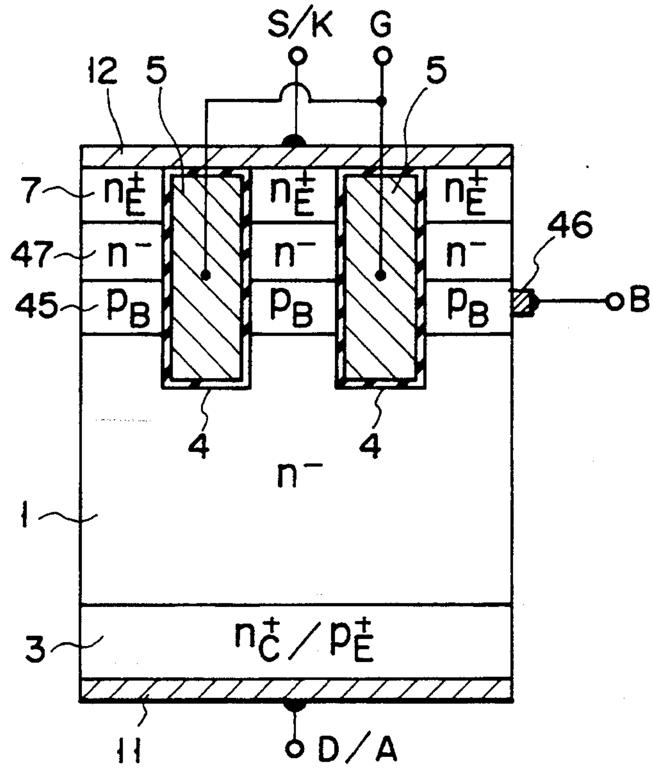

The thyristor shown in FIG. 14 can be turned on at high speed, by applying a positive voltage to the insulated gate electrodes 5, thereby forming an n-type channel in the p-type layer 45, which extends along the gate electrodes 5.

Figure 15:
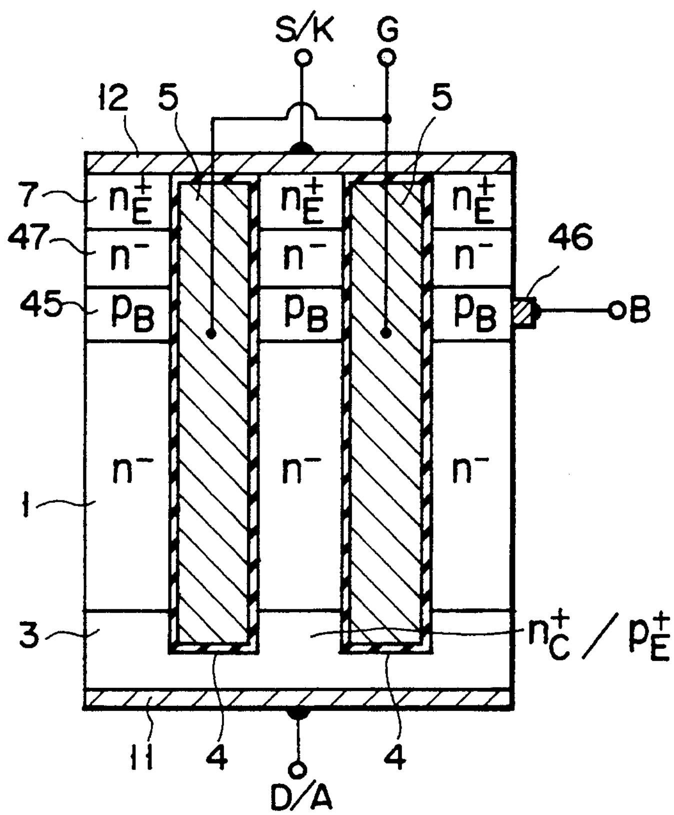

Like the thyristor of FIG. 11, the thyristor shown in FIG. 15 can be turned on at high speed when an electron-accumulating layer is formed in the $n^{-}$-type base layer 1, along the gate electrodes 5, and can be turned off at high speed when an inversion layer is formed in the $n^{-}$-type base layer 1, extending along the gate electrodes 5.

Figure 16A:
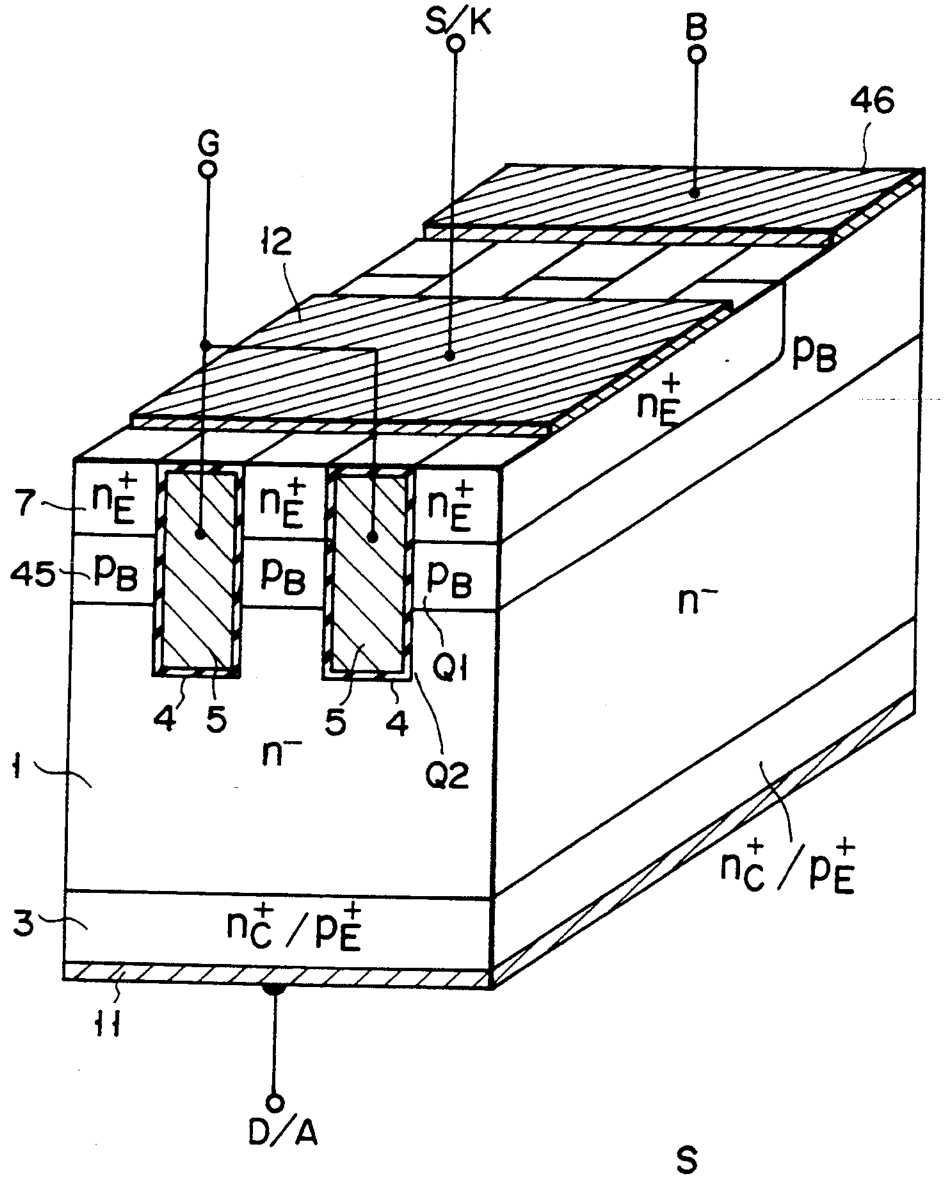
FIG. 16A is a perspective view showing the thyristor/transistor of FIG. 10.

FIG. 16A is a perspective view showing the thyristor of FIG. 10, illustrating how the gate electrode 46 is led out from the p-type base layer 45. As is shown in the figure, the p-type base layer 45 has an exposed portion which contact the rear ends of the stripe-shaped cathode layers 7. The gate electrode 46 is formed on this portion of the p-type base layer 45. As is shown in FIG. 16A, the electrode 46 is formed independently of the cathode 12. Instead, the electrode 46 can be short-circuited to the cathode 12. Even if short-circuited to the cathode 12, the gate electrode 46 can perform its function. The same holds true of the similar embodiments of the invention, which will be described below.

Figure 16B:
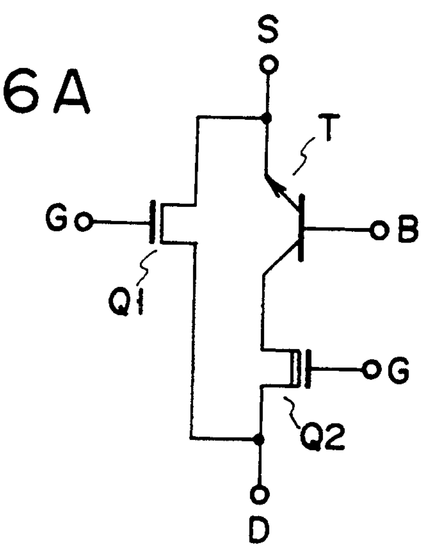
FIG. 16B is an equivalent circuit diagram of the thyristor/transistor.

FIG. 16B is an equivalent circuit diagram of the device shown in FIG. 16A. This device does not have a pnpn SI structure. Rather, it comprises npn SI transistors. More specifically, an E-type MOS transistor Q1 is connected in parallel to the drain-source path of a transistor T, and a D-type MOS transistor Q2 is connected in series to the drain of the E-type MOS transistor Q1. The E-type MOS transistor Q1 has its channel region formed of the p-type base layer 45, whereas the D-type MOS transistor Q2 has its channel region formed of that portion of the $n^{-}$-type base layer 1 in which the insulated gate electrodes 5 are buried.

FIG. 17A is a perspective view of the thyristor shown in FIG. 14, illustrating how the gate electrode 46 is led out from the p-type base layer 45. As is shown in FIG. 17A, the p-type base layer 45 has an exposed portion which contact the rear ends of the stripe-shaped cathode layers 7 and $n^{-}$-type channel layer 47. The gate electrode 46 is formed on this portion of the p-type base layer 45.

FIG. 17B is an equivalent circuit diagram of the device, which comprises SI transistors. To be more precise, an E-type MOS transistor Q1 is connected in parallel to the drain-source path of a transistor T. Two D-type MOS transistors Q2 and Q3 are connected in series to the drain and source of the transistor T, respectively. The E-type MOS transistor Q1 has its channel region formed of the p-type base layer 45. The D-type MOS transistor Q2 has its channel region formed of that portion of the $n^{-}$-type base layer 1 in which the insulated gate electrodes 5 are buried. The D-type MOS transistor Q3 has its channel region formed of the $n^{-}$-type channel layer 47.

Figure 18A:
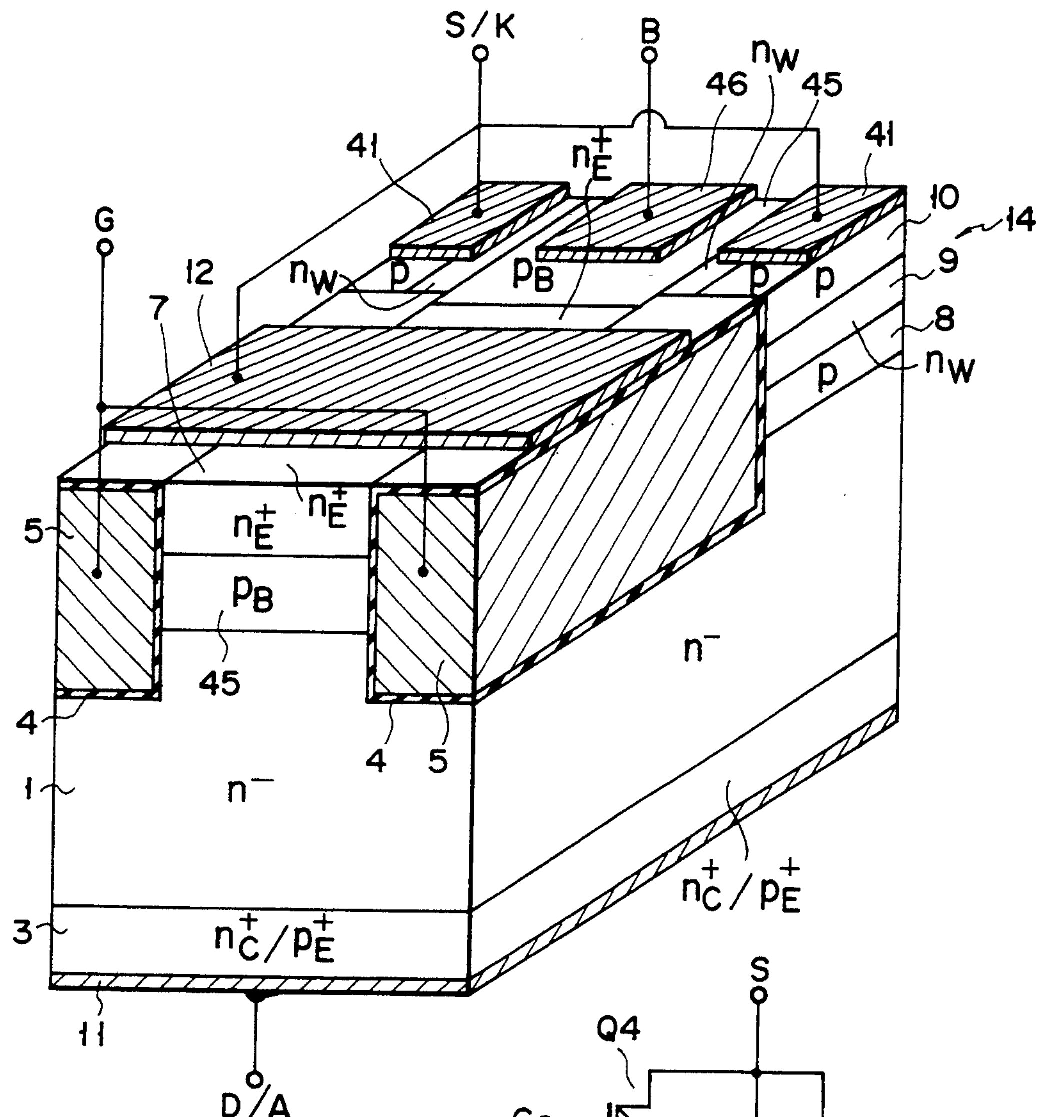
FIG. 18A is a perspective view of an modification of the thyristor/transistor shown in FIG. 16A.

FIG. 18A is a perspective view of an modification of the thyristor shown in FIGS. 10 and 16, which has a vertical MOS transistor for releasing holes when the thyristor is turned off. As FIG. 18A clearly shows, a p-type source layer 8, an n-type channel layer 9, and a p-type drain layer 10 are formed, all contacting the rear ends of the stripe-shaped insulated gate electrodes 5, as in the embodiment of FIG. 1.

The vertical MOS transistor 14 has drain electrodes 41 which are, in practice, continuous to the cathode 12. The p-type base layer 45 has an exposed portion which is connected to the rear ends of the cathode layer 7, as in the embodiments of FIGS. 16A and 17A. A gate electrode 46 is formed on this portion of the p-type base layer 45.

The gate electrode 46 can be dispensed with. In the case where the gate electrode 46 is not provided, the cathode 12 functions as drain electrodes of the vertical MOS transistor 14 as well. The thyristor, wherein the cathode 12 serves as drain electrodes of the MOS transistor 14, is suitable for a large-current element having press-bonded electrodes.

Figure 18B:
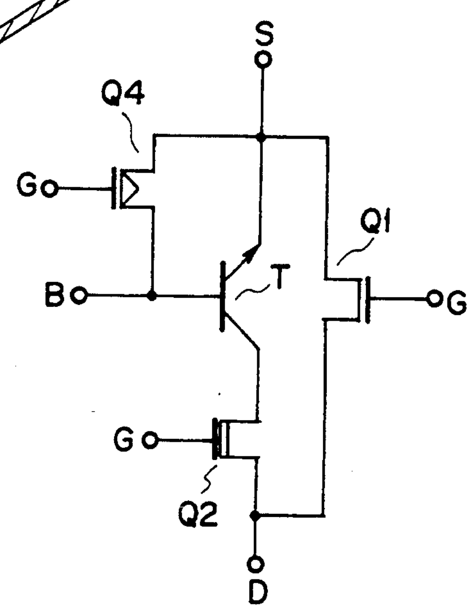
FIG. 18B is an equivalent circuit diagram of this modification.

FIG. 18B is an equivalent circuit diagram of the device shown in FIG. 18A, which comprises SI transistors. More specifically, a MOS transistor Q1 is connected in parallel to the drain-source path of a transistor T, and a MOS transistors Q2 is connected in series to the drain of the transistor T, as in the device shown in FIG. 17B. The vertical MOS transistor 14, or a MOS transistor Q4 is connected between the p-type base layer 45 and the source layer 7.

FIG. 19A is a perspective view showing a modification of the thyristor shown in FIGS. 14 and 17. Like the modified thyristor of FIG. 18A, this modified thyristor has a vertical MOS transistor 14 for releasing holes when it is turned off. FIG. 19B is an equivalent circuit diagram of the modified device. As is evident from FIG. 19B, the device is different from that of FIG. 17B, only in that a MOS transistor Q4 is added.

Figure 20A:
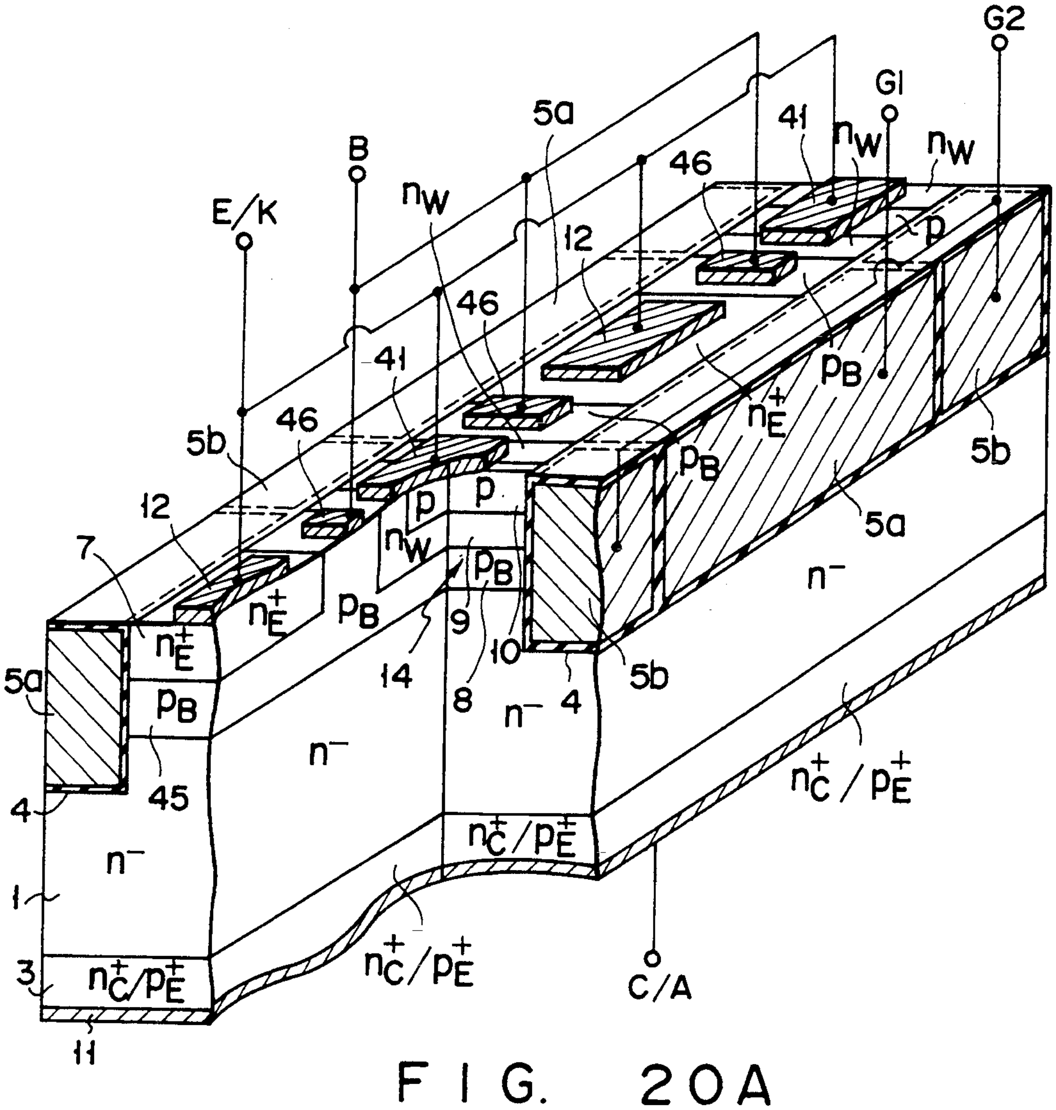
FIG. 20A is a perspective view of a modification of the insulated-gate thyristor/transistor shown in FIG. 18A.

FIG. 20A is a perspective view of a modification of the insulated-gate thyristor shown in FIG. 18A. This modified thyristor is characterized in that the main channel, the exposed portion of the p-type base layer 45, and the channel region of the vertical MOS transistor 14 for releasing holes are arranged in a line, so that the first insulated gate electrode 5*a* (G1) can control the main channel, and the second insulated gate electrode 5*b* (G2) can control the channel of the hole-releasing MOS transistor 14.

Figure 20B:
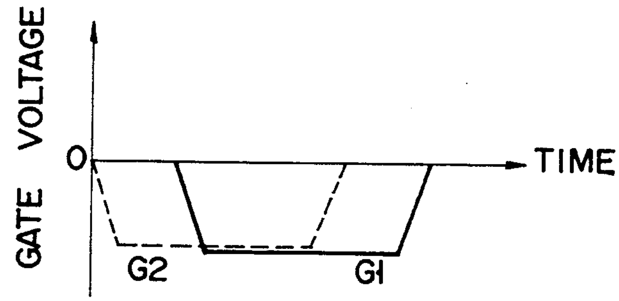
FIG. 20B is a timing chart explaining how the gates of the modified thyristor/transistor are driven when the thyristor is turned off.

To turn off this thyristor, the gates G1 and G2 are driven in a specific way, as will be described with reference to FIG. 20B. That is, as is shown in FIG. 20B, a negative voltage is applied to the gate electrode G2, thereby rendering the hole-releasing MOS transistor 14 conductive, and some time thereafter, a negative voltage is applied to the gate electrode G1, thus stopping the injection of electrons into the main channel. Hence, the injection of electrons into the main channel is efficiently suppressed when the thyristor is turned off. In other words, the thyristor has high turn-off efficiency.

FIG. 21A shows a modification of the thyristor shown in FIG. 19A. In this modified thyristor, the first insulated gate electrode 5*a* (G1) and the second insulated gate electrode 5*b* (G2) are driven in the way illustrated in FIG. 21B, controlling the main channel and the hole-releasing MOS transistor 14, respectively, when the modified thyristor is turned off. Like the thyristor of FIG. 19A, this thyristor has high turn-off efficiency.

Figure 22A:
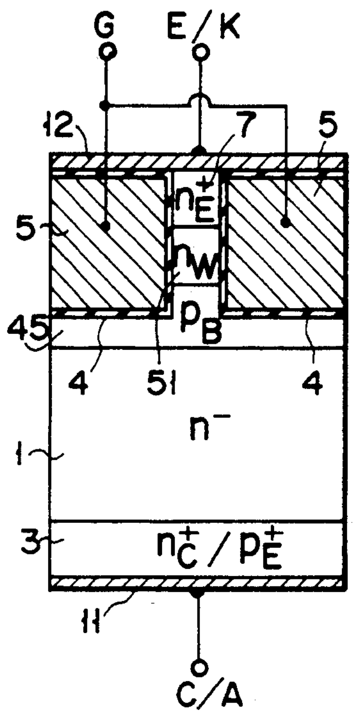
FIGS. 22A, 22B, and 22C are sectional views showing a modification of the thyristor/transistor shown in FIG. 13, which is characterized by a narrow channel, and also explaining how the modified thyristor/transistor is turned on and off.

FIG. 22A is a are sectional view showing a modification of the thyristor shown in FIG. 13A, which is characterized by a narrow channel having a width of, for example, 1 μm or less. As is shown in FIG. 22A, an n-type well layer 51 is interposed between the $n^{+}$-type cathode layer 7 and the p-type base layer 45. This n-type well layer 51 corresponds to the $n^{-}$-type channel layer 47 shown in FIG. 13A.

Figure 22B:
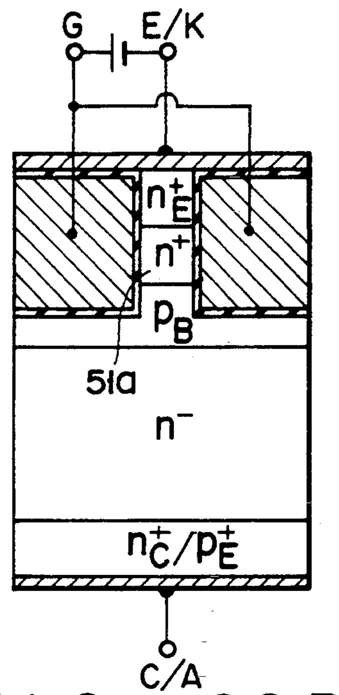

To turn on this thyristor, a voltage positive with respect to the cathode 12 is applied to both insulated gate electrodes 5. Then, as is shown in FIG. 22B, the n-type well layer 51 becomes a high-impurity $n^{+}$-type layer 51 accumulating electrons, whereby the cathode layer electrically contacts the p-type base layer 45. Hence, electrons are injected from the cathode 12 into the $n^{-}$-type base layer 1 with high efficiency.

Figure 22C:
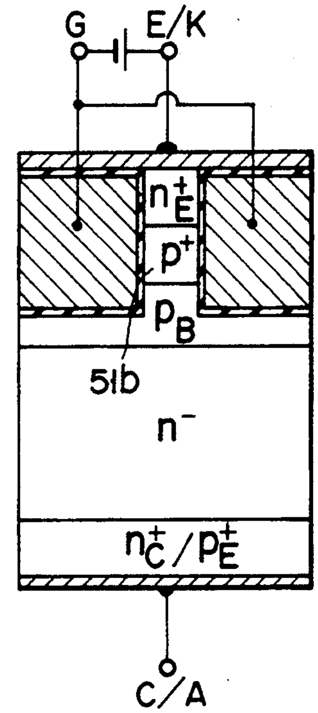

To turn off the thyristor, a voltage negative with respect to the cathode 12 is applied to both insulated gate electrodes 5. As a result, the n-type well layer 51 becomes a high-impurity $p^+$-type inversion layer 51*c* as is illustrated in FIG. 22C. The injection of electrons from the cathode 12 is thereby suppressed with high efficiency.

Figure 23A:
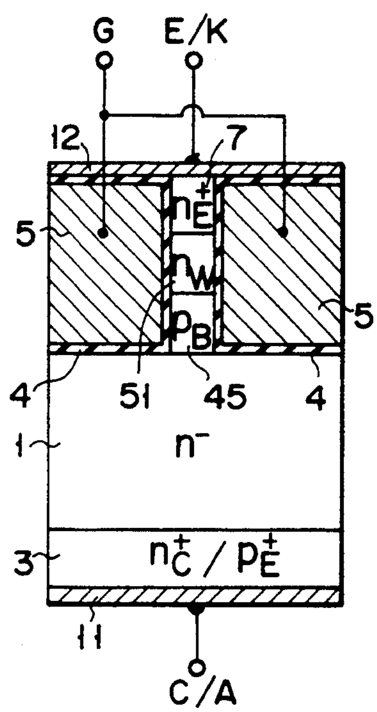
FIG. 23A is a sectional view illustrating a modification of the thyristor/transistor shown in FIG. 22A, which has two gates buried deeper.
Figure 23B:
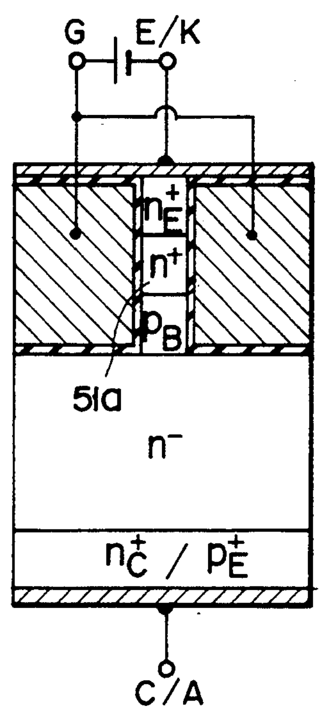
FIGS. 23B and 23C are sectional views of this modification, explaining how the modified thyristor/transistor is turned on and off.
Figure 23C:
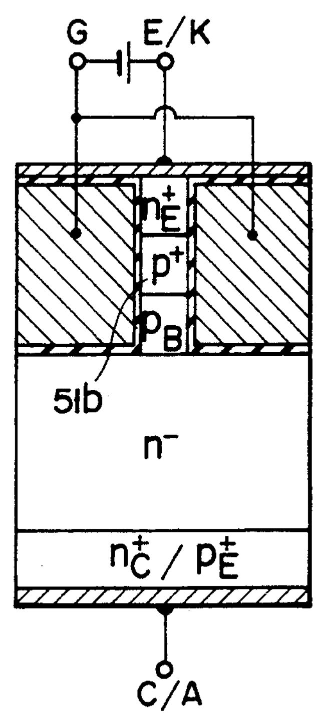

FIG. 23A is a sectional view showing a modification of the thyristor shown in FIG. 22A, which has two insulated gate electrodes buried deeper than in the thyristor of FIG. 22A. To be more specific, the insulated gate electrodes 5 almost reach the $n^-$-type base layer 1. This modified thyristor is turned on and off, exactly in the same way as the thyristor of FIG. 22A. That is, a positive voltage is applied to the gate electrodes 5 as is shown in FIG. 23B, whereby the thyristor is turned on; a negative voltage is applied to the electrodes 5 as is shown in FIG. 23C, whereby the thyristor is turned off. When a positive voltage is applied to both gate electrodes 5, an n-type channel is formed in the p-type base layer 45. Since this n-type channel extends along the electrodes 5, the modified thyristor can be turned on at higher speed than the thyristor shown in FIG. 22A.

In the embodiment of FIG. 23A, it is desirable that the grooves 4 and, hence, the gate electrodes 5 formed therein, extend almost to the pn junction between the $n^-$-type base layer 1 and the p-type base layer 45. If the electrodes 5 extended into the pn junction or deeper into the $n^-$-type base layer 1, that portion of the base layer 1 between the groove 4 would have an insufficient potential, impairing the operating characteristic of the thyristor.

Figure 24A:
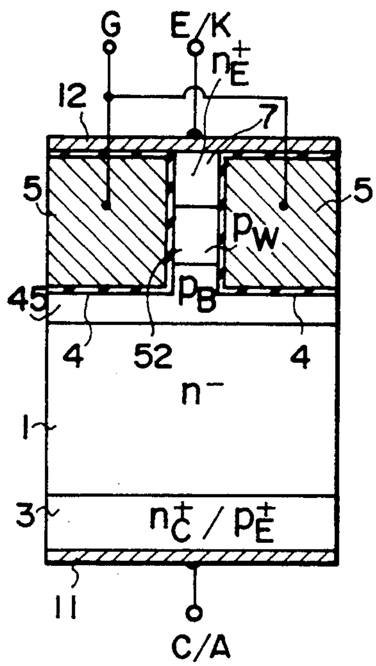
FIG. 24A is a sectional view showing another modification of the thyristor/transistor of FIG. 22A, one component of which has the conductivity type opposite to that of its equivalent of the thyristor shown in FIG. 22A, and FIGS. 24B and 24C are sectional views of this modified thyristor, explaining how the modified thyristor is turned on and off.
Figure 24B:
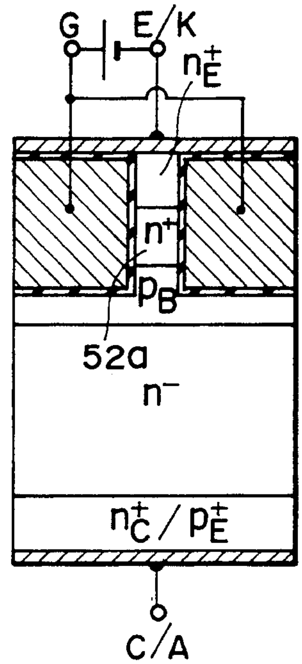
Figure 24C:
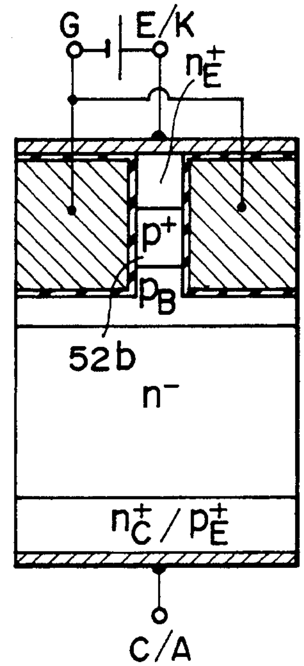

FIG. 24A shows a sectional view showing another modification of the thyristor of FIG. 22A. This modified thyristor has a p-type well layer 52 used in place of the n-type well layer 51 (FIG. 22A). To turn on this modified thyristor, a positive voltage is applied to the gate electrodes 5, thereby changing the p-type well layer 52 to an n-type inversion layer 52*a* as is illustrated in FIG. 24B. To turn off the thyristor, a negative voltage is applied to the gate electrodes 5, changing the p-type well layer 52 to an electron-accumulating p-type layer 52c, as is illustrated in FIG. 24C.

Figure 25A:
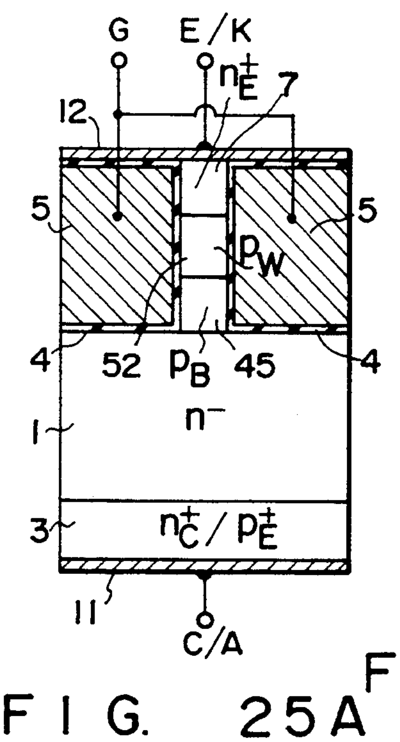
FIG. 25A is a sectional view showing a modification of the thyristor/transistor of FIG. 23A, one component of which has the conductivity type opposite to that of its equivalent of the thyristor/transistor shown in FIG. 23A, and FIGS. 25B and 25C are sectional views of this modified thyristor/transistor, explaining how the modified thyristor/transistor is turned on and off.
Figure 25B:
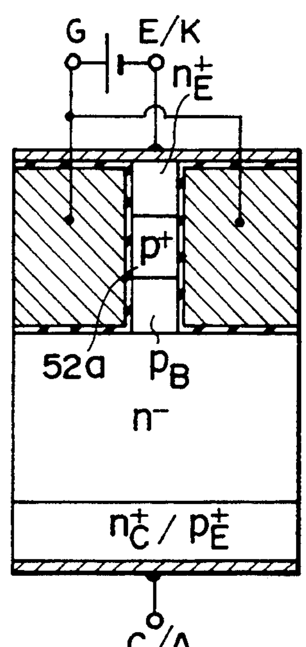
Figure 25C:
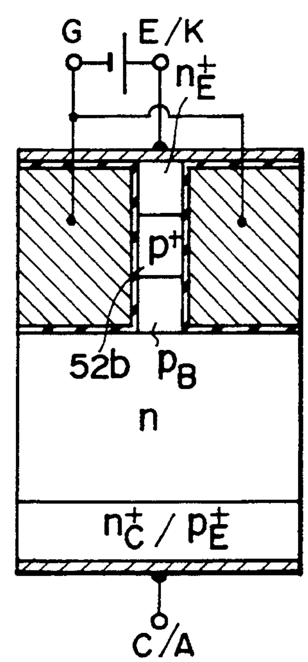

FIG. 25A shows a modification of the thyristor of FIG. 23A. This modified thyristor has a p-type well layer 52 used in place of the n-type well layer 51 (FIG. 23A). To turn on this modified thyristor, a positive voltage is applied to the gate electrodes 5, thereby changing the p-type well layer 52 to an n-type inversion layer 52*a* as is illustrated in FIG. 25B. To turn off the thyristor, a negative voltage is applied to the gate electrodes 5, changing the p-type well layer 52 to an electron-accumulating p-type layer 52*c*, as is illustrated in FIG. 25C.

Preferably, the embodiments shown in FIGS. 22A to 25A incorporate a vertical MOS transistor for releasing holes from the $n^-$-type base layer 1.

Figure 26A:
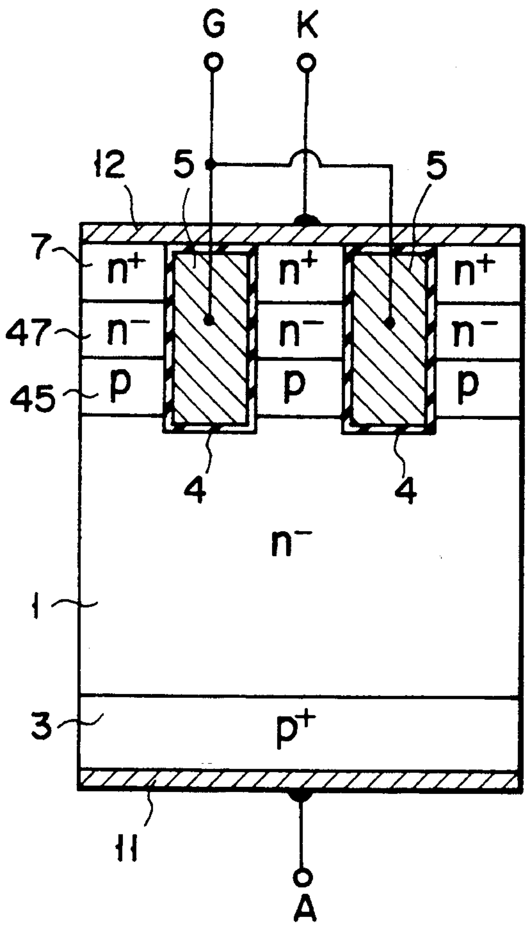
FIG. 26A is a sectional view showing another modification of the thyristor shown in FIG. 14, and 26B is an equivalent circuit diagram of the modification.
Figure 26B:
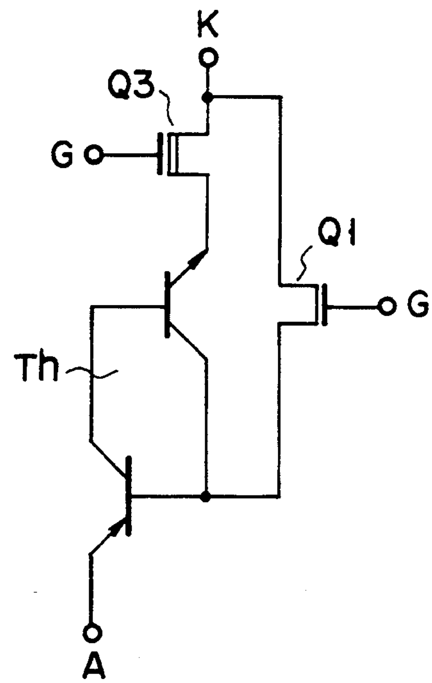

FIG. 26A shows another modification of the thyristor shown in FIG. 14, and 26B is an equivalent circuit diagram of the modification. As is shown in FIG. 26B, an E-type n-channel MOS transistor Q1 is connected in parallel to the npn transistor of the thyristor Th, and a D-type MOS transistor Q3 is connected in series to a cathode K. The MOS transistor Q1 has its n-channel formed of the p-type base layer 45. The MOS transistor Q3 has its n-channel formed of the $n^-$-type channel layer 47.

Figure 27A:
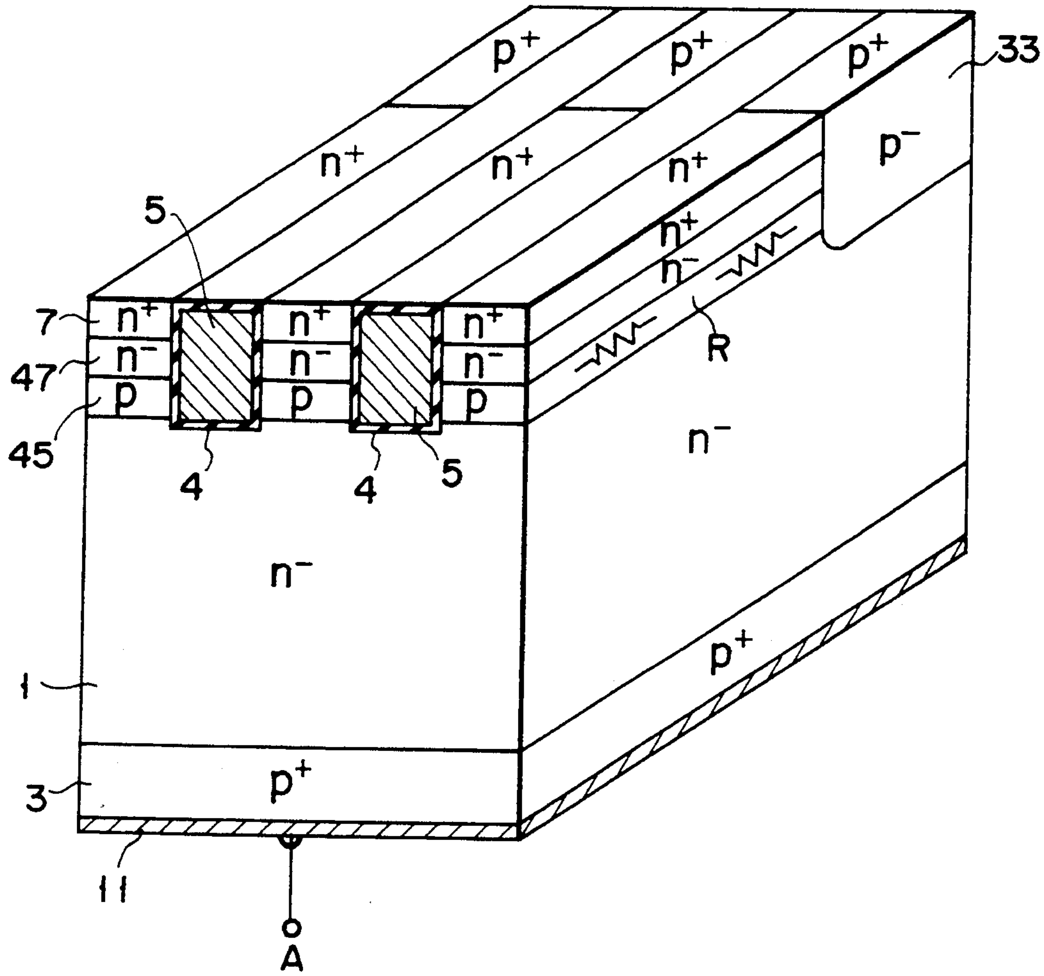
FIG. 27A is a perspective view of a thyristor identical to the thyristor of FIG. 26A, except that it has an addition layer.
Figure 27B:
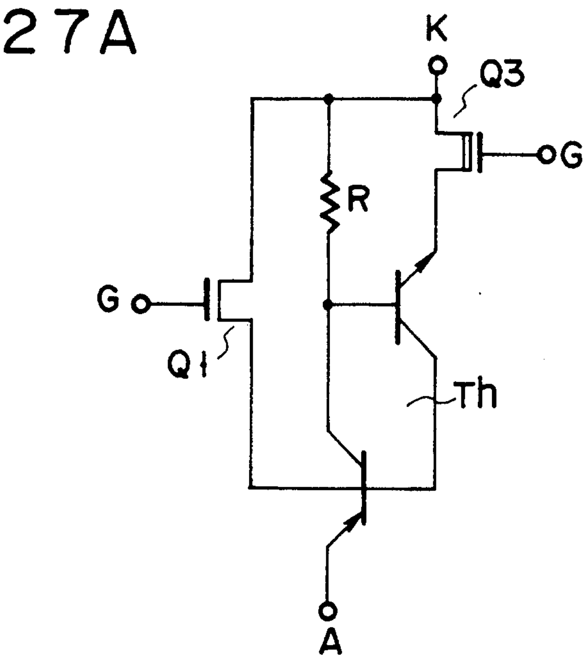
FIG. 27B is an equivalent circuit diagram of the thyristor shown in FIG. 27A.

FIG. 27A is a perspective view of a thyristor identical to the thyristor of FIG. 26A, except that it has a high-impurity $p^+$-type layer 33 for releasing holes from the $n^-$-type base layer 1. FIG. 27B is an equivalent circuit diagram showing this thyristor. As is evident from FIG. 27A, the layer 33 is connected to the rear ends of the stripe-shaped $n^+$-type cathode layers 7 and contacts the p-type base layer 45 and the $n^-$-type channel layer 47. A cathode (not shown) is formed on the $n^+$-type cathode layers 7 and also on the $p^+$-type layer 33.

As can be understood from FIG. 27B, the lateral resistance of the p-type base layer 45 form a resistor R which short-circuits the p-type base layer of the thyristor to the cathode (not shown). The resistance of the resistor R is reduced very much since hole-accumulating layers are formed and extend along the gates 5 when the thyristor is turned off. Thus, the holes are released at high speed.

Figure 28A:
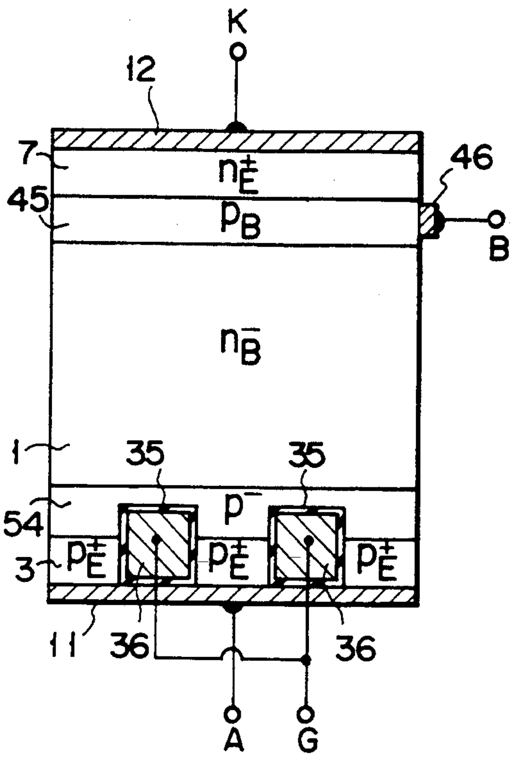
FIGS. 28A, 28B, and 28C are sectional views showing three insulated-gate thyristors, respectively, each having insulated gate electrodes in the anode-side surface.
Figure 28B:
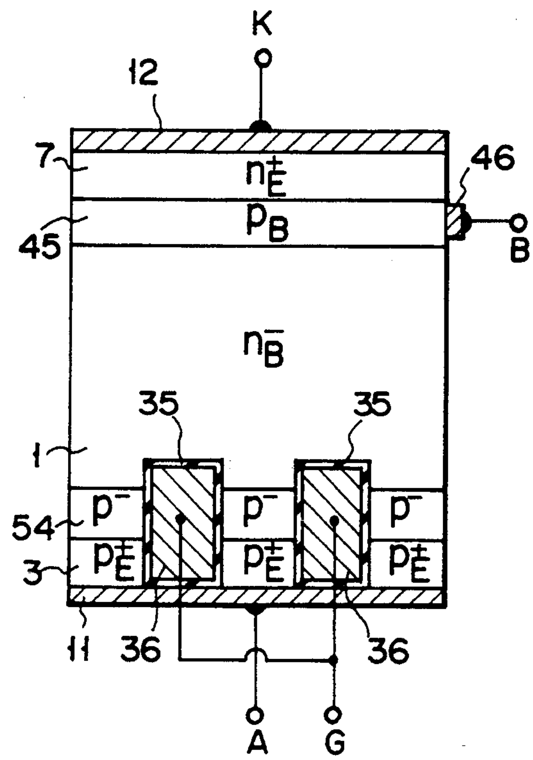
Figure 28C:
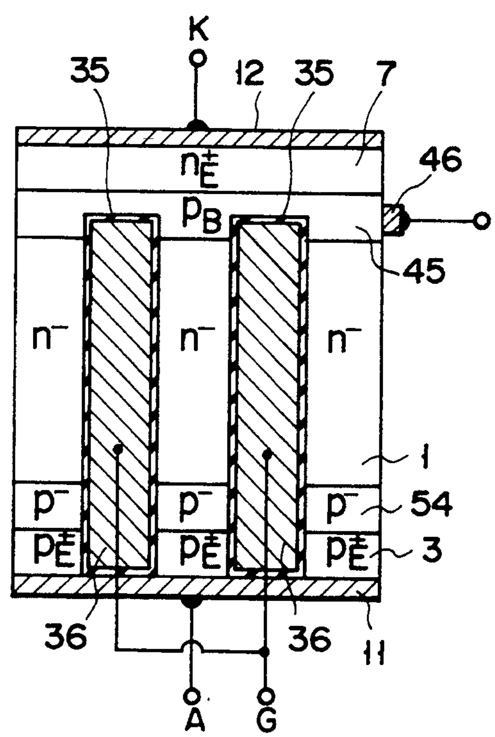

FIGS. 28A, 28B, and 28C are sectional views showing three insulated-gate thyristors, respectively, each having two insulated gate electrodes 36 in the anode-side surface, an $n^-$-type base layer 1, a $p^+$-type emitter layer 3, and a low-impurity p-type channel layer 54 interposed between the layers 1 and 3.

In the thyristor of FIG. 28A, two grooves 35 are formed, extending through the $p^+$-type emitter layer into the $p^-$-type channel layer 54, and the two insulated gate electrodes 36 are formed in these grooves 35, respectively. In the thyristor of FIG. 28B, two grooves 35 are formed, extending through the $p^+$-type emitter layer and the $p^-$-type channel layer 54, into the n-type base layer 1, and the two insulated gate electrodes 36 are formed in these grooves 35, respectively. In the thyristor of FIG. 28C, two grooves 35 are formed, extending through the $p^+$-type emitter layer, the $p^-$-type channel layer 54, the $n^-$-type base layer 1, into the n-type base layer 45 formed on the $n^-$-type base layer 1, and the two insulated gate electrodes 36 are formed in these grooves 35, respectively.

Figure 13:
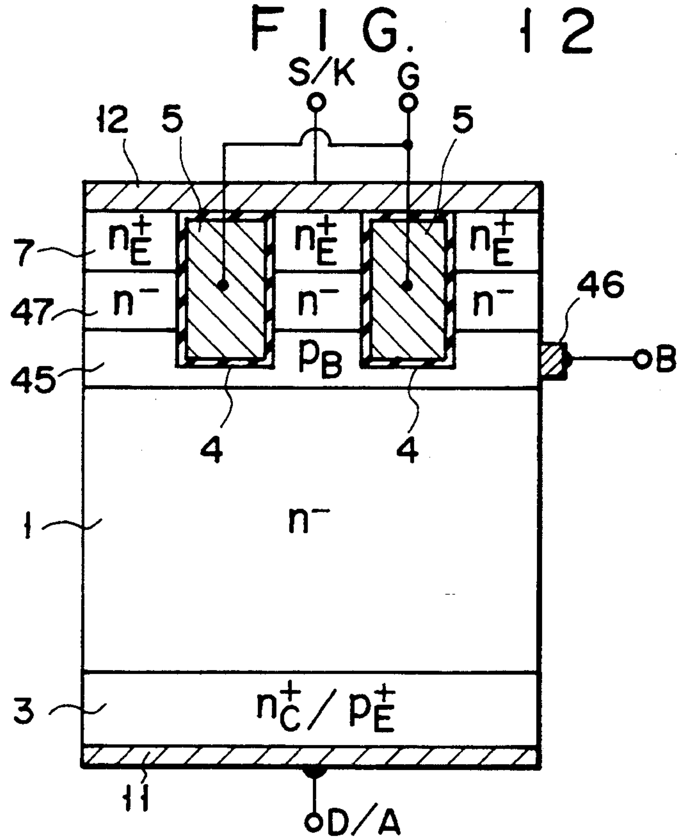

The thyristors shown in FIGS. 28A, 28B, and 28C can be turned on and off at high speed, for the same reason as in the thyristors of FIGS. 12 to 14.

FIG. 29A is a perspective view of the thyristor shown in FIG. 28A, and FIG. 29B is an equivalent circuit diagram of this thyristor. As is shown in FIG. 29A, a gate electrode 46 is formed on that portion of the p-type base layer 45 which is exposed and contacts the cathode layer 7, as in the thyristors shown in FIGS. 16A and 17A. As can be understood from FIG. 29B, a D-type p-channel MOS transistor Q5 is connected in series to the anode of the thyristor Th.

Figure 30:
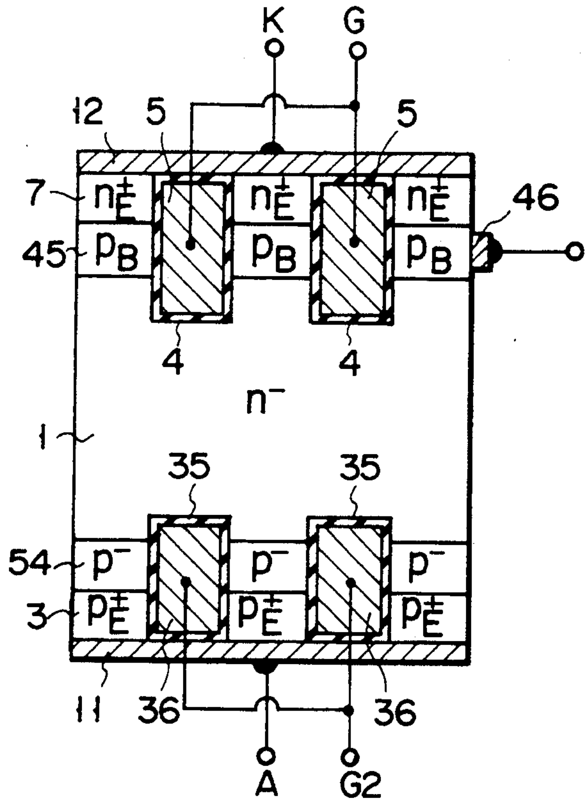
FIG. 30 shows an insulated-gate thyristor of the invention, which is identical to the thyristor of FIG. 10, except that two insulated gate electrodes are formed in the cathode-side surface, and two other insulated gate electrodes are formed in the anode-side surface.

FIG. 30 shows an insulated-gate thyristor, wherein two insulated gate electrodes 5 are formed in the cathode-side surface, and two other insulated gate electrodes 36 are formed in the anode-side surface. As is shown in FIG. 30, a gate electrode 46 is directly connected to a p-type base layer 45. The thyristor further comprises an $n^-$-type base layer 1, a $p^+$-type emitter layer 3, and a $p^-$-type channel layer 54 interposed between the layers 1 and 3.

Figure 31:
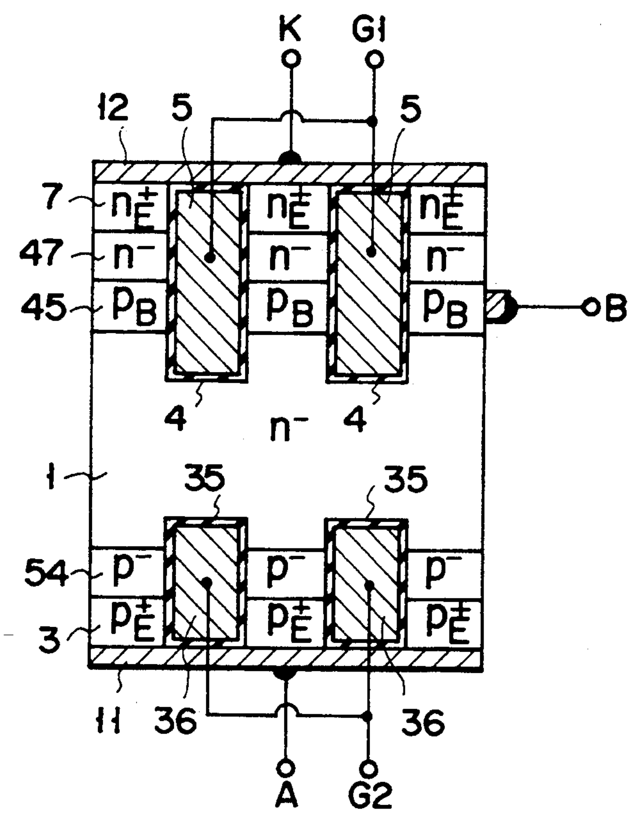
FIG. 31 shows a modification of the thyristor shown in FIG. 30.

FIG. 31 shows a modification of the thyristor shown in FIG. 30. The modified thyristor is different only in that an $n^-$-type channel layer 47 is interposed between the $n^+$-type emitter layer 7 and the p-type base layer 45.

In the thyristors of FIGS. 30 and FIG. 31, the injection of electrons from the cathode into the base layer 1, and also the injection of holes from the anode into the base layer 1 can be suppressed when the thyristors are turned off. Hence, both the thyristor of FIG. 30 and that of FIG. 31 can be turned off at high speed.

Figure 32A:
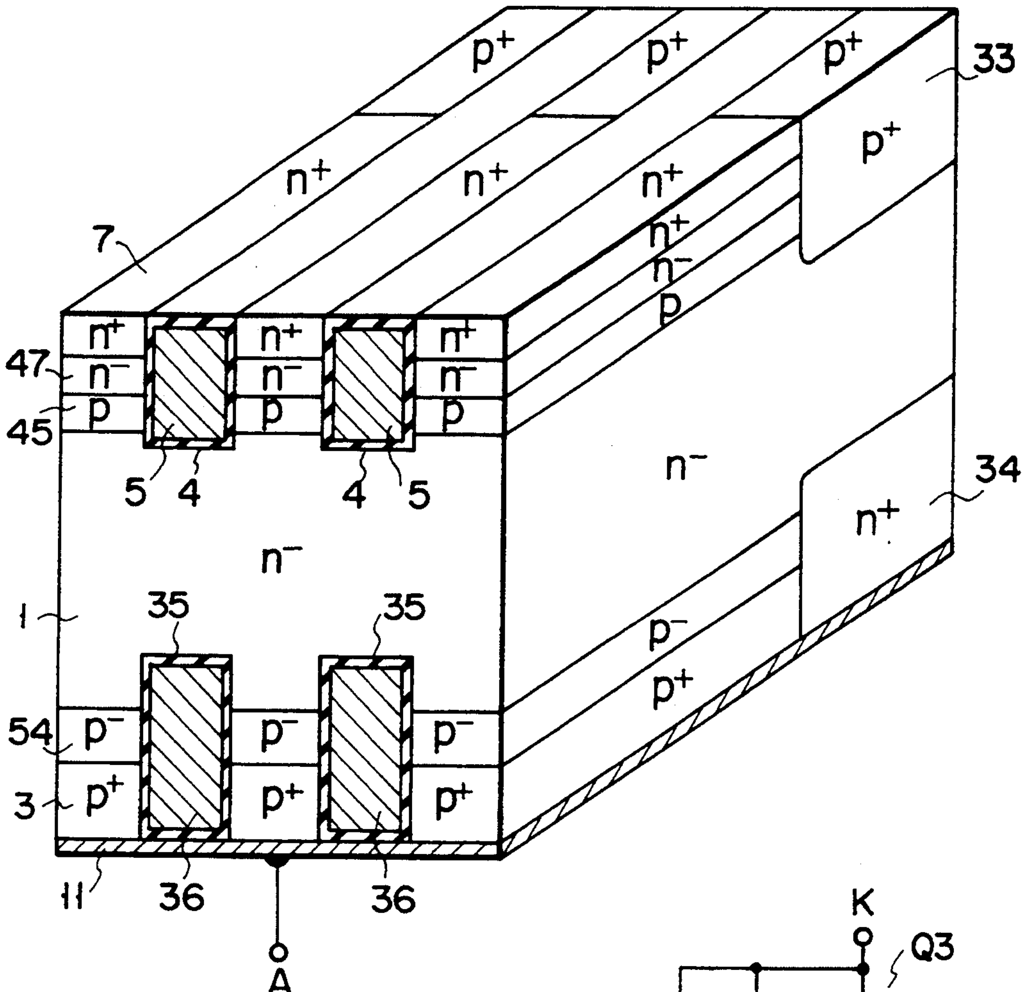
FIG. 32A is a perspective view of the thyristor shown in FIG. 31.
Figure 32B:
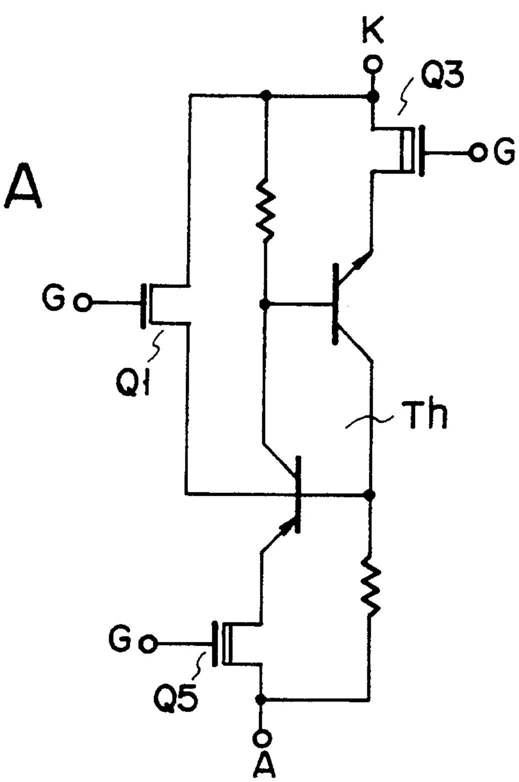
FIG. 32B is an equivalent circuit diagram thereof.

FIG. 32A is a perspective view of the thyristor shown in FIG. 31, and FIG. 32B is an equivalent circuit diagram thereof. As FIG. 32A shows, a p+-type base layer 33, which contacts the n−-type base layer 1, is connected to the rear ends of stripe-shaped n+-type emitter layers 7. A gate (not shown) is formed on the p+-type base layer 33. An n+-type layer 34 is formed in the anode-side surface. This layer 34 is connected to the rear ends of stripe-shaped p+-type emitter layers 3. The n+-type layer 34 short-circuits the n−-type base layer 1 to the anode 11.

Figure 33:
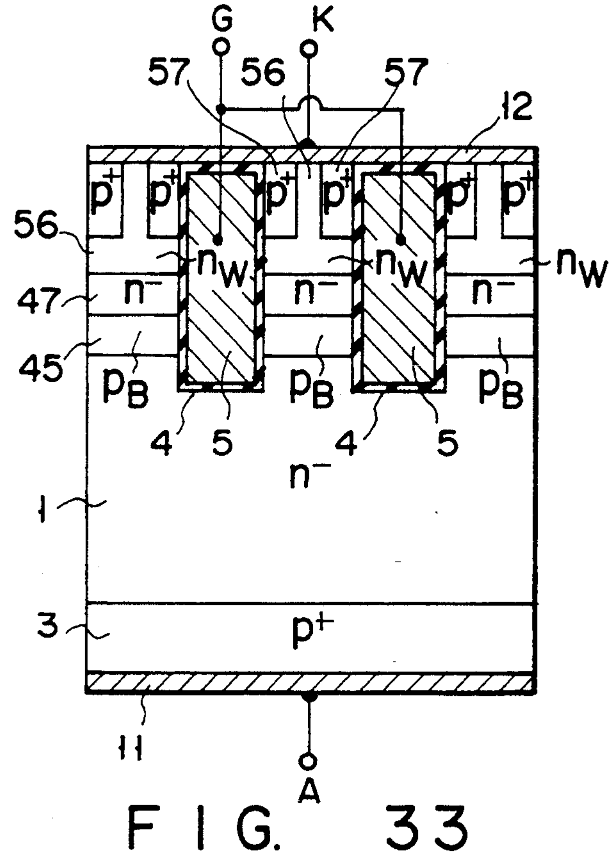
FIG. 33 is a sectional view showing a modification of the thyristor shown in FIG. 26A.

FIG. 33 shows an insulated-gate thyristor which is essentially the same in structure as the embodiment of FIG. 26A, but which is different in that a p-channel MOS transistor is formed in the cathode-side surface, for short-circuiting the emitter. More specifically, as is shown in FIG. 33, an n−-type channel layer 47 is formed on a p-type base layer 45, and an n-type well layer 56 (i.e.,, an n-type emitter layer) is formed on the n−-type channel layer 47. Two grooves 4 are formed, extending through the layers 56, 47 and 45, into a n−-type base layer 1. Two insulated gate electrodes 5 are formed in these grooves 4, respectively. P+-type drain layers 57 are formed in the n-type well layer 56, and extend along the insulated gate electrodes 5. A cathode 12 is connected to the n-type well layer 56 and also the p+-type drain layers 57.

To turn off this thyristor, a voltage negative with respect to the cathode 12 is applied to the insulated gate electrodes 5. Depletion layers develops along the electrodes 5, reaching the n−-type channel layer 47, and suppress the injection of electrons from the n-type well layer 45 into the n−-type base layer 1. Meanwhile, p-type channels develop in the n−-type channel 47 and the n-type well layer 56, extending along the gate electrodes 5. Holes are thereby released from the n−-type base layer 1 to the cathode 12. Hence, the thyristor is turned off at high speed.

Figure 34:
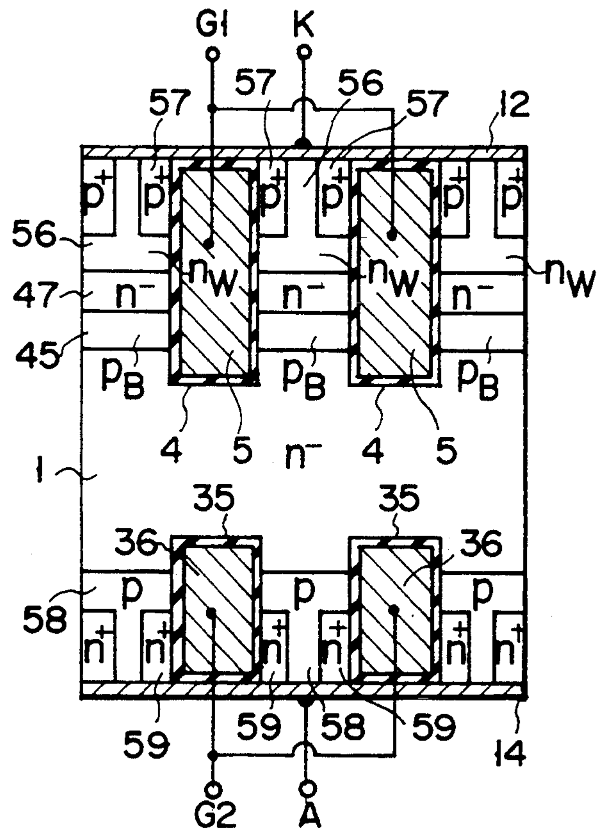
FIG. 34 is a sectional view of a modification of the thyristor shown in FIG. 33, which has two insulated gates formed in the cathode-side surface, and two other insulated gates formed in the anode-side surface.

FIG. 34 shows an insulated-gate thyristor which is essentially the same in structure as the embodiment of FIG. 33, but is different in two respects. First, two insulated gate electrodes 36 are formed not only in the cathode-side surface, but also in the anode-side surface. Second, an n-channel MOS transistor is formed not only in the cathode-side surface, but also in the anode-side surface, for short-circuiting the emitter. More specifically, as is shown in FIG. 33, a p-type well layer 58 (i.e., a p-type emitter layer) having a predetermined thickness is formed on the lower surface of an n−-type base layer 1. Two grooves 35 are formed in the p-type well layer 58, extending into the n−-type base layer 1. The two insulated gate electrodes 36 are formed in these grooves 35, respectively. N+-type drain layers 59 are formed in the p-type well layer 58, and extend along the insulated gate electrodes 36. An anode 14 is connected to the p-type well layer 58 and also the n+-type drain layers 59.

To turn off this thyristor, it is desirable that a voltage positive with respect to the anode 14 be applied to the insulated gate electrodes 36. N-type channels are thereby formed in the p-type well layer 58, which extend along the insulated gate electrodes 36. These n-type channels short-circuit the n−-type base layer 1 to the anode 14, suppressing the injection of holes from the anode 14 into the base layer 1. Then, a voltage negative with respect to the cathode 12 is applied to the insulated gate electrodes 5 formed in the cathode-side surface. As a result, the injection of electrons from the cathode 12 into the base layer 1 is suppressed, and holes are released from the base layer 1 to the cathode 12. The thyristor shown in FIG. 34 can, therefore, be turned off at high speed.

FIG. 35 is a perspective view showing a modification of the thyristor shown in FIG. 33. As is evident from FIG. 35, a plurality of p+-type drain layers 57 are formed in the n-type well layer 56, arranged along each of the stripe-shaped insulated gate electrodes 5, and spaced apart from one another. Hence, three p+-type drain layers 57 are seen in one vertical cross section of the thyristor, and are not seen in another vertical cross section of the thyristor, though both the n-type well layer 56 and the p-type drain layers 57 are shown in FIG. 33.

Figure 36:
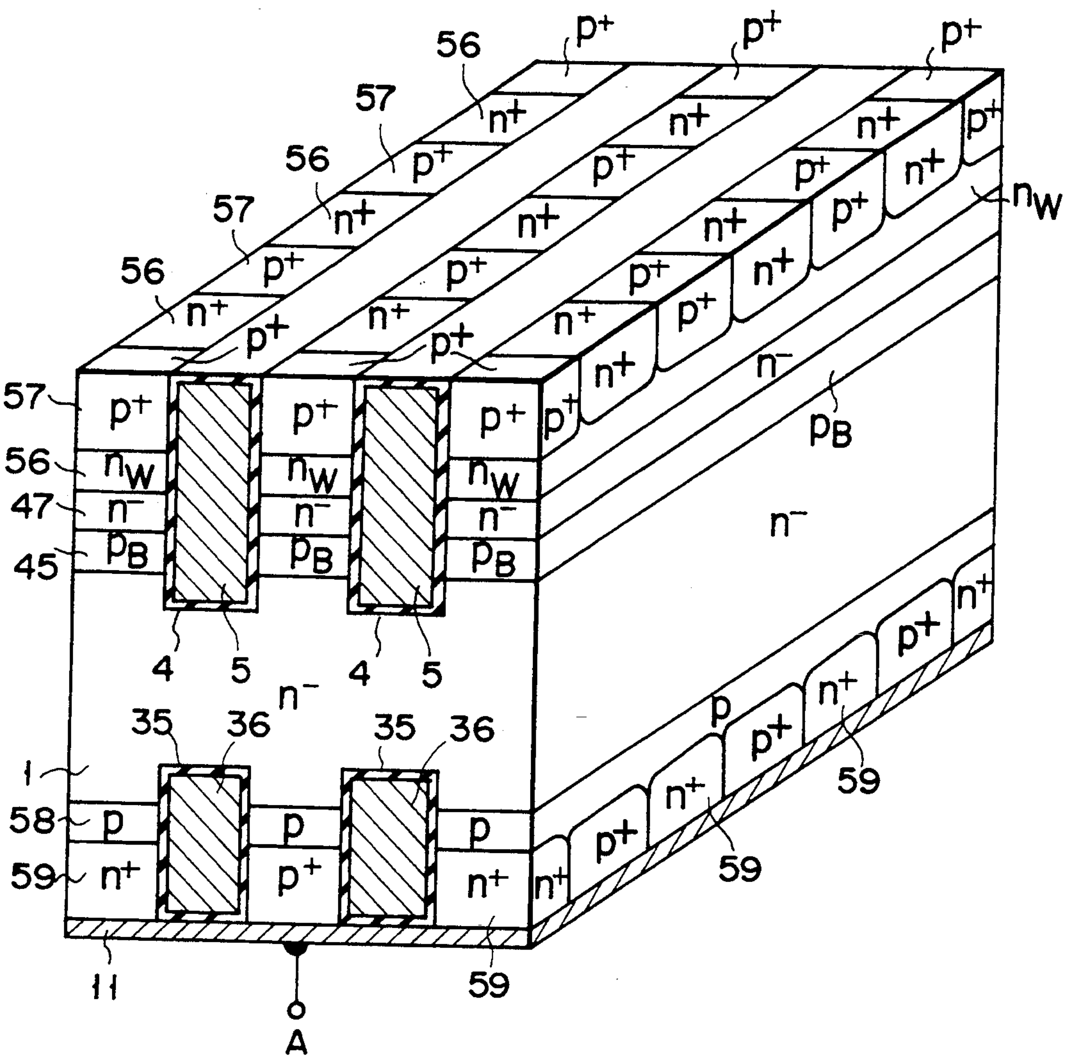
FIG. 36 is a perspective view showing a modification of the insulated-gate thyristor shown in FIG. 34.

FIG. 36 is a perspective view showing a modification of the thyristor shown in FIG. 34. As is evident from FIG. 36, a plurality of p+-type drain layers 57 are formed in the n-type well layer 56, arranged along 7each of the stripe-shaped insulated gate electrodes 5, and spaced apart from one another. Also, a plurality of n+-type drain layers 59 are formed in the p-type well layer 58, arranged along each of the stripe-shaped insulated gate electrodes 36, and spaced apart from one another.

In both thyristors shown in FIGS. 35 and 36, each drain layer interposed between the insulated gate electrodes can be used, in its entirety, as a drain region. Hence, the grooves 4 and 35 can be made narrower than in the embodiments of FIGS. 33 and 34. Therefore, a longer depletion layer is developed by each insulated gate electrode when either thyristor is turned off, whereby the injection of carriers is suppressed more effectively than in the embodiments of FIGS. 33 and 34. As a result, the thyristors of FIGS. 35 and 36 can be turned off at higher speed than those shown in FIGS. 33 and 34, respectively.

Figure 37A:
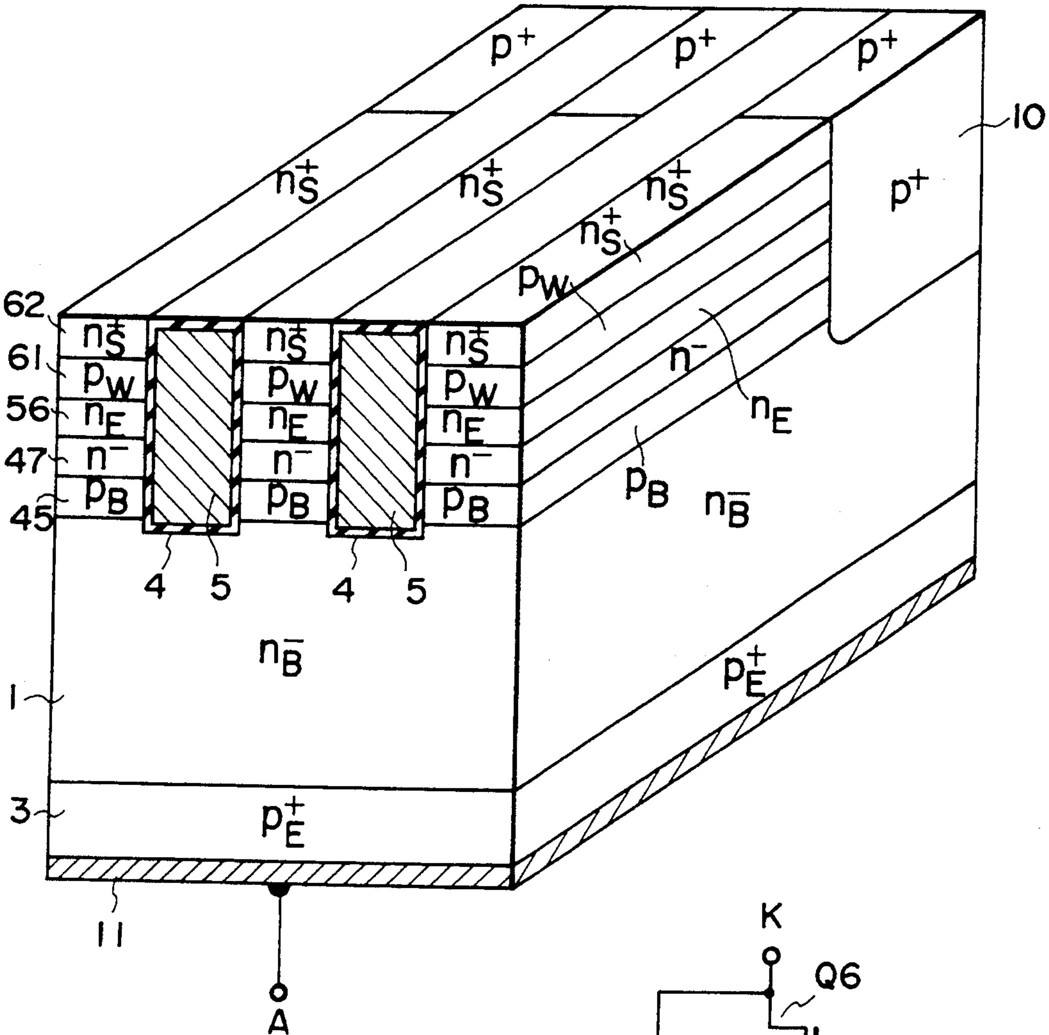
FIG. 37A is a perspective view showing a modification of the thyristor shown in FIG. 27A.
Figure 37B:
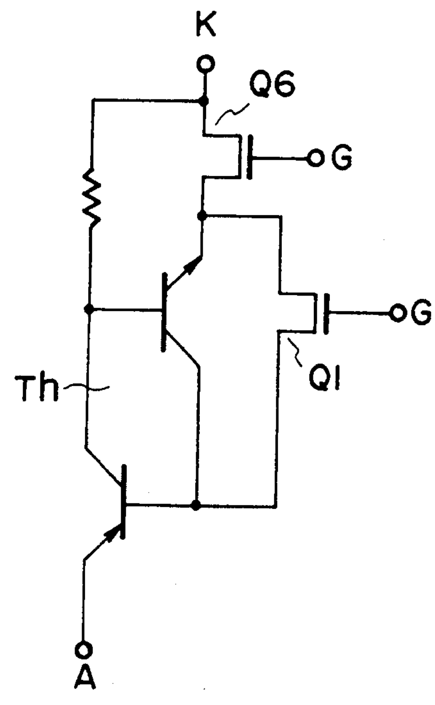
FIG. 37B is an equivalent circuit diagram of this modified thyristor

FIG. 37A is a perspective view showing a modification of the thyristor shown in FIG. 27A, and FIG. 37B is an equivalent circuit diagram of this modified thyristor. This modified thyristor is characterized in that a vertical n-channel MOS transistor is formed in the cathode-side surface. As FIG. 37A shows, an n−-type channel layer 47 is formed on a p-type base layer 45, and an n-type well layer 56 is formed on the channel layer 47. Further, a p-type well layer 61 is formed on the n-type well layer 56, and an n+-type source layer 62 is formed on the p-type well layer 61. Two grooves 4 are formed, extending through these layers 62, 61, 56, 47 and 45, reaching an n−-type base layer 1. Two insulated gate electrodes 5 are formed in these grooves 4, respectively. Hence, as can be understood from the equivalent circuit diagram of FIG. 37B, an n-channel MOS transistor Q6, the channel region of which develops in the p-type well layer 61 and extends along the groove 4, is connected in series to the cathode K of the thyristor. The thyristor of FIG. 37A has a thick p+-type layer 10 which contacts the n−-type base layer 1 and is connected to the rear ends of the stripe-shaped cathode regions.

To turn on the thyristor of FIG. 37A, a voltage positive with respect to the cathode (not shown) is applied to the insulated gate electrodes 5. N-type channels are thereby formed in the p-type well layer 61 and the p-type base layer 45, all n-type channels extending along the insulated gate electrodes 5. Hence, electrons move from the $n^+$-type source layer 62 through these n-channels into the $n^-$-type base layer 1. At the same time, holes move from the $p^+$-type emitter layer 3 into the $n^-$-type base layer 1. As a result, the thyristor is turned on at high speed.

To turn off the thyristor, a voltage negative with respect to the cathode 11 is applied to the insulated gate electrodes 5. The n-type channels are no longer formed anywhere in the thyristor, and electrons stop moving from the $n^+$-type source layer 62 into the base layer 1. Also, a depletion layer develops in the $n^-$-type channel layer 47, suppressing the injection of electrons from the cathode into the base layer 1. Meanwhile, holes are released from the $n^-$-type base layer 1 to the cathode through the $p^+$-type layer 10 through the hole-accumulating layer formed in the p-type base layer 45 and the $n^-$-type channel layer 47 and extending along the insulated gate electrodes 5. As a result, the thyristor is turned off.

The injection of electrons from the cathode into the base layer 1 is efficiently promoted by the MOS transistor connected in series to the cathode, and is efficiently suppressed by a depletion layer developed in the $n^-$-type channel layer 47. Therefore, the thyristor has high turn-off efficiency.

Figure 38A:
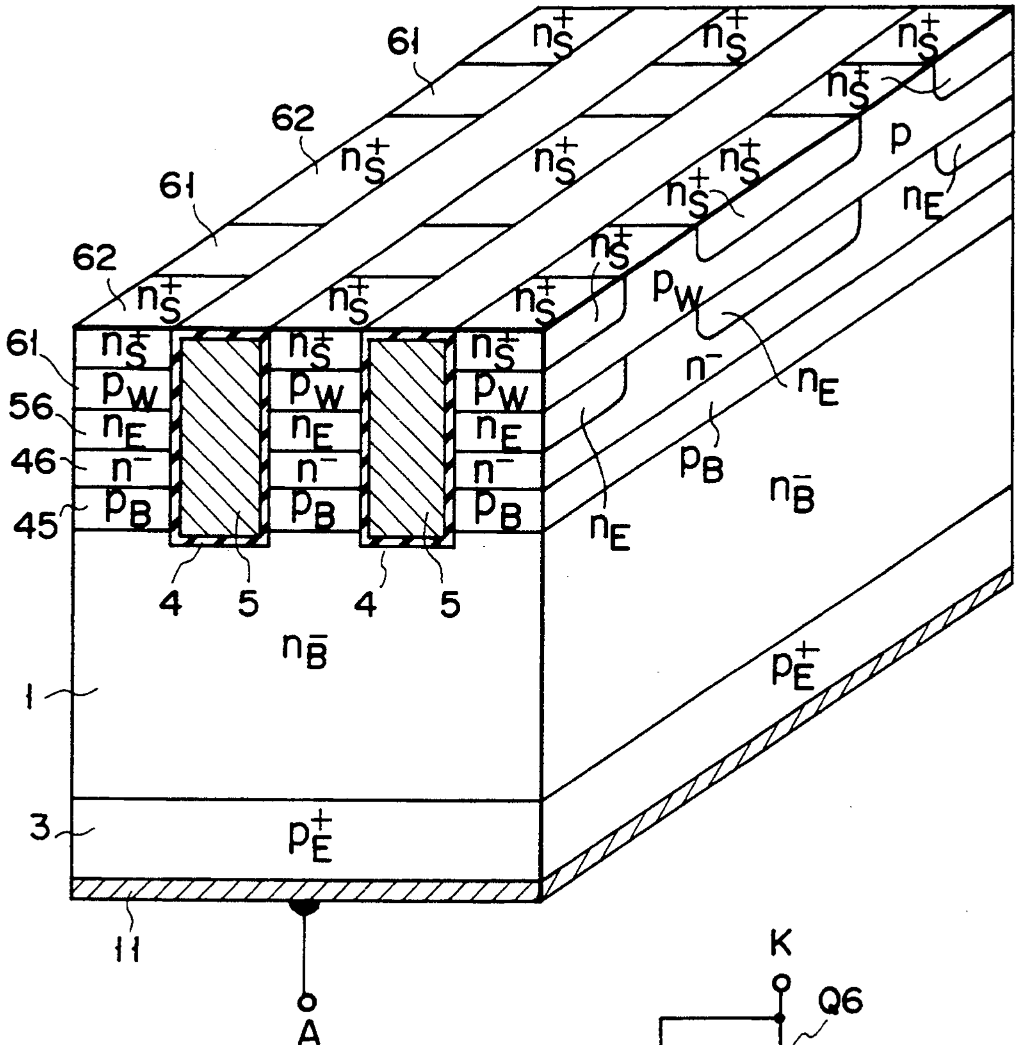
FIG. 38A is a perspective view showing a modification of the thyristor shown in FIG. 37A.
Figure 38B:
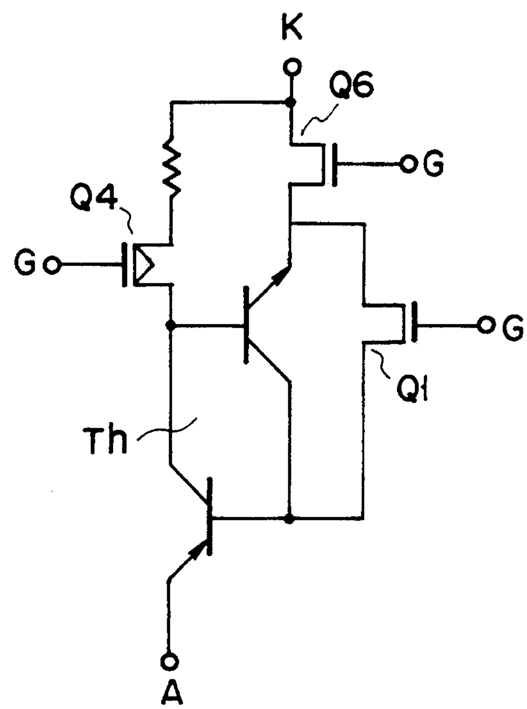
FIG. 38B is an equivalent circuit diagram of this modified thyristor.

FIG. 38A is a perspective view showing a modification of the thyristor shown in FIG. 37A, and FIG. 38B is an equivalent circuit diagram of the modified thyristor. As is shown in FIG. 38A, a plurality of $n^+$-type source layers 62 are spaced apart and arranged along stripe-shaped buried gate electrodes 5. P-type well layers 61 are exposed at the cathode-side surface. A cathode (not shown) contacts not only the $n^+$-type source layers 62, but also the p-type well layers 61. The thyristor of FIG. 38A has no element equivalent to the $p^+$-type layer 10 incorporated in the thyristor of FIG. 37A for releasing holes.

As can be understood from FIG. 38B, an n-channel MOS transistor Q6 is connected in series to the cathode K of the thyristor, and a p-channel MOS transistor Q4 is connected between the cathode K and a p-type base layer. The MOS transistor Q4 is connected to the cathode K by the p-type well layers 61 functioning as a resistor. The channel of the MOS transistor Q4 is 7formed of an n-type well layer 56 and an $n^-$-type channel layer 46.

In the thyristor of FIGS. 38A and 38B, the p-channel MOS transistor Q4 serves to release holes from the $n^-$-type base layer 1 when the thyristor is turned off. This thyristor is different from the embodiments described above, in that there are no passage for holes to move from the $n^-$-type base layer 1 directly to the cathode. Hence, the thyristor has high turn-off efficiency, not at the expense of its good turn-on characteristic.

FIG. 39A shows a modification of the thyristor shown in FIG. 38A, and FIG. 39B is an equivalent circuit diagram of the modified thyristor. In the modified thyristor, each buried insulated gate electrode is split into a plurality of gate electrodes. These gate electrodes are spaced apart in the lengthwise direction, and the layers sandwiched between any two adjacent gate electrodes form a p-channel MOS transistor 14 which have the same structure as the thyristor shown in FIG. 1.

This embodiment is also an insulated-gate thyristor which has high turn-off efficiency, not at the expense of its good turn-on characteristic. In addition, the p-channel MOS transistors 14 can have a desired threshold voltage set independently of the threshold voltage of the thyristor body. This is because the diffusion layers forming the p-channel MOS transistors 14, each used to release holes, are different from those forming the thyristor body.

FIG. 40A shows a modified thyristor which is a combination of the thyristors shown in FIGS. 32A and 37A, and FIG. 40B is an equivalent circuit diagram of the modified thyristor. More precisely, this thyristor is characterized in three respects. First, a $p^-$-type channel layer 54 and two insulated electrodes 36 are formed also in the anode-side surface. Second, a $p^+$-type layer 33 for short-circuiting the emitter is formed in the cathode-side surface and contacting the rear ends of the stripe-shaped gate electrodes 5. Third, an $n^+$-type layer 34 for achieving short-circuiting the emitter is formed in the anode-side surface and contacting the rear ends of the stripe-shaped gate electrodes 36.

As can be understood from the equivalent circuit diagram of FIG. 40B, a vertical MOS transistors Q6 suppresses the injection of electrons from the cathode, and a vertical MOS transistor Q5 suppresses the injection of holes from the anode 11, when the thyristor is turned off. Obviously, this thyristor has high turn-off efficiency, too.

Figure 41A:
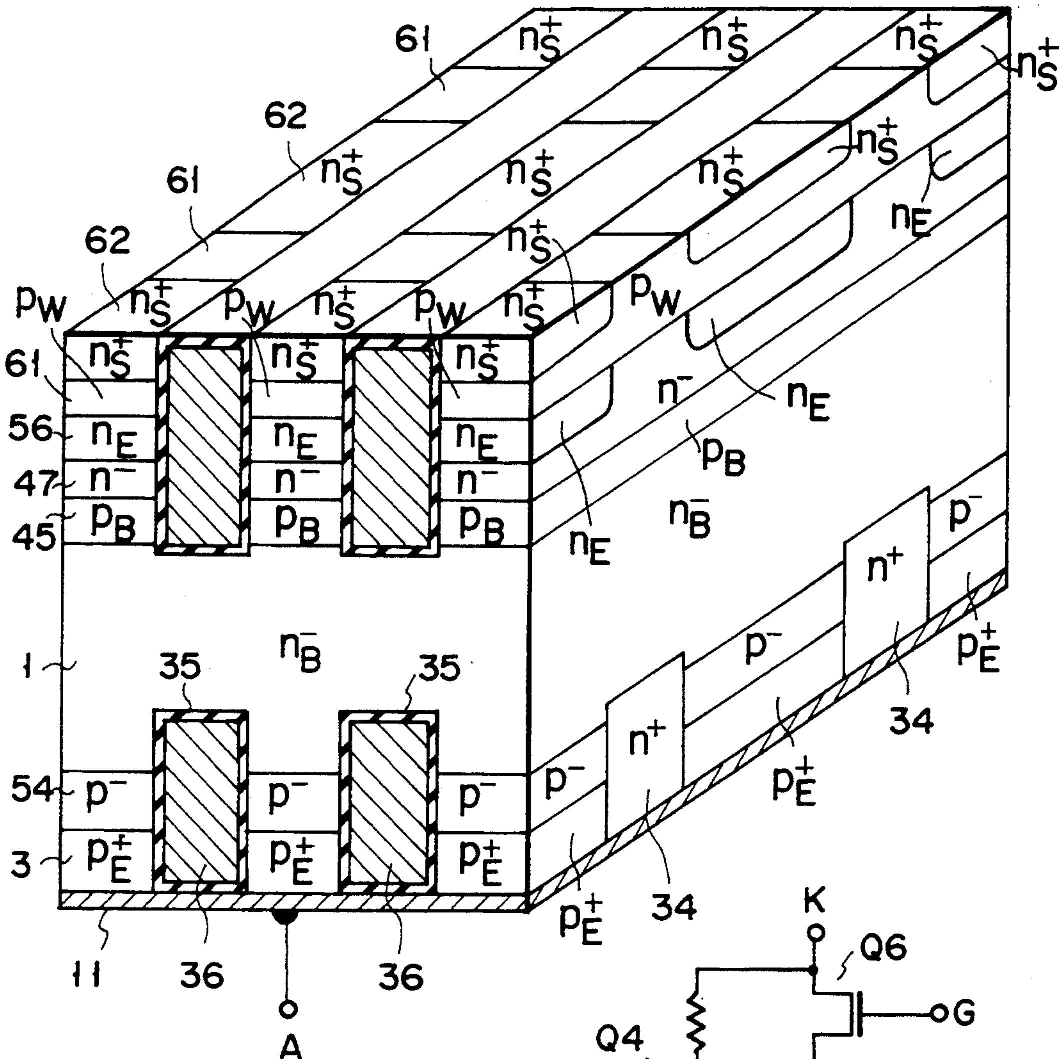
FIG. 41A is a perspective view showing a modification of the insulated-gate thyristor shown in FIG. 40A.
Figure 41B:
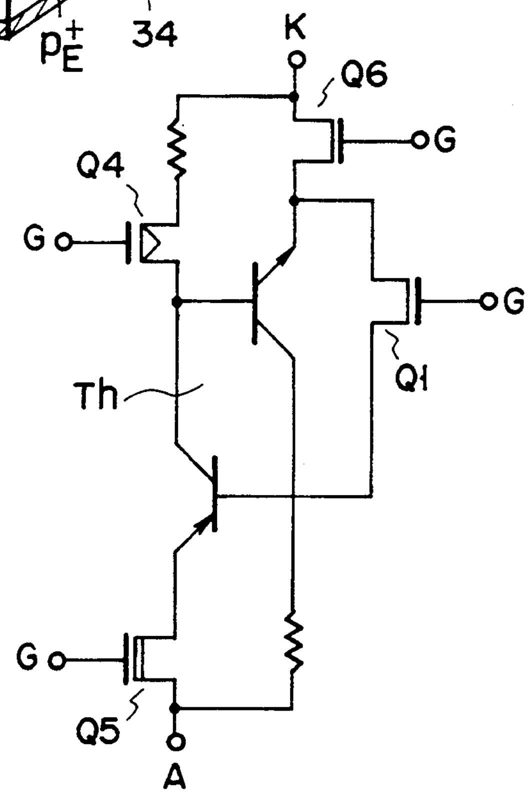
FIG. 41B is an equivalent circuit of the thyristor shown in FIG. 41A.

FIG. 41A shows another insulated-gate thyristor whose cathode section is identical to that of the thyristor shown in FIG. 38A, and whose anode section is identical to that of the thyristor shown in FIG. 40A, and FIG. 41B is an equivalent circuit of the thyristor shown in FIG. 41A. As is evident from FIG. 41B, a vertical MOS transistors Q6 suppresses the injection of electrons from the cathode, and a vertical MOS transistor Q5 suppresses the injection of holes from the anode 11, when the thyristor is turned off. Hence, the thyristor has high turn-off efficiency. In addition, it does not have its good turn-on characteristic degraded, since there are no passage for holes to move from the $n^-$-type base layer 1 directly to the cathode.

Figure 42A:
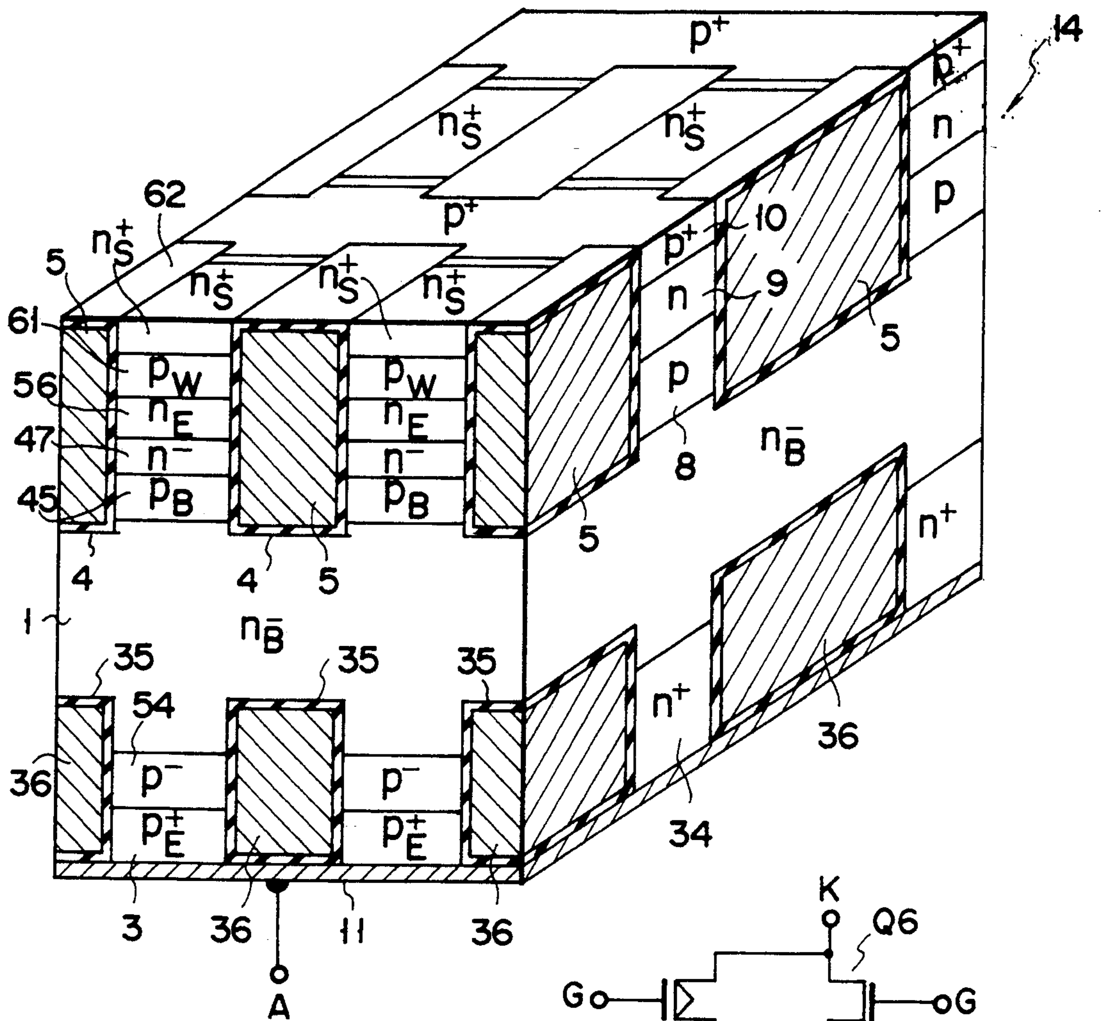
FIG. 42A is a perspective view showing an insulated-gate thyristor which is a combination of those shown in FIGS. 39A and 40A.
Figure 42B:
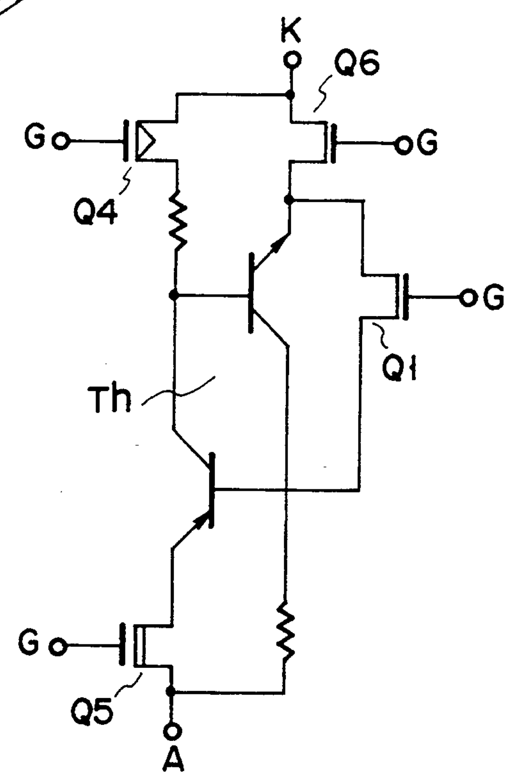
FIG. 42B is an equivalent circuit diagram of the thyristor shown in FIG. 42A.

FIG. 42A shows an insulated-gate thyristor which is a combination of those shown in FIGS. 39A and 40A, and FIG. 42B is an equivalent circuit diagram of the thirstier shown in FIG. 42A. As is evident from FIG. 42B, a vertical MOS transistors Q6 suppresses the injection of electrons from the cathode, and a vertical MOS transistor Q5 suppresses the injection of holes from the anode 11, when the thyristor is turned off. Hence, the thyristor has high turn-off efficiency. In addition, it does not have its good turn-on characteristic degraded, since there are no passage for holes to move from the $n^-$-type base layer 1 directly to the cathode. Moreover, the p-channel MOS transistors 14 can have a desired threshold voltage set independently of the threshold voltage of the thyristor body. This is because the the diffusion layers forming the p-channel MOS transistors 14, each used to release holes, are different from those forming the thyristor body.

In the embodiments of the invention, shown in FIG. 1 through FIG. 42A, the distance between the insulated gate electrodes, and the impurity concentration of any region interposed between the gate electrodes are set to the best possible values, on the basis of the way depletion layers extend in this region, along the insulated gate electrodes. The width of the depletion layers is proportional to the bias applied to the gate electrodes, provided the bias is relatively low so that the inversion layer has a negligibly small number of minor carriers. In the case where the bias is high, and the inversion layer has a great number of minor carriers, the width of the depletion layer has a saturated value. The lower the impurity concentration of the channel layers, the greater the saturated value. For example, when the channel layers have an impurity concentration of $5\times10^{13}/cm^3$ or less, the saturated width of the depletion layer increases by 5 μm or more. Hence, when the grooves are formed by reactive ion etching and, hence, spaced apart for a short distance, any region between the insulated gate electrodes can be depleted completely, making it easy to prevent carriers from moving from the cathode or anode into the base layer.

Insulated-gate thyristors according to the invention, which are generally called "emitter switched thyristors (ESTs)," will now be described.

Figure 43:
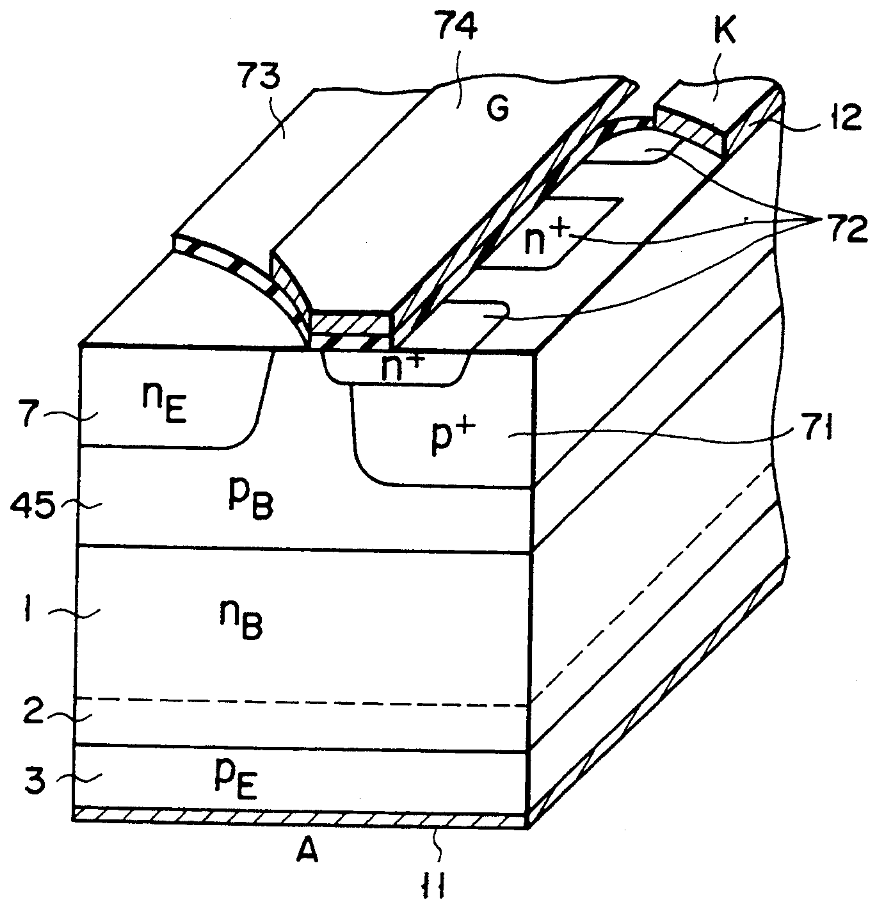
FIG. 43 is a perspective view showing an insulated-gate thyristor according to the invention, which has a flat gate electrode.

FIG. 43 shows the basic structure of an EST according to the invention. As this figure shows, the EST comprises an n-type base layer 1, an n-type buffer layer 2 formed on the lower surface of the n-type base layer 1, a p-type emitter layer 3 is formed on the buffer layer 2, a p-type base layer 45 formed on the upper surface of the n-type base layer 1, and a stripe-shaped n-type emitter layer 7 is formed in the upper surface of the p-type base layer 45. The EST further comprises a stripe-shaped high-impurity $p^+$-type well layer 71, a plurality of n-type source layers 72, an gate-insulating film 73, and a first gate electrode 74. The $p^+$-type layer 71 is formed in the upper surface of the p-type base layer 45 and extends along the stripe-shaped n-type emitter layer 7. The layer 71 is provided to release holes. The n-type source layers 72 are formed partly in the surface of the p-type base layer 45 and partly in the surface of the $p^+$-type layer 71. The gate-insulating film 73 is formed on the base layer 45, the emitter layer 7, part of the $p^+$-type layer 71, and part of each source layer 72. The first gate electrode 74 is formed on the film 73. The EST has an anode 11 formed on the lower surface of the p-type emitter layer 3, and a cathode 12 formed on the $p^+$-type layer 71 and part of each n-type source layer 72.

As is shown in FIG. 43, the n-type source layers 72, which are formed mostly in an edge portion of the $p^+$-type layer 71, are spaced apart and arranged in the lengthwise direction of the stripe-shaped $p^+$-type layer 71. In this respect, the EST shown in FIG. 43 is different from the conventional EST.

The EST of FIG. 43 has a second gate electrode (not shown) to which a bias needs to be applied in order to turn on the EST. The second gate electrode is formed on the gate-insulating film (not shown, either) formed on that region of the p-type base layer 45 which is interposed between the n-type base layer 1 and the n-type emitter layer 7. The other ESTs of the invention, which will later be described, also has a similar second gate electrode.

To turn on the EST shown in FIG. 43, a bias is applied to the second gate electrode (not shown), and a voltage positive with respect to the cathode 12 is applied to the gate electrode 74, thereby injecting electrons from the n-type emitter layer 7 into the n-type base layer 1. As a result, an n-type inversion channel is formed between the layer 7 and the n-type source layer 72. Hence, the n-type emitter layer 7 is electrically connected to the cathode 12 by the n-type inversion channel and the n-type source layers 72.

To turn off the EST of FIG. 43, no voltage or a negative voltage is applied to the gate electrode 74, whereby an n-type channel is no longer formed between the layer 7 and the layer 72. The n-type emitter layer 7 is thereby electrically disconnected from the n-type source layers 72. Hence, electrons stop moving from the cathode 12 into the n-type base layer 1, whereby the EST is turned off at high speed.

The n-type source layer 72, the p-type base layer 45, the n-type base layer 1 and p-type emitter layer 3 form a parasitic thyristor. The parasitic thyristor acts against the release of holes from the n-type base layer 1 to the cathode 12 while the EST is being turned off. Were the n-type source layers 72 connected together, forming a single stripe-shaped source layer extending along the n-type layer 71, electrons would keep moving from the n-type source layer 72 even after the n-type emitter layer 7 is electrically disconnected from the n-type source layer 72. In this case, the EST would have low turn-off efficiency. In the EST, the layers 72 are spaced apart from one another, and help to suppress the injection of electrons from the layers 72, making the parasitic thyristor inactive. The EST therefore has high turn-off efficiency.

FIGS. 44A, 44B, 45A, 45B, 46 show five ESTs, respectively, which are basically identical to the EST of FIG. 43 and in which the parasitic thyristor is made less active than in the EST of FIG. 43.

Figure 44A:
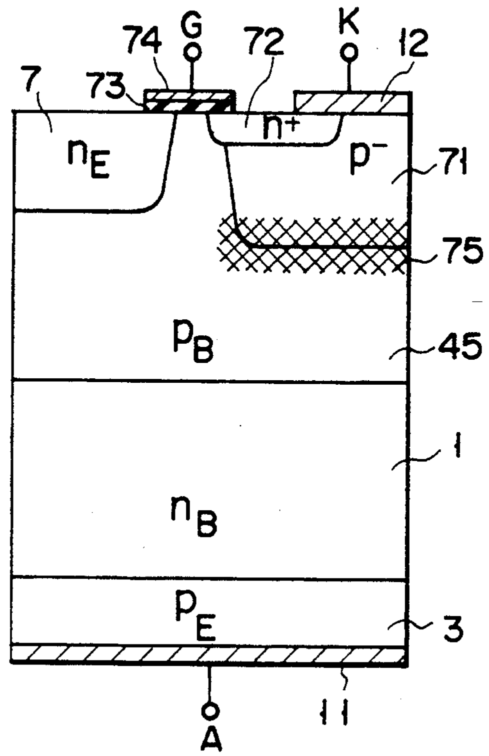
FIGS. 44A and 44B are sectional views showing two modifications of the thyristor shown in FIG. 43, respectively.

The EST of FIG. 44A, a high-impurity $p^+$-type layer 75 is formed at the bottom of the p-type layer 71. This layer 75 reduces the resistance the p-type base layer 45 has with respect to the horizontal direction, suppressing the parasitic thyristor effect.

Figure 44B:
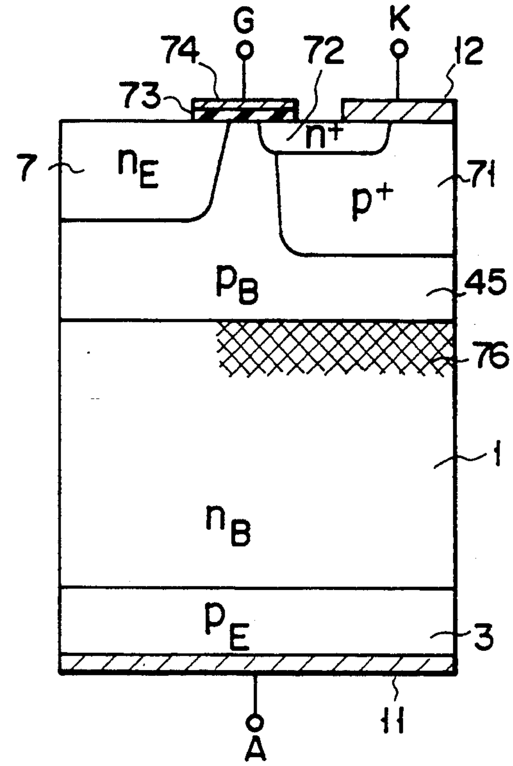

In the EST of FIG. 44B, a low carrier-lifetime layer 76 is formed, near the pn junction between the n-type base layer 1 and the p-type base layer 45. The carrier-lifetime layer 76 shortens the lifetime of the excessive holes existing in the n-type base layer 1, thus suppressing the parasitic thyristor effect. The EST shown in FIG. 44B therefore has high turn-off efficiency.

Figure 45A:
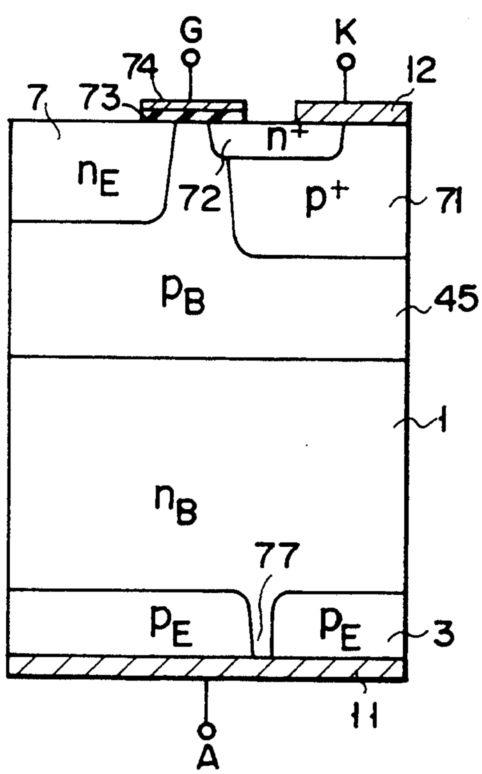
FIGS. 45A and 45B are sectional views showing two other modifications of the thyristor shown in FIG. 43, respectively.

In the EST of FIG. 45A, the n-type base layer 1 has a portion 77 extending through the p-type emitter layer 3 and reaching the anode 11. The portion 77 suppresses the injection of holes from the anode 11 into the base layer 1, while the EST is being turned off. Hence, the EST shown in FIG. 45A also has high turn-off efficiency.

Figure 45B:
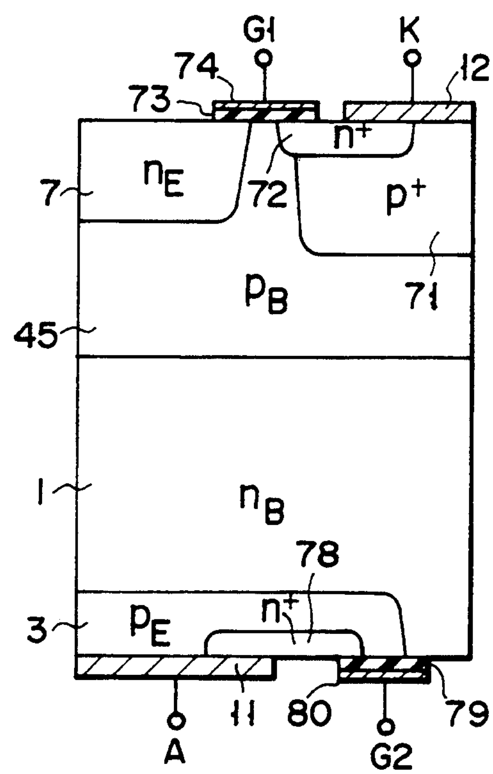

The EST of FIG. 45B is characterized in three respects. First, a p-type emitter layer 3 is selectively formed. Second, an n-type source layer 78 is formed in the lower surface of the p-type emitter layer 3. Third, a gate-insulating film 79 is formed on that portion of the layer 3 which is interposed between the base layer 1 and the source layer 78, and a gate electrode 80 is formed on this gate-insulating film 79. To turn off this EST, a voltage positive with respect to the anode 11 is applied to the gate electrode 80, thereby short-circuiting the emitter layer 3. Hence, the EST can be turned off at high speed. As along as the EST remains on, no bias or a negative bias is applied to the gate electrode 80, and the emitter layer 3 is not short-circuited. The turn-on characteristic of the EST is not deteriorated at all.

Figure 46:
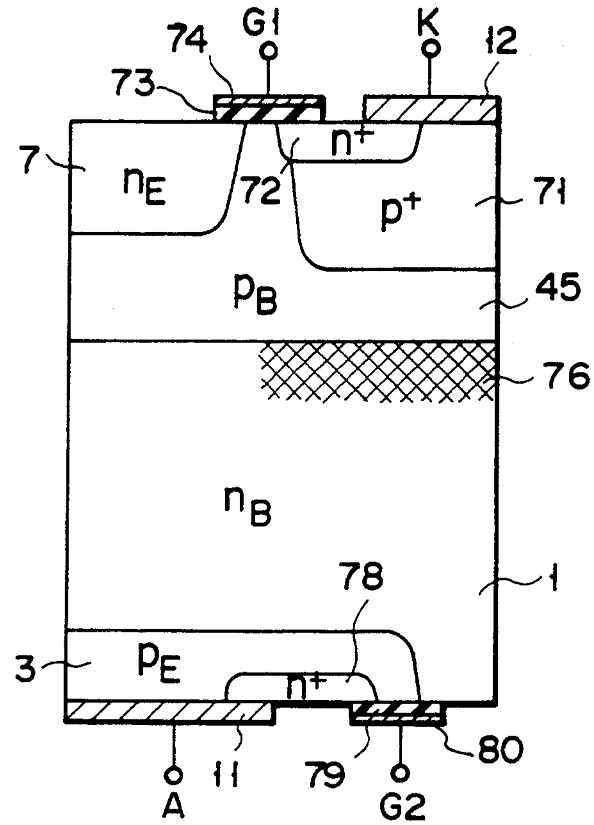
FIG. 46 is a sectional view illustrating still another modification of the thyristor shown in FIG. 43.

The EST shown in FIG. 46 is essentially the same as that of FIG. 45B. This EST is characterized in that a low carrier-lifetime layer 76 is formed in the upper surface of the n-type base layer 1.

Although not illustrated, a high-impurity $p^+$-type layer 75 of the type shown in FIG. 44A can be formed in the EST of FIG. 45A. Further, a low carrier-lifetime layer 76 of the type shown in FIG. 44B can be formed in the EST of FIG. 45A. Also, a $p^+$-type layer 75 of the type shown in FIG. 44A and a low carrier-lifetime layer 76 of the type shown in FIG. 44B can be formed in the EST illustrated in FIG. 44A.

Figure 47:
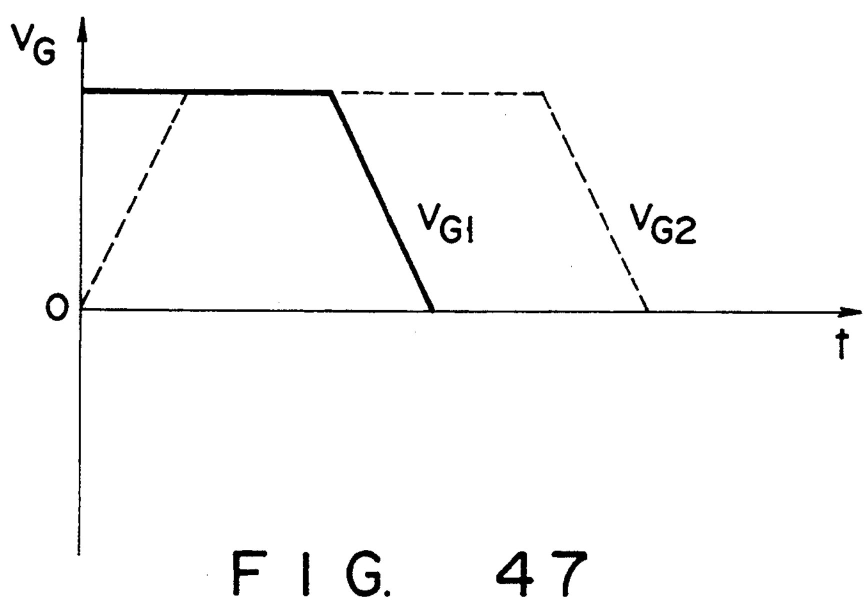
FIG. 47 is a timing chart, explaining how the gate electrode of the thyristor shown in FIG. 46 is driven.

FIG. 47 shows the waveforms of signals for driving the cathode-side gate electrode 74 (G1) and anode-side gate electrode 80 (G2) of the EST shown in FIG. 46. To turn on the EST, a positive voltage VG1 is applied to the cathode-side gate electrode 74, thereby connecting the n-type emitter layer 7 to the cathode 12 by the channel formed below the gate electrode 74 and the n-type source layers 72. Meanwhile, no bias is applied to the anode-side gate electrode 80, allowing many holes to move from the p-type emitter layer 3 into the n-type base layer 1.

To turn off the EST of FIG. 46, a positive voltage VG2 is applied to the anode-side gate electrode 80, thus short-circuiting the p-type emitter layer 3 and suppressing the injection of holes from the layer 3 into the layer 1. Then, the bias voltage VG1 applied to the cathode-side gate electrode 74 is decreased to 0V. As a result, the n-type emitter layer 7 is electrically disconnected from the cathode 12, whereby holes are released from the n-type base layer 1 to the cathode 12.

By driving the two gate electrodes 74 and 80 as is shown in FIG. 47, the EST is turned off at high speed. In other words, the EST shown in FIG. 46 has high turn-off efficiency.

Figure 48:
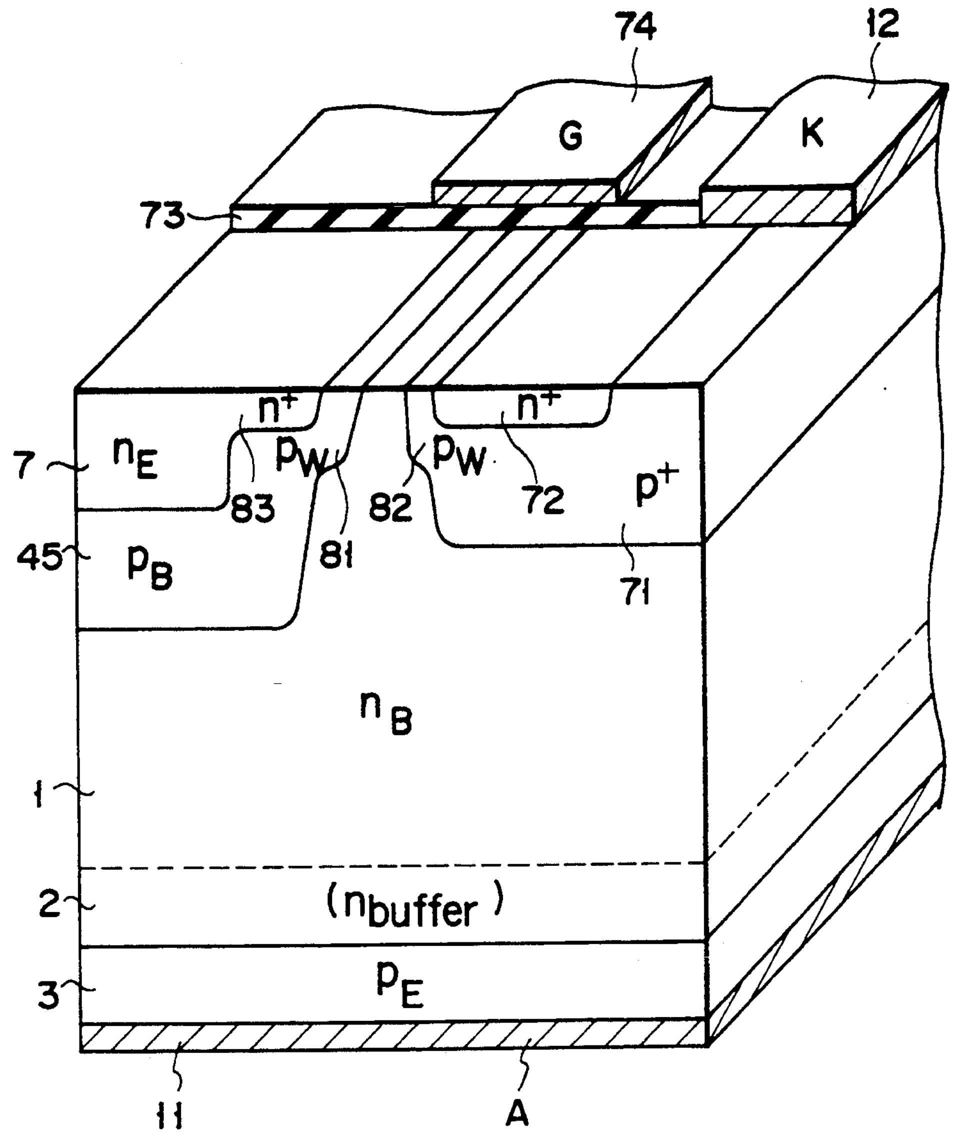
FIG. 48 is a perspective view showing a modification of the thyristor illustrated in FIG. 43.

FIG. 48 shows an insulated-gate thyristor of another type according to the present invention. As is shown in the figure, this thyristor comprises an n-type base layer 1, a p-type base layer 45 formed in the upper surface of the n-type base layer 1, and a $p^+$-type layer 71 formed also in the upper surface of the n-type base layer. The layers 45 and 71 are spaced apart, and the n-type base layer 1 has an exposed portion which is interposed between the layers 45 and 71. The opposing portions of the layers 45 and 71 are p-type well layers 81 and 82, both having a low impurity concentration. The thyristor further comprises an n-type buffer layer 2, a p-type emitter layer 3, an n-type emitter layer 7, an anode 11, a cathode 12, an n-type source layer 72, an gate-insulating film 73, a gate electrode 74, and a high-impurity $n^+$-type layer 83. The $n^+$-type layer 83 is that portion of the emitter layer 7 which contacts the p-type well layer 81. The gate-insulating film 73 is formed on the surface of the base layer 1 and p-type well layers 81 and 82. The gate electrode 74 is formed on that portion of the insulating film 73 which lies on p-type well layers 81 and 82 and that region of the n-type base layer 1 which is inter posed between the p-type well layers 81 and 82. The n-type source layer 72 is not divided as in the thyristor of FIG. 43, and is shaped like a stripe.

To turn on the thyristor shown in FIG. 48, a voltage positive with respect to the cathode 12 is applied to the gate electrode 74. Two n-type inversion channel thereby develops in the surfaces of the surfaces of the p-type well layers 81 and 82, respectively. Hence, the n-type emitter layer 7 and the n-type source layer 72 are short-circuited by the n-type inversion channel and the n-type base layer 1. To turn off the thyristor, a negative voltage is applied to the gate electrode 74, thereby electrically disconnecting the n-type emitter layer 7 from the n-type source layer 72. As a result, the p-type base layer 45 and the $p^+$-type layer 71 are short-circuited by the p-type inversion channel formed in the surface of the n-type base layer 1 and located between the p-type well layers 81 and thus forming a hole-releasing path.

The p-type well layers 81 and 82 in which n-channel is formed at turn-on state are formed in the p-type base layer 45 and the $p^+$-type layer 71, respectively. They can have different threshold values. In this embodiment, that portion of the $p^+$-type layer 71 which is located beneath the n-type source layer 72 has so high an impurity concentration that the $p^+$-type layer 72 has a low resistance with respect to the horizontal direction. The layer 72 therefore suppresses parasitic thyristor effect, whereby holes can be released from the n-type base layer 1 to the cathode 12 at high speed while the thyristor is being turned off.

FIG. 49 shows a modification of the thyristor shown in FIG. 48. This modified thyristor has a plurality of n-type source layers 72, used in place of the single n-type source layer used in the thyristor of FIG. 48. The thyristor has higher turn-off efficiency than the thyristor of FIG. 48.

Figure 50:
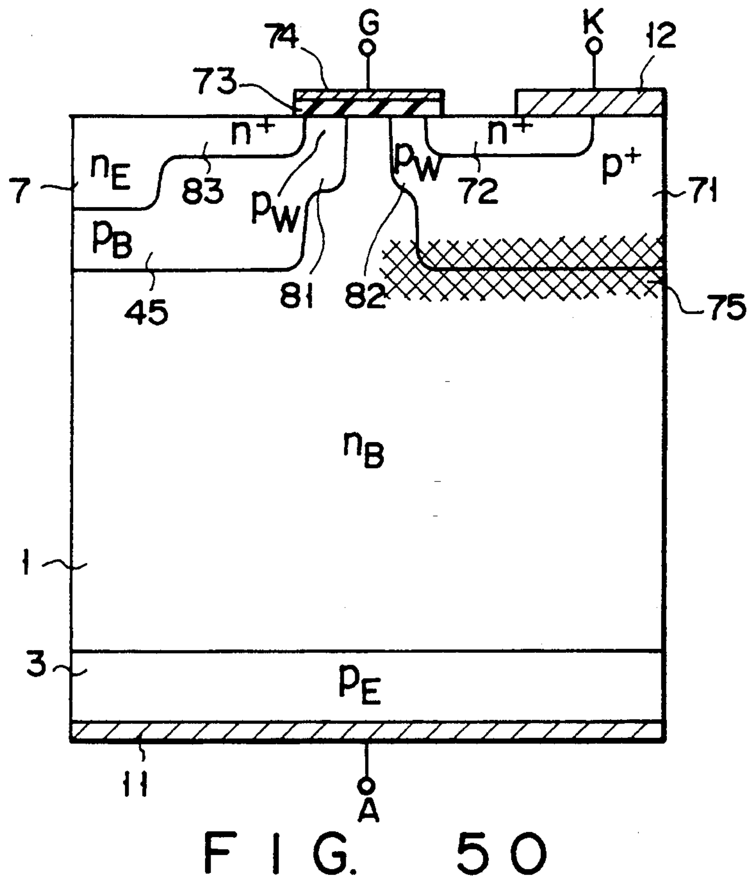
FIG. 50 is a sectional view showing a modification of the thyristor shown in FIG. 48 or 49.
Figure 51:
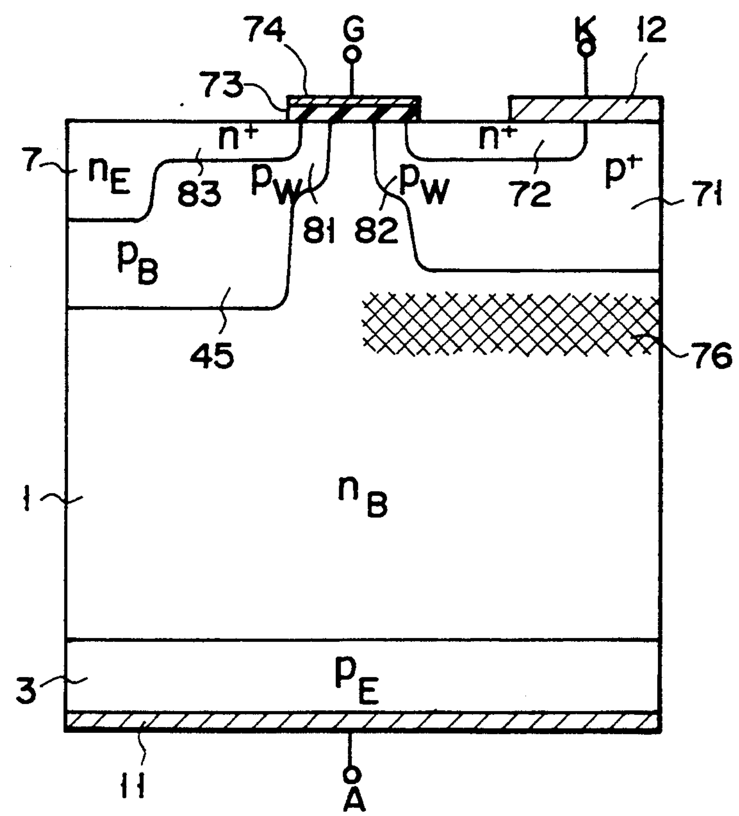
FIG. 51 is a sectional view illustrating a modification of the thyristor shown in FIG. 48 or 49.

FIGS. 50 and 51 show two modifications of the thyristor shown in FIG. 48 or 49, either having means improving the turn-off efficiency. Like the thyristor of FIG. 44A, the thyristor shown in FIG. 50 has a $p^+$-type layer 75 formed at the bottom of the p-type layer 71. Like the thyristor of FIG. 44B, the thyristor shown in FIG. 51 has a low carrier-lifetime layer 76 formed near the pn junction between the n-type base layer 1 and the p-type base layer 45.

Figure 52:
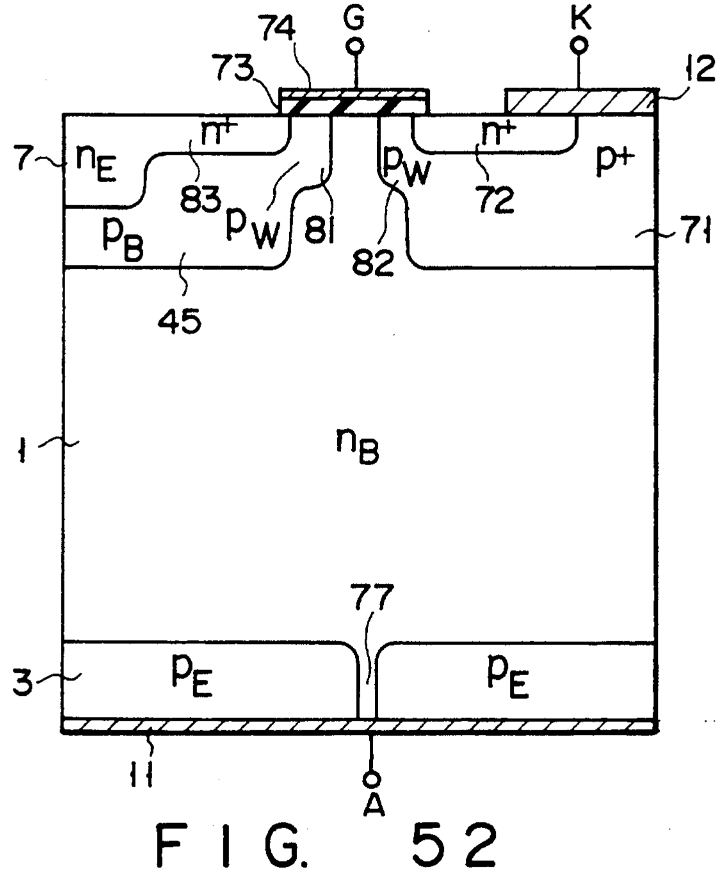
FIG. 52 is a sectional view showing a modification of the thyristor shown in FIG. 48 or 49.
Figure 53:
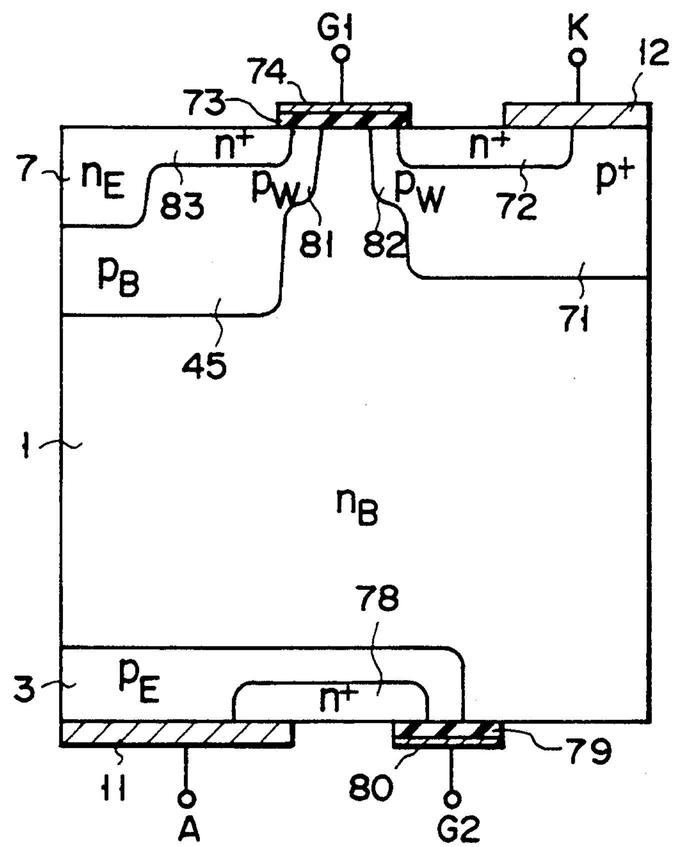
FIG. 53 is a sectional view showing a modification of the thyristor shown in FIG. 48 or 49.

FIGS. 52 and 53 show two modifications of the thyristor shown in FIG. 48 or 49. The modified thyristor of FIG. 52 has an emitter short-circuiting section 77 of the same type shown in FIG. 45A. The modified thyristor of FIG. 53 has an emitter short-circuiting section of the same type illustrated in FIG. 45B.

According to the invention, the thyristor of FIG. 52 can have a low carrier-lifetime layer 76 of the type shown in FIG. 51; the thyristor of FIG. 53 can have a $p^+$-type layer 75 of the type shown in FIG. 50; the thyristor of FIG. 52 can have a $p^+$-type layer 75 of the type shown in FIG. 50; and the thyristor of FIG. 53 can have a $p^+$-type layer 75 of the type shown in FIG. 50 and a low carrier-lifetime layer 76 of the type shown in FIG. 51.

FIG. 54 illustrates a modification of the thyristor shown in FIG. 53, which is characterized by a low carrier-lifetime layer 76 interposed between the n-type base layer 1 and the p-type base layer 45. This modified thyristor has high turn-off efficiency, too.

Figure 55:
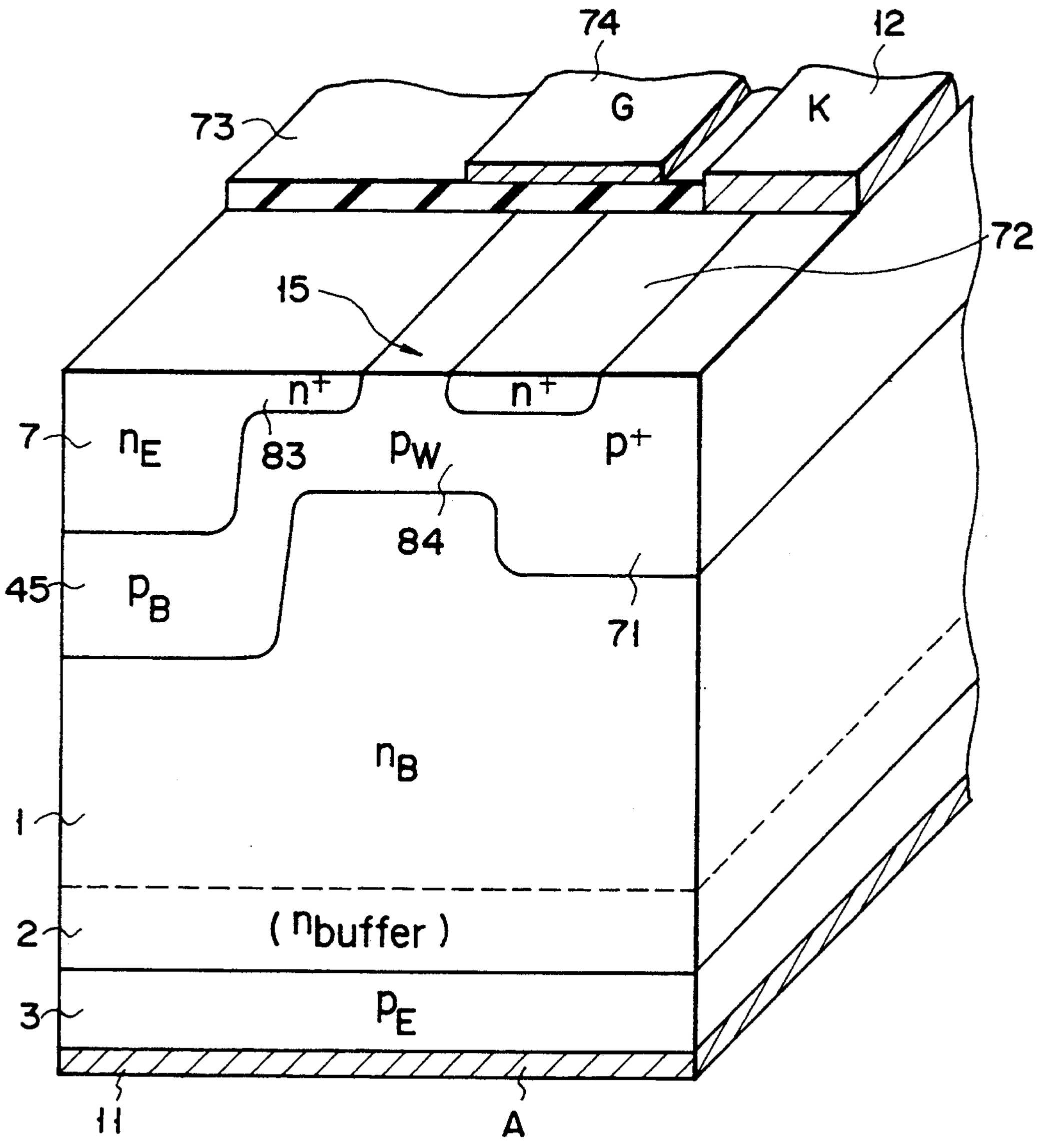
FIG. 55 is a perspective view showing a modification of the insulated-gate thyristor shown in FIG. 43.

FIG. 55 shows a thyristor of another type according to the present invention. As is evident from FIG. 55, the thyristor comprises an n-type base layer 1, a n-type buffer layer 2, a p-type emitter layer 3, an n-type emitter layer 7, an anode 11, a cathode 12, a p-type base layer 45, an $n^+$-type layer 71, an n-type source layer 72, a gate-insulating layer 73, and a gate electrode 74. A p-channel layer 84 is formed between the p-type base layer 45 and the $p^+$-type layer 71. The layer 84 has an impurity concentration lower than those of the layers 45 and 71. The n-type emitter layer 7 is formed in the surface of the p-type base layer 45. That portion of the n-type emitter layer 7 which contacts the the channel layer 84 is an $n^+$-type layer 83. The n-type source layer 72 is formed in the surface of the $p^+$-type layer 71. The source layer 72 contacts the channel layer 84 and is shaped like a stripe, not divided into pieces.

Since the p-channel layer 84 has an impurity concentration different from those of the the p-type base layer 45 and p+-type layer 71, the MOS transistor 15 for short-circuiting the n-type emitter layer 7 can have the best possible threshold value. Further, both the p-type base layer 45 and the p+-type layer 71 can have a sufficiently high impurity concentration. The thyristor of FIG. 55 can, therefore, have high turn-off efficiency.

Figure 56:
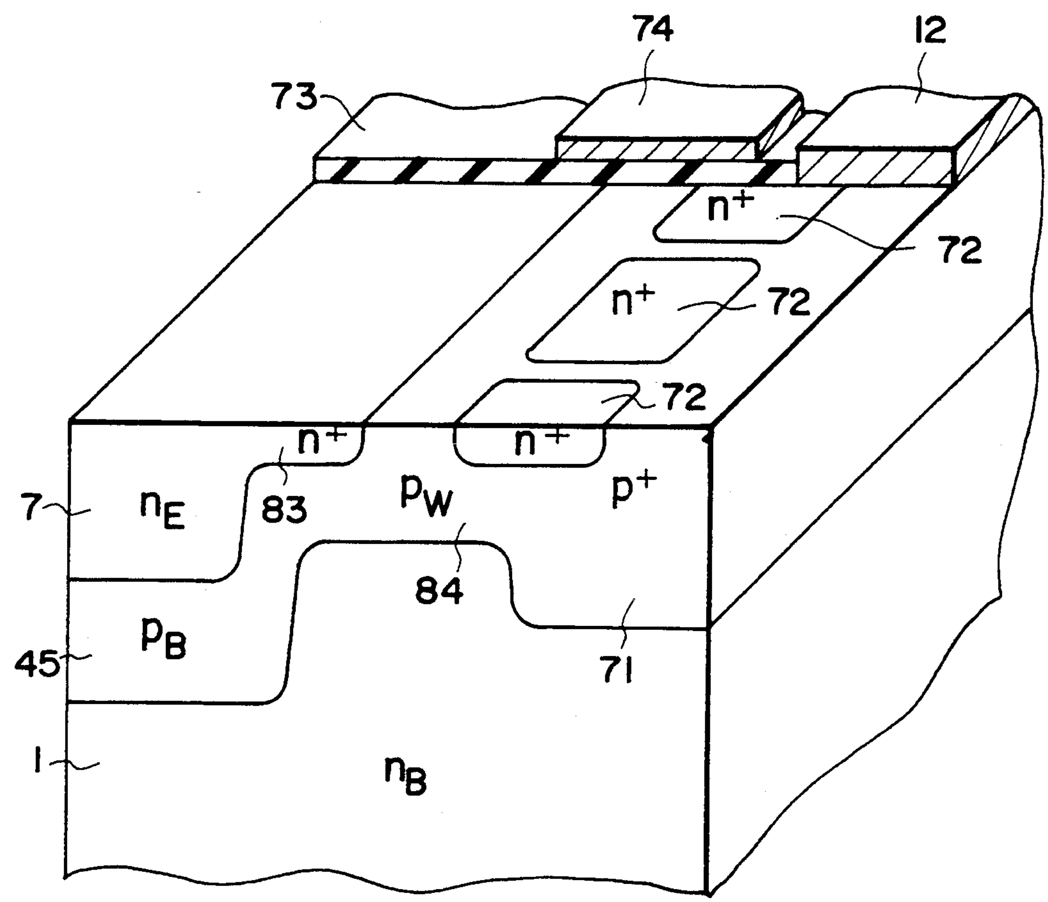
FIGS. 56 and 57 are perspective views showing two modifications of the insulated-gate thyristor shown in FIG. 55, respectively.
Figure 57:
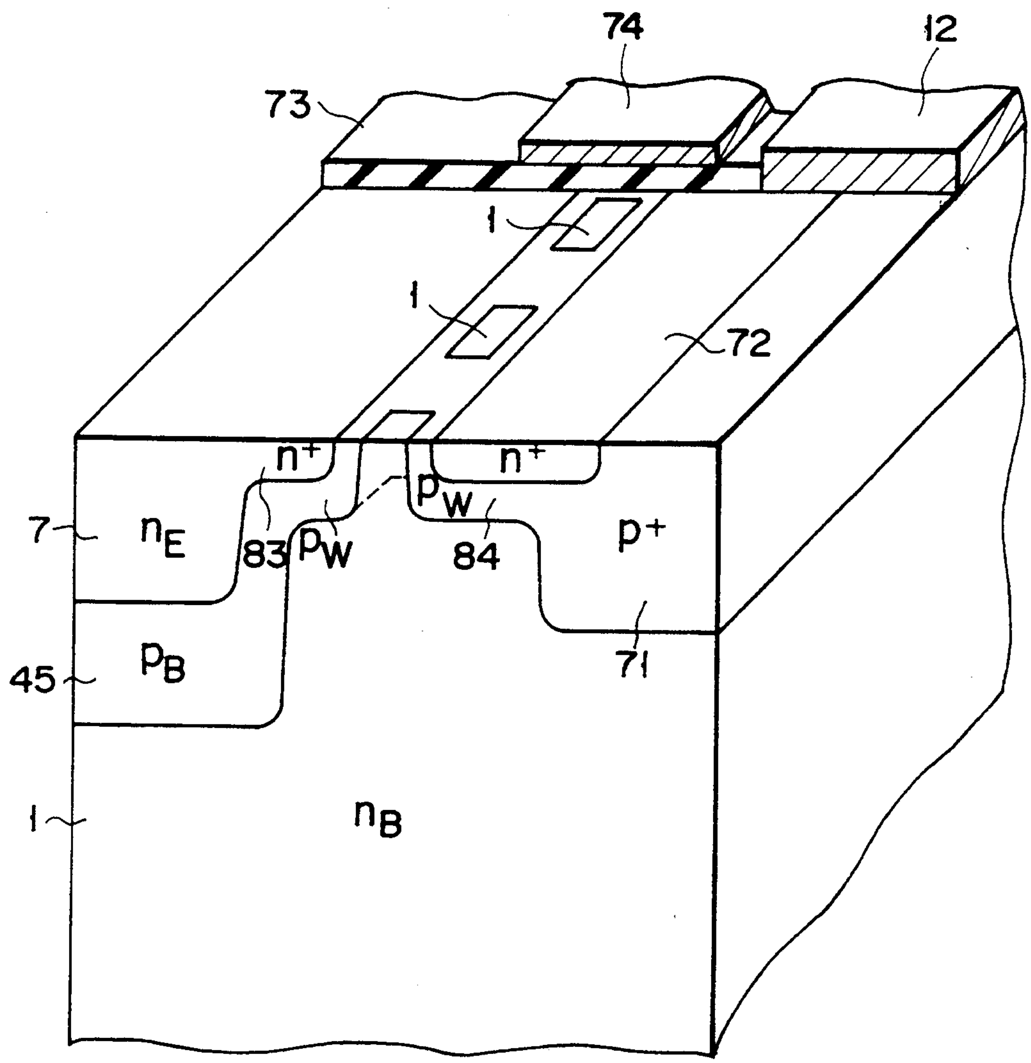
Figure 60:
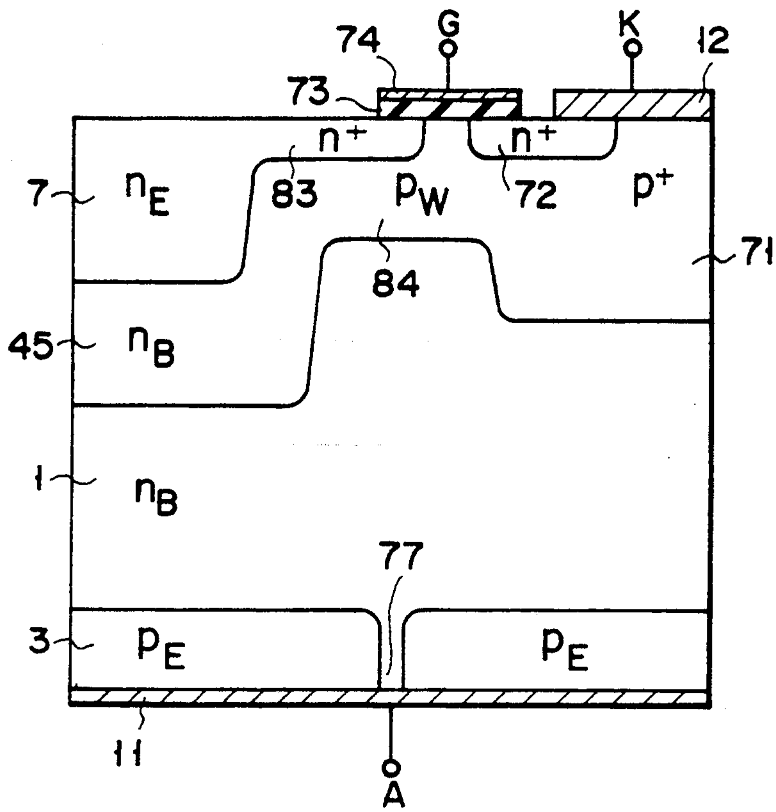

FIGS. 56 and 57 shows two modifications of the thyristor illustrated in FIG. 55, respectively. The modified thyristor of FIG. 56 is characterized in that a plurality of n-type source layers 72 are used in place of the single n-type source layer 72. The modified thyristor of FIG. 57 is characterized in that the n-type base layer 1 have portions which extend through the p-channel layer 84 and which are therefore exposed. The modified ESTs shown in FIGS. 56 and 57 attain the same advantage as the thyristor illustrated in FIG. 55.

FIGS. 58, 59, 60, and 61 show four modifications of the thyristor shown in FIG. 55, respectively. The modified thyristor of FIG. 58 has a p+-type layer 75 of the type shown in FIG. 44A. The modified thyristor of FIG. 59 has a low carrier-lifetime layer 76 of the type shown in FIG. 44B. The modified thyristor of FIG. 60 has an emitter short-circuiting section 77 of the same type shown in FIG. 45A. The modified thyristor of FIG. 61 has an anode-side gate electrode 80 of the type shown in FIG. 46.

Figure 61:
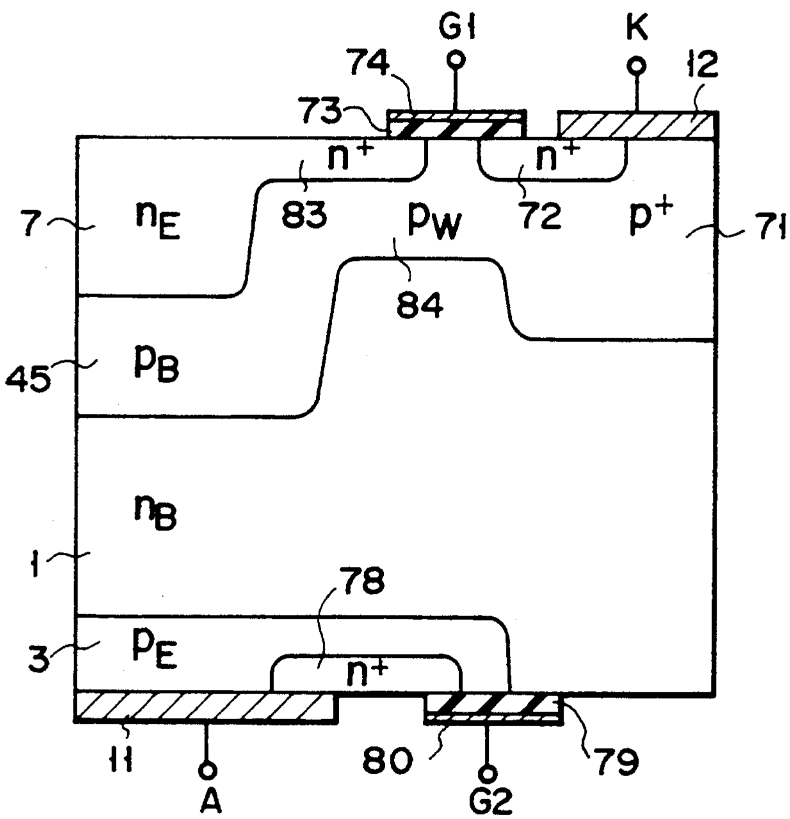

According to the invention, the thyristor of 60 can have a p+-type layer 75 of the type shown in FIG. 44A, and the thyristor of FIG. 61 can have a low carrier-lifetime layer 76 of the type illustrated in FIG. 44B.

The ESTs shown in FIGS. 58 to 61 have turn-off efficiency higher than the thyristor illustrated in FIG. 55.

Figure 62:
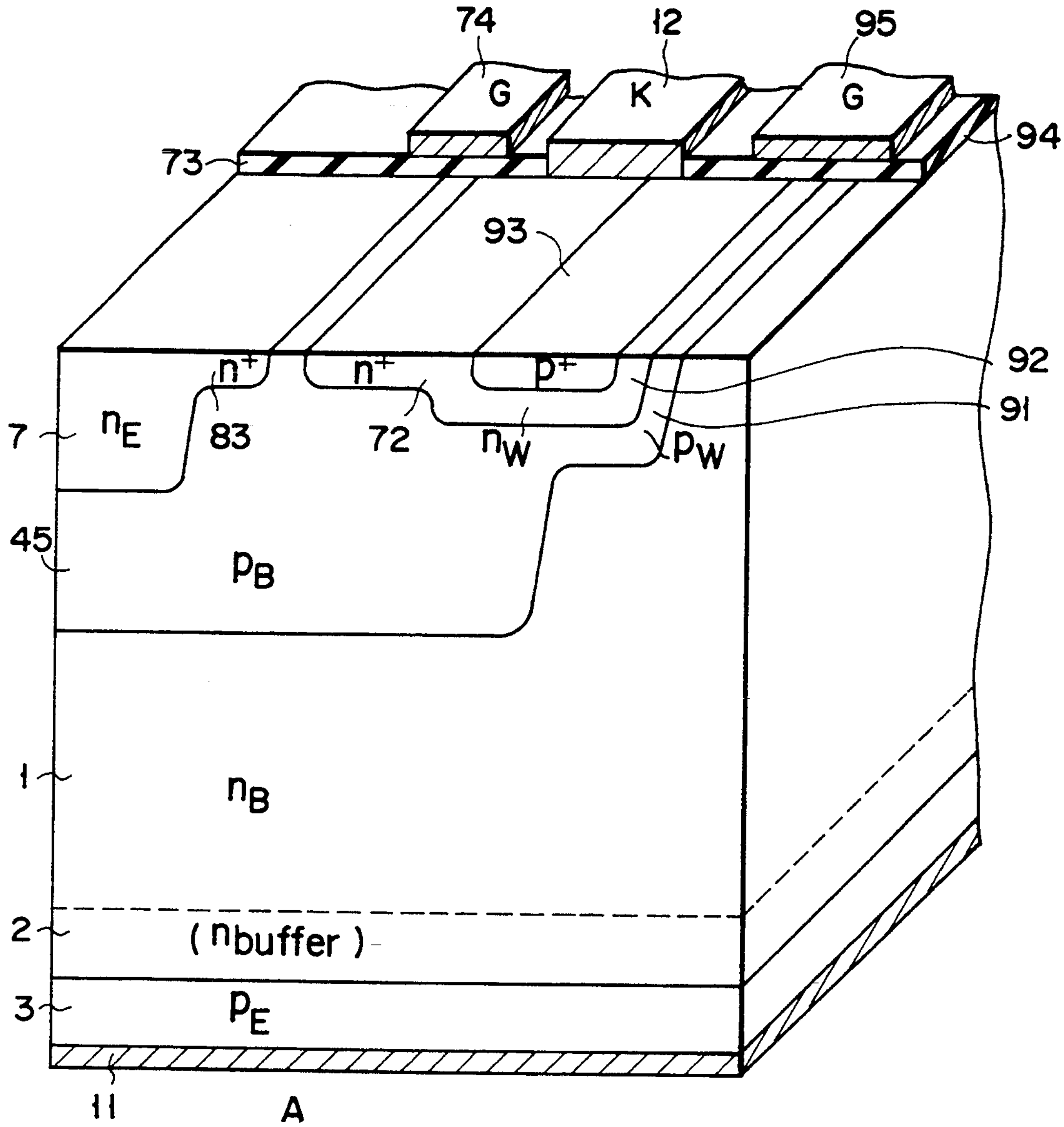
FIG. 62 is a perspective view illustrating an insulated-gate thyristor of still another type according to the invention.

FIG. 62 shows a thyristor of still another type according to the invention. As has been described, in all ESTs described above, the turn-off insulated gate is provided at that portion of the p-type base layer 45 which is located between the n-type emitter layer 7 and the n-type source layer 72. The thyristor of FIG. 62 has a turn-on MOS transistor and a hole-bypassing MOS transistor, both continuous to the n-type source layer 72 and located on the right of the n-type emitter layer 7.

More specifically, an end portion of the p-type base layer 45 is a shallow p-type well layer 91. An n-type well layer 92 is formed in the surface of the p-type well layer 91. The n-type well layer 92 is connected to the n-type source layer 72 formed in the surface of the p-type base layer 45. A p-type source layer 93 is formed in the surface of the n-type well layer 92. A cathode 12 is formed, contacting both the n-type source layer 72 and the p-type source layer 93. A gate-insulating film 94 is formed on part of the p-type well layer 91, part of the n-type well layer 92, and part of the p-type source layer 93. An gate electrode 95 is formed on the film 94 and located above the layers 91, 92, and 93.

To turn on the thyristor shown in FIG. 62, a positive voltage is applied to the gate electrodes 74 and 95, an n-type inversion layer is formed in the surface of the p-type well layer 91, and an n-type inversion layer is formed in the surface of the p-type base layer 45. As a result, electrons moves from the n-type well layer 92 into the n-type base layer 1 through the n-type inversion layer formed in the p-type well layer 91, and the n-type source layer 72 is short-circuited to the n-type emitter layer 7 by the n-type inversion layer formed in the p-type base layer 45, connecting the n-type emitter layer 7 to the cathode 12.

To turn off the thyristor of FIG. 62, a negative voltage is applied to the gate electrodes 74 and 95. The n-type emitter layer 7 and the n-type source layer 72 are thereby electrically disconnected. Simultaneously, the p-type source layer 93 and the p-type well layer 91 are short-circuited by a p-type inversion layer formed in the surface of the n-type well layer 92. This is the operation a p-channel MOS transistor performs, wherein the p-type source layer 93 connects the p-type source layer 93 to the cathode 12, resulting in releasing the holes.

As long as the thyristor of FIG. 62 remains on, no hole-releasing bypasses are formed. Hence, the thyristor has good turn-on characteristic. Further, parasitic thyristor effect does not work against the operation of the thyristor, since the p-type base 45 located below the n-type source layer 72 is sufficiently thick.

FIG. 63 shows a modification of the thyristor shown in FIG. 62. In this modified thyristor, the p-type well layer 91 connected to a p-type base layer 45 is broad. An n-type source layer 72, an n-type well layer 92, and a p-type source layer 93 are formed in the surface of the p-type well layer 91. A high-impurity p+-type layer 75 is formed at the bottom of the p-type well layer 91, thereby reducing the resistance the layer 91 has with respect to the horizontal direction. Except for these features, the thyristor of FIG. 63 is identical to the thyristor of FIG. 63.

The thyristor of FIG. 63 operates, exactly in the same way as the thyristor shown in FIG. 62. Although the p-type well layer 91 located below the n-type source layer 72 is thin, parasitic thyristor effect does not work against the operation of this thyristor. This is because the p+-type layer 75 is formed at the bottom of the p-type well layer 91.

Figure 64:
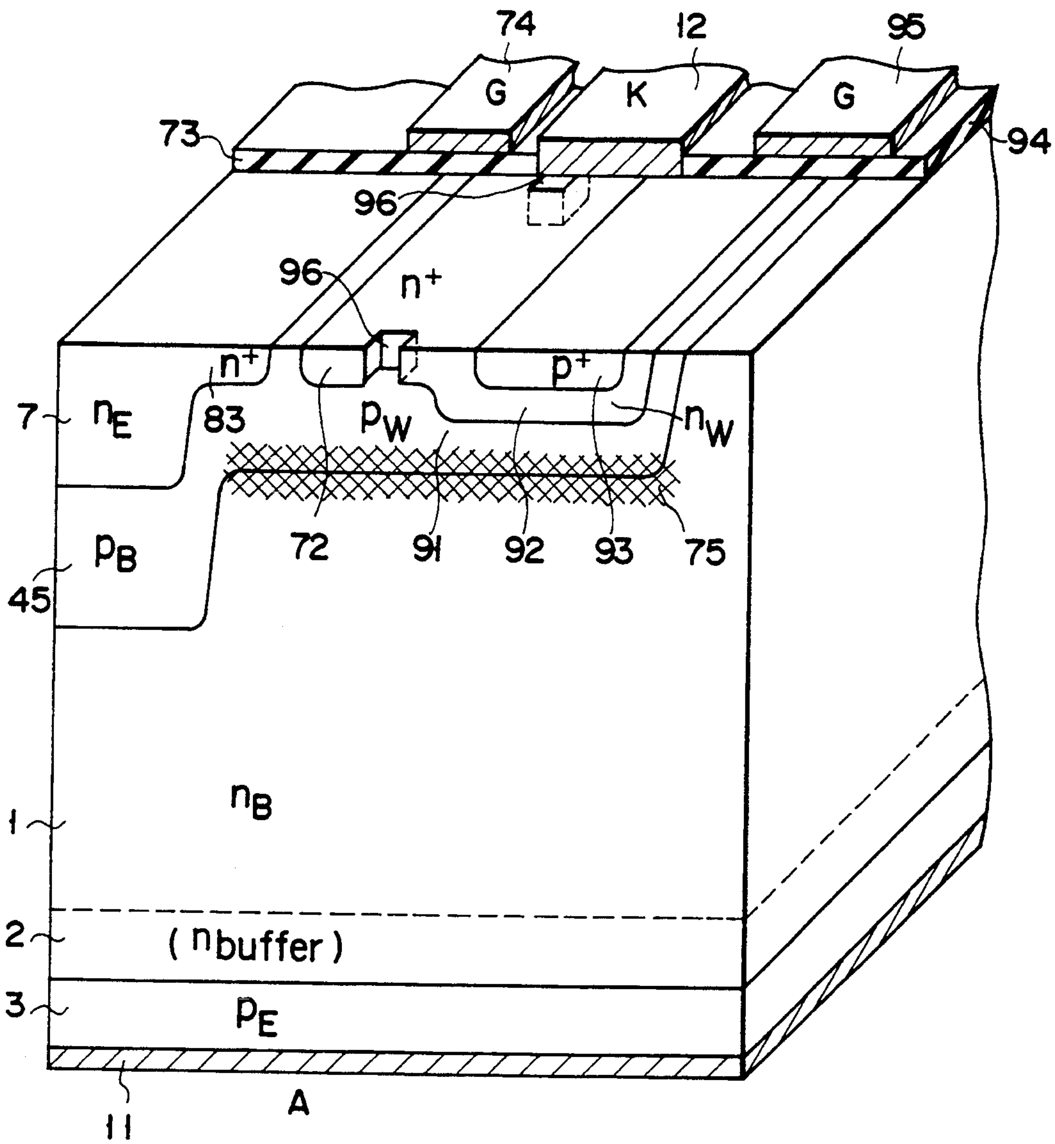
FIG. 64 is a perspective view showing another modification of the thyristor shown in FIG. 62.

FIG. 64 shows a thyristor designed by slightly modifying the thyristor shown in FIG. 63. In this thyristor, an opening is made in the n-type source layer 72, thereby exposing a portion of the p-type well layer 91 and, hence, putting the cathode 12 in direct contact with the p-type well layer 91. This is a cathode short-circuiting structure.

In operation, holes are released to the cathode 12 more efficiently than in the thyristor of FIG. 63, while the thyristor is being turned off. Hence, the thyristor shown in FIG. 64 can be turned off faster than the thyristor of FIG. 63.

Figure 66:
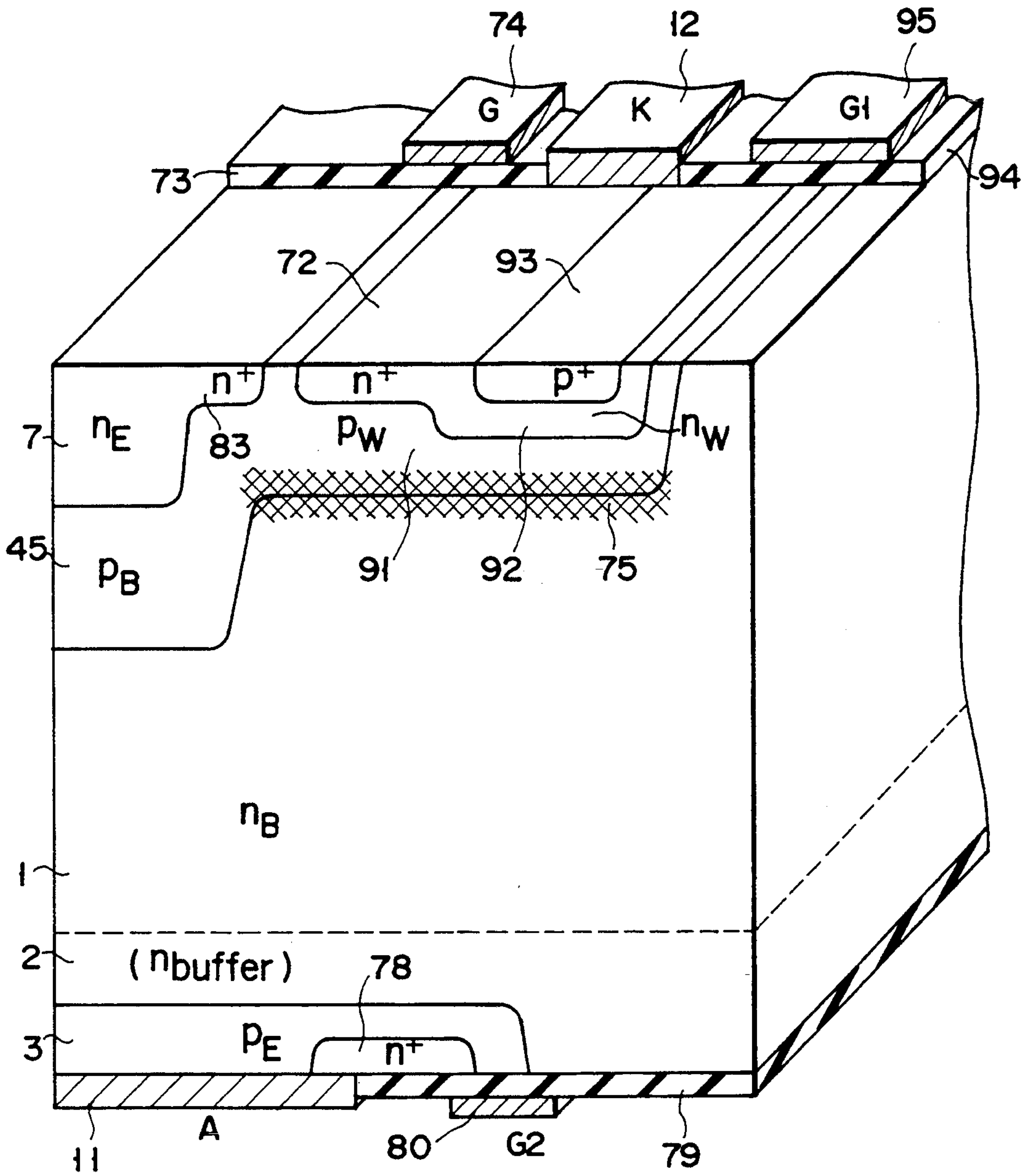

FIG. 65 shows a thyristor designed by slightly modifying the thyristor shown in FIG. 63. To be more specific, this thyristor has an emitter short-circuit section 77 in the anode-side surface. FIG. 66 illustrates the thyristor designed by modifying a little the thyristor shown in FIG. 63. This thyristor has an MOS transistor formed in the anode-side surface, for short-circuiting the emitter. Both the thyristor of FIG. 65 and that of FIG. 66 can be turned off at high speed.

Figure 67:
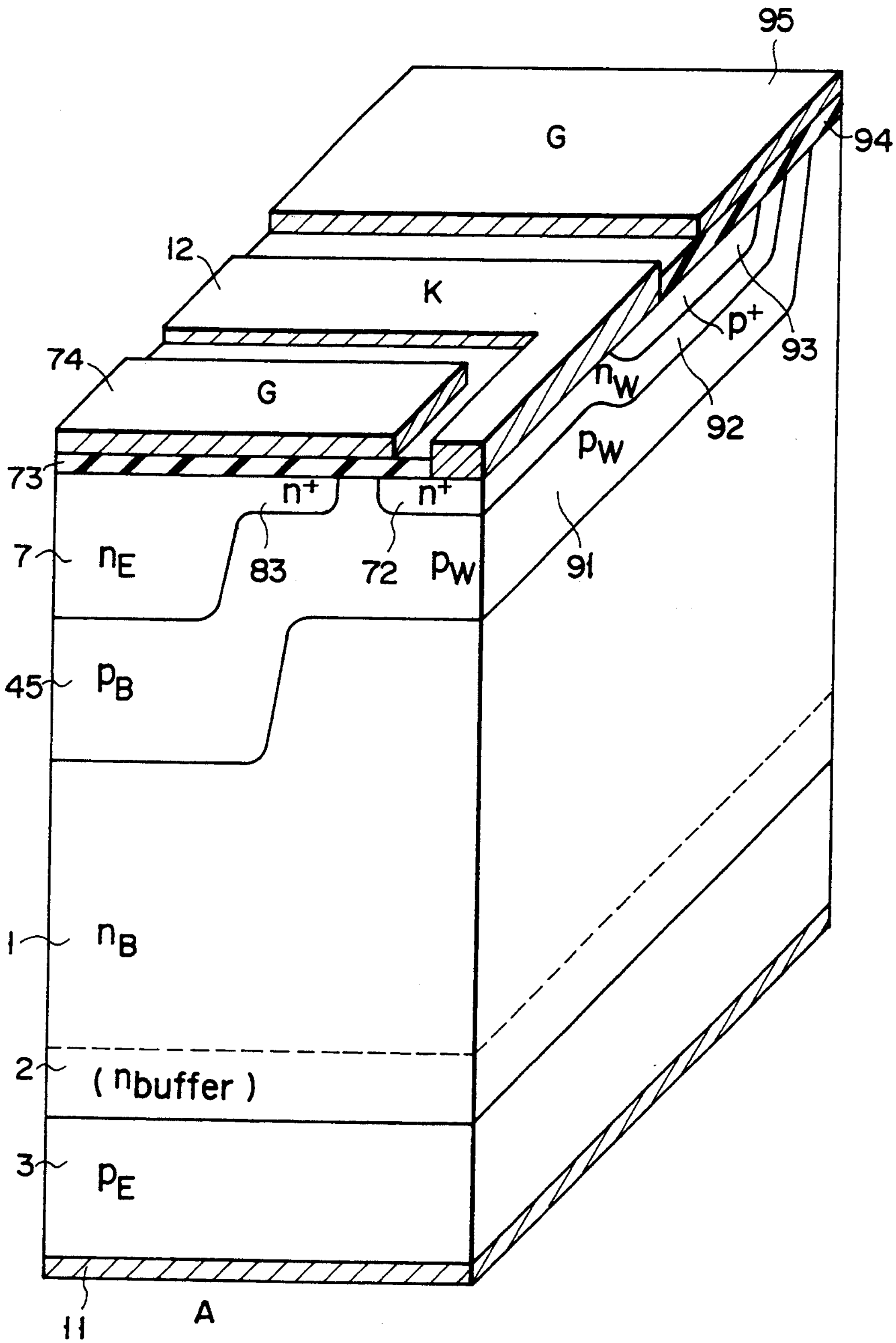
Figure 70:
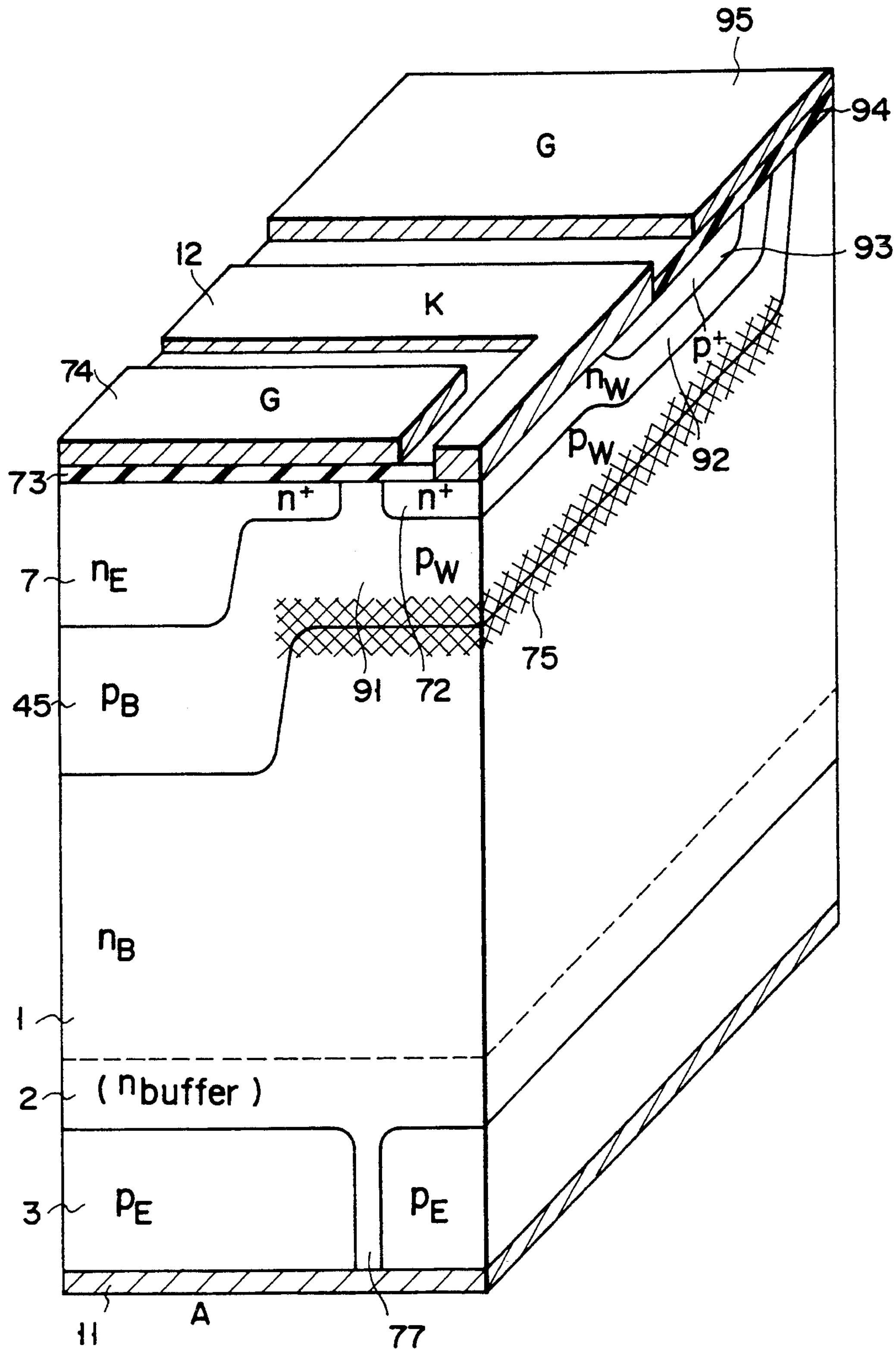

FIG. 67 shows a thyristor designed by developing the thyristor of FIG. 62 three-dimensionally. FIG. 68 shows a thyristor designed by developing the thyristor of FIG. 63 three-dimensionally. FIG. 69 shows a thyristor designed by developing the thyristor of FIG. 64 three-dimensionally. FIG. 70 shows a thyristor designed by developing the thyristor of FIG. 65 three-dimensional. FIG. 71 shows a thyristor designed by developing the thyristor of FIG. 66 three-dimensionally. FIG. 72 illustrates a thyristor which is essentially the same as the thyristor of FIG. 71 and which has a p-type emitter layer 3 and an insulated-gate transistor structure surrounding the p-type emitter layer 3.

Other ESTs according to the invention, which have each two similar MOS transistors formed in the anode-side surface and the cathode-side surface, respectively, will now be described, with reference to FIG. 73 through FIG. 80. The MOS transistor formed in the cathode-side surface is a conventional one.

Figure 73:
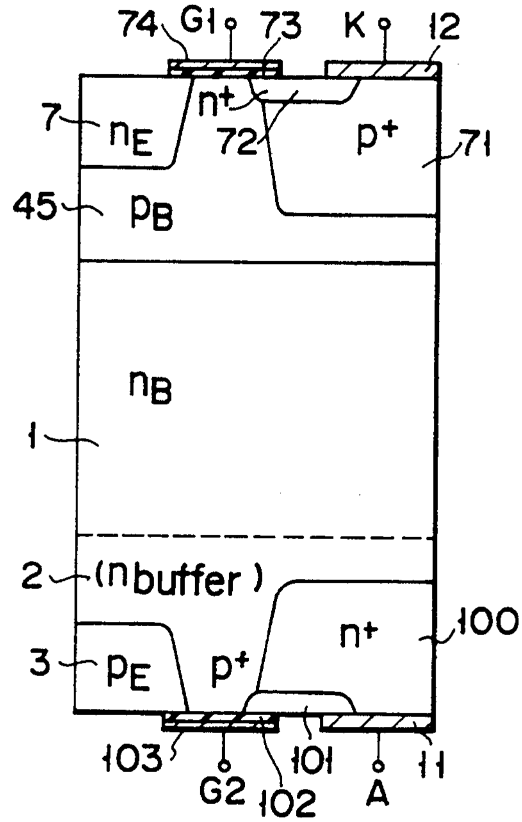
FIG. 73 is a sectional view illustrating an insulated-gate thyristor which has two similar MOS transistors formed in the anode-side surface and the cathode-side surface, respectively.

The thyristor shown in FIG. 73 has a p-type emitter layer 3 is formed in a selected portion of an n-type buffer layer 2. As is evident from FIG. 73, an n+-type layer 100 is formed in another portion of the n-type buffer layer 2, and spaced apart from the p-type emitter layer 4 by a predetermined distance. A p-type source layer 101 is formed in that portion of the n+-type layer 100 which is closer to the layer 3 than any other portion. A gate-insulating film 102 is formed on that portion of the n-type buffer layer 2 which is located between the emitter layer 3 and the source layer 101. A gate electrode 103 is formed on the gate-insulating film 102. The layers 2, 3,100, the film 102, and the gate electrode 103 constitute a p-channel MOS transistor. An anode 11 is formed, contacting both the n+-type layer 100 and the p-type source layer 101, not contacting the p-type emitter layer 3.

To turn on the thyristor shown in FIG. 73, a voltage positive with respect to the cathode 12 is applied to the. cathode-side gate electrode 74, and a voltage negative with respect to the anode 11 is applied to the anode-side gate electrode 103. Two channels are formed which are located beneath the gate electrodes 74 and 103, respectively. The channel formed beneath the electrode 74 connects the n-type emitter layer 7 to the n-type source layer 72, whereas the channel formed beneath the electrode 103 connects the p-type emitter layer 3 to the p-type source layer 101. When a base current is supplied from a turn-on gate (not shown) to the p-type base 45, the thyristor is turned on.

To turn off the thyristor of FIG. 73, a voltage either zero or negative with respect to the cathode 12 is applied to the cathode-side electrode 74, and a voltage either zero or positive to the anode 11 is applied to the anode-side gate electrode 103. As a result, the n-type emitter layer 7 is electrically disconnected from the n-type source layer 72, and electrons stop moving from the n-type emitter layer 7, whereas the p-type emitter layer 3 is electrically disconnected from the p-type source layer 101, and holes stop moving from the p-type emitter layer 3. Since both the gate electrodes 74 and 103 control the injection of carriers into the n-type base layer 1, the thyristor of FIG. 73 is turned off at high speed. The thyristor can be turned off even faster when by turning off first the MOS transistor formed in the anode-side surface, and then turning off the MOS transistor formed in the cathode-side surface, as has been explained with reference to FIG. 47.

Figure 74:
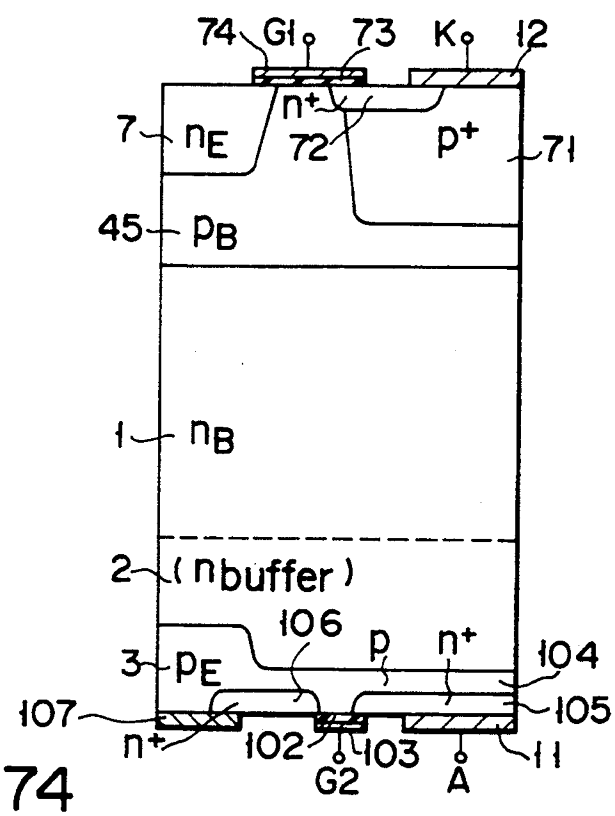
FIG. 74 is a sectional view showing a modification of the insulated-gate thyristor shown in FIG. 73.

FIG. 74 shows a thyristor identical to the thyristor of FIG. 73, except that the MOS transistor formed in the anode-side surface is an n-channel one. As is evident from FIG. 74, a p-type well layer 104 is formed in the n-type buffer layer 2. The p-type well layer 104 is continuous to the p-type emitter layer 3 formed in the n-type buffer layer 2. An n-type drain layer 105 is formed in the surface of the well layer 104. An n-type source layer 106 is formed in part of the emitter layer 3 and part of the well layer 104, and is spaced apart from the drain layer 105 by a predetermined distance. A gate-insulating film 102 is formed on that portion of the p-type well layer 104 which is located between the drain layer 105 and the source layer 106. A gate electrode 103 is formed on the gate-insulating film 102. The layers 3, 104, 105 and 106, the gate-insulating film 102, and the gate electrode 103 constitute an n-channel MOS transistor. A short-circuiting electrode 107 is formed, partly on the p-type emitter layer 3 and partly on the n-type source layer 106. This electrode 107 is made of either metal or high-impurity polysilicon, and short-circuits the n-type emitter layer 3 and the n-type source layer 106.

To turn on the thyristor shown in FIG. 74, a voltage positive with respect to the cathode 12 is applied to the cathode-side gate electrode 74, and a voltage positive with respect to the anode 11 is applied to the anode-side gate electrode 103. As a result, the n-type emitter layer 7 is electrically connected to the n-type source layer 72, whereby electrons are injected from the p-type base layer. At the same time, the n-type drain layer 105 and the n-type source layer 106 are electrically connected, and the short-circuiting electrode 107 short-circuits the p-type emitter layer 3 to the anode 11, whereby holes are injected from the p-type emitter layer 3.

To turn off the thyristor of FIG. 74, a voltage either zero or negative with respect to the cathode 12 is applied to the cathode-side gate electrode 74, and a voltage either zero or negative with respect to the anode 11 is applied to the anode-side gate electrode 103. The n-type emitter layer 7 is thereby electrically disconnected from the n-type source layer 72, where by electrons stop moving from the n-type emitter layer 7. Simultaneously, the p-type emitter layer 3 is electrically disconnected from the n-type drain layer 105 and the anode 11, whereby holes stop moving from the p-type emitter layer 3.

When the thyristor is turned off, holes completely stop moving from the p-type emitter layer 3, whereas in the thyristor of FIG. 73, holes keeps moving from the p-type source layer 101 for some time even after holes stopped moving from the p-type emitter layer 3. Obviously, the thyristor of FIG. 74 can be turned off faster than the thyristor shown in FIG. 73.

Figure 75:
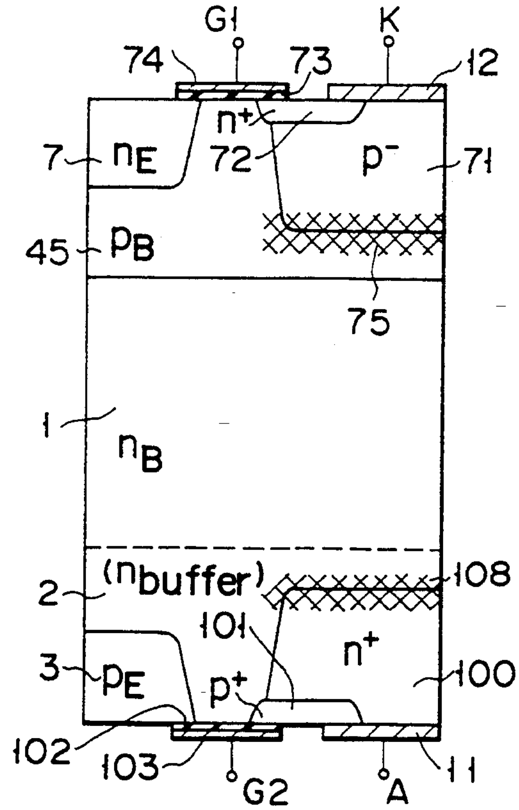
FIG. 75 is a sectional view illustrating a modification of the thyristor shown in FIG. 73.

FIG. 75 shows a thyristor which is identical to the thyristor shown in FIG. 73, except in two respects. First, a high-impurity p+-type layer 75 is formed near the pn junction between the n-type base layer 1 and the p-type base layer 45 as in the thyristor shown in FIG. 44A. Second, a high-impurity n+-type layer 108 is formed at the bottom of the n-type well layer 100. One of these high-impurity p+-type layers 75 and 108 can be dispensed with.

Figure 76:
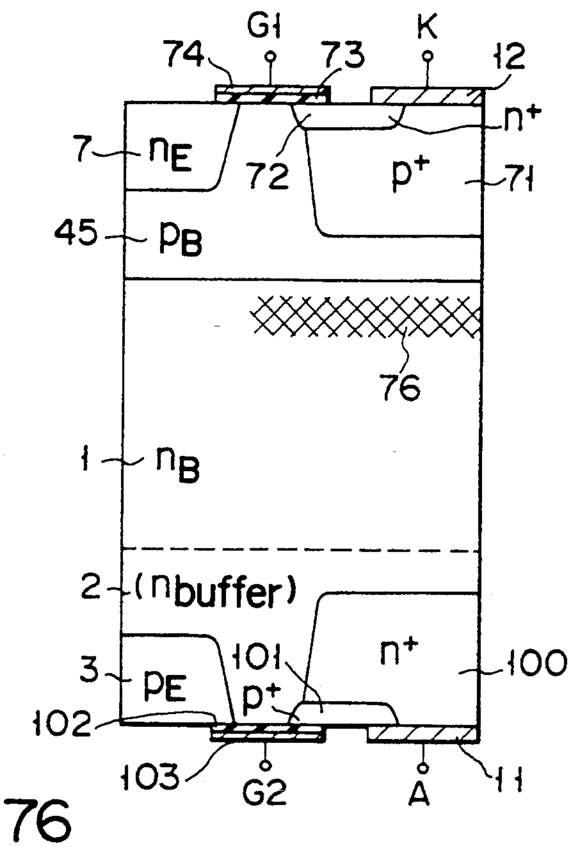
FIGS. 76, 77, and 78 are sectional views sowing three other modifications of the thyristor shown in FIG. 73, respectively.
Figure 77:
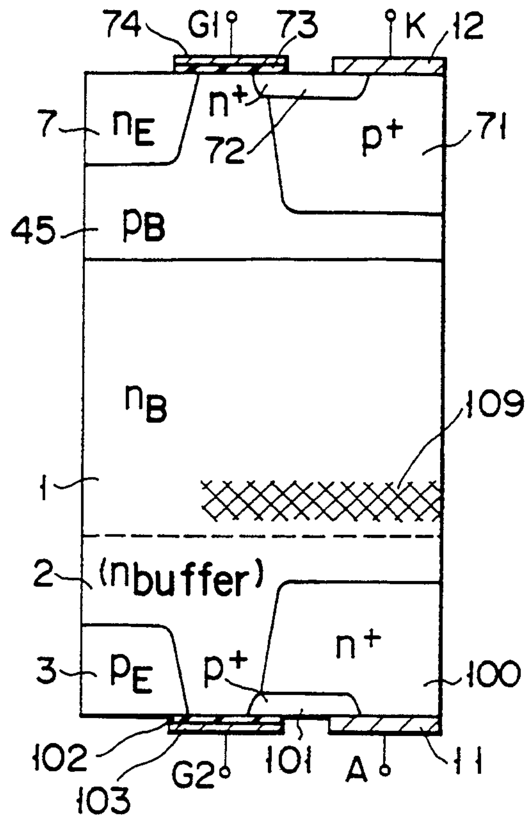
Figure 78:
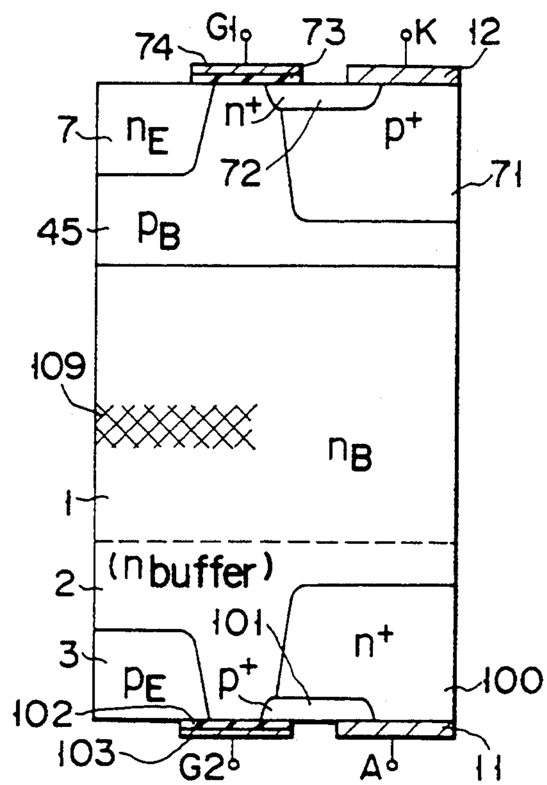

FIGS. 76, 77, and 78 show three modifications of the thyristor shown in FIG. 73. The thyristor of FIG. 76 has a low carrier-lifetime layer 76 located near the pn junction between the n-type base layer 1 and the p-type base layer 45 as in the thyristor of FIG. 44B. The thyristor shown in FIG. 77 has a low carrier-lifetime layer 109 formed in the n-type base layer 1 and located above the n+-type layer 100. The thyristor of FIG. 78 has a low carrier-lifetime layer 109 formed in a central portion of the n-type base layer 1 along a main current path of the thyristor and located above the p-type emitter layer 3.

The modified ESTs shown in FIGS. 75, 76, 77, and 78 have turn-off efficiency higher than that of the thyristor illustrated in FIG. 73.

Several thyristors according to the invention, which have each buried insulated gate electrodes, will now be described, with reference to FIGS. 79 to 84.

Figure 79:
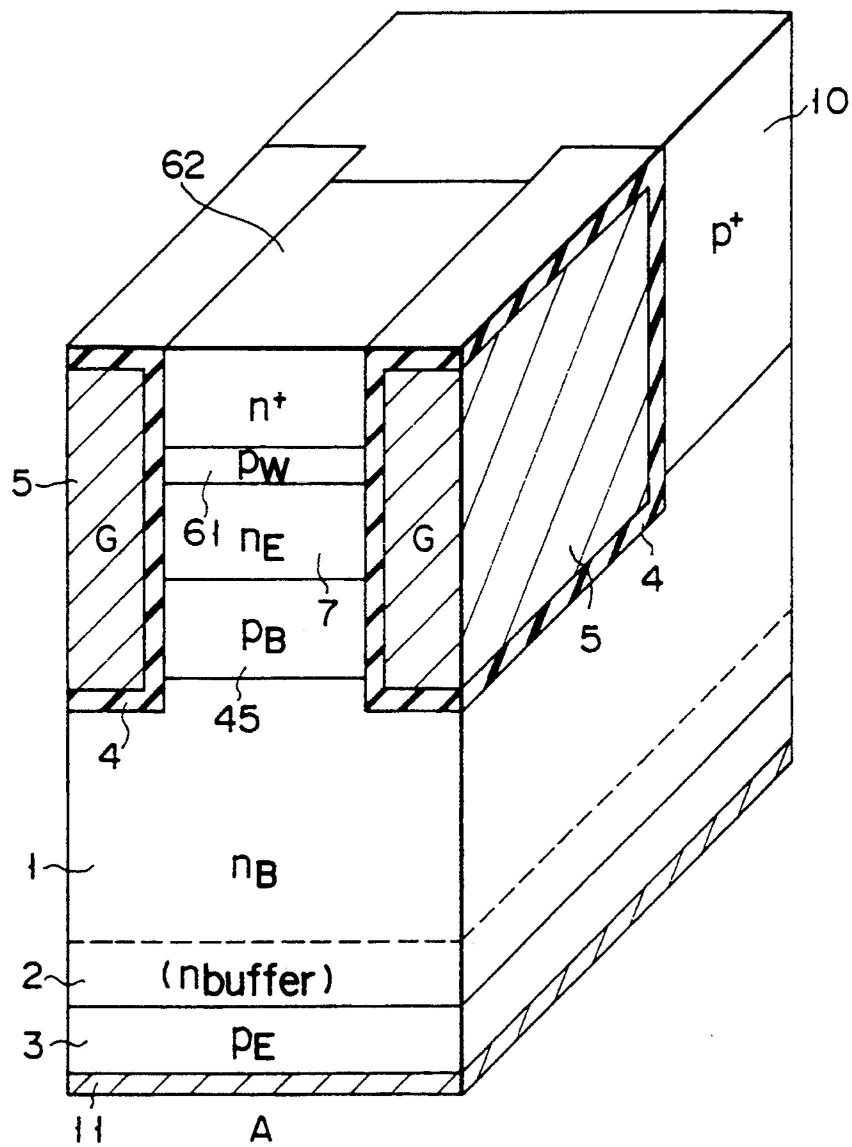
FIG. 79 is a perspective view showing an another type of an insulated-gate thyristor according to the invention.

FIG. 79 shows an insulated-gate thyristor of such a type, which is essentially the same as the thyristor shown in FIG. 37A. As is shown in FIG. 79, this thyristor has an n-type emitter layer 7 formed between two buried insulated gate electrodes 5, a p-type well layer 61 formed on the emitter layer 7, and an n+-type source layer 62 formed on the well layer 61. It also has an n-type buffer layer 2 interposed between the n-type base layer 1 and the anode-side p-type emitter layer 3. A anode 11 is formed on the emitter layer 3. A cathode (not shown) is formed on the upper surface of the structure.

To turn on this thyristor, a voltage positive with respect to the cathode (not shown) is applied to the gate electrodes 5. N-channels are thereby formed in the p-type well layer 61 and the p-type base layer 45. Since these n-channel extend along the electrodes 5, they short-circuit the n+-type source layer 62 to the n-type emitter layer 7, and the n-type emitter layer 7 to the n-type base layer 1. As a result, electrons are injected into the n-type base layer 1.

To turn off the thyristor, a voltage either zero or negative with respect to the cathode is applied to both insulated gate electrodes 5, whereby the n-type emitter layer 7 is electrically disconnected from the n+-type source layer 62 and the n-type base layer 1. Electrons stop moving into the n-type base layer 1, and holes are released from the n-type base layer 1 to the cathode (not shown) through the p+-type layer 10 connected to the rear ends of the gate electrodes 10.

Figure 80:
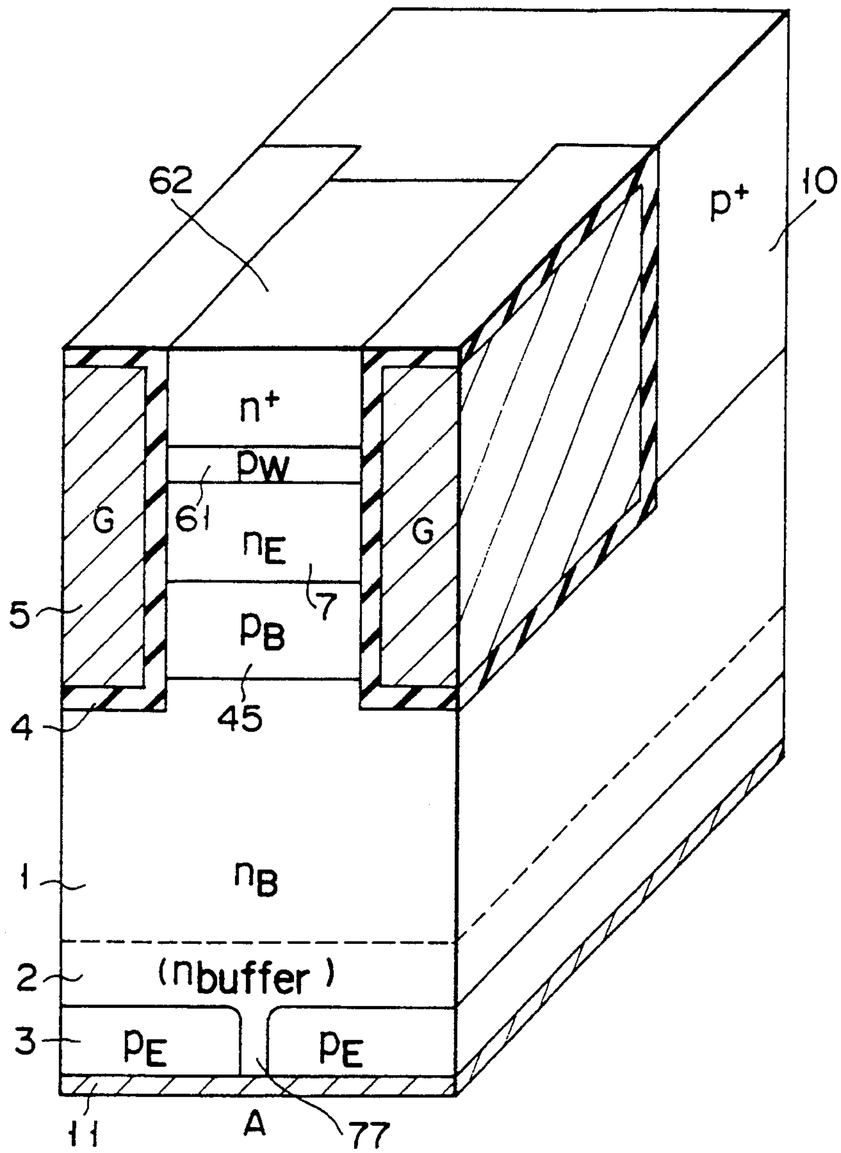
FIGS. 80, 81, and 82 are perspective views showing three modifications of the thyristor shown in FIG. 79, respectively.
Figure 81:
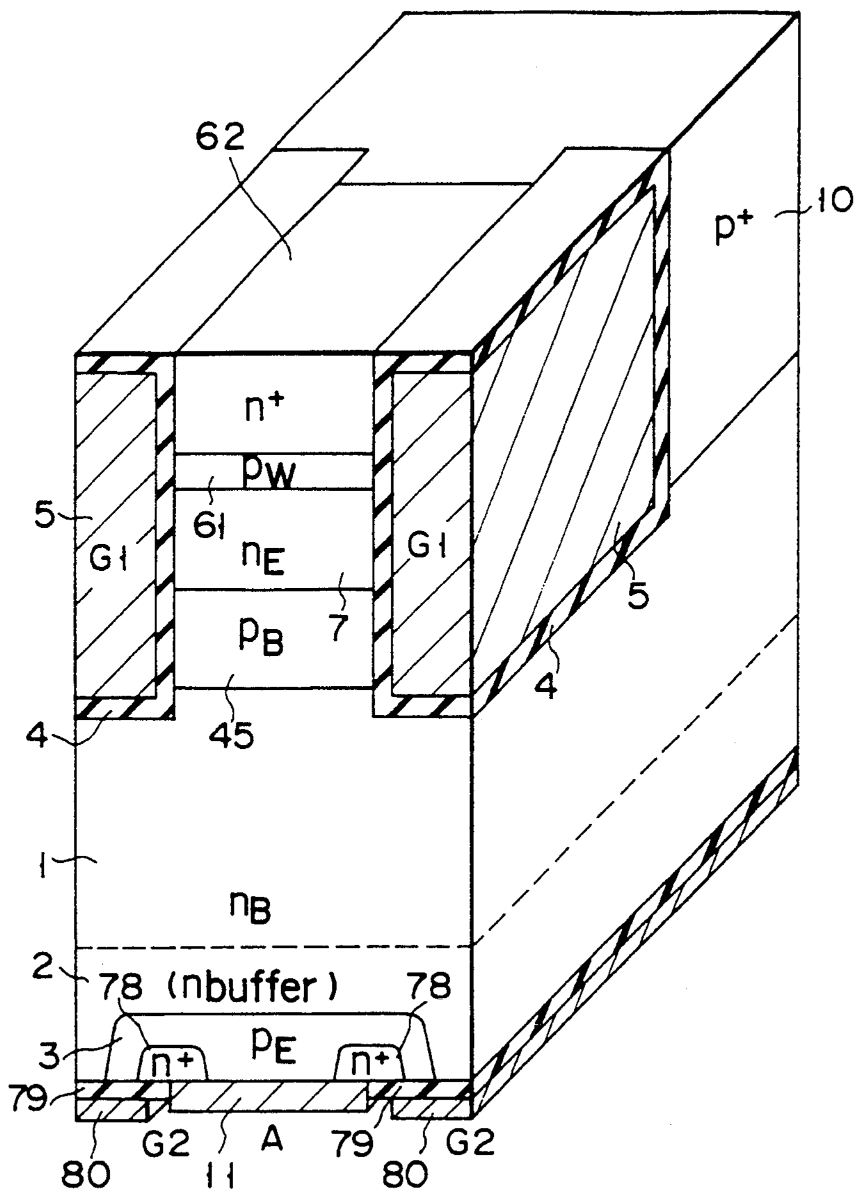
Figure 82:
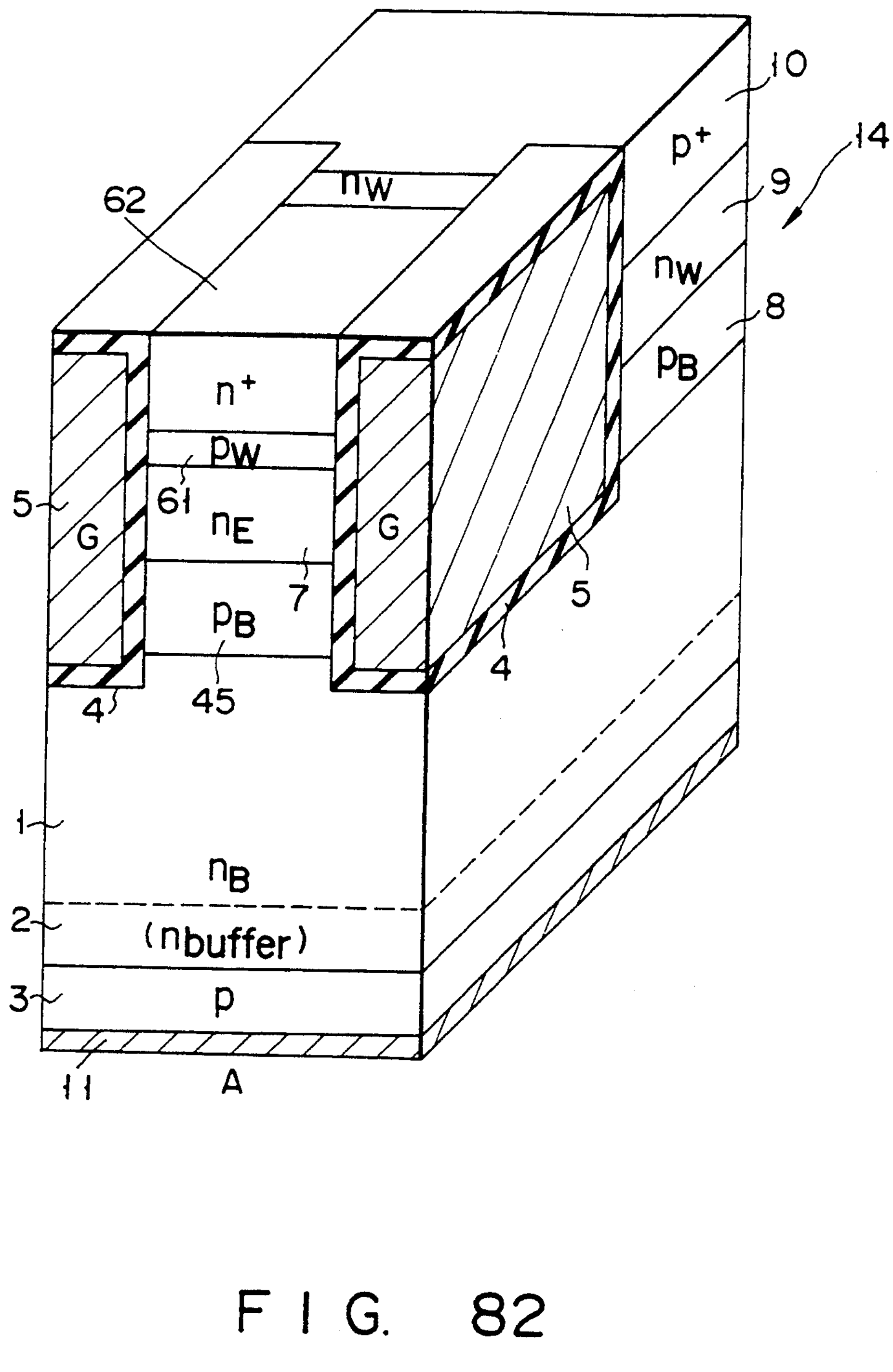

FIGS. 80, 81, and 82 show three modifications of the thyristor shown in FIG. 79. The modified thyristor of FIG. 80 has an emitter short-circuit section 77 in the anode-side surface. The modified thyristor shown in FIG. 81 is of so-called "double-gate structure." It is characterized in three respects. First, an p-type emitter layer 3 is formed in a selected portion of the n-type buffer layer 2. Second, n+-type source layers 78 are formed in the surface of the p-type emitter layer 3. Third, gate-insulating films 79 are formed on those portions of the layer 3 which are each sandwiched between the n-type buffer layer 2 and the n+-type source layer 78, and gate electrodes 80 are formed on these gate-insulating films 79. The modified thyristor of FIG. 82 has a hole-bypassing vertical p-channel MOS transistor 14 of the type shown in FIG. 1. The MOS transistor 14 comprises a p-type layer 8, an n-type layer 9 (i.e., channel layer) formed on the layer 8, and a p+-type layer 10—all connected to the rear ends of the insulated gate electrodes 5. The n-type layer 9 functions as the channel of the MOS transistor.

Figure 83:
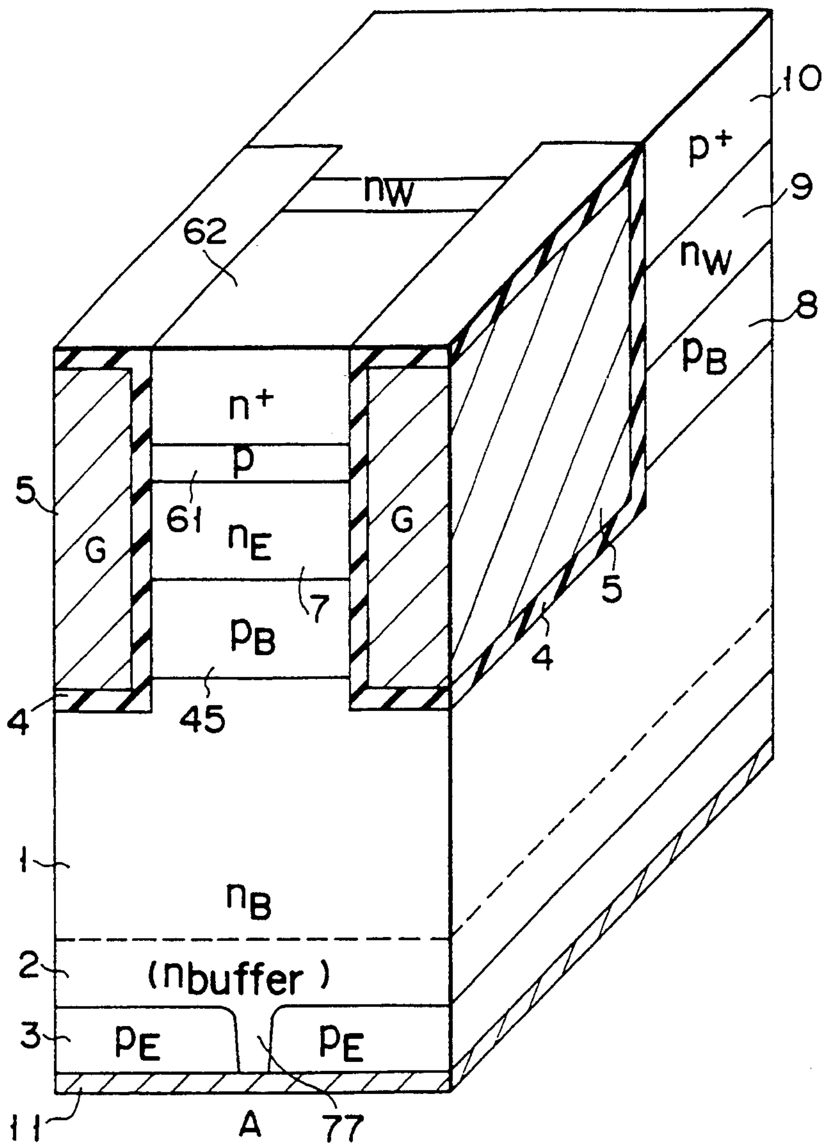

FIGS. 83 and 84 show two modifications of the thyristor shown in FIG. 82. The modified thyristor of FIG. 83 has an emitter short-circuiting section 77 formed in the anode-side surface, as in the thyristor of FIG. 80. The modified thyristor of FIG. 84 has an transistor in the anode-side surface, as in the thyristor of FIG. 81.

The thyristors shown in FIGS. 79 to 84 have high turn-off efficiency.

FIG. 85 shows a thyristor which has a flat gate electrode, instead of buried insulated gate electrodes of the type incorporated in the thyristor of FIG. 82. As is shown in FIG. 85, this thyristor comprises an n-type base layer 1, an n-type buffer layer 2, a p-type emitter layer 3, an p-type base layer 45 sufficiently thick and formed in the surface of the layer 1, and an n+-type emitter layer 7 formed in the surface of the layer 45. The thyristor further comprises a stripe-shaped n+-type source layer 72 formed in the surface of the p-type base layer 45, and a stripe-shaped p+-type drain layer 10 formed in the surface of the n-type base layer 1 and extending along the n+-type source layer 72. A gate-insulating film 73 is formed on the entire upper surface at which the layers 1, 7, 10, 45, and 72 are exposed. A stripe-shaped gate electrode 74 is formed on the film 73 and located above that portion of the layer 45 which is interposed between the layers 7 and 72. Another stripe-shaped gate electrode 74 is formed on the film 73 and located above those portions of the layers 1 and 45 which are interposed between the layers 10 and 72. An anode 11 is formed on the lower surface of the p-type emitter layer 3. Two stripe-shaped cathodes 12 are formed on the layers 10 and 72, respectively.

To turn on this thyristor, a voltage positive with respect to the cathodes 12 is applied to the gate electrodes 74. An n-channel is thereby formed in the surface of p-type base layer 45, short-circuiting the n+-type emitter layer 7 and the n+-type source layer 72. Another n-channel is formed in the end portion of the p-type base layer 45 and electron move from the n+-type source layer 72 into the n-type base layer 1 through the another n-channel, whereby the thyristor is turned on. To turn off the thyristor, a voltage negative with respect to the cathodes 12 is applied to the gate electrodes 74. The n+-type emitter layer 7 is thereby electrically disconnected from the n+-type source layer 72. Simultaneously, an inversion layer is formed in the surface of the n-type base layer 1, electrically connecting the p-type base layer 45 and the p+-type drain layer 10. As a result, holes are released from the layer 45 to the cathodes 12, whereby the thyristor is turned off.

In the thyristor of FIG. 85, the p-channel MOS transistor section is off as long as the thyristor remains on. The thyristor has no hole bypasses, and its turn-on characteristic is not degraded at all. Since the p-type base layer 45, formed below the n+-type source layer 72, is sufficiently thick, there is little parasitic transistor effect. Thus, when the thyristor is turned off, holes are released through the p-type base layer 45 (having a low resistance with respect to the horizontal direction) and the p-type inversion channel. Obviously, the thyristor has high turn-off efficiency.

FIG. 86 shows a modification of the insulated-gate thyristor illustrated in FIG. 85. This modified thyristor has a thin p-type well layer 91 formed beneath the n+-type source layer 7.2, and a high-impurity p+-type layer 75 formed at the bottom of the p-type well layer 91. In the modified thyristor, the p-type well layer 91, formed independently of the p-type base layer 45, serves to set the threshold voltage of the MOS transistor at an optimal value. Further, the high-impurity p+-type layer 75 suppresses the parasitic thyristor effect. Hence, the thyristor shown in FIG. 86 can have high turn-off efficiency.

FIGS. 87, 88, and 89 show three modifications of the thyristor shown in FIG. 86. The modified thyristor of FIG. 87 has an emitter short-circuiting section 77 in the anode-side surface. The modified thyristor of FIG. 88 has a MOS transistor formed not only in the cathode-side surface, but also in the anode-side surface, for selectively forming an emitter short-circuiting section in the anode-side surface, too. The modified thyristor of FIG. 89 has an emitter short-circuiting section 96 in the cathode-side surface. The insulated-gate thyristors shown in FIGS. 87, 88, and 89 can also have high turn-off efficiency.

Figure 90:
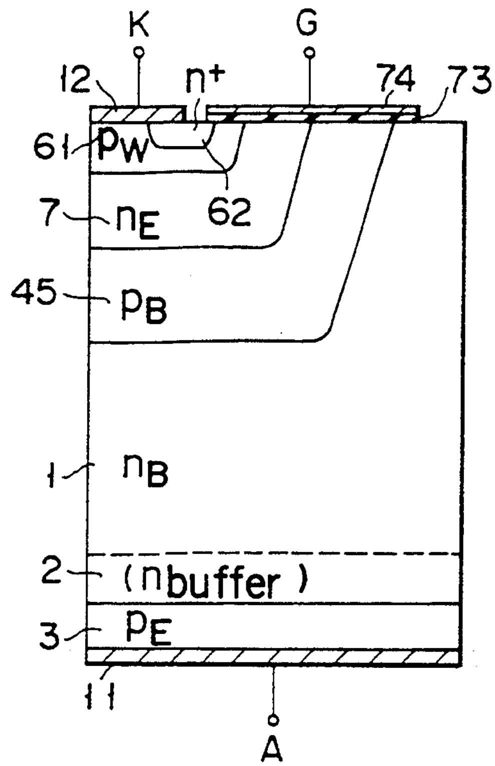
FIG. 90 is a sectional view showing an insulated-gate thyristor which has a planar MOS transistor.

FIG. 90 shows a modification of the thyristor shown in FIG. 79. The modified thyristor has a flat gate electrode, instead of buried insulated gate electrodes. As is shown in FIG. 90, this thyristor comprises a p-type base layer 45 formed in a selected portion of an n-type base layer 1, an n-type emitter layer 7 formed in a selected portion of the p-type base layer 45, an p-type well layer 61 formed in a selected portion of the n-type emitter layer 7, and an n+-type source layer 62 is formed in a selected portion of the p-type well layer 61. A cathode 12 is formed, contacting both the n+-type source layer 62 and the p-type well layer 61. A gate-insulating film 73 is formed on the exposed portions of the layers 1, 7, 45, 61 and 62. A gate electrode 74 is formed on the insulating film 73.

To turn on the thyristor, a voltage positive with respect to the cathodes 12 is applied to the gate electrodes 74. The n-channels are thereby formed, whereby the n-type emitter layer 7 and the n+-type source layer 62 are short-circuited and the n-type emitter layer 7 and n-type base layer are short-circuited. Electrons move from the n+-type source layer 62 into the n-type base layer 1 through the n-channels, whereby the thyristor is turned on. To turn off the thyristor, a voltage negative with respect to the cathodes 12 is applied to the-gate electrodes 74. The n+-type emitter layer 7 is thereby electrically disconnected from the n-type source layer 62 and also from the n-type base layer 1. Hence, electrons stop moving from the source layer 62. Simultaneously, a p-channel is formed in the surface of the n-type emitter layer 7, short-circuiting the p-type base layer 45 to the p-type well layer 61. As a result, holes are released from the layer 1 to the cathodes 12 through the p-type base layer 45, the p-channel and the p-type well layer 61, whereby the thyristor is turned off.

The thyristor shown in FIG. 90 has no hole bypasses while it remains on. When the thyristor is turned off, the injection of electrons from the cathode and the emitter is suppressed, and holes are released from the layer 1 to the cathodes 12 through the hole bypasses. Obviously, the thyristor has high turn-off efficiency, not at the expense of its good turn-on characteristic.

Figure 91:
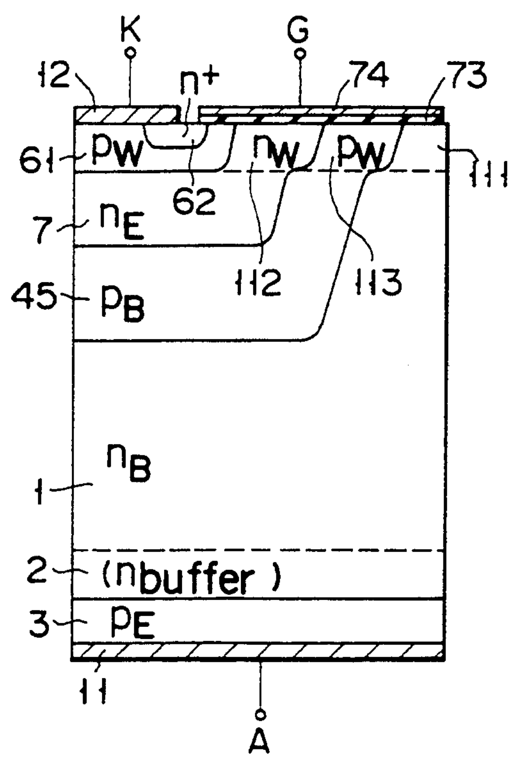
FIG. 91 is a sectional view showing a modification of the insulated-gate thyristor illustrated in FIG. 90.

FIG. 91 shows a modification of the thyristor shown in FIG. 90. The modified thyristor has an n-type base layer 1, a p-type base layer 45 formed in the base layer 1, an n-type emitter layer 7 formed in the p-type base layer 45, and an n-type epitaxial layer 111. The epitaxial layer 111 has been formed after forming the p-type base layer 45 and the n-type emitter layer 7 by means of impurity diffusion. The thyristor further has a p-type well layer 61 and a p-type well layer 113, which have been simultaneously formed on the epitaxial layer 111. The p-type well layer 113 contacts the p-type base layer 45. An n-type well layer 112 is formed between the p-type well layers 61 and 113.

The p-type base layer 45, n-type emitter layer 7, p-type well layer 61, and n+-type source layer 62 of the thyristor shown in FIG. 90 have been formed in this order by means of impurity diffusion. Inevitably, the layer 45, formed first, has the lowest impurity concentration, whereas the layer 62, formed last, has the highest impurity concentration. It is, therefore, difficult for any MOS transistor formed in the thyristor to have an optimal threshold value. By contrast, any MOS transistor formed in the thyristor of FIG. 91 can have an optimal threshold value. This is because the p-type well layers 61 and 113 and the n-type well layer 112 are formed after the n-type emitter layer 7 and the epitaxial layer 111 have been formed.

Figure 92:
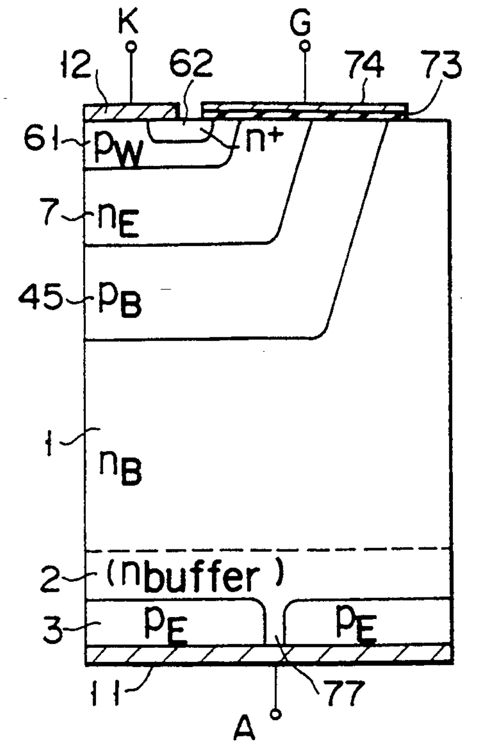
FIGS. 92 and 93 are sectional views showing two modifications of the thyristor shown in FIG. 90.
Figure 93:
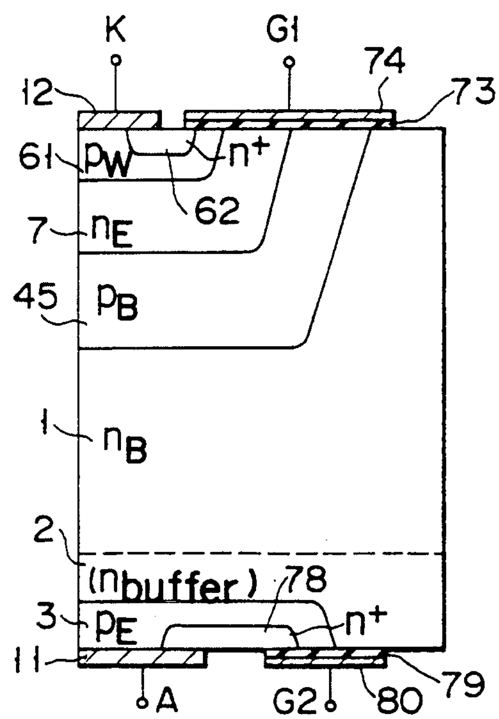

FIG. 92 shows an insulated-gate thyristor which is identical to the thyristor of FIG. 90, except that an emitter short-circuiting section 77 is formed in the anode-side surface. FIG. 93 shows an insulated-gate thyristor which is identical to the thyristor of FIG. 90, except that a MOS transistor is formed in the anode-side surface, for short-circuiting the emitter. Both thyristors shown in FIGS. 92 and 93 attain the same advantage as the thyristor illustrated in FIG. 90.

Figure 94:
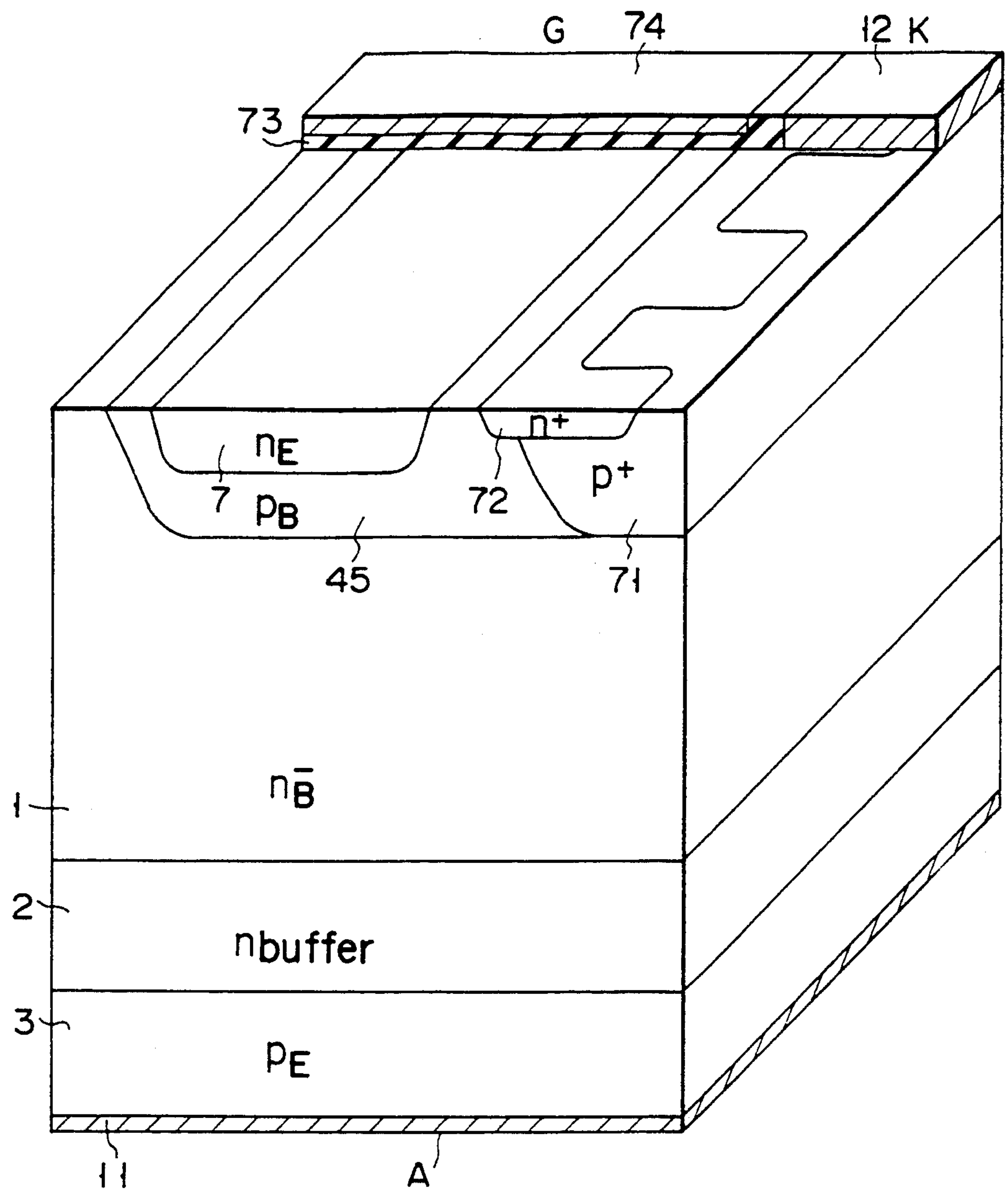
FIG. 94 is a perspective view showing a modification of the thyristor illustrated in FIG. 43.

FIG. 94 illustrates an insulated-gate thyristor designed by improving the thyristor shown in FIG. 43. This thyristor has an n+-type source 72 which is shaped like a comb and has a continuous stripe-shaped portion extending along the n-type emitter layer 7, not consisting of completely discrete parts as in the embodiment of FIG. 43.

In the thyristor of FIG. 43, the discrete n+-type source layers 72 reduce parasitic thyristor effect, but the effective gate width of the MOS transistor formed between the n-type emitter layer 7 and the n+-type source layers 72 (i.e., the total side length of the layers 72 opposing to that of the emitter 7) is small, inevitably increasing the on-voltage of the thyristor. By contrast, in the thyristor of FIG. 94, the effective gate width of the MOS transistor has a sufficient since the n+-type source layer 72 has a continuous stripe-shaped portion extending along the n-type emitter layer 7, and a sufficiently great cathode short-circuiting rate is ensured. Further, the parasitic thyristor effect can be reduced.

FIG. 95 is a plan view showing another insulated-gate thyristor according to the invention, and FIG. 96 is a sectional view, taken along line A—A′ in FIG. 95. As is shown in FIG. 96, an n-type base layer 1 is located adjacent to a p-type emitter layer 3. A p-type base layer 45 is formed in the n-type base layer 1 by means of impurity diffusion, and an n-type emitter layer is formed in the p-type base layer 45 by means of impurity diffusion. A pnpn thyristor is thereby formed. An n-type source layer 72 is formed in the p-type base layer 45, located beside the the n-type emitter layer 7. An gate-insulating film 73 is formed on that portion CH1 of the layer 45 which is interposed between the emitter layer 7 and the source layer 72. A first gate electrode 74 (G1) is formed on this gate-insulating film 73. Hence, the p-type base layer 45, the emitter layer 7, the source layer 72, the insulating film 73, and the gate electrode 74 constitute an n-channel MOS transistor whose channel region is said portion CH1 of the layer 45.

As is evident from FIG. 96, a p-type source layer 93 is formed in that portion of the n-type source layer 72 which is remote from the n-type emitter layer 7. A gate-insulating film is formed on that portion CH2 of the source layer 72 which is interposed between the p-type base layer 45 and the p-type source layer 93. A gate electrode 95 (G2) is formed on this gate-insulating film.

When a positive voltage is applied to both gate electrodes G1 and G2, the channel region CH1 is made conductive, whereas the channel region CH2 is rendered non-conductive. As a result, an emitter short-circuiting section no longer exists. Electrons are thereby injected at high rate from the n-type emitter layer 7 into the pnpn thyristor, whereby the thyristor is turned on. When a negative voltage is applied to both gate electrodes G1 and G2, the channel regions CH1 and CH2 are rendered non-conductive and conductive, respectively. Electrons stop moving from the n-type emitter layer 7, and holes are released to the cathode 12 through the channel region CH2. As a result, the thyristor is turned off.

The thyristor shown in FIGS. 95 and 96 has no cathode short-circuiting paths while it is on. Electrons can, therefore, be injected at high rate into the pnpn thyristor structure.

Figure 97:
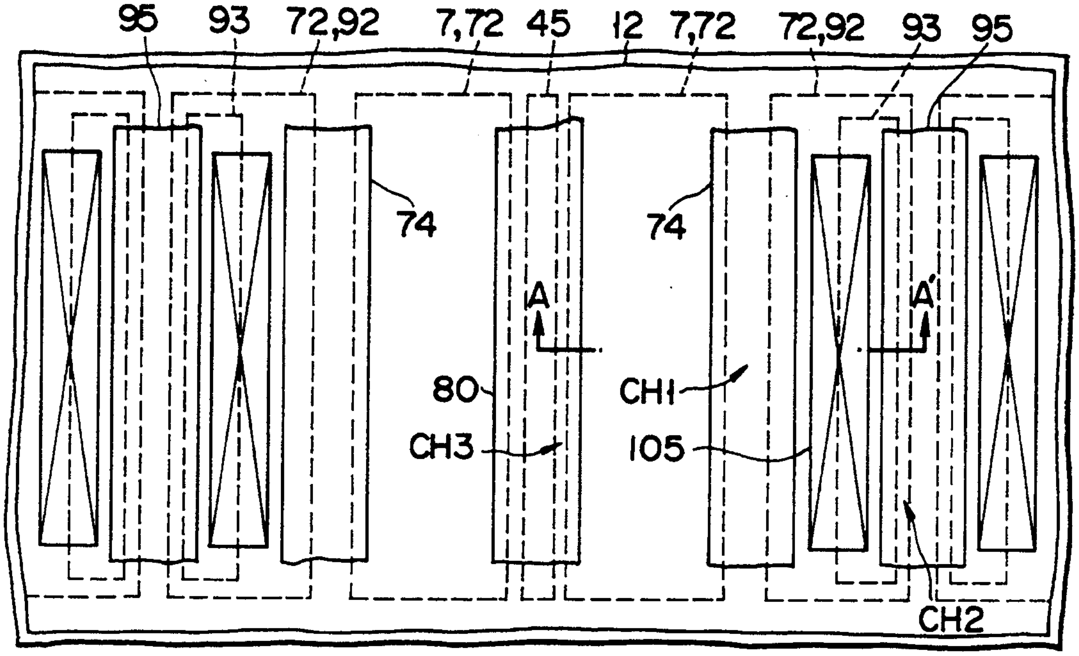
FIG. 97 is a plan view of a modification of the thyristor shown in FIG. 95.
Figure 98:
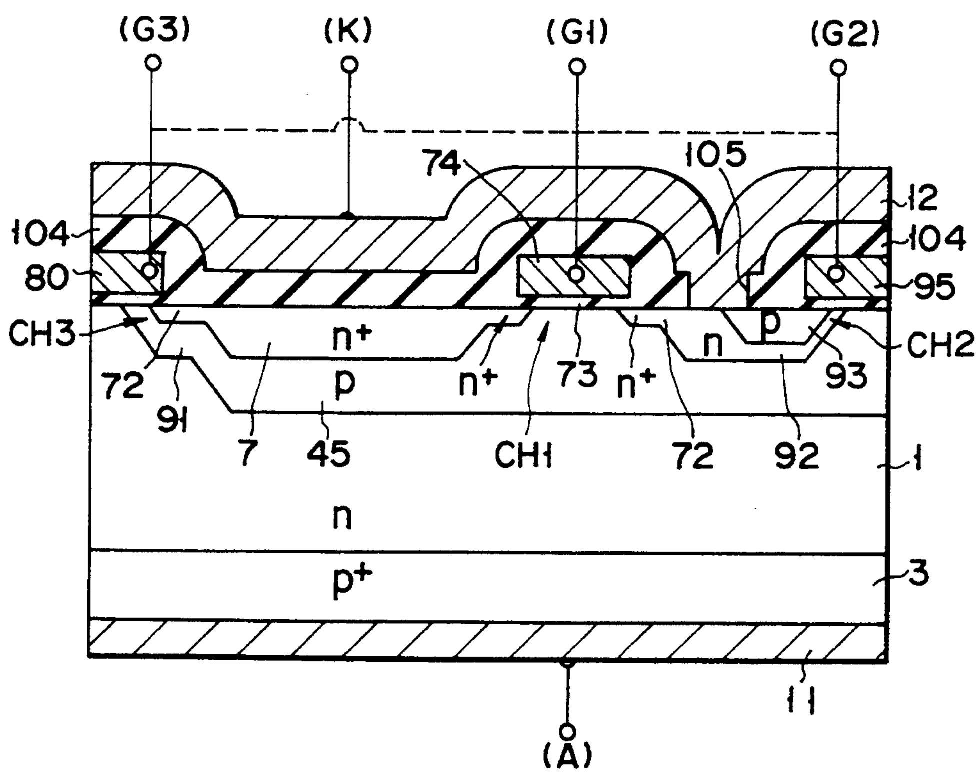
FIG. 98 is a sectional view, taken along line A—A' in FIG. 97.

FIG. 97 is a plan view of a modification of the thyristor shown in FIG. 95, and FIG. 98 is a sectional view, taken along line A—A' in FIG. 97. As is shown in FIG. 98, a high-impurity source layer 72 is formed right below one side of a gate electrode 74, not only decreasing the resistance of the source layer, but also controlling the channel length with high accuracy. A p-type well 91 is formed, contacting one side of the p-type base layer 45, an n-type source layer 72 is formed, contacting one side of an n-type emitter layer 7, and a third gate electrode 80 (G3) is formed, right above the channel region CH3, i.e., that portion of the p-type well 91 which is sandwiched between an n-type base layer 1 and the n-type source layer 72. Thus, a turn-on MOSFET is formed at one side of the n-type emitter layer 72. The thyristor is turned on, starting at this MOSFET, preventing the parasitic thyristor, whose n-type emitter is an n-type well layer 92, from being latched up. In this respect the thyristor of FIGS. 97 and 98 is advantageous over the thyristor shown in FIGS. 95 and 96.

Figure 99:
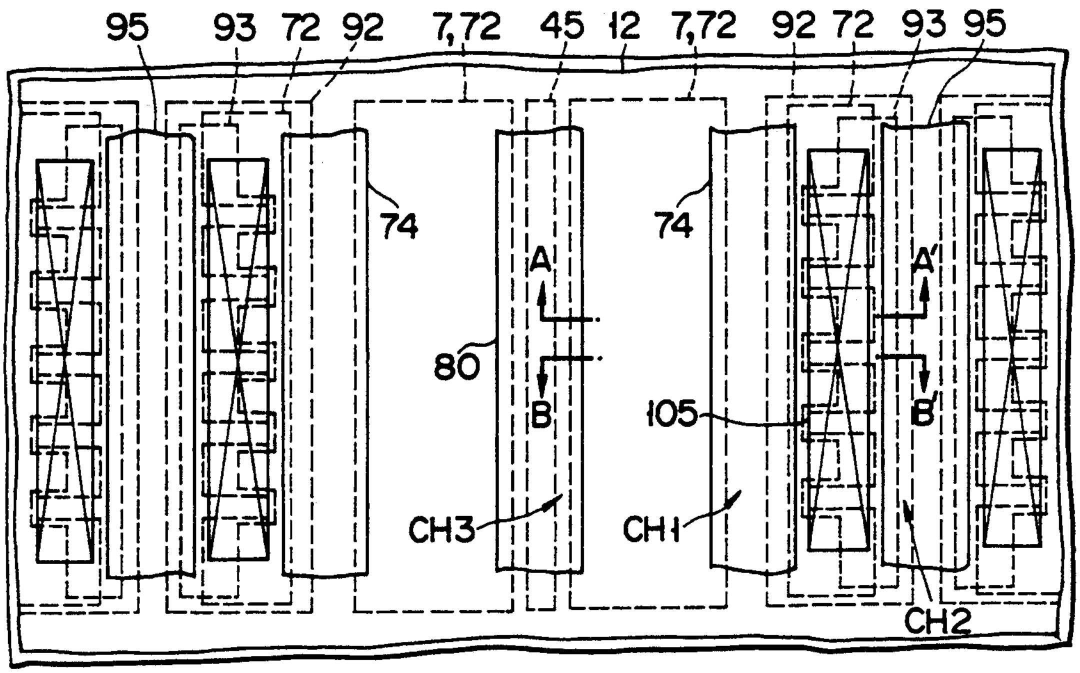
FIG. 99 is a plan view of another modification of the thyristor shown in FIG. 95.
Figure 100:
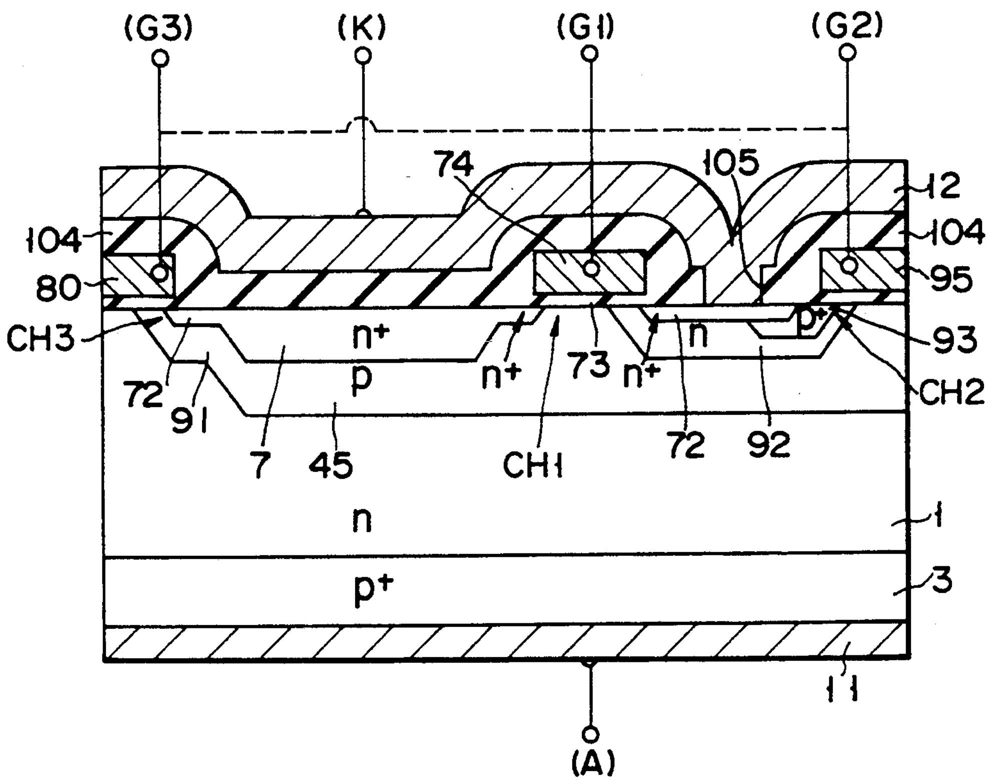
FIG. 100 is a sectional view, taken along line A—A' in FIG. 99.
Figure 101:
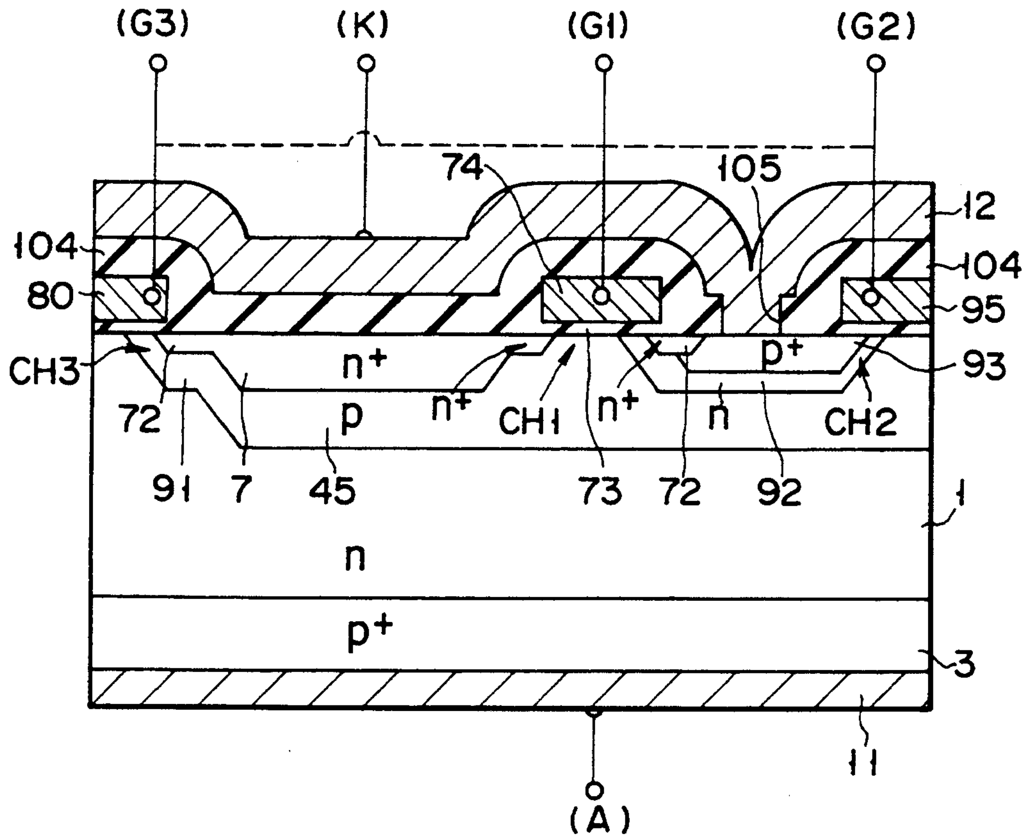
FIG. 101 is a sectional view, taken along line B—B' in FIG. 99.

FIG. 99 is a plan view of another modification of the thyristor shown in FIG. 95, FIG. 100 is a sectional view, taken along line A—A' in FIG. 99, and FIG. 101 is a sectional view, taken along line B—B' in FIG. 99. This modified thyristor is characterized in that both an n-type source layer 72 and a p-type source layer 93 are shaped like a comb, and their elements are arranged in an interdigital pattern. Due to the interdigital pattern, the contact hole 105 can be so small that the contact resistances of both layers 72 and 93 are sufficiently low. Also, owing to the interdigital pattern, the region of the layers 72 and 93 has but a little dead space.

FIG. 102 is a plan view of another type of an insulated-gate thyristor according to the invention, and FIG. 103 is a sectional view, taken along line A—A' in FIG. 102. In this embodiment, a p-type source layer 93 is formed in that portion of the n-type source layer 72 which is adjacent to the n-type emitter layer 7. Hence, when this thyristor is turned off, holes can be efficiently released through a channel CH2 which is near the thyristor region. The the thyristor of FIGS. 102 and 103 can therefore be turned off at high speed.

FIG. 104 is a plan view showing a modification of the thyristor illustrated in FIG. 102, and FIG. 105 is a sectional view, taken along line A—A' in FIG. 104. This embodiment is characterized by a turn-on insulated gate electrode 80, which enables the thyristor to be turned on at high speed.

Figure 106:
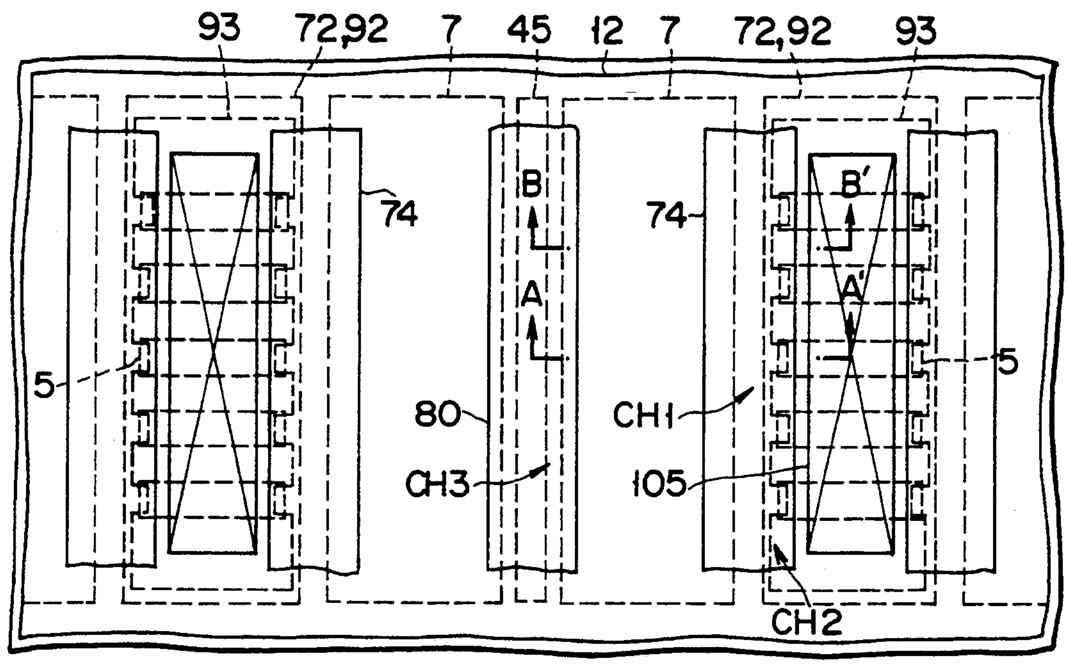
FIG. 106 is a plan view showing another modification of the thyristor illustrated in FIG. 102.
Figure 107:
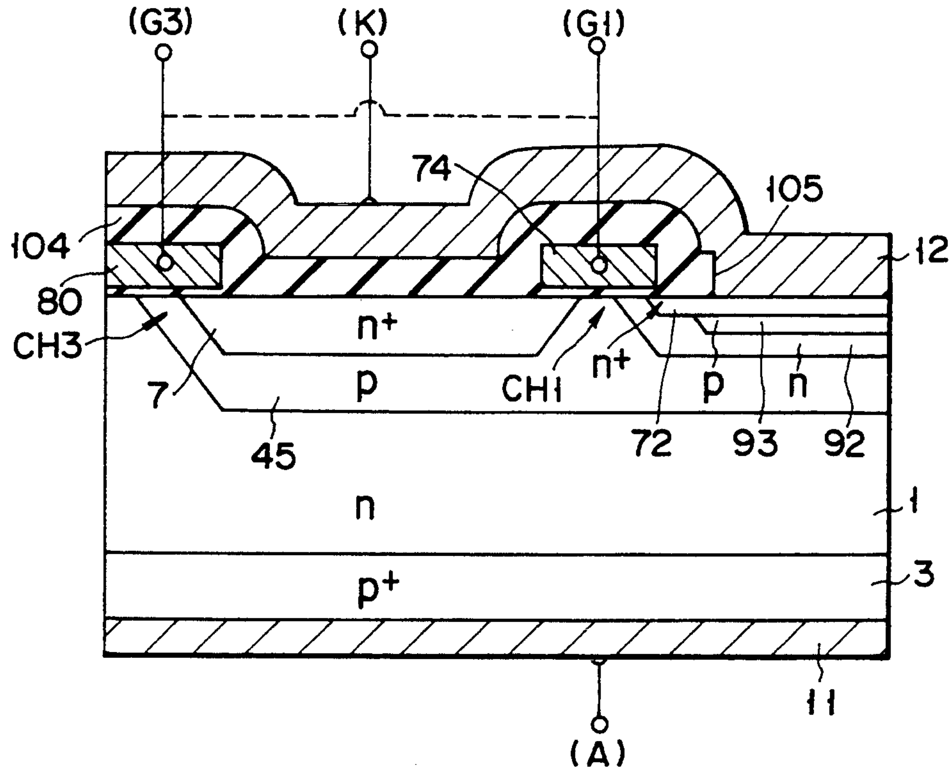
FIG. 107 is a sectional view, taken along line A—A' in FIG. 106.
Figure 108:
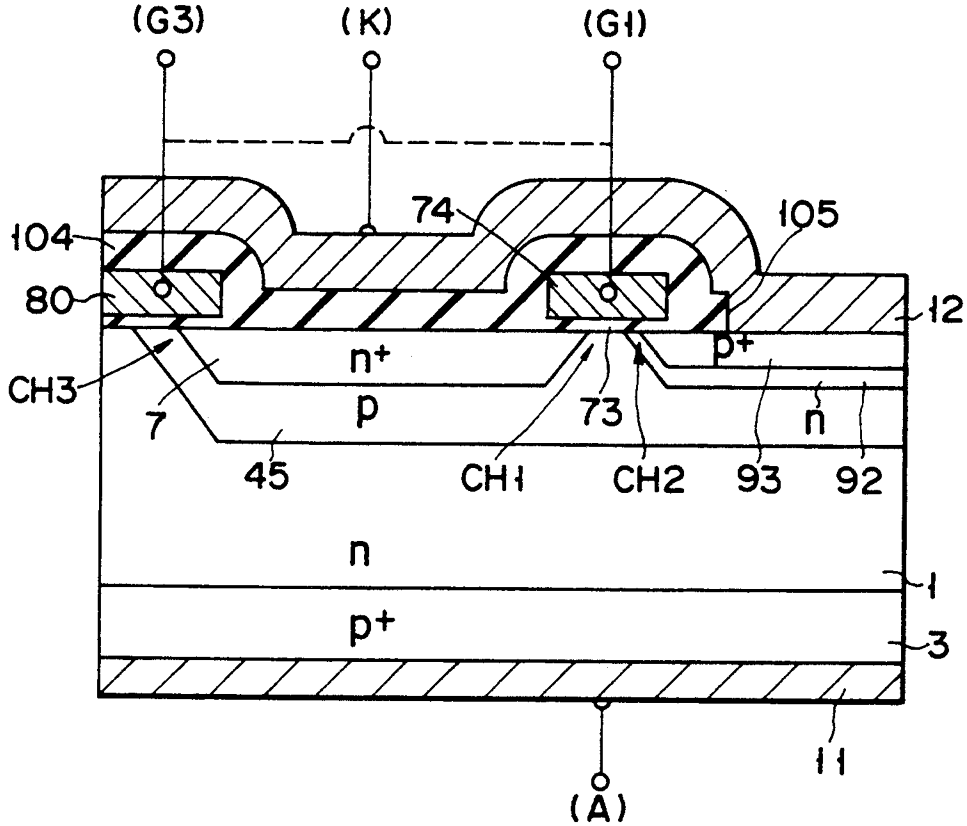
FIG. 108 is a sectional view, taken along line B—B' in FIG. 106.

FIG. 106 is a plan view showing another modification of the thyristor illustrated in FIG. 102, FIG. 107 is a sectional view, taken along line A—A' in FIG. 106, and FIG. 108 is a sectional view, taken along line B—B' in FIG. 106. This thyristor is characterized in that both an n-type source layer 72 and a p-type source layer 93 are shaped like a comb, and their elements are arranged in an interdigital pattern. Due to the interdigital pattern, the source resistances of both layers 72 and 93 are sufficiently low. Hence, the thyristor can have a low on-voltage.

Figure 109:
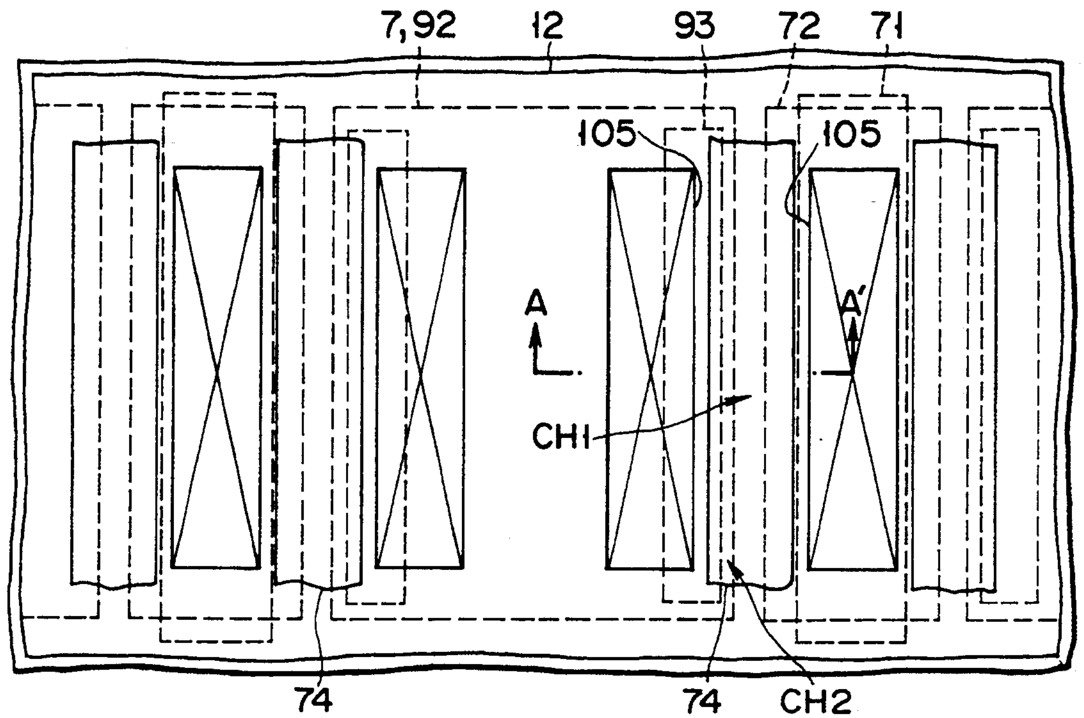
FIG. 109 is a plan view showing an insulated-gate thyristor according to the present invention.
Figure 110:
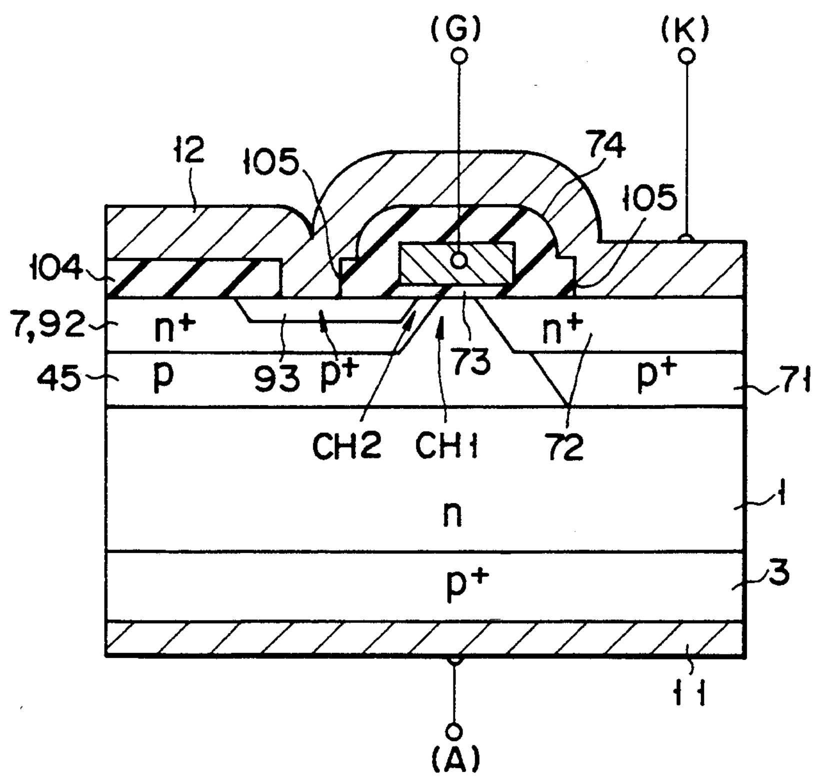
FIG. 110 is a sectional view, taken along line A—A' in FIG. 109.

FIG. 109 is a plan view showing an insulated-gate thyristor according to the present invention, and FIG. 110 is a sectional view, taken along line A—A' in FIG. 109. This thyristor has a p-type source layer 93 formed in that portion of the n-type emitter layer 7 which is adjacent to a gate electrode G. Hence, when a positive voltage is applied to the gate electrode G, the channel regions CH1 and CH2 are made conductive and non-conductive, respectively. As a result, the thyristor has no emitter short-circuiting section any longer. Electrons are thereby injected at high rate from the n-type emitter layer 7 to the thyristor section. As a result, the thyristor is turned on. On the other hand, when a negative voltage is applied to the gate electrode G, the channel regions CH1 and CH2 are rendered non-conductive and conductive, respectively. Electrons stops moving from the n-type emitter layer 7, and holes are released to the cathode 12 through the channel region CH2. As a result, the thyristor is turned off.

When the thyristor remains on, electrons are injected into the thyristor section at high rate since the cathode 12 is not short-circuited. The thyristor has a p-type layer 71 for preventing the parasitic thyristor, whose emitter is an n-type source layer 72, from being latched up.

FIG. 111 is a plan view showing a modification of the thyristor shown in FIG. 109, and FIG. 112 is a sectional view, taken along line A—A' in FIG. 111. The modified thyristor is designed by adding a turn-on insulated gate 80 to the thyristor of FIG. 109. It can, therefore, be turned on at higher speed than the thyristor illustrated in FIG. 109.

Figure 113:
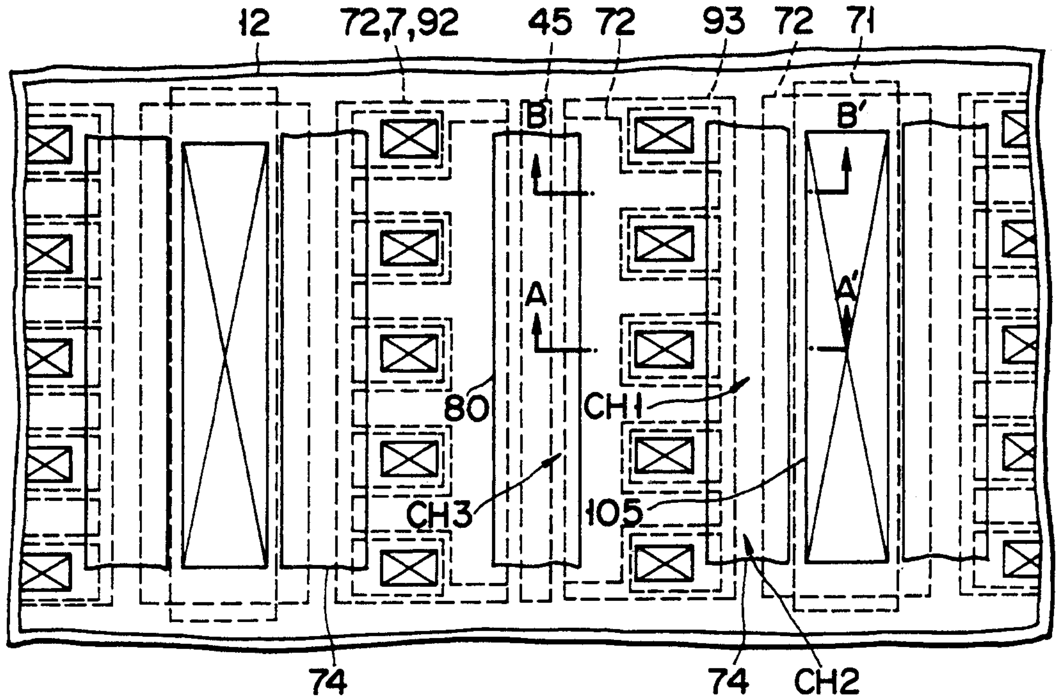
FIG. 113 is a plan view showing another modification of the thyristor shown in FIG. 109.
Figure 114:
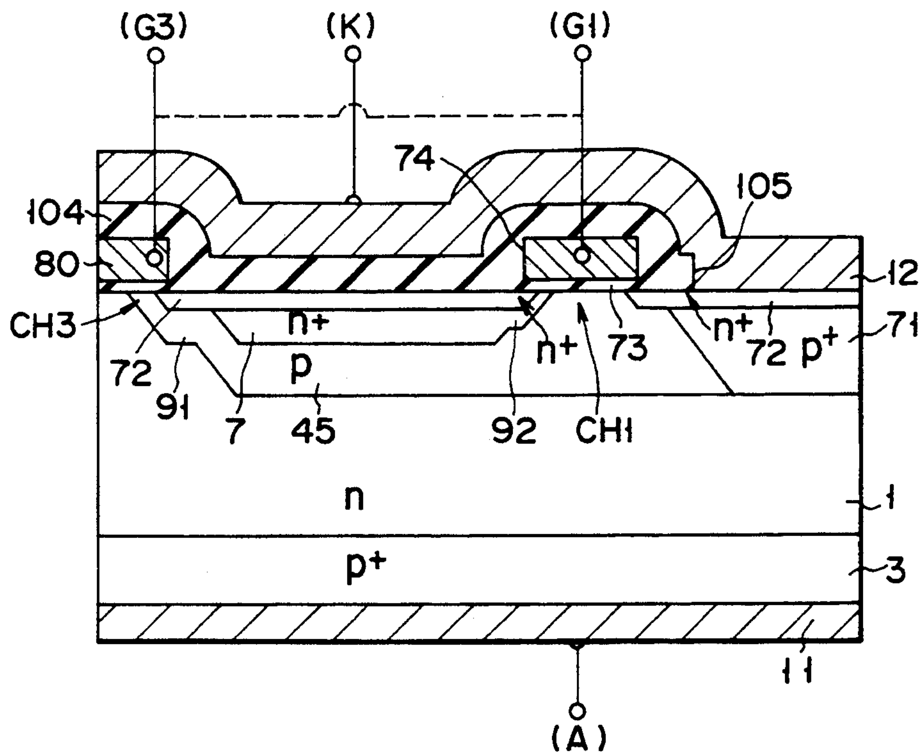
FIG. 114 is a sectional view, taken along line A—A' in FIG. 113.

FIG. 113 is a plan view showing another modification of the thyristor shown in FIG. 109, FIG. 114 is a sectional view, taken along line A—A' in FIG. 113, and FIG. 115 is a sectional view, taken along line B—B' in FIG. 113. This modification has a high-impurity n-type source layer 72. This source layer 72 reduces the source-layer resistance, imparting a low on-voltage to the thyristor.

FIG. 116 is a plan view showing still another modification of the thyristor shown in FIG. 109, and FIG. 117 is a sectional view, taken along line A—A' in FIG. 116. The modified thyristor is characterized in that a high-impurity p-type source layer 93 is formed in the substantially entire surface of the n-type emitter layer 7. Hence, the cathode 12, which is made of metal and has high thermal conductivity, covers the substantially entire surface of the thyristor section through which more current flows than in any other section. The heat generated in the thyristor can, therefore, be radiated outside through the cathode 12 with high efficiency. As a result, the thyristor can have high operating frequency.

Figure 118:
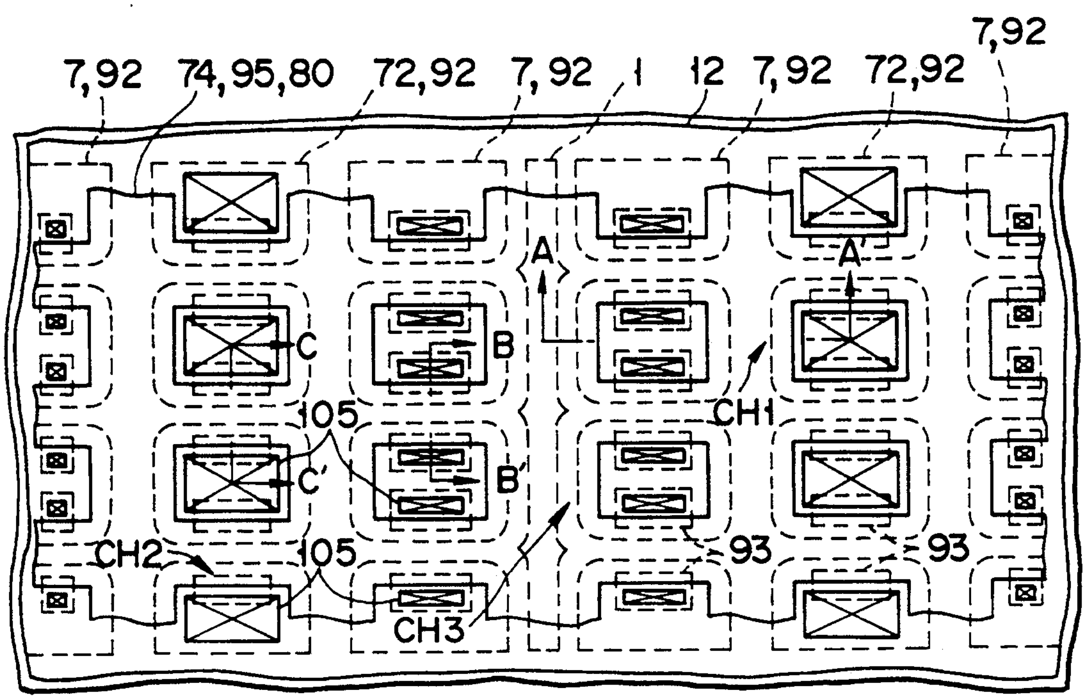
FIG. 118 is a plan view illustrating an insulated-gate thyristor according to the present invention.
Figure 119:
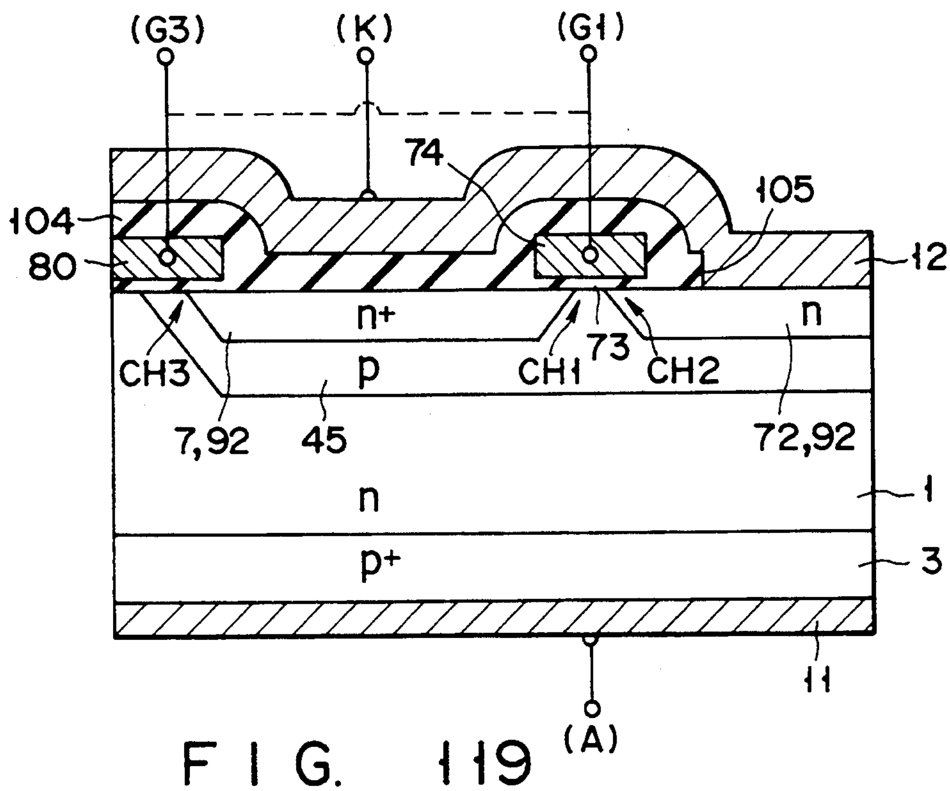
FIG. 119 is a sectional view, taken along line A—A' in FIG. 118.
Figure 120:
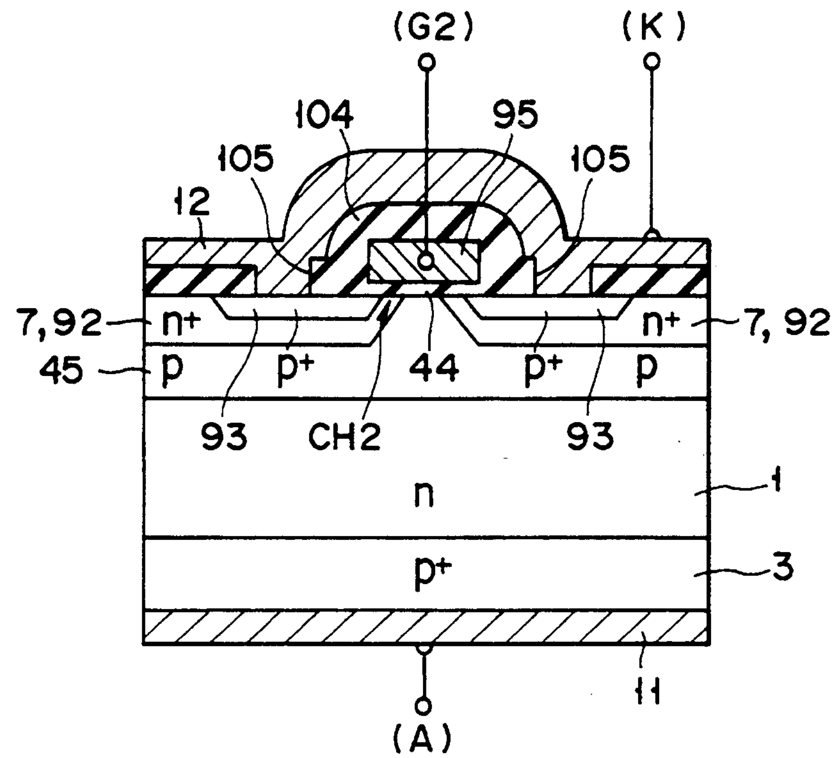
FIG. 120 is a sectional view, taken along line B—B' in FIG. 118.
Figure 121:
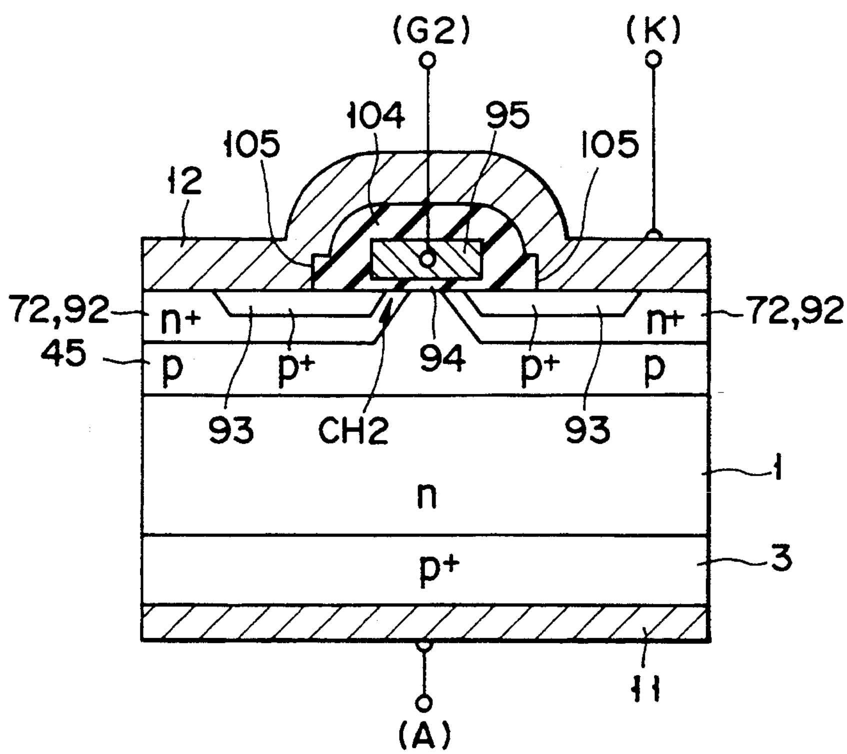
FIG. 121 is a sectional view, taken along line C—C' in FIG. 118.

FIG. 118 is a plan view illustrating an insulated-gate thyristor according to the present invention, FIG. 119 is a sectional view, taken along line A—A' in FIG. 118, FIG. 120 is a sectional view, taken along line B—B' in FIG. 118, and FIG. 121 is a sectional view, taken along line C—C' in FIG. 118. This embodiment is characterized in two respects. First, it has a single electrode layer consisting of gate electrodes 80 and gate electrode 95, each crossing one gate electrode 80. Second, it has n-type emitter layers 7 and n-type source layers 72—each shaped like a rectangle. As far as FIG. 119 is concerned, this thyristor looks like a conventional one. Nonetheless, since the p-type base layer 45 does not contact the cathode 12, the electron-injection efficiency can be high. Further, this thyristor can be turned on at high speed since electrons are injected from the n-type emitter layer 7 into the n-type base layer 1 through the channel region CH3. As can be understood from FIGS.

120 and 121, taken along line B—B' and line C—C', respectively, a p-type source layer 93 is formed in the edge portion of the n-type emitter layer 7 and that of each n-type source layer 72. Thus, when the gate G2 is biased, accumulated holes are released to the cathode 12 through the channel region CH2. The thyristor is thereby turned off at high speed.

Since the p-type source layer 93 is located far from the n-type source layer 72, the source resistance is lower than otherwise. Hence, the thyristor can have a low on-voltage. Further, since the width and length of the n-type emitter layer 7 can be changed, and the lengths of the channel regions CH1 and CH2 can, therefore, be set independently, the thyristor can have an optimal turn-on voltage and a high turn-off efficiency.

In the insulated-gate thyristor of FIG. 118, the gate electrodes of three types are integrated. Instead, these electrodes can be separated ones so that the thyristor may be driven more efficiently or may be manufactured more easily. Further, it suffices to form the p-type source layer 93 in either the edge portion of the n-type emitter layer 7 or that of the n-type source layer 72, not in the edge portions of both layers 7 and 72.

In the embodiment of FIG. 118, the p-type source layer 93 functions as anode of a zener diode, not as source layer of an insulated-gate transistor, if it is located far from the gate electrode 93. In this case, too, the thyristor of FIG. 118 has no cathode short-circuiting section, and can have a high electron-injection efficiency.

Figure 122:
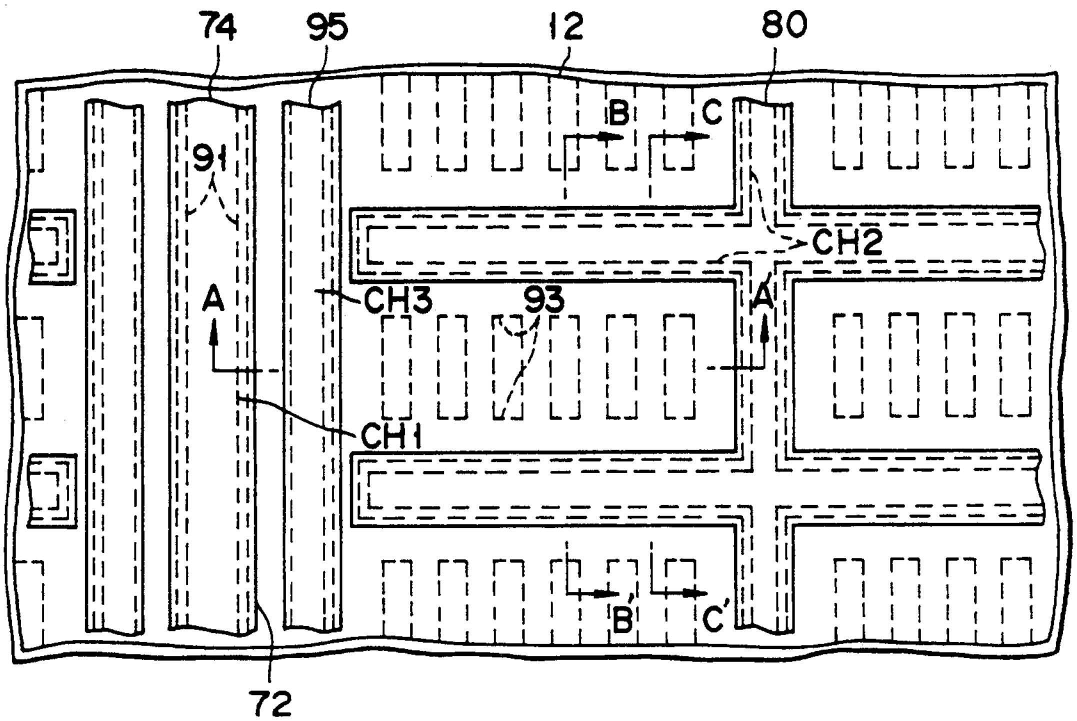
FIG. 122 illustrates an insulated-gate thyristor according to the invention.
Figure 123:
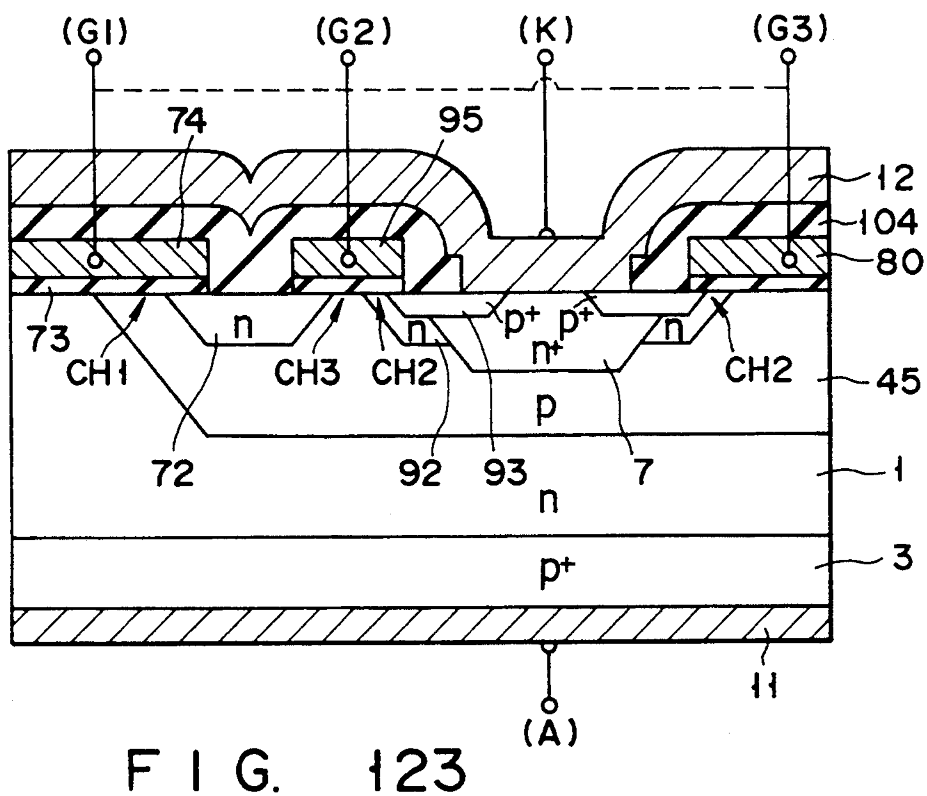
FIG. 123 is a sectional view, taken along line A—A' in FIG. 122.
Figure 124:
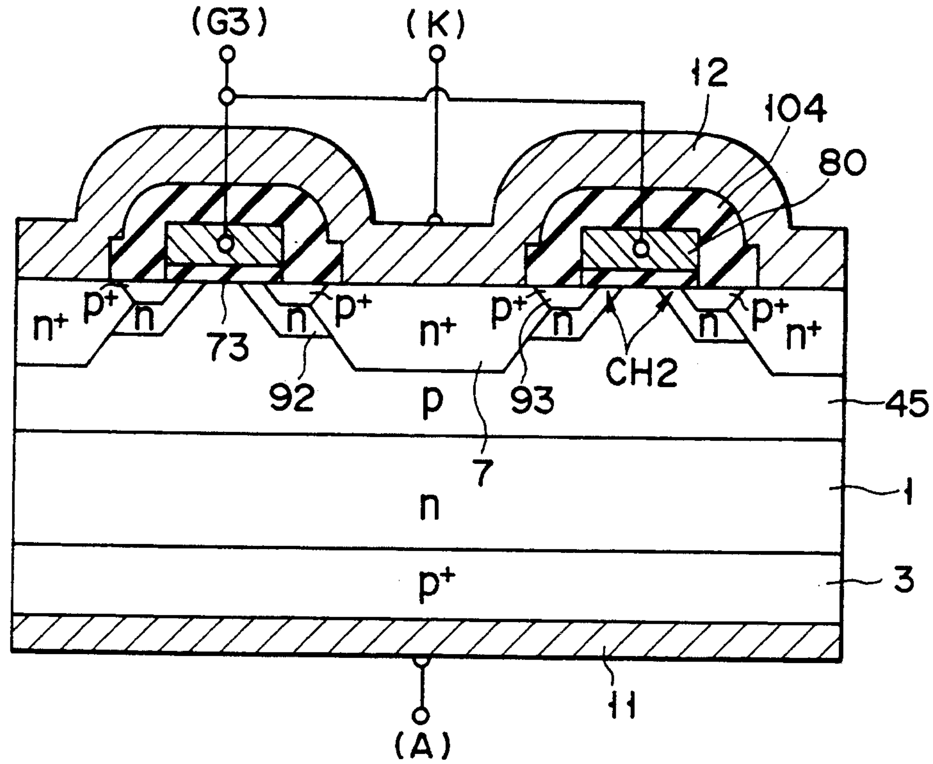
FIG. 124 is a sectional view, taken along line B—B' in FIG. 122.
Figure 125:
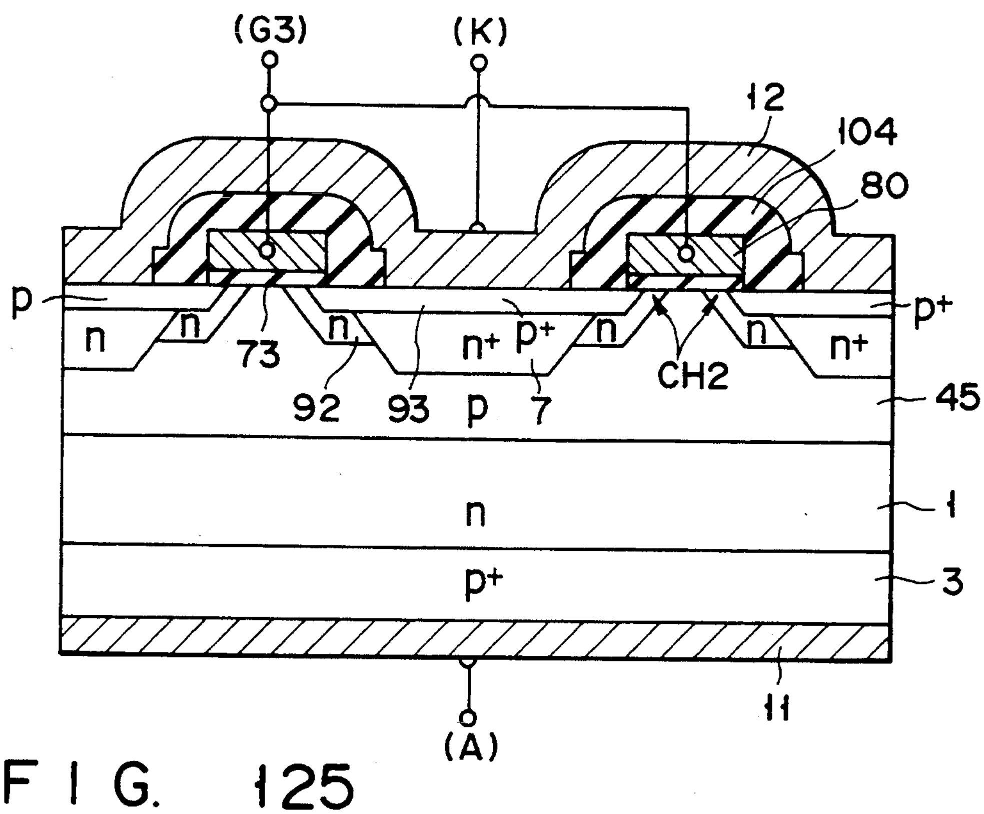
FIG. 125 is a sectional view, taken along line C—C' in FIG. 122.

FIG. 122 illustrates an insulated-gate thyristor according to the invention, FIG. 123 is a sectional view, taken along line A—A' in FIG. 122, FIG. 124 is a sectional view, taken along line B—B' in FIG. 122, and FIG. 125 is a sectional view, taken along line C—C' in FIG. 122. In this thyristor, an n-type base layer 1 is formed on an p-type emitter layer 3. A p-type base layer 45 is formed in the n-type base layer 1 by impurity diffusion. An n-type emitter layer 7 is formed in the p-type base layer 45. The layers 3, 1, 45, and 7 form a pnpn thyristor. An anode 11 is formed on the p-type emitter layer 3, and a cathode 12 is formed on the n-type emitter layer 7. The n-type emitter layer 7 is divided into a plurality of stripe-shaped regions. The cathode 12 is put in ohmic contact with these stripe-shaped emitter regions 7.

As is evident from FIGS. 123 and 124, a third gate electrode 80 is formed in the shape of a comb, extending along the long sides of each n-type emitter layer 7 and along one short side thereof. An n-type well layer 92 and a p-type source layer 93 are formed, self-aligned with the ends of the third gate electrode 80, constituting the channel region CH2 of a turn-off MOSFET. As is best shown in FIG. 122, the p-type source layer 93 is patterned like a ladder. FIG. 124 shows a cross section, wherein the n-type emitter layer 7 contacts the cathode 12. FIG. 125 shows a cross section, wherein the p-type source layer 93 contacts the cathode 12. For the sake of simplicity, a part of the ladder-patterned p-type source layer 93 is not shown in FIG. 123.

Due to the specific shape of the p-type source layer 93, the cathode 12 can be connected to the source layer 93 even if the n-type emitter layer 7 has a very small contact hole. Hence, the thyristor of FIG. 122 can be small and have a carrier-releasing path of low resistance. As a result, the thyristor can have a great peak turn-off current.

As is shown in FIGS. 122 and 123, a first gate electrode 74 and a second gate electrode 95, both shaped like a stripe and extending along the other short end of each n-type emitter layer 7. That portion of the p-type base layer 45 which is sandwiched between the n-type source layer 72 and he n-type base layer 1 functions as a channel region CH1. A gate-insulating film 73 is formed on the channel region CH1, and the first gate electrode 74 is formed on this film 73. The layers 1, 45, 72, the film 73, and the gate electrode 74 constitute a turn-on MOSFET. That portion of the n-type well layer 92 which is interposed between the p-type base layer 45 and the p-type source layer 93 serves as a channel region CH2. That portion of the base layer 45 which is interposed between the n-type source layer 72 and the n-type well layer 92 serves as a channel region CH3. A gate insulating film 73 is formed on these channel regions CH2 and CH3, and a second gate electrode 95 is formed on this insulating film 73. The layers 45, 72, 92, and 93, the insulating film 73, and the second gate electrode 95 constitute a turn-off MOSFET and a connecting MOSFET. The n-type source layer 72 and the n-type well layer 92 are simultaneously formed by means of impurity diffusion, thus simplifying the method of manufacturing this insulated-gate thyristor.

To turn on the thyristor shown in FIGS. 122 to 125, a positive voltage is applied to the first gate electrode 74 and the second gate electrode 95. The channel regions CH1 and CH3 are thereby made conductive, thereby injecting electrons from the n-type well layer 92 to the n-type base layer 1 through the channel region CH3, the n-type source layer 72 and the channel region CH1. At the same time, holes, as many as these electrons, are injected from the p-type emitter layer 3 into the n-type base layer 1. As a result, the thyristor is turned on.

To turn off the thyristor, a negative voltage is applied to the second gate electrode 95 and the third gate electrode 80. The channel region CH2 is thereby rendered conductive, whereby the holes are released from the p-type base layer 45 to the cathode 12 through the channel region CH2 and the p-type source layer 93 with this operation, the potential of the n-type emitter layer 7 becomes equal to that of the p-type base layer 45. As a result, electrons stops moving from the n-type emitter layer 7, and the thyristor is turned off.

In this embodiment, the channel region CH1 of the turn-on MOSFET is isolated from the channel region CH2 of the turn-off MOSFET. Therefore, the resistance of the diffusion layer forming a carrier-releasing path becomes lower when the thyristor is turned off. The channel region CH2 can have as high a turn-off efficiency as that of the channel region CH2 which is operated by the insulated gate 80. The n-type source layer 72, which a component of the turn-on MOSFET, is isolated from any other layer when the channel region CH3 is made non-conductive, that is when the thyristor is turned off. Hence, the parasitic thyristor, whose emitter is the n-type source layer 72, is not latched up to degrade the turn-off characteristic of the thyristor.

The thyristor shown in FIGS. 122 to 125 can be turned off in another method. More specifically, a negative voltage can be applied to the third gate electrode 80, and a negative voltage is applied, upon lapse of a predetermined time, to the first gate electrode 74 and the second gate electrode 95. In this method, the thyristor is turned off after excessive carriers have been expelled from the n-type base layer 1. Thus, when the thyristor is turned off by this method, the turn-off loss can be minimized.

Since the gate electrodes are set apart from one another, the thyristor can operate reliably, no matter how much the channel regions CH1, CH2 and CH3 differ in their threshold voltages.

Figure 126:
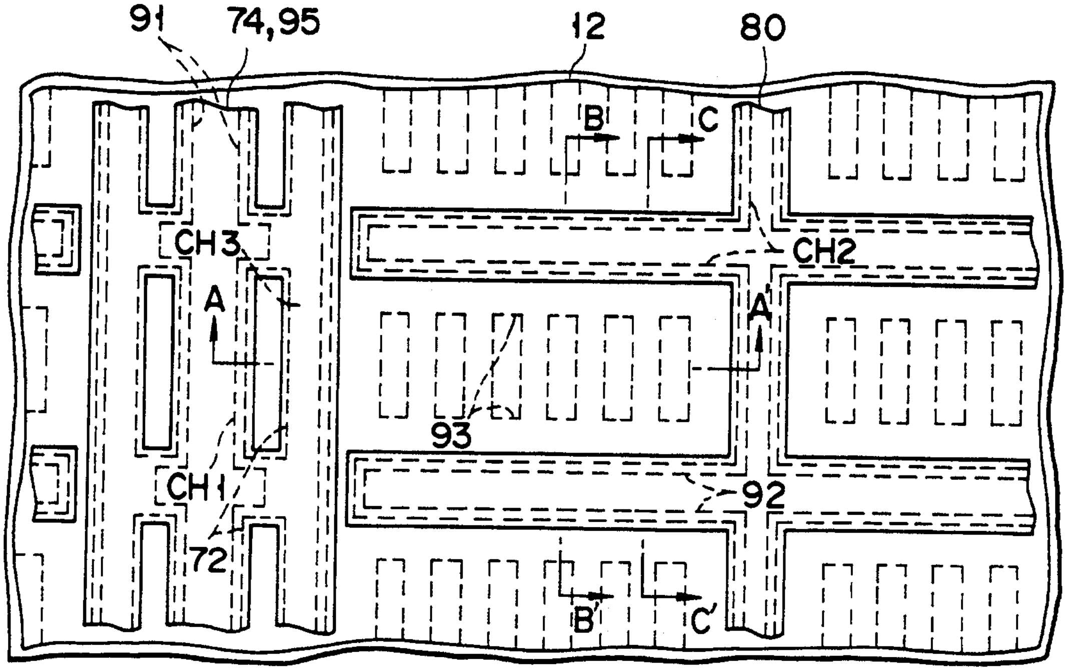
FIG. 126 is a plan view showing a modification of the insulated-gate thyristor illustrated in FIG. 122.

FIG. 126 shows a modification of the thyristor illustrated in FIG. 122. The cross sections of the modified thyristor, taken along line A—A', line B—B', and line C—C' are identical to those shown in FIGS. 123, 124, and 125, respectively. This modified thyristor has a gate electrode used in place of the first and second gate electrodes 74 and 95, and a third gate electrode 80. To be more specific, this gate electrode, corresponding to the electrodes 74 and 95, have connecting portions which are located in parallel axes of the branching portions of a third gate electrode 80.

The modified thyristor of FIG. 126 is advantageous in that an single electrode can control an on and off operations of the trigger portion formed at one end of a stripe-shaped n-type emitter layer 7. Moreover, since the channel region CH1 has a threshold voltage lower than that of the channel region CH2, the channel regions CH1 and CH2 are successively made conductive when the thyristor is turned on, and successively made non-conductive when the thyristor is turned off.

Figure 127:
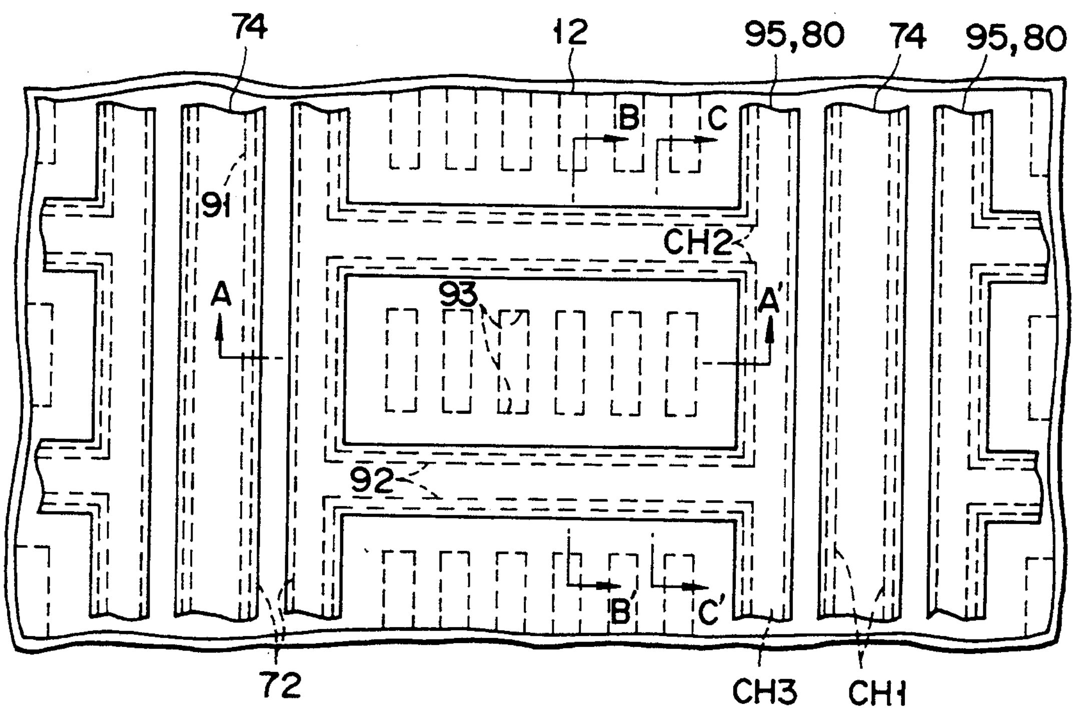
FIG. 127 is a plan view showing another modification of the thyristor shown in FIG. 122.

FIG. 127 shows another modification of the thyristor illustrated in FIG. 122. The cross sections of this modified thyristor, taken along line A—A', line B—B', and line C—C' are identical to those shown in FIGS. 123,124, and 125, respectively. The thyristor has a first gate electrode 74 and another gate electrode used in place of the second and third gate electrodes 95 and 80.

The thyristor of FIG. 127 is advantageous in that one gate electrode can control the turn-off MOSFET formed, surrounding the stripe-shaped n-type emitter layer 7. To turn on the thyristor, it is necessary to to apply a positive voltage to the gate electrodes, thereby to inject electrons into the n-type base layer 1 through the channel regions CH3 and CH1. To turn off the thyristor, it suffices to apply a negative voltage to the gate electrodes when a negative voltage is applied to the gate electrodes, the n-type source layer 72 is electrically disconnected from the n-type well layer 92, whereby holes are released through the channel region CH2.

Figure 128:
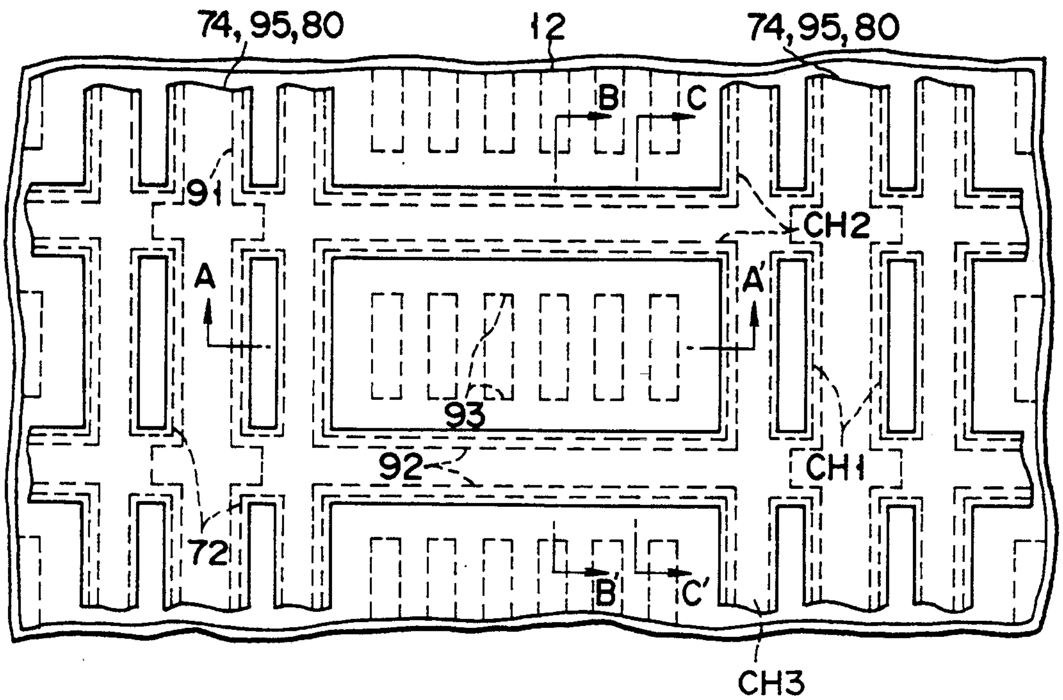
FIG. 128 is a plan view showing still another modification of the thyristor shown in FIG. 122.

FIG. 128 shows another modification of the thyristor illustrated in FIG. 122. The cross sections of this modified thyristor, taken along line A—A', line B—B', and line C—C' are identical to those shown in FIGS. 123,124, and 125, respectively. The thyristor has a single gate electrode, which is a combination of the first, second and third gate electrodes 74, 95 and 80 incorporated in the thyristor of FIG. 122.

The insulated-gate thyristor of FIG. 128 is advantageous in that a single gate electrode can severe to turning on and off the thyristor. The threshold voltages of the channel regions CH1, CH2 and CH3 of this thyristor have the relationship of: CH3>CH1>CH2. Therefore, the thyristor is turned on when a voltage higher than that of the channel region CH3 is applied to the gate electrode, and is turned off when a voltage lower than that of the channel region CH2. More precisely, when a voltage higher than that of the channel region CH3 is applied to the gate electrode, the channel region CH2 of the turn-off MOSFET becomes non-conductive, and the channel region CH1 of the turn-on MOSFET and the channel region CH3 of the connecting MOSFET successively become conductive. When a voltage lower than that of the channel region CH2, the channel region CH3 becomes non-conductive, the channel region CH1 then becomes non-conductive, and the channel region CH2 becomes conductive.

Figure 129:
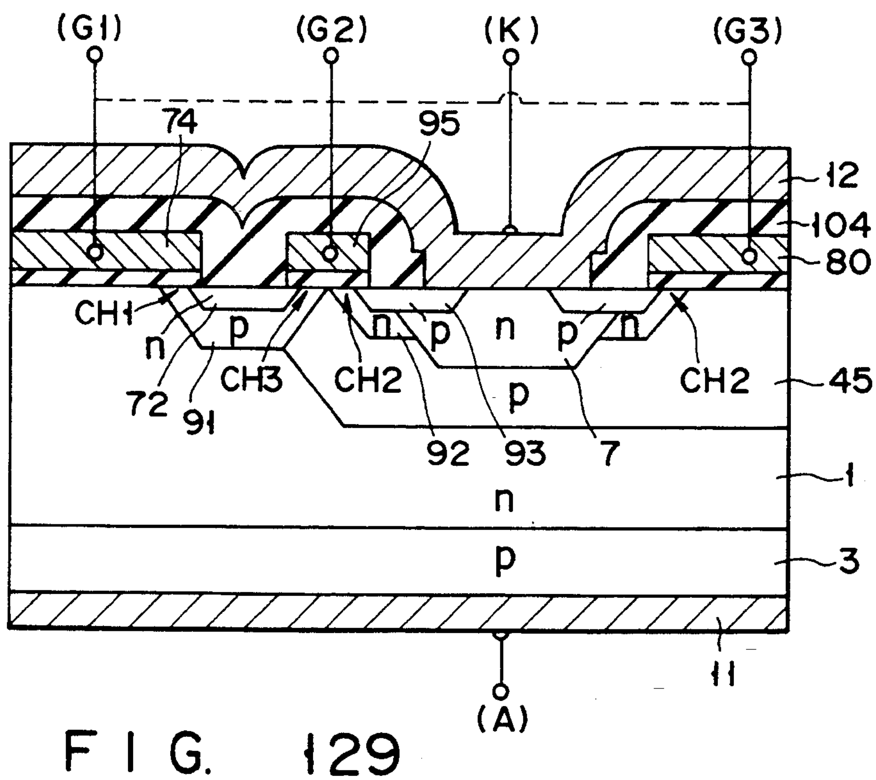
FIG. 129 is a sectional view, taken along line A—A' in FIG. 128.

FIG. 129 shows still another modification of the thyristor illustrated in FIG. 122. This cross section of the modified thyristor corresponds to the cross section taken along line A—A', B—B' of plan views shown in FIGS. 122, 126, 127 and 128. This cross section can be replaced with FIG. 123. This thyristor is characterized in that a p-type well layer 91 is formed, besides a p-type base layer 45. This p-type well layer 91 serves as well layer for the turn-on MOSFET.

With this embodiment it is possible to set the impurity concentration of the p-type well layer 91 at the best possible value, independently of the impurity concentration of the p-type base layer 45. Hence, the turn-on MOSFET can have a desired threshold voltage. For this thyristor it is important where the edge of the p-type base layer 45 is located. The location of the edge of the layer 45 is a prominent determinant of the thyristor characteristics. The p-type base layer 45 should have its edge located near the n-type source layer 72, not near the n-type emitter layer 7. The anode current would otherwise concentrate at the edge of the p-type base layer 45. Also, the edge of the p-type base layer 45 must be located closer to the n-type source layer 72 than to the second gate electrode 95, so that the diffusion layer functioning as a hole-releasing path has a low resistance, and the thyristor therefore has high turn-off efficiency.

Figure 130A:
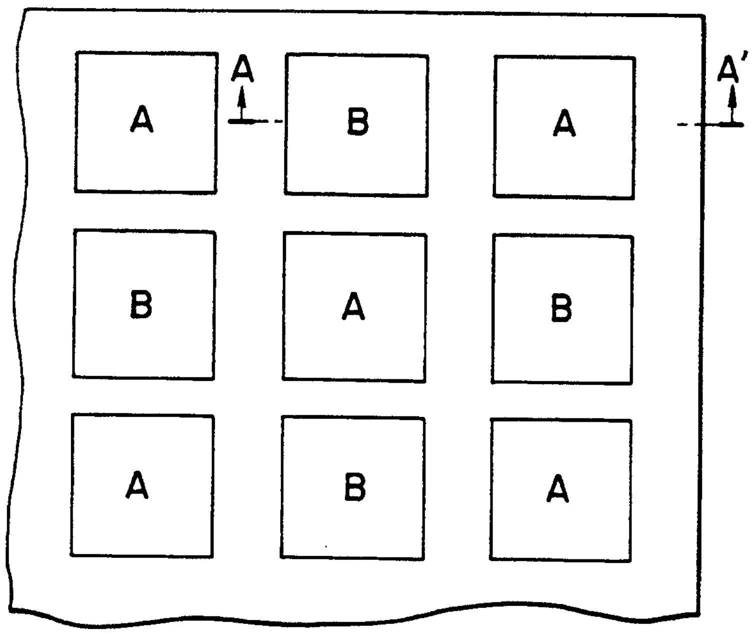
FIGS. 130A is a plan view schematically showing an MCT according to the present invention.
Figure 130B:
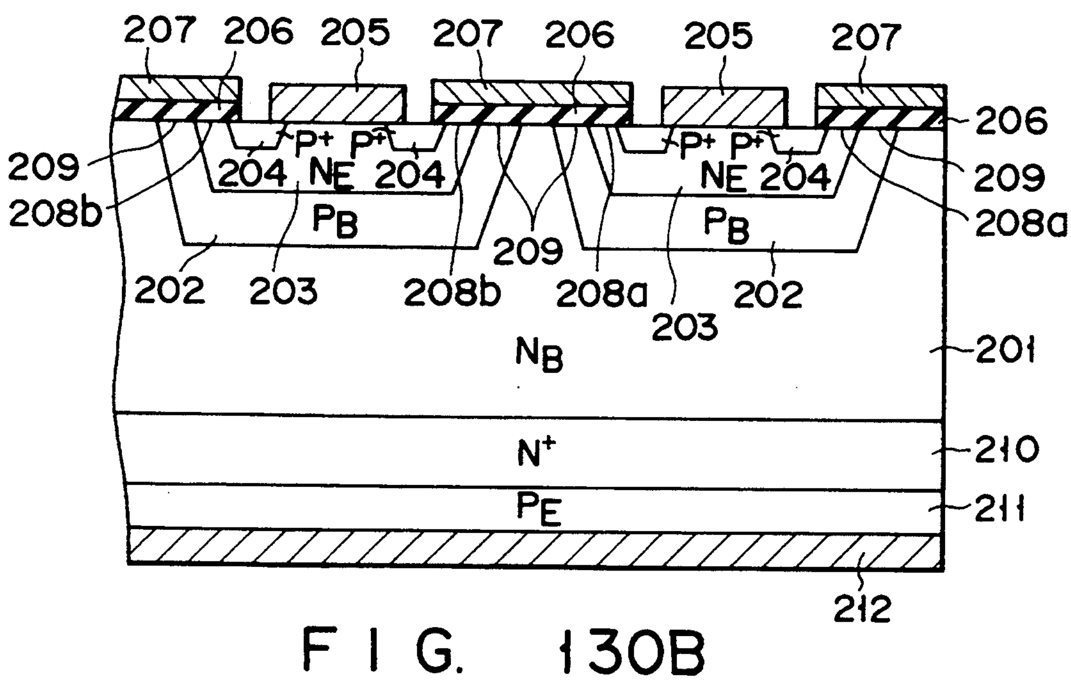
FIG. 130B is a sectional view, taken along line A—A' in FIG. 130A.

FIG. 130A schematically shows an MCT according to the invention, FIG. 130B is a sectional view, taken along line A—A' in FIG. 130A, and FIG. 131 shows the diffusion layers forming each of the identical elements of the MCT. As is shown in FIG. 130A, these elements are arranged on a semiconductor pellet, in rows and columns, and each is surrounded by a turn-on channel. More specifically, the elements A having a threshold voltage Vth1, and the elements B having a different threshold voltage Vth2 are alternately arranged in both the row direction and the column direction.

The MCT will be described in greater detail, with reference to FIG. 130B. As is shown in this figure, each element comprises a p-type base layer 202 formed in the surface of an n-type base layer 201, an n-type emitter layer 203 formed in the surface of the p-type base layer 202, a ring-shaped $p^+$-type diffusion layer 204 (i.e., the source of a turn-off MOSFET) formed in the surface of the n-type emitter layer 203, and a cathode 205 formed mostly on the emitter layer 203 and partly on the diffusion layer 204. Two peripheral portions of the n-type emitter layer 203 are turn-off channel regions **208*a* and 208*b*. That peripheral portion of the p-type base layer 202 which is sandwiched between the n-type base layer 201 and the n-type emitter layer 203 is a turn-on channel region 209. A gate-insulating film 206 is formed on the channel regions 208*a*, 208*b* and 209, and a gate electrode 207 is formed on this gate-insulating film 206**.

The turn-off region **208*a* of each element A has threshold voltage Vth1, and the turn-off region 208*b* of each element B has threshold voltage Vth2. The turn-on region 209** which surrounds each element of either type has a predetermined threshold voltage.

An $n^-$-type buffer layer 210 is formed on the lower surface of the n-type base layer 201. A p-type emitter layer 211 is formed on the $n^-$-type buffer layer 210. An anode 212 is formed on the p-type emitter layer 211.

In FIG. 130B, one n-type emitter layer is shown for each element, for the sake of simplicity. In actual power-device, however, each element has a plurality of n-type emitter layer and, hence, a plurality of turn-off channels.

Since turn-off channels of two types, either type having a specific threshold voltage, are arranged on the MCT pellet, the MCT has a broad dig/dt-controlling margin, as can be understood from to FIG. 132B. Obviously, when the MCT is turned off, dig/dr is smaller than in the conventional MCT. Current concentration is more suppressed than in the conventional MCT, and the MCT of the invention has higher turn-off efficiency. The use of MCT elements of two types having different threshold voltages Vth1 and Vth2, respectively, reduces the adverse influence of threshold-voltage difference among the elements, which inevitably occurs during the manufacture of the MCT. This also helps to suppress the current concentration. As a result, the MCT shown in FIGS. 130A and 130B can have not only high turn-on efficiency but also high turn-off efficiency.

Figure 133:
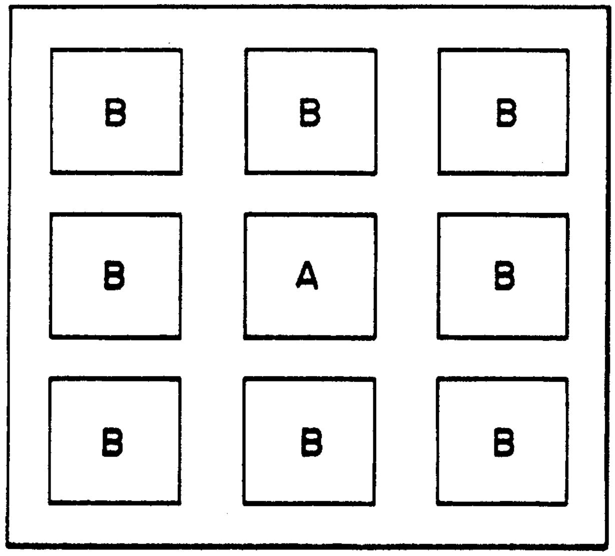
FIGS. 133 and 134 illustrate two MCTs, which differ in pattern of arranging MCT elements on an MCT pellet.
Figure 134:
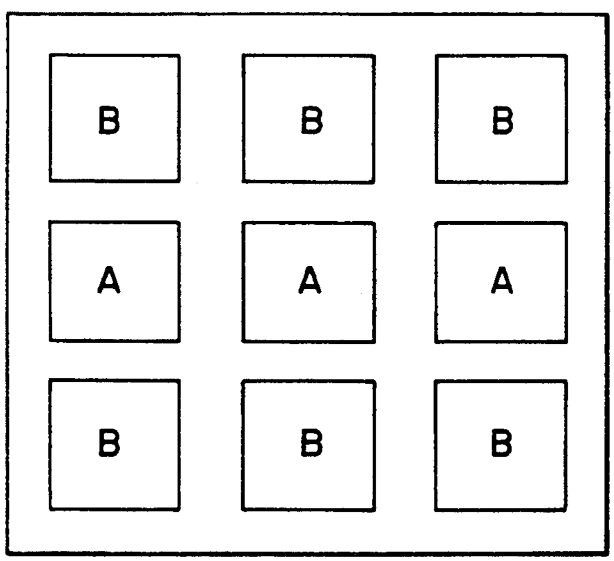

FIGS. 133 and 134 illustrate two MCTs, which differ in pattern of arranging MCT elements on an MCT pellet. In the MCT shown in FIG. 133, the elements A and B are arranged such that each element A is surround by eight elements B. In the MCT of FIG. 134, columns of elements A and those of elements B are alternately arranged. Both MCTs shown in FIGS. 133 and 234 can achieve the same advantage as the MCT illustrated in FIGS. 130A and 130B.

Figure 135A:
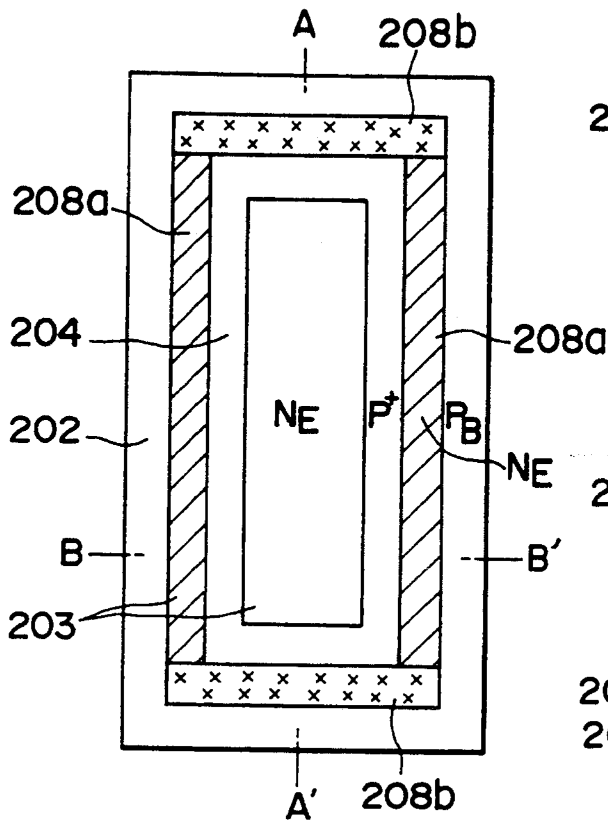
FIG. 135A shows one of the identical elements of an MCT according to the invention.
Figure 135B:
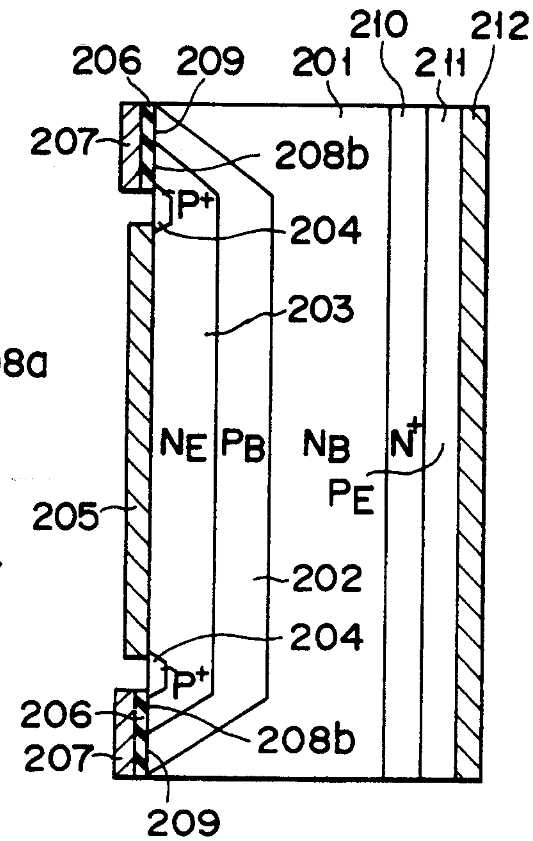
FIG. 135B is a sectional view, taken along line A—A' in FIG. 135A.
Figure 135C:
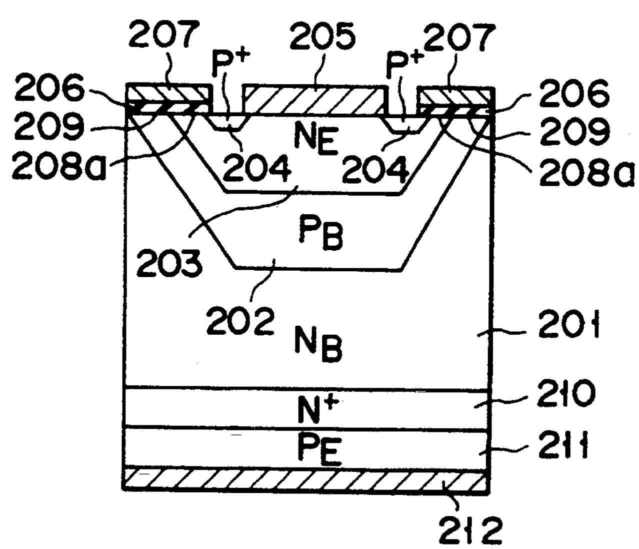
FIG. 135C is a sectional view, taken along line B—B' in FIG. 135A.

FIG. 135A shows one of the identical elements of an MCT according to the invention, FIG. 135B is a sectional view, taken along line A—A' in FIG. 135A, and FIG. 135C is a sectional view, taken along line B—B' in FIG. 135A. In these figures, the same components as those shown in FIGS. 130A and 130B are denoted at the same reference numerals. In this MCT, the turn-off channel regions of each element have two different threshold voltages, whereas those of each element has only one threshold voltage in the MCT of FIGS. 130A and 130B. More specifically, as can be best understood from FIG. 135A, of the turn-off channel regions forming a closed loop, the vertical regions **208*b* have a threshold voltage Vth1, and the horizontal regions 208*b*** have a threshold voltage Vth2.

Figure 136A:
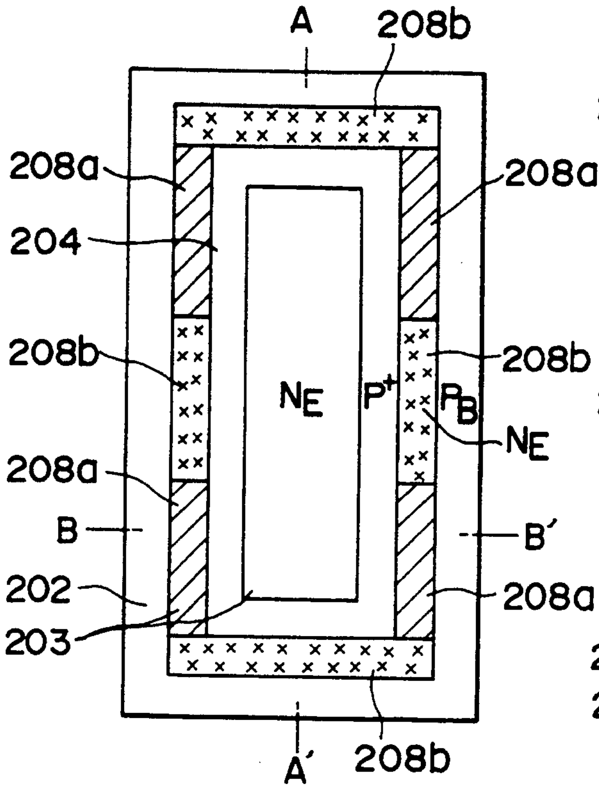
FIG. 136A shows one of the identical elements of an MCT according to the invention.
Figure 136B:
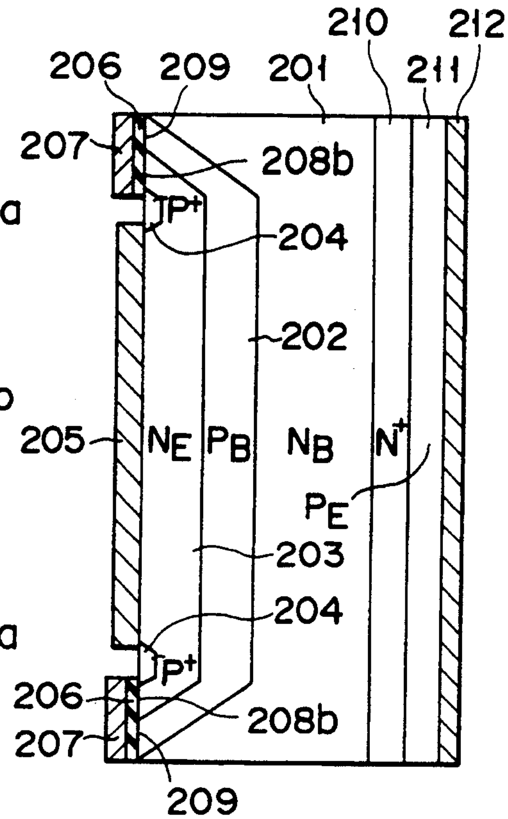
FIG. 136B is a sectional view, taken along line A—A' in FIG. 136A.
Figure 136C:
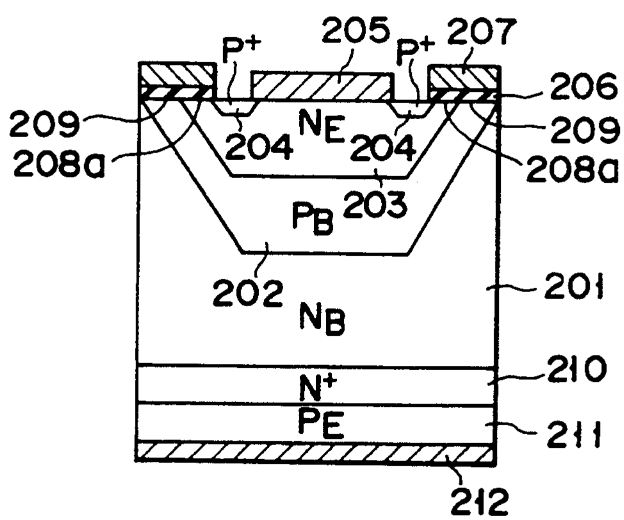
FIG. 136C is a sectional view, taken along line B—B' in FIG. 136A.

FIG. 136A shows one of the identical elements of an MCT according to the invention, FIG. 136B is a sectional view, taken along line A—A' in FIG. 136A, and FIG. 136C is a sectional view, taken along line B—B' in FIG. 136A. In FIGS. 136A, 136B and 136C, the same components as those shown in FIGS. 130A and 130B are denoted at the same reference numerals. In this MCT, the turn-off channel regions of each element have two different threshold voltages. More specifically, as can be best understood from FIG. 136A, of the turn-off channel regions forming a closed loop, some vertical regions **208*a* have a threshold voltage Vth1, the other vertical regions 208*b* have a threshold voltage Vth2, and the horizontal regions 208*b*** have a threshold voltage Vth2.

Figure 137A:
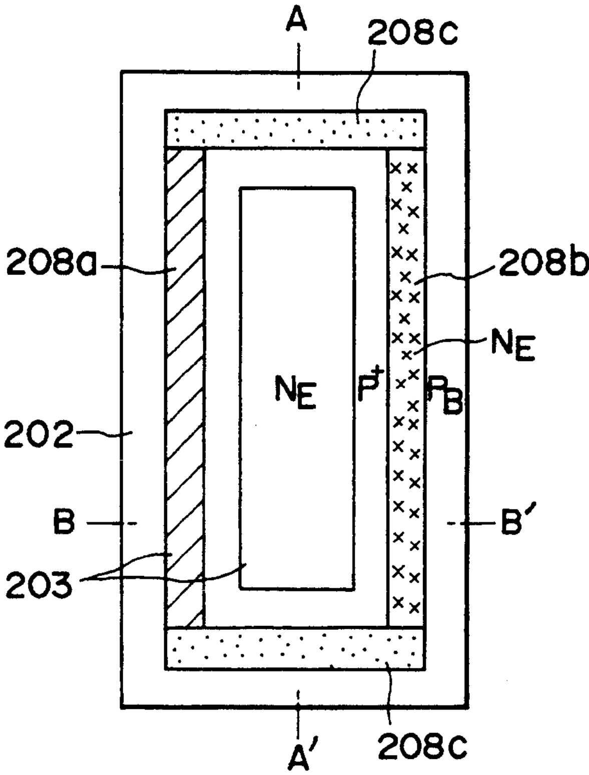
FIG. 137A shows one of the identical elements of an MCT according to the invention.
Figure 137B:
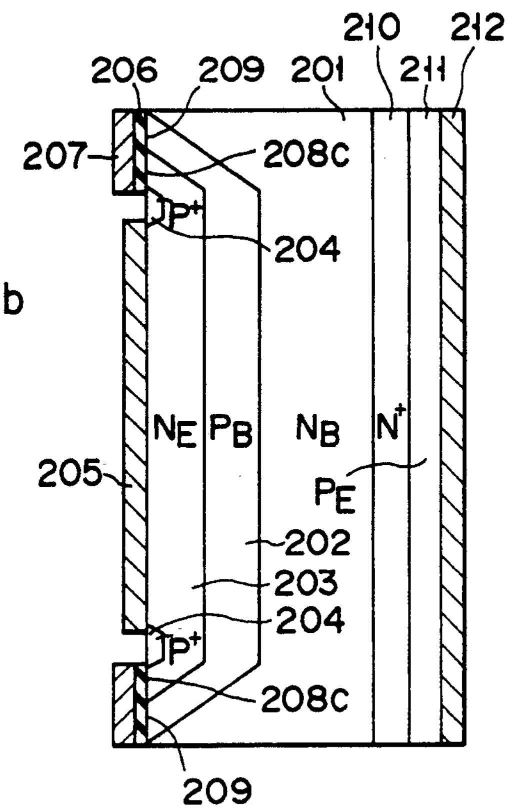
FIG. 137B is a sectional view, taken along line A—A' in FIG. 137A.
Figure 137C:
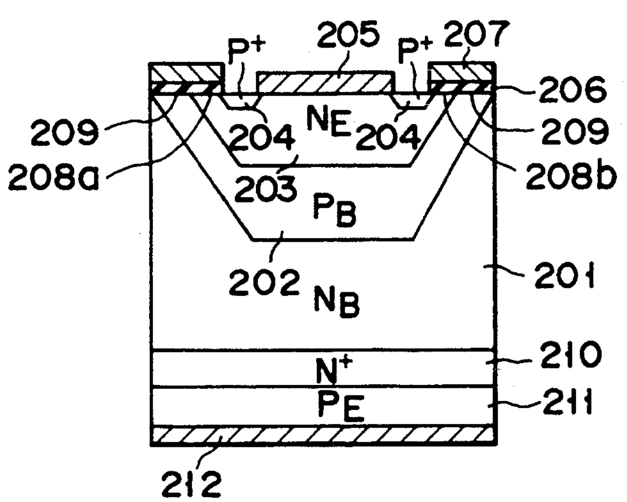
FIG. 137C is a sectional view, taken along line B—B' in FIG. 137A.

FIG. 137A shows one of the identical elements of an MCT according to the invention, FIG. 137B is a sectional view, taken along line A—A' in FIG. 137A, and FIG. 137C is a sectional view, taken along line B—B' in FIG. 137A. In these figures, the same components as those shown in FIGS. 130A and 130B are denoted at the same reference numerals. In the MCT, the turn-off channel regions of each element have three different threshold voltages. More specifically, as can be best understood from FIG. 137A, of the turn-off channel regions forming a closed loop, the first vertical regions **208*a* has a threshold voltage Vth1, the second vertical region 208*b* has a threshold voltage Vth2, and the horizontal regions 208*c* have a threshold voltage Vth3**.

Figure 138A:
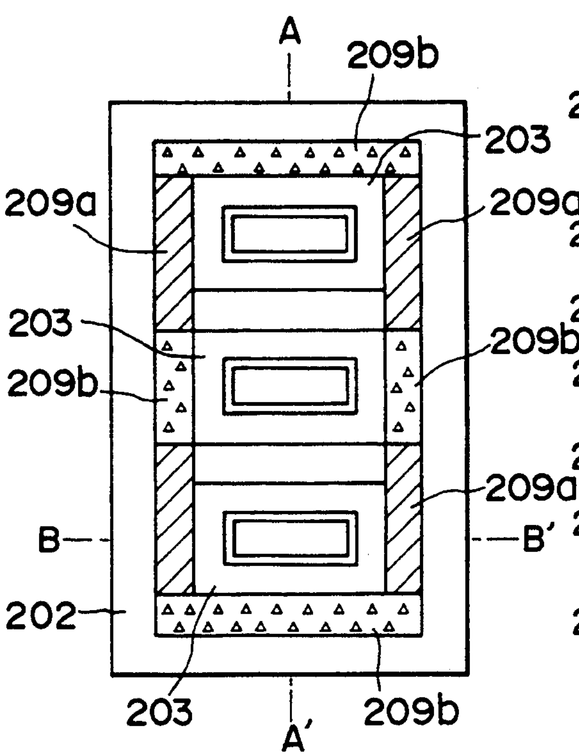
FIG. 138A shows one of the identical elements of an MCT according to the invention.
Figure 138B:
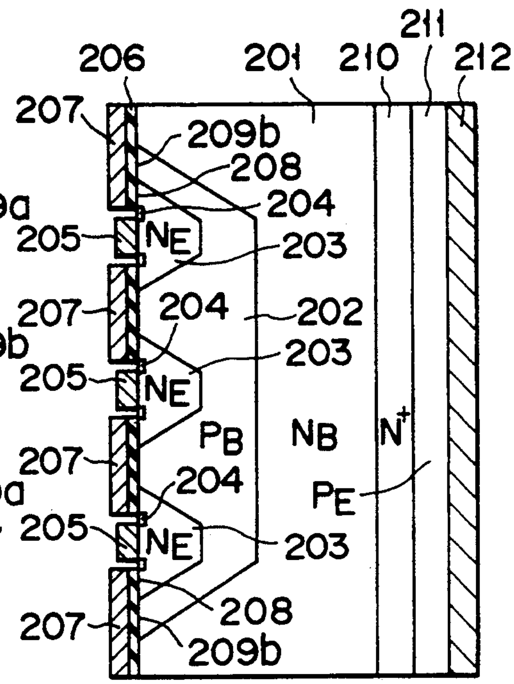
FIG. 138B is a sectional view, taken along line A—A' in FIG. 138A.
Figure 138C:
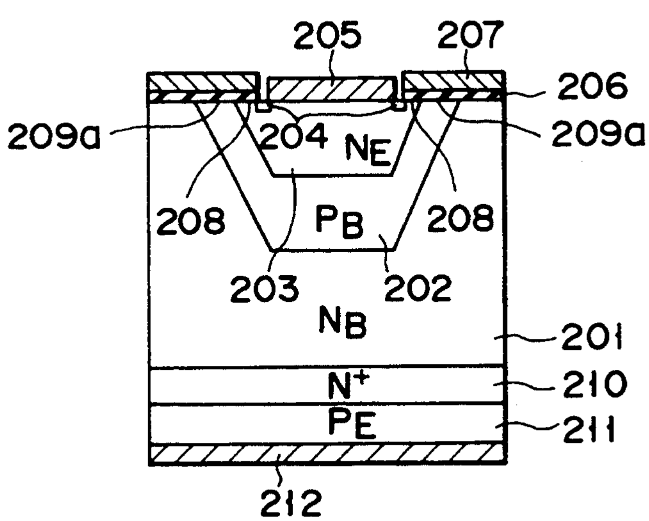
FIG. 138C is a sectional view, taken along line B—B' in FIG. 138A.

FIG. 138A shows one of the identical elements of an MCT according to the invention, FIG. 138B is a sectional view, taken along line A—A' in FIG. 138A, and FIG. 138C is a sectional view, taken along line B—B' in FIG. 138A. In these figures, the same components as those shown in FIGS. 130A and 130B are denoted at the same reference numerals. This MCT is characterized in that turn-on channel regions forming a loop surrounding the elements have different threshold voltages. More precisely, some turn-on channel regions **209*a* have a threshold voltage Vth3, and the remaining turn-on channel regions 209*b* have a threshold voltage Vth4. Preferably, the turn-off channel regions 208*a* and 208*b* can have three or more different threshold voltages among them. Needless to say, however, the turn-off channel regions 208** can have the same threshold voltage.

The MCTs shown in FIGS. 135A, 136A, 137A and 138A attain the same advantage as the embodiment of FIGS. 130A and 130B. That is, current concentration can be suppressed when the MCTs turned off, merely by turning on the turn-off channels and then by applying a gate-drive voltage having a specific waveform, thereby turning off, at different times, the turn-off channels having different threshold voltages. The gate-drive voltage will be later described.

Figure 139A:
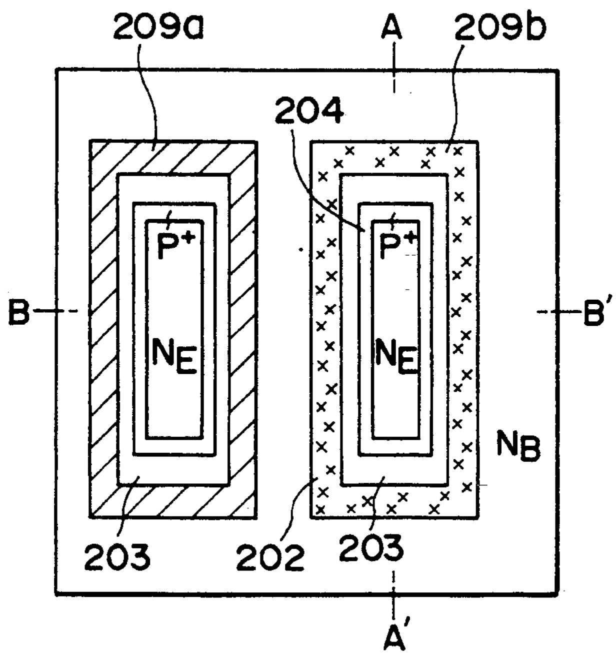
FIG. 139A is a plan view showing every two of the identical elements of an MCT according to the invention.
Figure 139B:
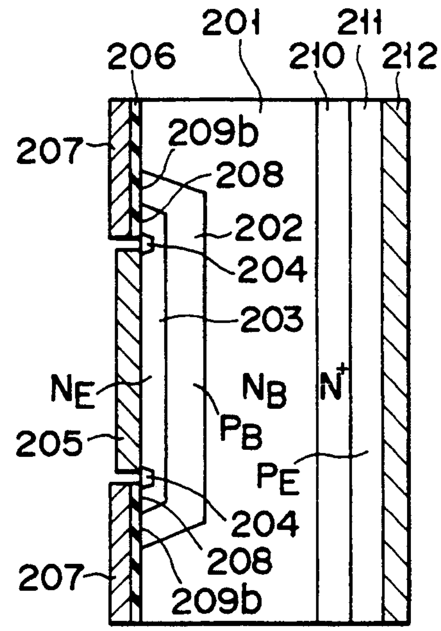
FIG. 139B is a sectional view, taken along line A—A' in FIG. 139A.
Figure 139C:
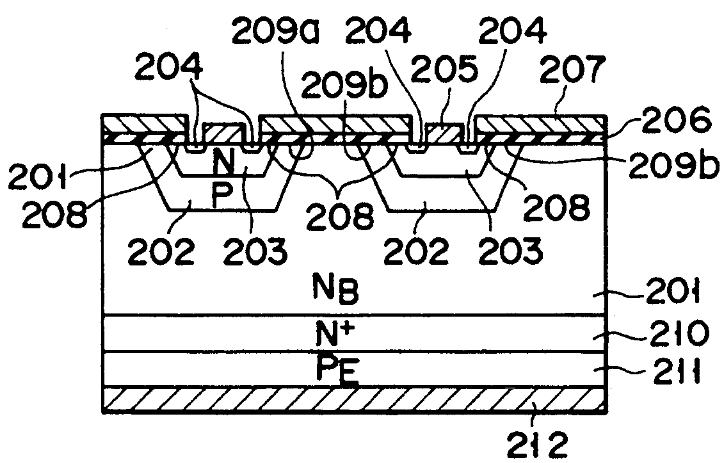
FIG. 139C is a sectional view, taken along line B—B' in FIG. 139A.

FIG. 139A shows every two of the identical elements of an MCT according to the invention, FIG. 139B is a sectional view, taken along line A—A' in FIG. 139A, and FIG. 139C is a sectional view, taken along line B—B' in FIG. 139A. This MCT is different from that of FIGS. 138A, 138B, and 138C in that the turn-on channel for each element has a uniform threshold voltage, but the turn-on channel regions for any two adjacent elements have different threshold voltages. To be more specific, the turn-on channel region **209*a* of one element has a threshold voltage Vth3, whereas the turn-on channel region 209*b* of the adjacent element has a threshold voltage Vth4. The MCT, comprising a semiconductor pellet and MCT elements of two types arranged on the pellet in rows and columns, attain the same advantage as the embodiment of FIGS. 130A and 130B**.

FIG. 140 shows another MCT according to this invention, wherein each element has two insulated gate electrode formed in the cathode-side and anode-side surfaces, respectively. In the anode-side surface of each MCT element, a p-type emitter layer 211 is formed in a selected portion of an $n^-$-type buffer layer 210, and an $n^+$-type layer 213 is formed in the surface of the p-type emitter 211. An anode 212 contacts both the p-type emitter layer 211 and the $n^+$-type layer 213. The peripheral edge of the p-type emitter layer 211 serves as a channel region 216. A gate-insulating film 214 is formed on the channel region 216, and a gate electrode 15. 215 is formed on the insulating film 214. In this MCT, too, the channel regions 208, 209, and 216 of each element have different threshold voltages, or each have a threshold voltage different from that of the corresponding channel region of any other element. The MCT, part of which is shown in FIG. 140, has the same advantage as the MCTs described above.

To impart high turn-off efficiency to any MCT described above, it is desirable that the $n^{-}$-type base layer 201 have such an impurity concentration NB (/cm$^3$) and such a thickness W (cm), as would satisfy the following relation:

$$1.5\times10^{14}<NB/W<2.5\times10^{14}$$

To impart high turn-on efficiency to any MCT described above, it is desirable that the $n^{-}$-type base layer 201 have such an impurity concentration NB (/cm$^3$) and such a thickness W (cm), as would satisfy the following relation:

$$NB/W>2.5\times10^{14}$$

Figure 142:
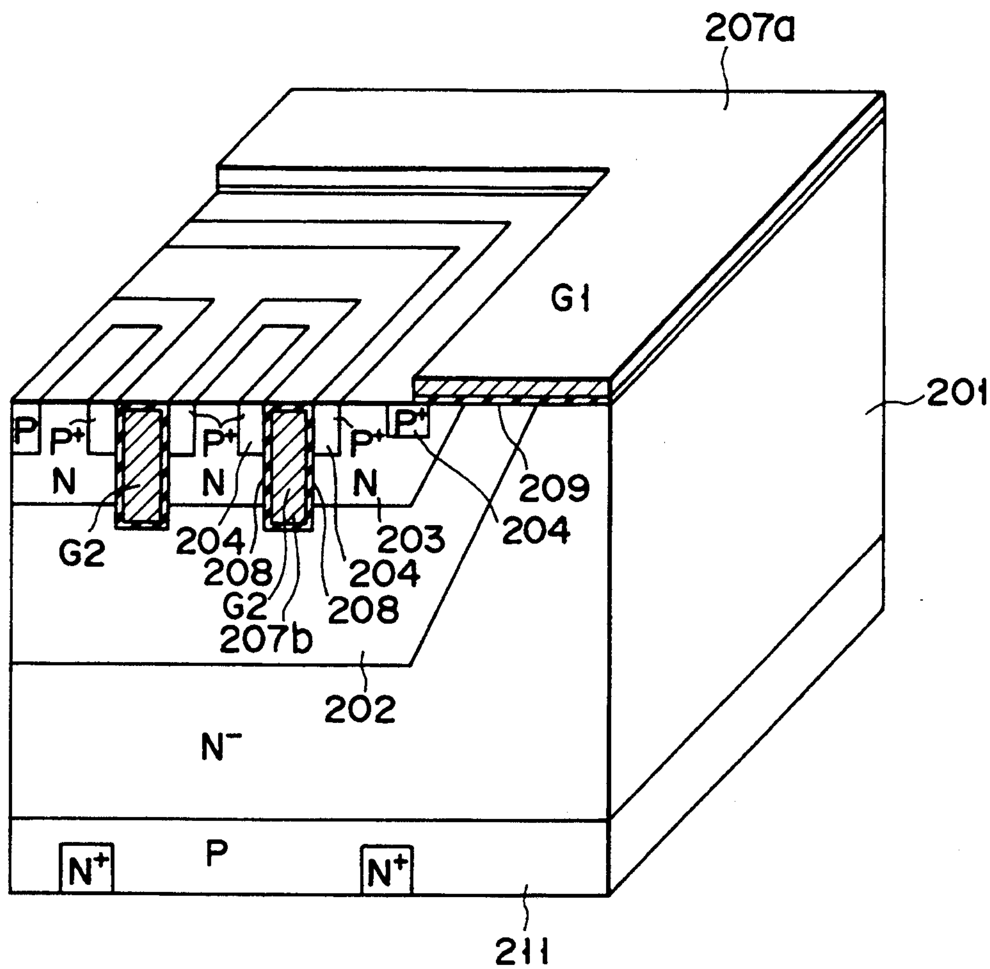
FIG. 142 is a perspective view illustrating an MCT according to the present invention.

FIGS. 141, 142, and 143 show three MCTs according to the invention, which have better operating characteristics than the MCTs described above.

The MCT of FIG. 141 is characterized in three respects. First, an anode is formed on the upper surface of a thick $p^{-}$-type base layer. Second, a $p^{+}$-type layer is formed on the lower surface of the $p^{-}$-type base layer. Third, a plurality of stripe-shaped cathodes are formed on the $p^{+}$-type layer. Each MCT element has a turn-on channel CH1, and two turn-off channels CH2 and CH3.

The MCT shown in FIG. 142 is characterized in the following respects. First, a first gate electrode 207*a* for controlling the turn-on channel region 209 is formed independently of second gate electrodes 207*b* for controlling the turn-off channel regions 208. Second, the first gate electrode 207*a* is an ordinary planer insulated one, whereas the second gate electrodes 207*b* are formed in grooves made in the n-type emitter layer 203 and extending into the p-type base layer 202. Third, $p^{+}$-type diffusion layers 204 are formed in the surface of the n-type emitter layer 203 and extend along the grooves.

FIG. 143 illustrates a modification of the MCT shown in FIG. 142. As in the embodiment of FIG. 142, grooves are formed in the n-type emitter layer 203 and extends into the p-type base layer 202, and second gate electrodes 207*b* having a stripe pattern are formed in these groove, respectively. N-type emitter layers 203 and p-type diffusion layers 204 are alternately formed among the second gate electrodes 207*b*, and the peripheral edge of the n-type emitter layer 203 serves as a channel region 208. In other words, the vertical turn-off channel region 208 is formed in that portion of the region having the p-type diffusion layer 204, which is surrounded by the second gate electrodes 207*b*.

The MCT of FIG. 142 has buried gate electrodes, but is similar to the conventional one in that the n-type emitter layer 203 and the turn-off channel region 208 for short-circuiting the layer 203 to the p-type base layer 202 are formed in the same region.

In the MCT of FIG. 143, the n-type emitter layers 203 connected to the cathode 205, for injecting carriers, and the turn-off channel regions 208 for short-circuiting the p-type emitter layer 204 to the p-type base layer 202 are spaced apart and arranged alternately by the buried gate electrode 207. Since the n-type emitter layers 203 are arranged at short intervals of, for example, 10 μm, they can inject carriers at high efficiency, and can also serve to suppress current concentration.

Further, in the MCT of FIG. 143, third gate electrodes 215 are buried in the anode-side surface, too. More specifically, a p-type emitter layer 211 is formed on the lower surface of the $n^{-}$-type base layer 210. Grooves are formed in the p-type emitter layer 211, each extending into the base layer 210. A gate insulating film 214 is formed in the surfaces of each groove, and a gate electrode 215 is formed in each groove. An n-type diffusion layers 213 is formed in the surface of the p-type emitter layer 211 located in every other gap between the gate electrodes 215. A turn-off channel region 216 is formed in the region of p-type emitter layer 211 on which n-type diffusion layer 213 exists, and extends along the gate electrode 215.

Figure 144:
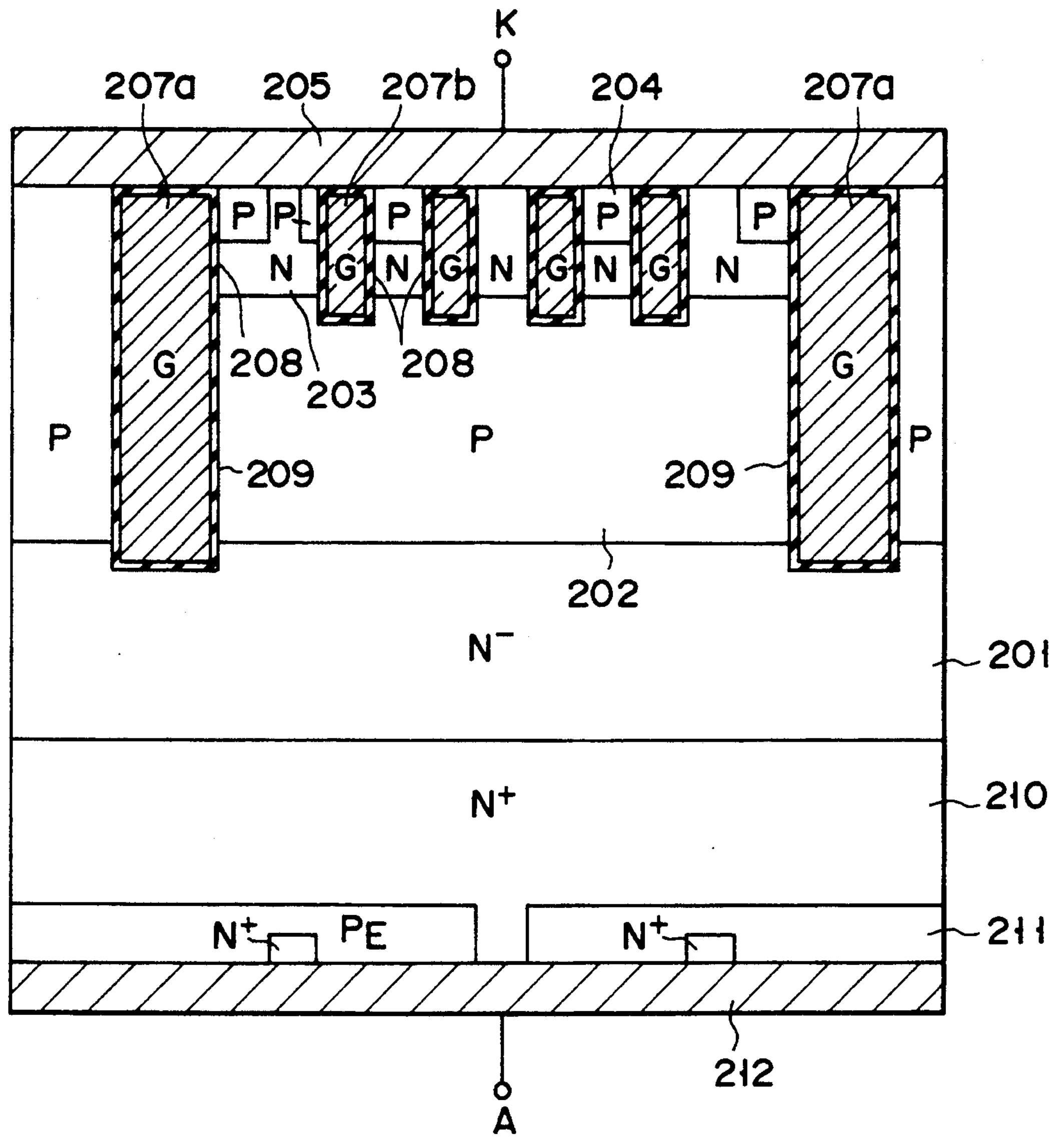
FIG. 144 is a sectional view showing an MCT having an improved buried gate structure.

FIG. 144 shows a MCT according to the invention, which has an improved buried gate structure. This MCT is characterized in that the first gate electrode 207*a* for controlling the turn-on channel region is buried in the cathode-side surface, just like the second gate electrode 207*b* for controlling the turn-off channel regions. This MCT is advantageous in that each MCT element, though a large-current one, occupies a small area.

Also in the embodiments of FIGS. 141 to 144, the channel regions can have different threshold voltages. If so, the MCTs shown in these figures can have the same advantage as those illustrated in FIGS. 130A and 130B. The MCTs shown in FIGS. 143 and 144 can have improved turn-off efficiency, not at the expense of their high turn-on efficiency, even if the channel regions do not have different threshold voltages. This is because, the channel regions extend vertically, and small emitters are formed in the semiconductor pellet and arranged at intervals as short as 10 μm, ensuring high emitter injection efficiency and suppressing current concentration when the MCT is turned off.

Figure 145:
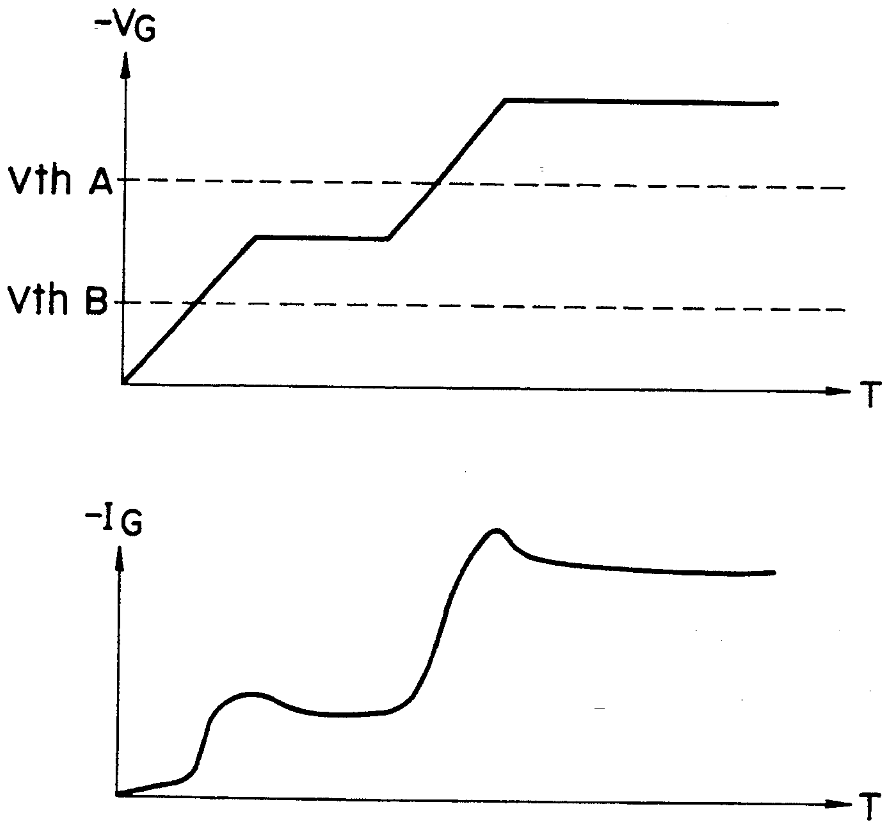
FIG. 145 is a timing chart showing the waveform of the gate voltage applied to the turn-off gate of the MCT shown in FIG. 130A and 130B, and corresponding gate current.

FIG. 145 is a timing chart showing the waveform of the gate voltage applied to the turn-off gate of the MCT of the above embodiments, wherein the turn-off channels have two different threshold voltages VthA and VthB, and also showing the waveform of the gate current corresponding to the gate voltage. As can be understood from FIG. 145, the gate voltage is increased in two steps, first over the threshold voltage VthB, and then over the threshold voltage VthA. Hence, the turn-off channels having the threshold voltage VthB are turned on, and the turn-off channels having the threshold voltage VthA are turned on some time later. As a result, the gate current does not fast increase, and current concentration is mitigated, unlike in the case where all turn-off channels formed in the pellet are turned on at the same time. Obviously, current concentration is suppressed successfully.

Figure 146:
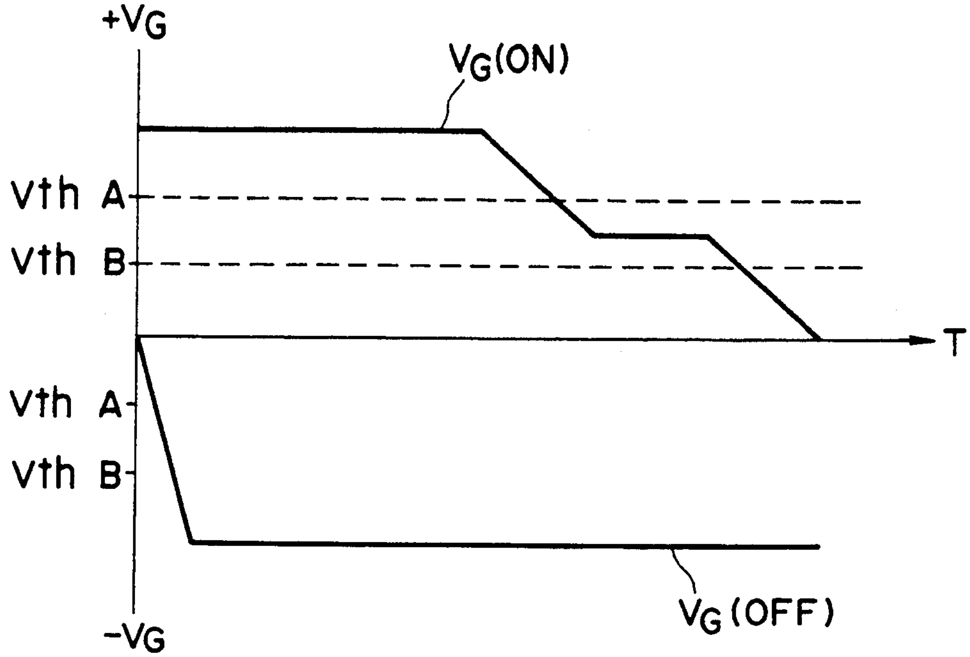
FIG. 146 is a timing chart showing the waveform of the gate voltage applied to the turn-off gate of the MCTs shown in FIGS. 138A and 139A, thereby turn off the MCTs.

FIG. 146 is a timing chart showing the waveform of the gate voltage applied to the turn-off gate of the MCTs shown in FIGS. 138A and 139A, thereby turn off the MCTs, wherein the turn-on channels have two different threshold voltages VthA and VthB. As is evident from FIG. 146, a gate-off voltage VB(OFF) is applied to the turn-off gate electrode while the turn-on channel is open, thereby causing main current to flow concentratedly in the turn-on channels. Thereafter, as is shown FIG. 146, the gate voltage VG(ON) applied to the turn-on channels is decreased in two steps, first below the voltage VthA, and then below the voltage VthB. As a result, the turn-on channels having the threshold voltage VthA are turned off, and the turn-on channels having the threshold voltage VthB some time later. Thus, current concentration is suppressed when the MCTs of FIGS. 138A and 139B are turned off.

Figure 147:
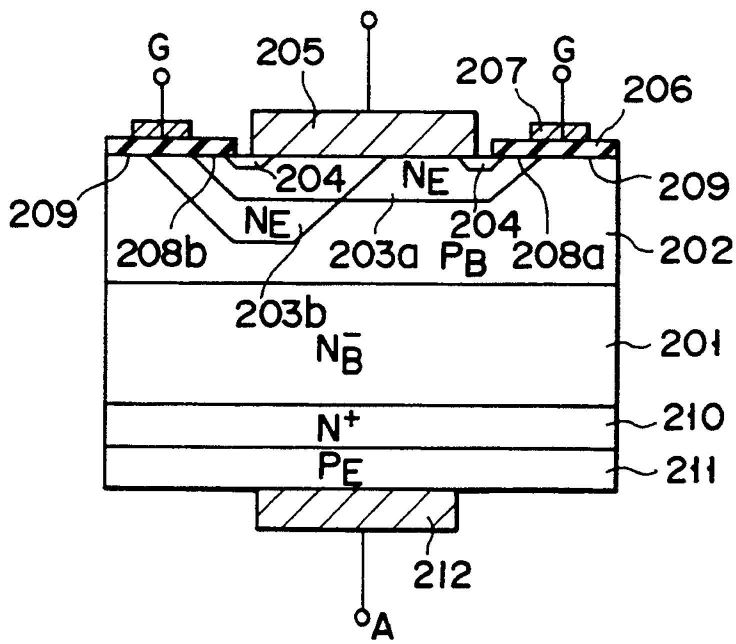
FIG. 147 is a diagram explaining a method of imparting different threshold voltages to the channel regions of the MCT according to the invention.

It has hot been described how the channel regions are set at different threshold values. The methods known in the field of MOS technology can be used to set the channel regions at different threshold values. For example, as is shown in FIG. 147, two diffusion layers 203*a* and 203*b* having different impurity concentrations are overlapped, thereby forming a single n-type emitter layer and, hence, imparting different threshold voltages to channel regions 208*a* and 208*b*. Any other method can be employed, such as applying radiations to a selected portion of a layer, or forming a gate-insulating film consisting of portions having different thicknesses.

Figure 148:
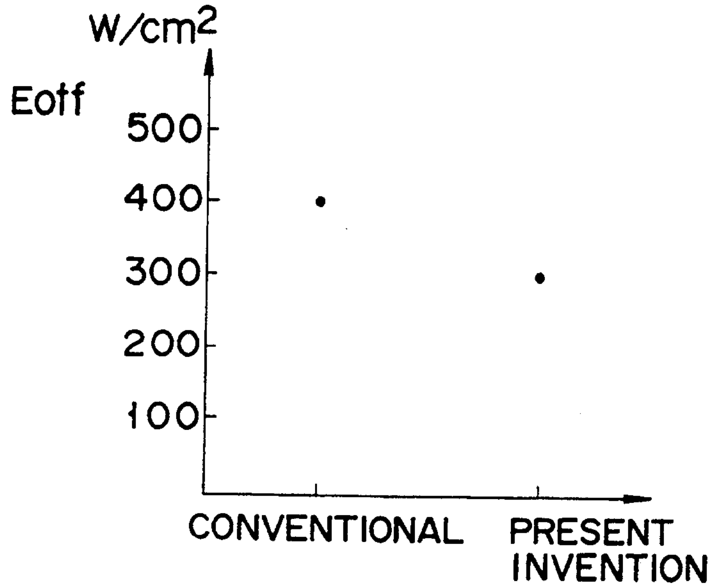
FIG. 148 is a diagram representing the turn-off loss of the MCT according to the invention, as compared with the turn-off loss of a conventional MCT.
Figure 149:
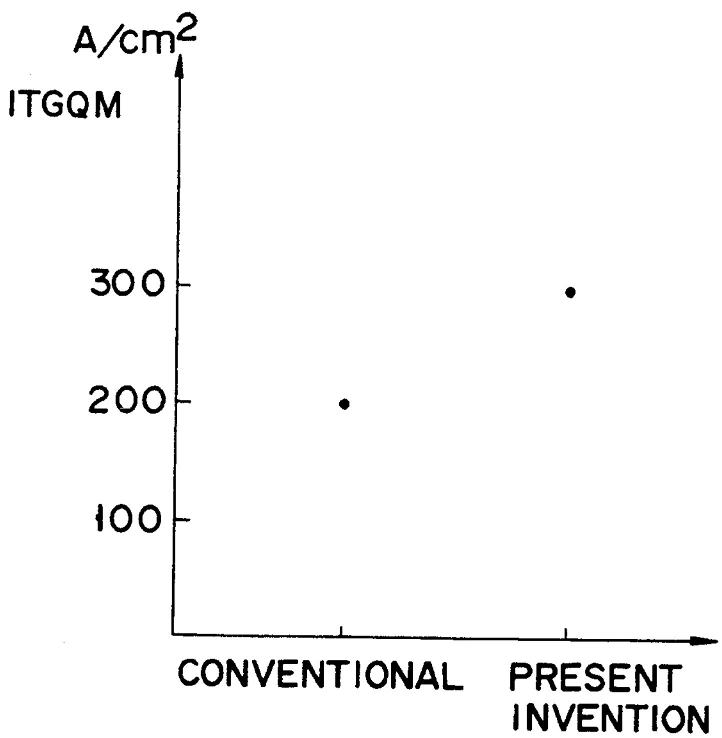
FIG. 149 is a diagram illustrating the maximum turn-off current density of the MCT, as compared with that of the conventional MCT.

FIG. 148 is a diagram representing the turn-off loss of the MCT according to the invention, as compared with the turn-off loss of a conventional MCT. FIG. 149 is a diagram illustrating the maximum turn-off current density of the MCT, as compared with that of the conventional MCT.

Figure 150A:
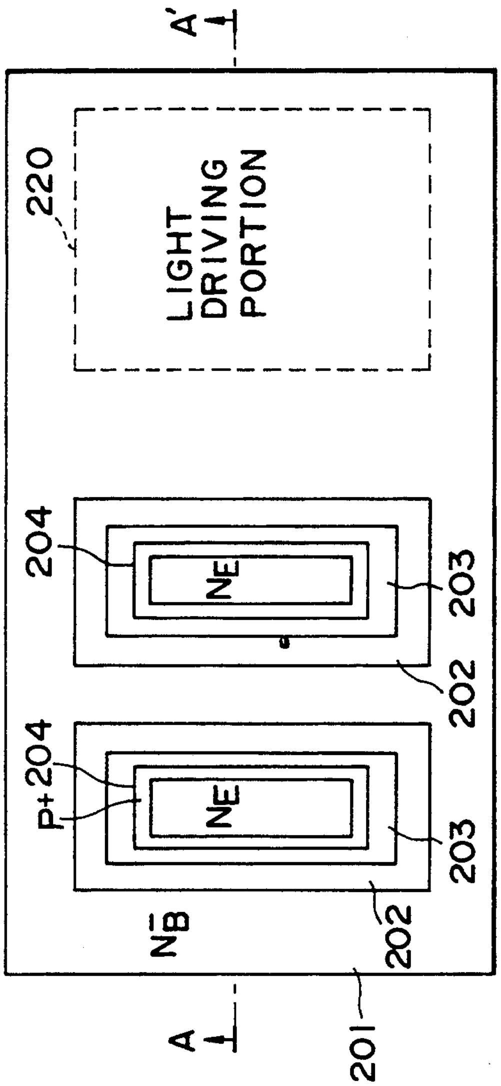
FIG. 150A is a plan view showing an MCT of another type according to the invention, which incorporates a light triggered gate drive portion.
Figure 150B:
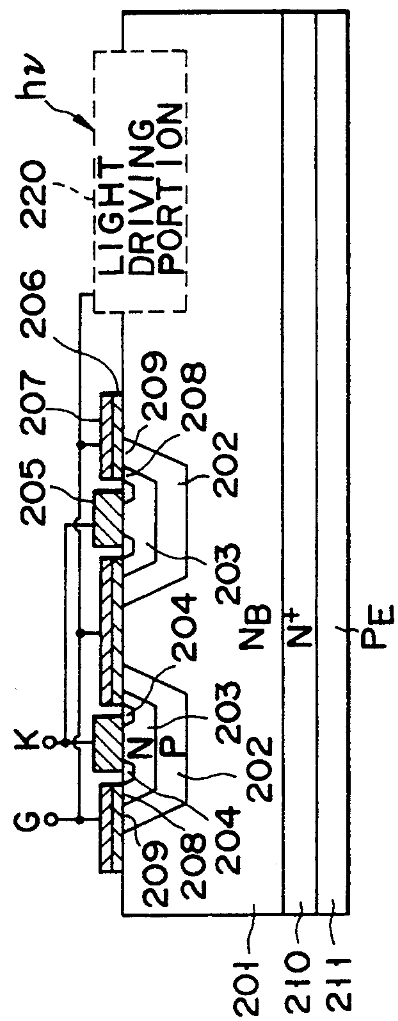
FIG. 150B is a sectional view, taken along line A—A' in FIG. 150A.

FIG. 150A shows an MCT of another type according to the invention, which has a light triggered gate drive portion 20 formed on a pellet, and FIG. 150B is a sectional view, taken along line A—A' in FIG. 150A. The main current of this MCT is controlled by a gate signal which is a light signal externally applied.

Figure 151:
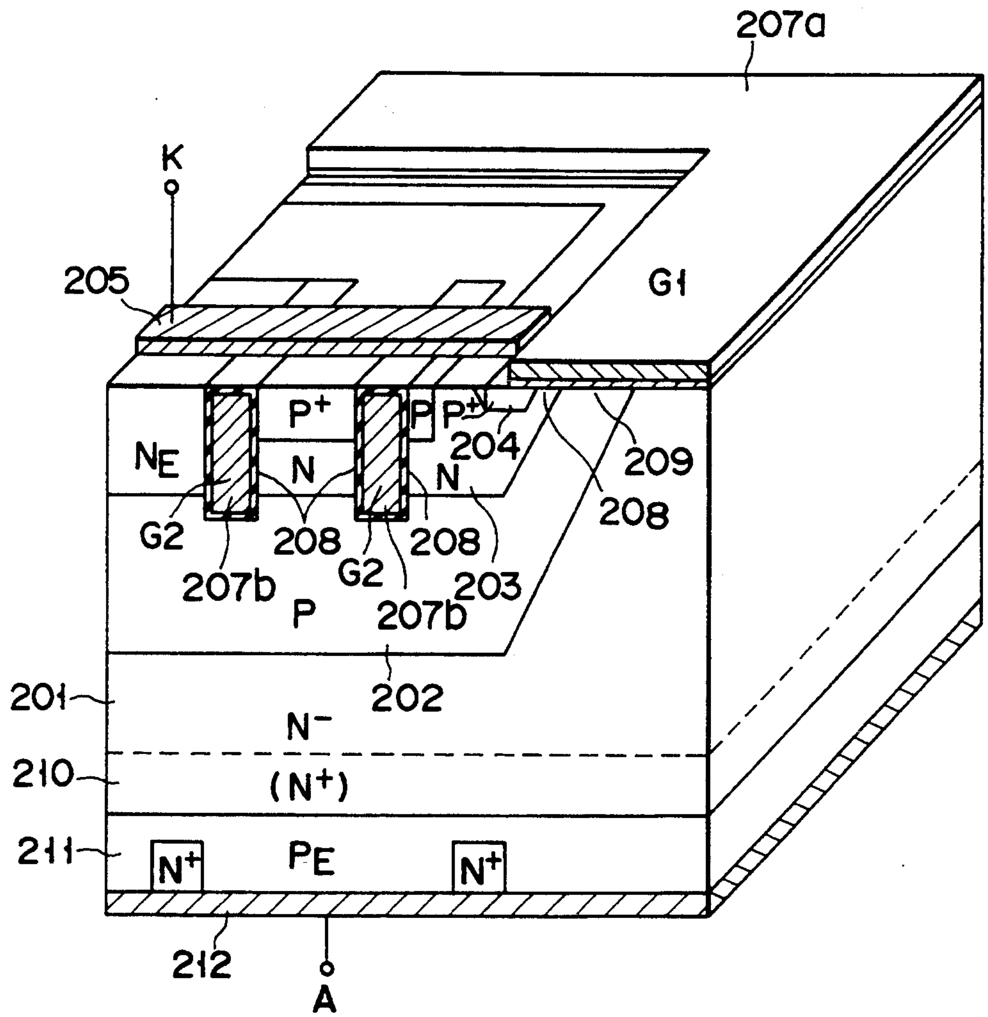
FIG. 151 is a perspective view showing another MCT of the invention whose anode-side structure is identical to that of the MCT illustrated in FIG. 142.

FIG. 151 shows another MCT of the invention whose cathode-side structure and anode-side structure are identical to that of the MCT illustrated in FIG. 142 and 143, respectively.

FIG. 152 shows an IGBT according to the invention, which has buried gate electrodes of the same type incorporated in the MCT of FIG. 143. Grooves are formed in the cathode-side surface. They extend downwards through a p-type base layer 202 into the n-type base layer 201 on which the p-type base layer 202 is formed. A gate-insulating film 206 is formed on the surfaces of each groove, and a gate electrode 207 is buried in the groove. Hence, the gate electrodes 207 divide the p-type base layer 202 into a plurality of p-type regions 202. An n-type emitter layer 203 is formed in the surface of every other p-type region 202. When each p-type region 202, on which an n-type emitter layer 203 (i.e., a source layer) is formed, is con trolled by the gate electrode 207, its sides function as channel regions 221, to turn on and off the MCT. A cathode 205 (i.e., a source electrode) is formed on the p-type base regions 202 and also on the n-type emitter layers 203.

In this IGBT, too, thin stripe-shaped emitters can be arranged in great numbers at short intervals. The IGBT has, therefore, high turn-off efficiency, as well as high turn-on efficiency. Its turn-off efficiency can be enhanced by imparting different threshold voltages to the channel regions 221, as in the MCTs of FIGS. 143 and 144.

Figure 153:
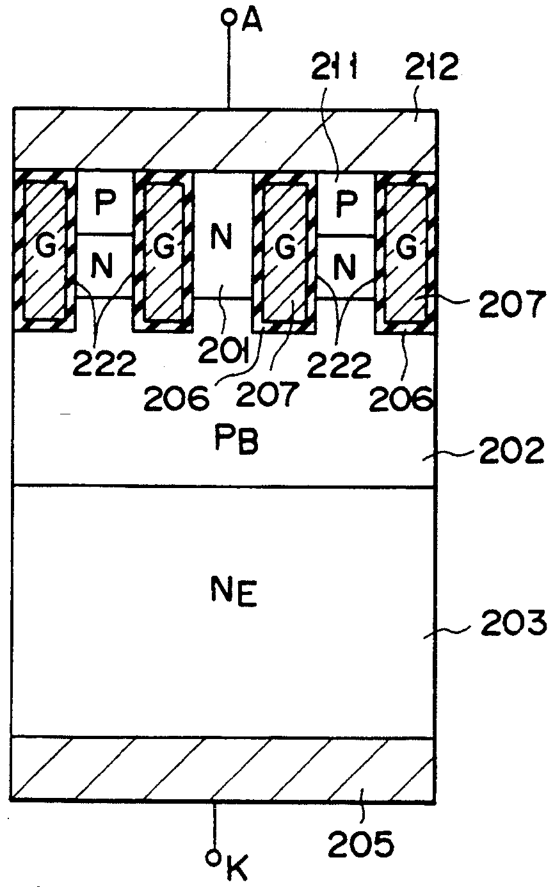

FIG. 153 shows an IGBT identical to the IGBT of FIG. 152, except that buried gate electrodes are formed in the anode-side surface, not in the cathode-side surface as in the embodiment of FIG. 152. To be more specific, an n-type base layer 201 is formed in the surface of a p-type base layer 202. Stripe type grooves are formed, spaced apart for a short distance, and extending through the n-type base layer 201 into the p-type base layer 202. A gate-insulating film 206 is formed on the surfaces of each groove, and a gate electrode 207 is buried in the groove. Hence, the gate electrodes 207 divide the n-type base layer 201 into a plurality of n-type regions 201. A p-type emitter layer 211 (a drain layer) is formed in the surface of every other n-type region 201. The sides of each n-type regions 201, on which a p-type emitter layer 211 is formed, function as channel regions 222. An anode 212 (i.e., the drain electrode) is formed on the n-type base regions 201 and also on the p-type emitter layers 211.

Obviously, the IGBT of FIG. 153 attains the same advantage as the IGBT illustrated in FIG. 152.

Figure 154:
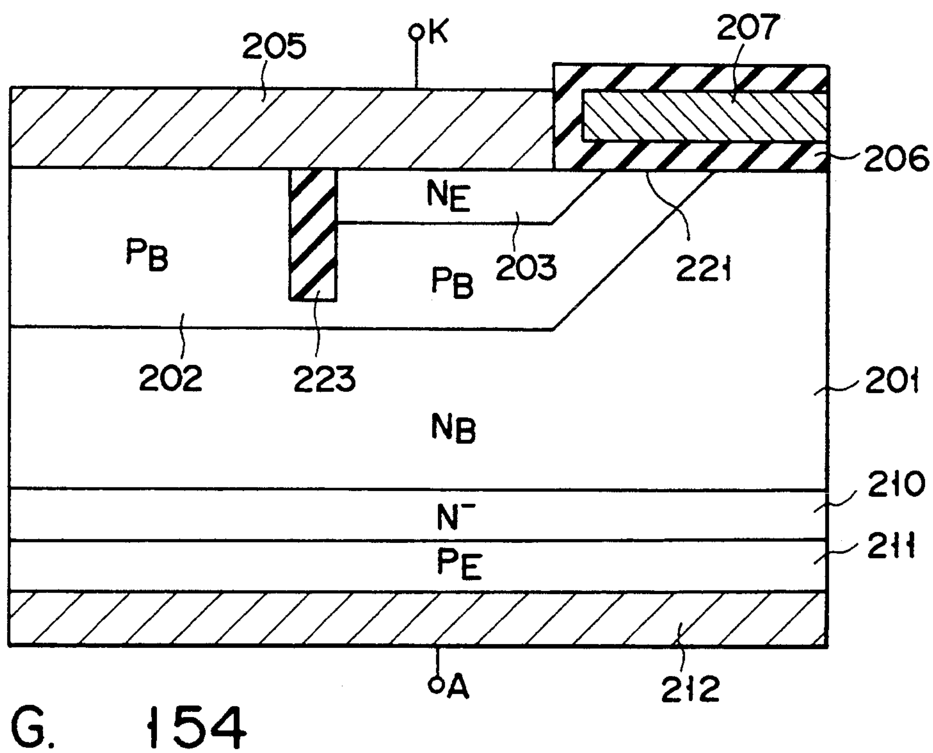
FIG. 154 is a sectional view illustrating another IGBT which has an improved cathode-emitter junction structure.

FIG. 154 illustrates one of identical elements of an IGBT, each having an improved cathode-emitter Junction termination structure. As is evident from FIG. 154, an n-type emitter layer 203 is formed in a selected portion of a p-type base layer 202, which in turn is formed in the surface of an n-type base layer 201. That surface portion of the p-type base layer 202 which is sandwiched between the base layer 201 and the emitter layer 203 is a channel region 221. A gate-insulating film 206 is formed on this channel region 221. A gate electrode 207 is formed on the insulating film 206. A cathode 205 is formed, contacting both the p-type base layer 202 and the n-type emitter layer 203. The layers 201, 202, 203, the cathode 205, the film 206, and the electrode 207 constitute the main section of the IGBT element, which is identical to the main section of the conventional IGBT element. The IGBT element of FIG. 154 is characterized in that an insulating film 223 is buried in the p-type base layer 202, contacting that portion of the pn junction defined by the layers 202 and 203, which is remote from the channel region 221. In other words, the buried insulating film 223 surrounds the n-type emitter layer 203.

A number of IGBT elements of the type shown in FIG. 154, each having a small cathode-emitter structure described above, are arranged on a pellet. Preferably, their channel regions have at least two different threshold voltages, whereby the resultant IGBT has, therefore, high turn-off efficiency and high turn-on efficiency, with a current leaks being in a small amount from the junction between the n-type emitter and the p-type base layer.

A structure similar to that of FIG. 154 can be applied to a thyristor or a MOSFET. FIG. 155 shows such a thyristor. An n-type emitter layer 203 is formed in the surface of a p-type base layer 202. A $p^+$-type diffusion layer 224 is formed in the surface of the n-type emitter layer 203, for short-circuiting the emitter layer 203 to the p-type base layer 202. An insulating film 223 is buried in the emitter layer 203 and surrounds the $p^+$-type diffusion layer 224.

FIG. 156 shows a MOSFET having a structure similar to that of FIG. 154. In FIG. 156, the similar components are designated at he same reference numerals as those used in FIG. 154. However, the n-type base layer 201 and the n-type emitter layer 203 function as drain region and source region, respectively, and the cathode electrode 205 and the anode electrode 212 function as source electrode and drain electrode, respectively. This MOSFET has the same advantage as the IGBT shown in FIG. 154.

FIG. 157 shows an MCT which is identical to the MCT of FIG. 143, except that buried insulating films 223 are used in place of the gate electrodes 215 formed in the anode-side surface. Obviously, this MCT has an emitter short-circuiting section formed in the anode-side surface, without reducing the emitter injection efficiency.

Other embodiments of the invention will now be described, which has high turn-off efficiency and high turn-on efficiency due to the use of stripe-shaped buried gate electrodes arranged at short intervals, and also the use of emitter layers and base layers having specific impurity concentrations and alternately arranged among the gate electrodes. The insulated gate electrodes formed in a pellet may have different threshold voltages, as in the embodiments described above.

FIG. 158 shows an MCT having such stripe-shaped buried gate electrodes 207 formed in a p-type base layer 202. These electrodes 207 are turn-off electrodes. An n-type emitter layer 203 is formed between every other pair of gate electrodes 207. A cathode 205 is formed, contacting the p-type base layer 202 and the n-type emitter layer 203. The MCT has turn-on gate electrodes, too, though these gates are not shown in FIG. 158.

The gap between any two adjacent buried gate electrodes 207 is 10 μm or less. The p-type base layer 202 has an impurity concentration of $10^{17}/cm^3$ or less, except for the portions contacting the cathode electrodes 205. Preferably, each gate electrode 267 extends deeper than the gap of 10 μm or less.

With the MCT shown in FIG. 158 it is possible to control greatly the resistance of those portions of the p-type base layer 202 which are interposed among the buried gate electrodes 207, by applying a voltage to the buried gate electrodes 207. As a result, the MCT has high turn-off efficiency and high turn-on efficiency. It will be explained how this resistance is greatly controlled, with reference to FIGS. 159 and 160.

As is evident from FIG. 159, when a positive voltage is applied to the gate electrodes 207 to turn on the MCT, inversion layers are formed in the p-type base layer 202 and extend along the gate electrodes 207. Electrons are accumulated in these inversion layers. Those portions of the p-type base layer 202 which are interposed among the electrodes 207 thereby have a high resistance, making it difficult for holes to move from a p-type emitter layer 211 to a cathode 205 through the p-type base layer 202. Thus, the efficiency of the emitter short-circuiting section decreases to half, whereas the efficiency of injecting electrons from the n-type emitter layer 203 increases.

When a negative voltage is applied to the gate electrodes 207 to turn off the MCT, hole-accumulating layers are formed, extending along the gate electrodes 207, as is illustrated in FIG. 160. The resistance of those portions of the p-type base layer 202 which are interposed among the electrodes 207 decreases, whereby holes are fast released from the $n^-$-type base layer 201 to the cathode 205 through the p-type base layer 202. At the same time, hole-accumulating layers are formed also in the n-type emitter layer 203, suppressing the injection of electrons from the n-type emitter layer 203. Hence, the MCT is turned off at high speed.

Figure 161:
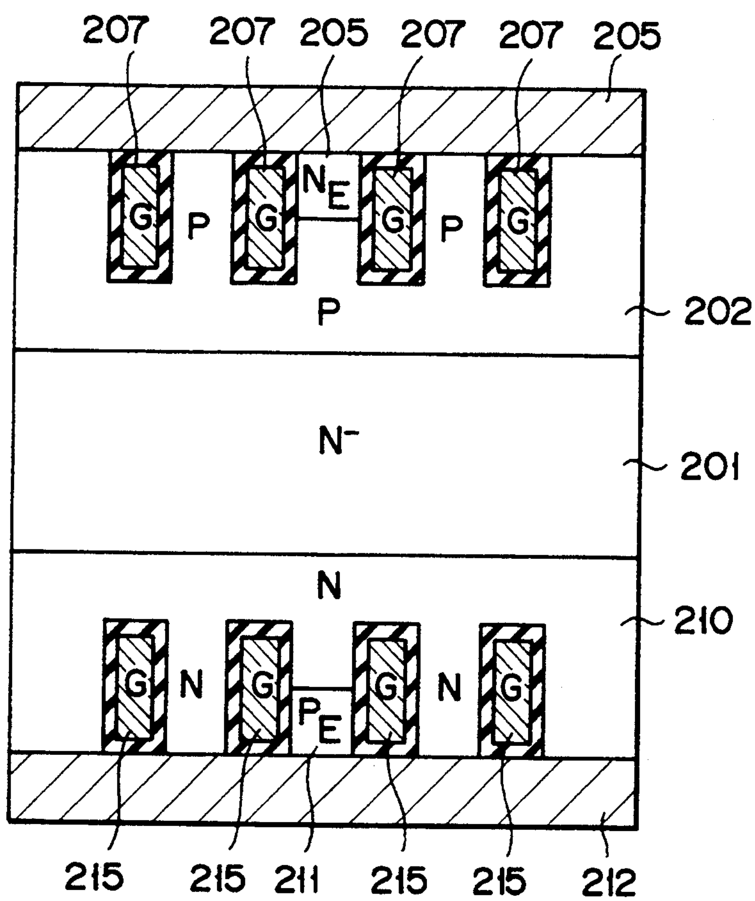
FIG. 161 is a sectional view showing a modification of the MCT shown in FIG. 158, which has buried insulated gates in both the cathode-side surface and the anode-side surface.

FIG. 161 shows a modification of the MCT shown in FIG. 158, which has buried insulated gates 215 formed in the anode-side surface. More specifically, an n-type buffer layer 210 is formed on the lower surface of an $n^-$-type base layer 210. Grooves of the stripe shape are made in the lower surface of the n-type buffer layer 210, and are spaced apart by a short distance. Insulated gate electrodes 215 are formed in these grooves. A p-type emitter layer 211 is formed between every other pair of gate electrodes 215. An anode 212 is formed, contacting the p-type emitter layer 211 and those portions of the n-type buffer layer 210 which are interposed among the gate electrodes 215.

The modified MCT of FIG. 161 is advantageous in two respects. First, carriers can be injected at high rate from the anode 212 when the MCT is turned on. Second, the emitter is short-circuited efficiently in the anode-side surface when the MCT is turned off.

Figure 162:
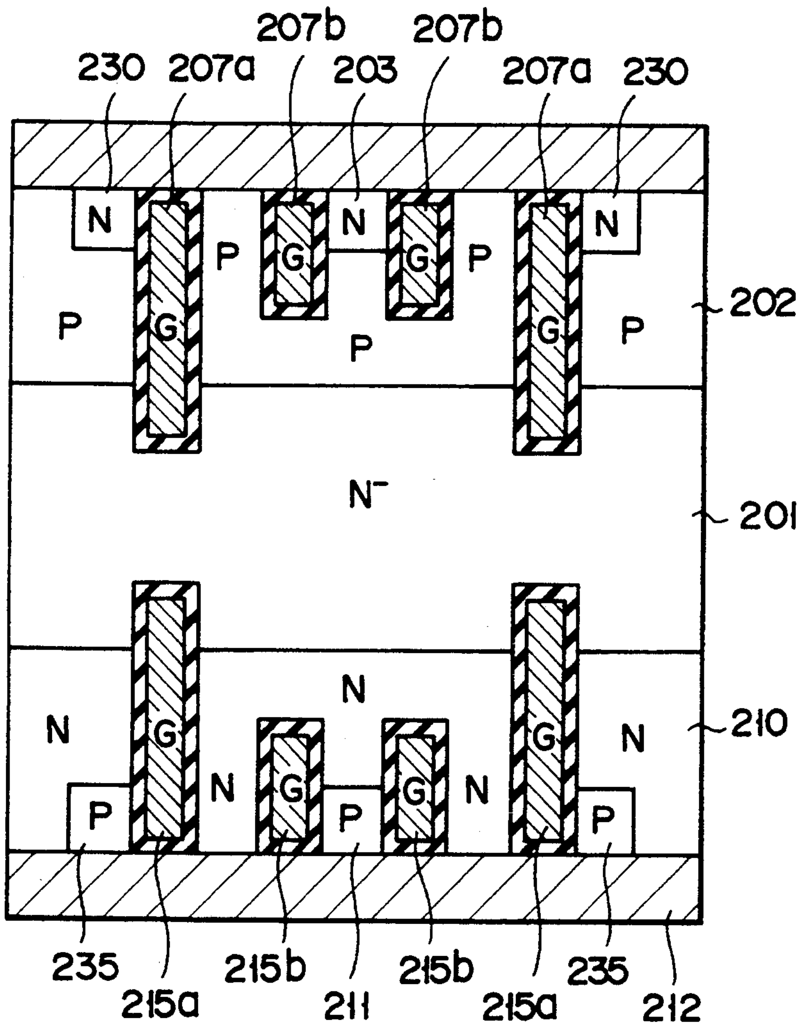

FIG. 162 illustrates a modification of the MCT shown in FIG. 161. This modified MCT has turn-on gate electrodes 207*a* in the cathode-side surface and turn-on gate electrodes 215*a* in the anode-side surface, in addition to turn-off gate electrodes 207*b* and 215*b* which are identical to those incorporated in the MCT of FIG. 161. The turn-on gate electrodes 207*a* extend through the p-type base layer 202 into the $n^-$-type base layer 201. N-type source layers 230 are formed in those surface portions of the base layer 202 which extend along the insulated gate electrode 207*a*. These n-type source layers 230 function as turn-on channels. The turn-on gate electrodes 215*a* extend through the n-type buffer layer 210 into the $n^-$-type base layer 201. P-type source layers 235 are formed in those surface portions of the buffer layer 210 which extend along the insulated gate electrodes 215*a*. These p-type source layers 235 function as turn-on channels.

Figure 163:
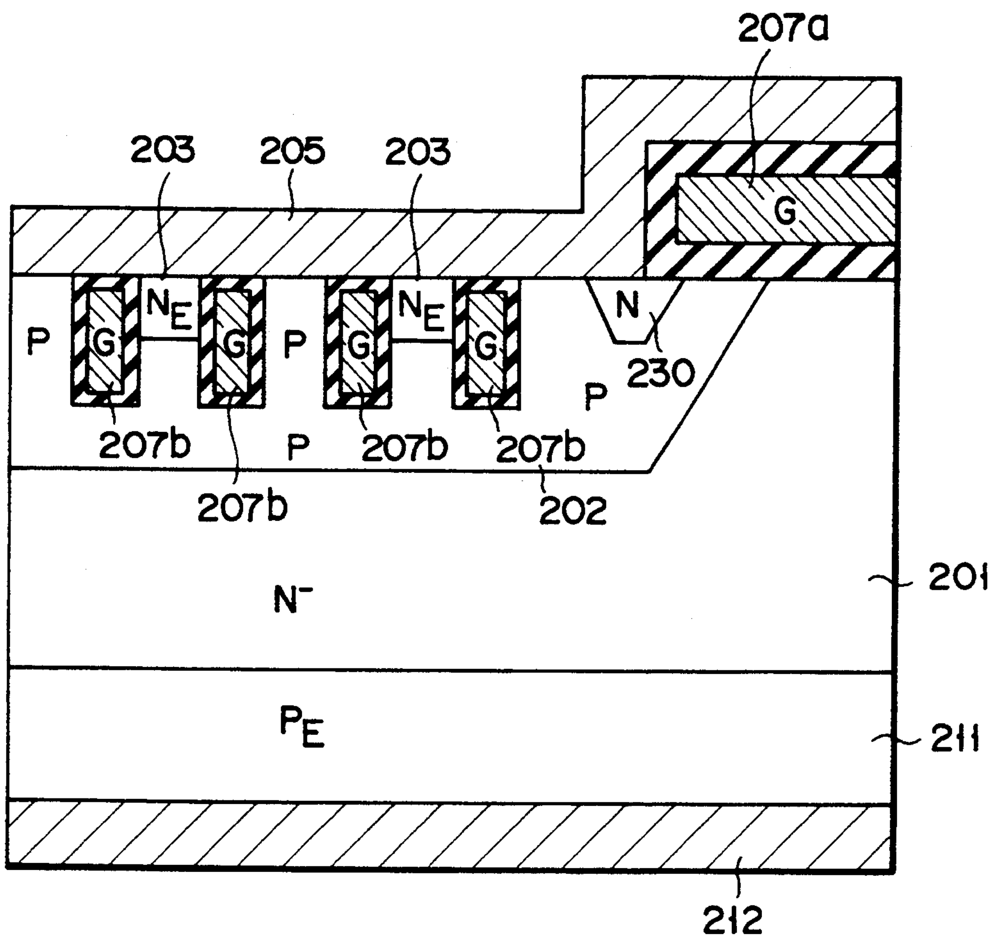

FIG. 163 shows an MCT which is basically the same as the MCT of FIG. 158, but different in that it has a planer turn-on insulated gate electrode. As is shown in FIG. 163, an n-type source layer 230 is formed in the peripheral portion of a p-type base layer 202 which is formed on an $n^-$-type base layer 210. This layer 230 will be short-circuited to the n-type emitter layer 203 formed in that portion of the layer 202 which is interposed between every other pair of insulated gate electrodes 207*b*. A turn-on insulated gate electrode 207*a* is formed above that portion of the p-type base layer 202 which is sandwiched between the $n^-$-type base layer 201 and the n-type source layer 230.

Figure 164:
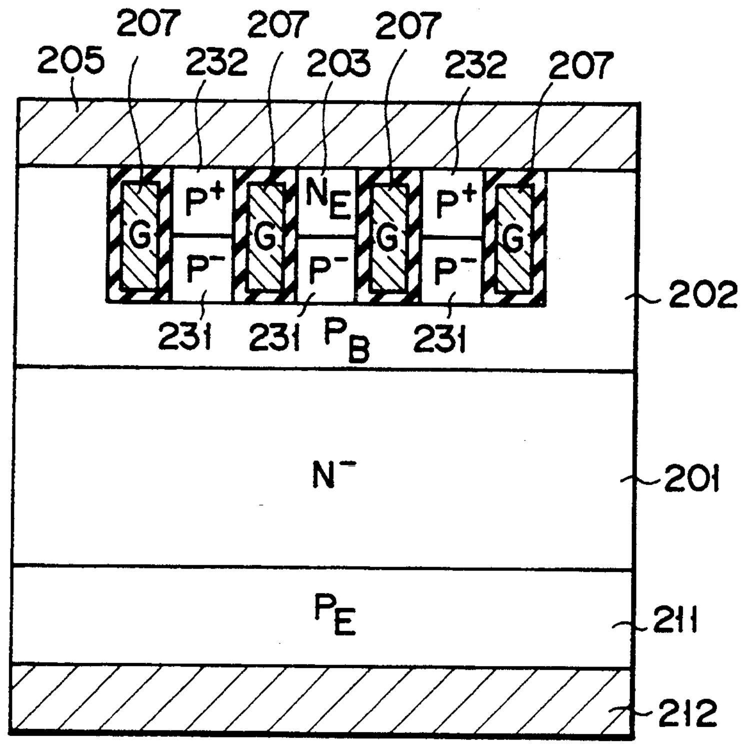

FIG. 164 shows another modification of the MCT shown in FIG. 158, which is characterized in two respects. First, $p^-$-type channel layers 231 are formed among the insulated gate electrodes 207 formed in the surface of a p-type base layer 202. Second, n-type emitter layers 203 and $p^+$-type layers 232 are alternately formed among the electrodes 207 and located on the $p^-$-type channel layers 231. The $p^-$-type channel layers 231 have an impurity concentration of $10^{15}/cm^3$ or less.

This MCT is advantageous over the MCT of FIG. 158 on two points. First, the injection of holes from the p-type base layer to the cathode is suppressed more effectively, and electrons are injected from the n-type emitter at higher efficiency, when the MCT is turned on. Secondly, holes are released at higher efficiency, and the injection of electrons from the emitter layer is suppressed more effectively, when the MCT is turned off.

Figure 165:
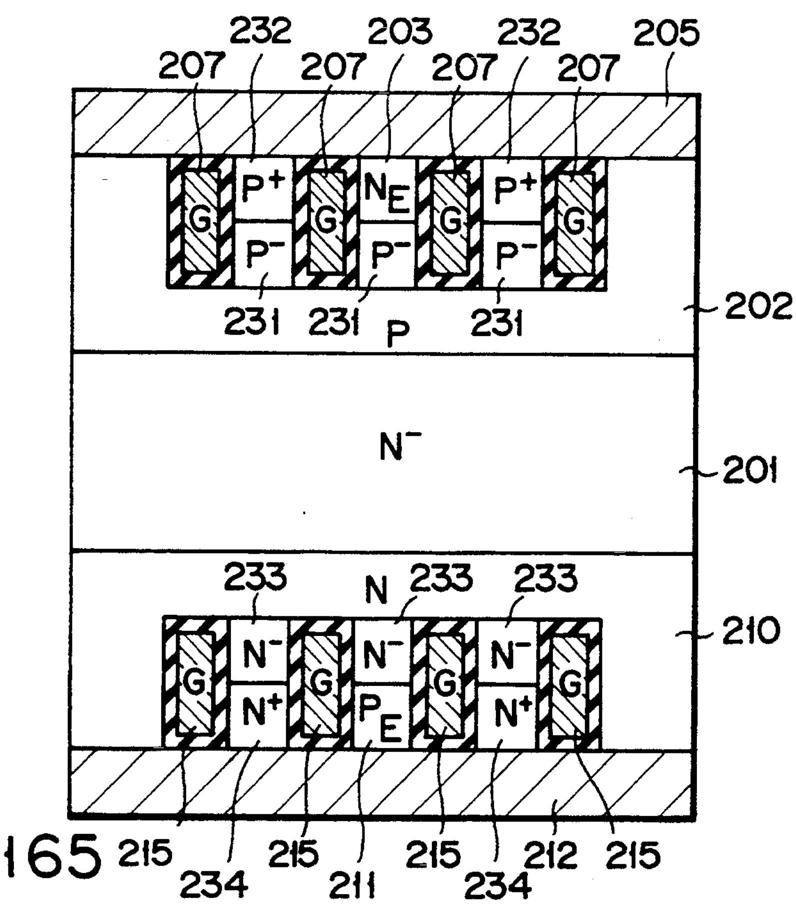

FIG. 165 shows a modification of the MCT shown in FIG. 161 having buried insulated gate electrodes formed in both the cathode-side surface and the anode-side surface, and high-resistance channel layers in both sides. As can be understood from FIG. 165, this MCT has the same cathode-side structure as the MCT of FIG. 164. In the anode-side surface, high-impurity $n^-$-type channel layers 233 are interposed among insulated gate electrodes 215, and p-type emitter layers 211 and $n^+$-type layers 234 are formed on the $n^-$-type channel layers 233 and arranged alternately. The MCT shown in FIG. 165 can have not only high turn-on efficiency, but also high turn-off efficiency.

FIG. 166 illustrates an MCT which is a combination of the MCTs of FIGS. 162 and 165.

Figure 167:
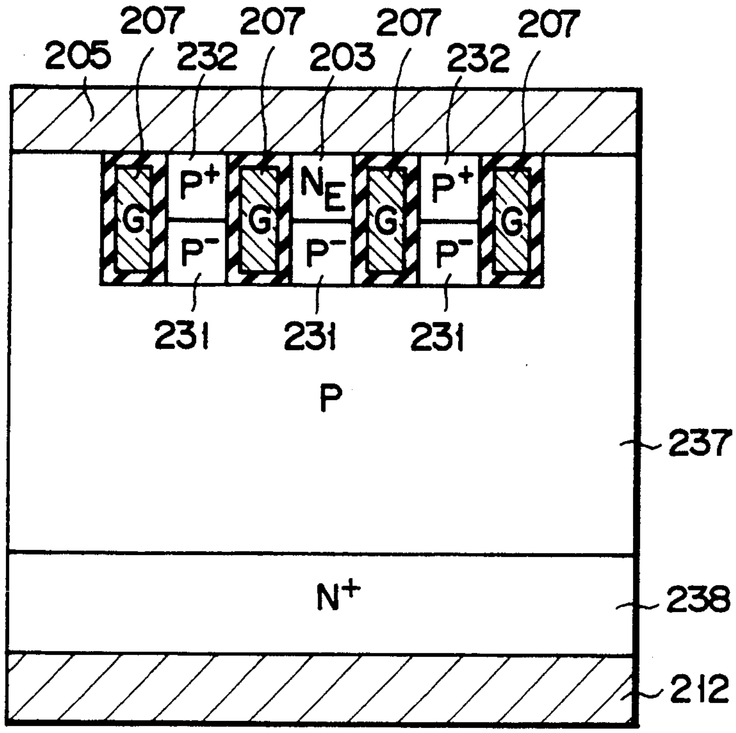

FIG. 167 shows a transistor having buried insulated gate electrodes. This embodiment is identical to 7 the MCT of FIG. 164, except that a p$^-$-type base layer 237 is used in place of the n$^-$-type base layer 201, and n+-type drain layer 238 is used in place of the p-type emitter layers 211. Even though the n$^-$-type base layer 201 is used without modifying it, the device shown in FIG. 167 operates as a transistor.

Figure 168:
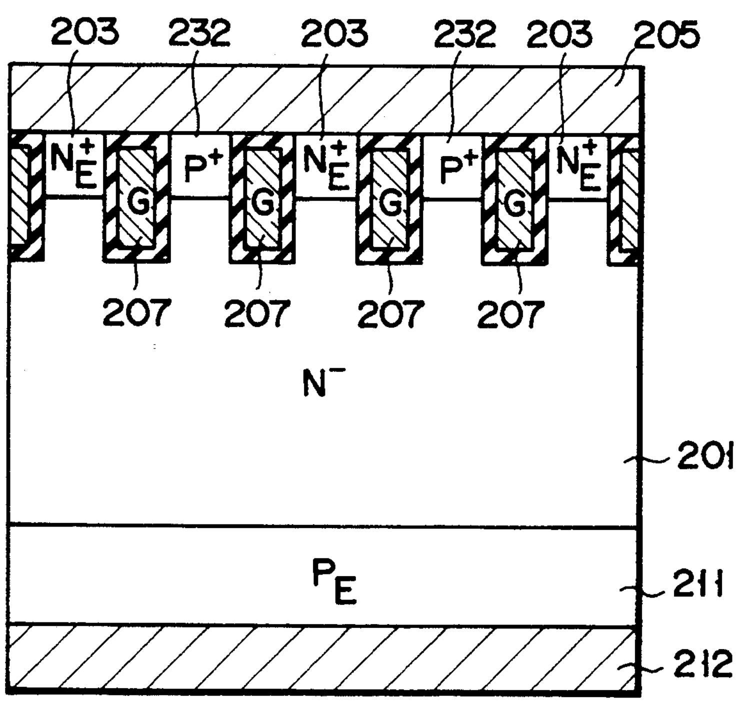

FIG. 168 shows an SI thyristor, wherein buried insulated gate electrodes 207 are formed in an n$^-$-type base layer 210, and n$^+$-type emitter layers 203 and p$^+$-type base layers 202 are formed among the gate electrodes 207 and arranged alternately.

Figure 169:
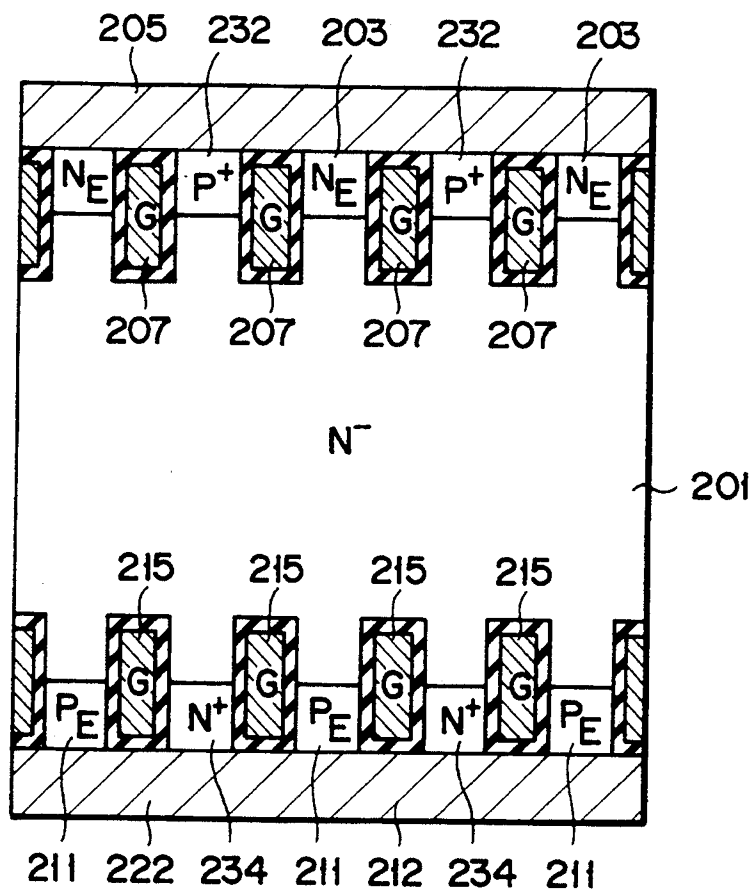

FIG. 169 shows a modification of the SI thyristor shown in FIG. 168, which has additional buried insulated gate electrodes 215 formed in the anode-side surface and extending through a p-type emitter layer 211 into a n$^-$-type base layer 201.

FIG. 170 shows another MCT according to the invention, wherein buried insulated gate electrodes extend through a p-type base layer 202 into an n$^-$-type base layer 201. N-type emitter layers 203 and p$^+$-type base 8 layers 232 are formed among the gate electrodes 207 and on the p-type base layer 202, and are alternately arranged.

The embodiments of FIGS. 166 to 170 can have high turn-off efficiency, not at the expense of their good turn-on characteristics.

FIG. 171 shows an MCT having an array of parallel turn-off insulated gate electrodes and two turn-on insulated gate electrodes, located at the opposing sides of the array, respectively. FIGS. 172, 173, 174, and 175 are sectional views, taken along line A—A', line B—B', C—C', and D—D', respectively.

Figure 172:
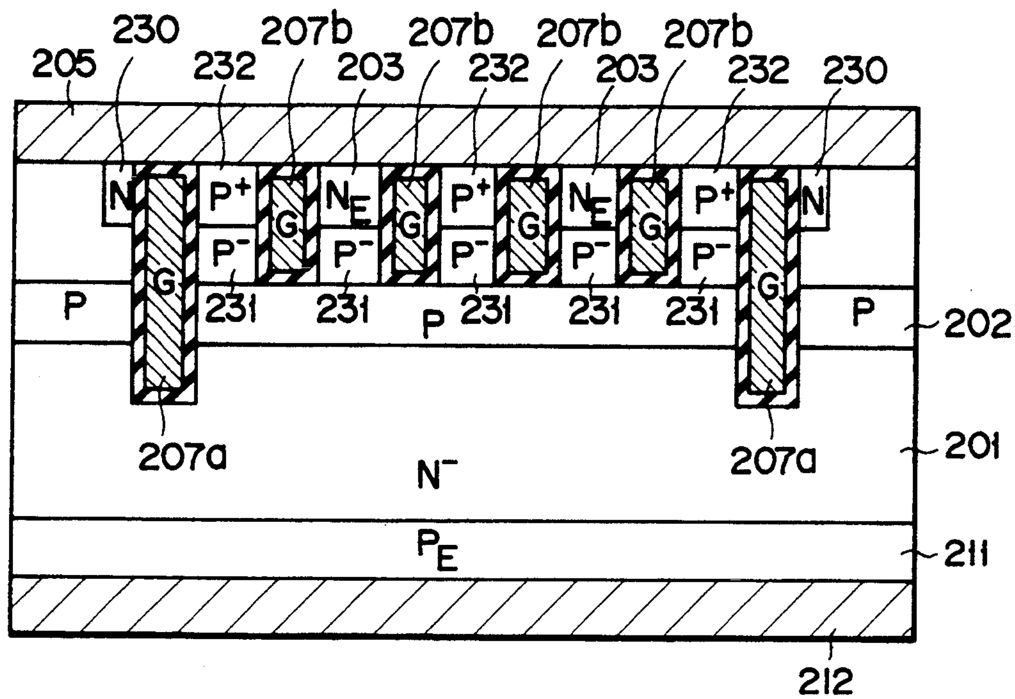
Figure 173:
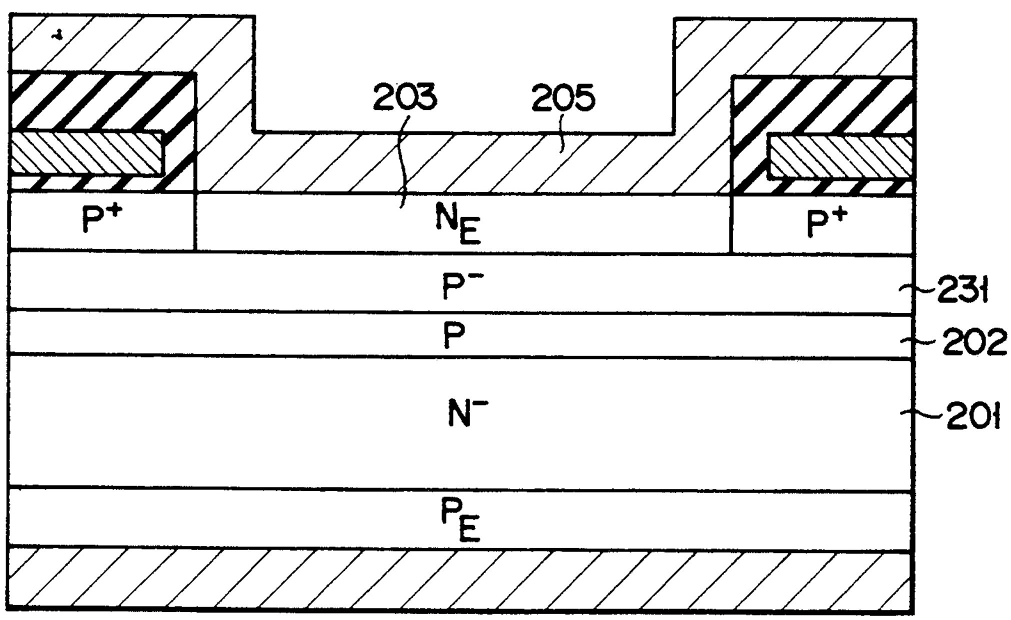
Figure 174:
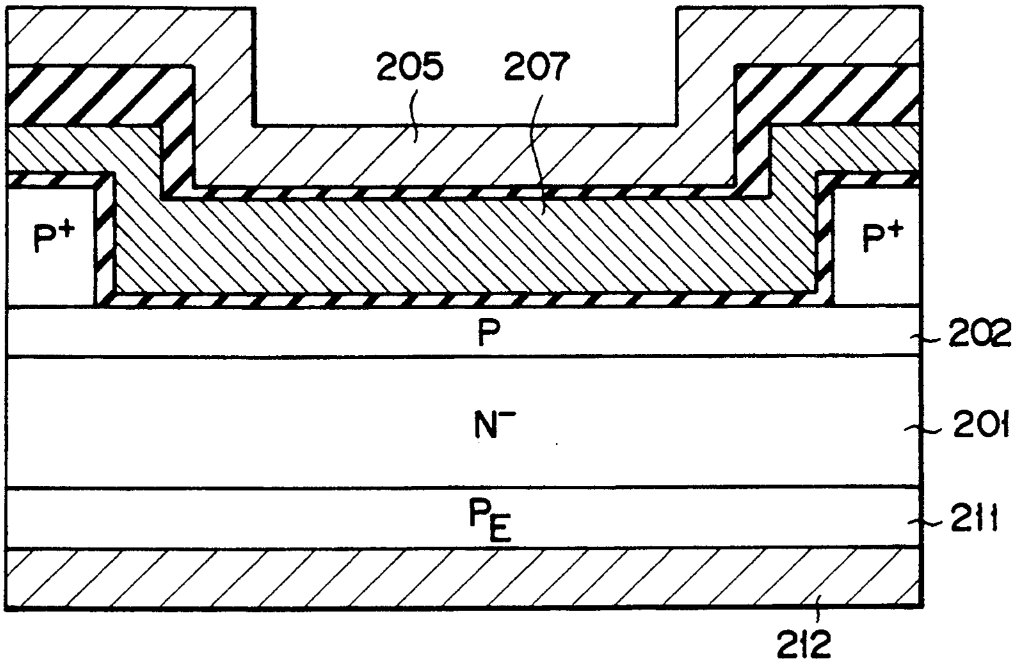
Figure 175:
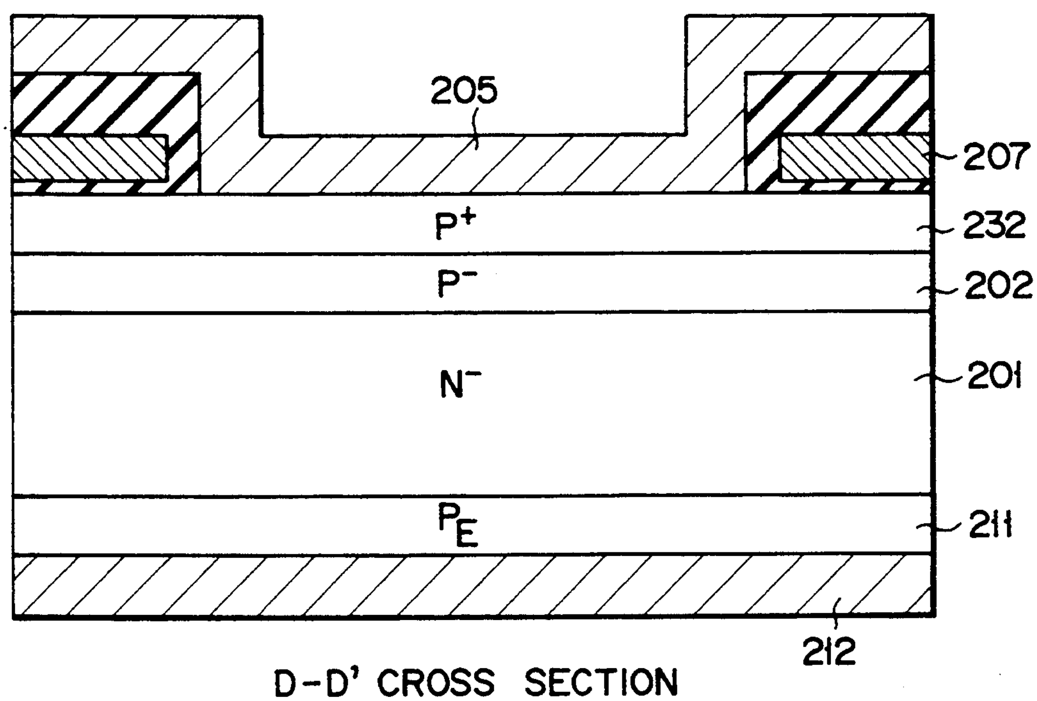

As is shown in FIG. 171, this MCT has stripe-shaped insulated gate electrodes which are arranged parallel and at short intervals. The turn-off gate electrodes **207*b* are formed in a p-type base layer 202 as is shown in FIG. 172. P$^-$-type channel layers 231 are formed among these gate electrodes 207*b*. N-type emitter layers 203 and p$^+$-type base layers 232 are formed on the p-type channel layers 231, and are arranged alternately. The MCT further comprises two turn-on insulated gate electrodes 207*a* which are formed in the p-type base layer 202, located near the leftmost and rightmost electrode 207*b*, respectively, and extending into an n$^-$-type base layer 201. As is evident from FIG. 174, the turn-on gate electrodes 207*a* and the turn-off gate electrodes 207*b* are exposed at both ends on the opposing sides of the pellet. A cathode 205 is formed on the entire upper surface of the structure. As is shown in FIG. 173, the cathode 205 contact n-type emitter layers 203 which are interposed among the buried insulated gate electrodes 207*b*. Further, as is shown in FIG. 175, the cathode 205 contacts the n$^+$-type base layers 232**.

FIG. 176 shows the layout of an insulated gate thyristor according to the invention, and FIGS. 177, 178, 179, and 180 are sectional views, taken along line A—A' line B—B' line C—C and line D—D' in FIG. 176 respectively.

Figure 177:
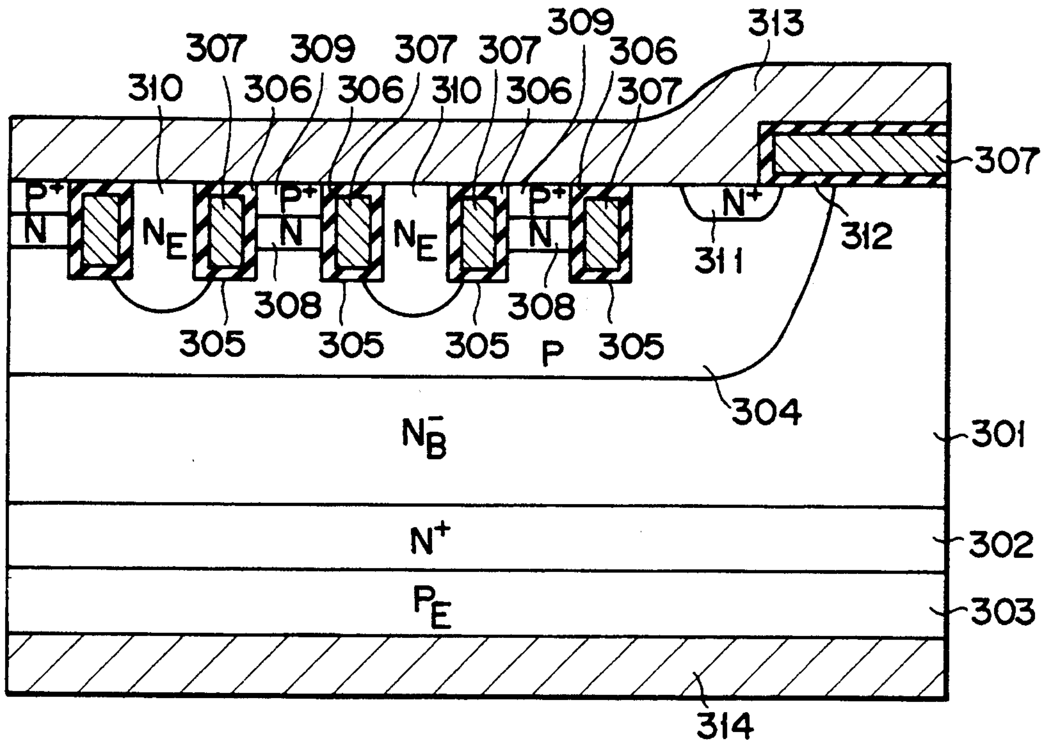
Figure 178:
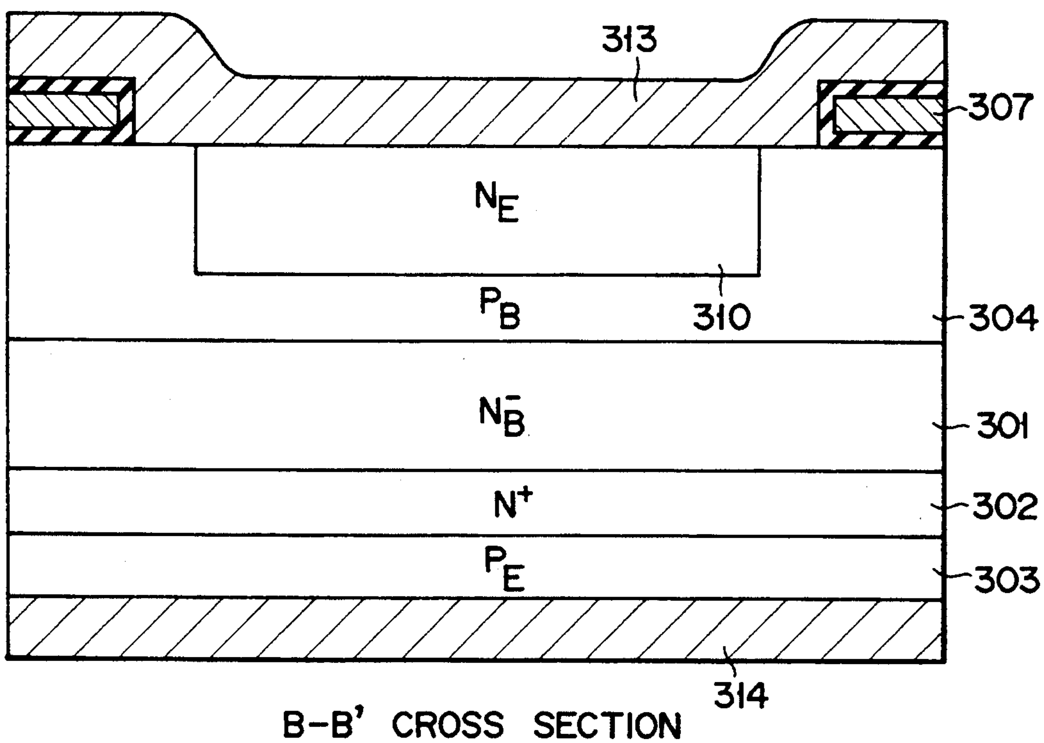
Figure 179:
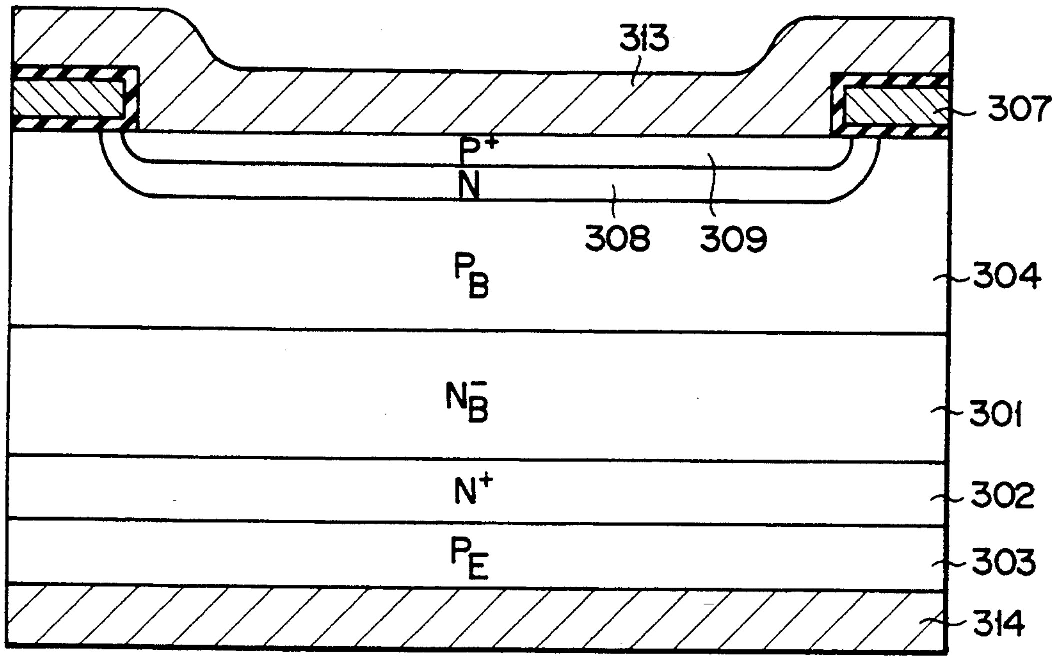
Figure 180:
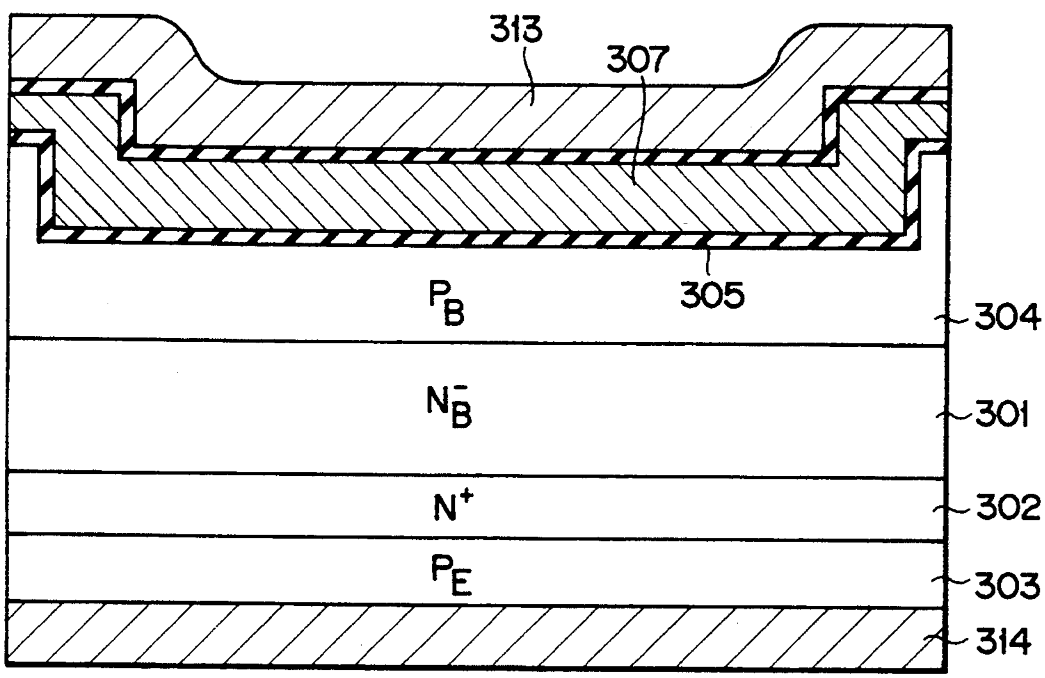

As is evident from FIG. 177, an n-type buffer layer 302 is formed on one major surface of an n-type base layer 301, and a p-type emitter layer 303 is formed on the n-type buffer layer 302. A p-type base layer 304 is formed by impurity diffusion in the other major surface of the n-type base layer 301.

Stripe-shaped grooves 305 are formed in the p-type base layer 304 and spaced apart from one another at regular intervals. A gate-insulating film 306 is formed in the surfaces of each groove, and a gate electrode 307 is formed in each groove 305. An n-type turn-off channel layer 308 is formed in the gap between the gate electrodes 307 of every other pair. A p-type drain layer 309 is formed on the turn-off channel layer 308. Vertical p-channel MOS transistors are thereby formed, wherein the gate electrode 307 controls the sides of the n-type turn-off channel layer 308. An n-type emitter layer 310, which is deeper than the n-type turn-off channel layers 308, is formed in the gap between the gate electrodes 307 of any other pair.

Turn-on channels are located at one edge of the n-type base layer 304. More precisely, as is shown in FIG. 177, an n-type source layer 311 is formed in that portion of the p-type base layer 304 which is at a predetermined distance from said edge thereof. A gate insulating film 312 is formed on that portion of the base layer 304 which is sandwiched between the n-type base layer 301 and the n-type source layer 311, and a gate electrode 307 is formed on this insulating film 312. The gate electrode 307 is integral with the buried gate electrode 307. The layers 301, 304, the electrode 307, the layer 311, and the film 312 constitute an n-channel IGBT.

A cathode 313, i.e., the first main electrode, is formed, contacting the n-type emitter layers 310, the p-type drain layers 309, and the n-type source layer 311. An anode 324, i.e., the second main electrode, is formed on the p-type emitter layer 303.

The n-type base layer 301 is made from an n-type wafer which has a thickness of 450 μm. The buffer layer 302 has a thickness of 15 μm, and the p-type base layer 304 has a thickness of 15 μm. The grooves 305 made in the layer 304 are 1 μm wide and 2 μm deep, and are spaced apart such that a gap of 1 μm is formed among them. The gate-insulating film 306 is made by thermal oxidation and has a thickness of 0.1 μm. The n-type turn-off channel layers 308, each having a p-type drain layer 309 at the top thereof, has a channel length of 0.5 μm. The n-type emitter layers 310 and the p-type emitter layer 303 are formed by impurity diffusion, and have a thickness of about 2 μm.

To turn on the insulated-gate thyristor of FIG. 177, a voltage positive with respect to the cathode 313 is applied to the gate electrodes 307. The turn-on channel formed in the edge of the p-type base layer 304 is thereby turned on, whereby electrons are injected from the n-type source layer 311 into the n-type base layer 301. As a result, the insulated-gate thyristor is turned on by the IGBT operation. To turn off the thyristor, a negative voltage is applied to the gate electrodes 307. Both sides of each n-type turn-off channel layer 308 are inverted, whereby the p-channel MOS transistor operates, releasing the carriers from the p-type base layer 304 to the cathode 313 through the p-type drain layer 309. As a result, the insulated-gate thyristor is turned off.

The thyristor of FIG. 177 has unit cells having a size of 4 μm. (The buried gate section, p-type drain layer, other buried gate section, and n-type emitter layer forming each unit cell have the same width of 1 μm.) Despite this small unit cell, the thyristor has large-current cutoff efficiency. In addition, the thyristor has high emitter injection efficiency and, hence, can perform desirable thyristor operation, since the n-type emitter layers 310 are formed on the opposite side of the grooves 305 with respect to the turn-off channels layers 308 and are as deep as the grooves 305. Moreover, the n-type emitter layers 310 are located in the gap between the insulated gate electrodes 307 of every other pair, and are self-aligned with the gate electrodes 307. The p-type drain layer 309 is also self-aligned with the gate electrode 307. Hence, the unit cells are correctly located though they are small.

FIG. 181 shows the layout of the insulated-gate thyristor according to the invention, and FIGS. 182, 183, and 184 are sectional views, taken along line A—A', line B—B' and line C—C' in FIG. 181, respectively. The same components as those of the thyristor shown in FIGS. 181 to 184 are denoted at the same reference numerals in FIGS. 176 to 180, and will now be described in detail.

As is evident from FIG. 182, grooves 305 extend downwards through a p-type base layer 304 into a n-type base layer 301. They are spaced apart from one another at regular intervals. The p-type base layer 304 has a thickness of about 3 μm, and the grooves 305 have a depth of about 6 μm. As in the thyristor of FIGS. 181 to 184, a gate-insulating film 306 is formed in the surfaces of each groove 305, and a gate electrode 307 is formed on the gate insulating film 306. The gap between any two adjacent grooves 305 is broader than in the thyristor shown in FIGS. 176 to 180, for example 3 μm. An n-type turn-off channel layer 308 is formed between the grooves 305 of any pair, and a p-type drain layer 309 is formed on the n-type turn-off channel layer 308. An n-type emitter layer 310 is formed, extending through the layers 309 and 308, both interposed between any two adjacent insulated gate electrode 307, into the p-type base layer 304. Hence, the layers 310 are located among the gate electrodes 307. The n-type emitter layers 310 extend deeper than the n-type turn-off channel layers 308, as in the thyristor of FIGS. 176 to 180.

In the thyristor of FIGS. 181 to 184, both sides of each p-type base layer 304 interposed between the insulated gate electrodes 307 of each pair function as turn-on channels. In other words, each gate electrode 307 serves to turn on and off the thyristor, and a turn-off p-channel MOS transistor and a turn-on n-channel MOS transistor are formed one upon the other.

To turn on the insulated-gate thyristor of FIGS. 181 to 184, a voltage positive is applied to the gate electrodes 307. N-type channels are thereby formed in the sides of the p-type base layers 304, whereby the thyristor is turned on. At this time, electrons are injected from the n-type emitter layers 310 into the n-type base layer 301 through the n-type turn-off channel layers 308. When a negative voltage is applied to the gate electrodes 307, the thyristor is turned off, exactly in the same way as in the thyristor shown in FIGS. 176 to 180. Obviously, the thyristor attains the same advantage as the thyristor of FIGS. 176 to 180.

FIG. 185 shows still another thyristor according to the invention, which have insulated gate electrodes in both the cathode-side surface and the anode-side surface. As can be understood from FIG. 185, this thyristor is, so to speak, a combination of the thyristors illustrated in FIGS. 176 and 181. More specifically, grooves 305 are formed in a p-type base layer 304 in the same manner as in the thyristor of FIG. 176. A gate-insulating film 306 is formed in the surfaces of each groove 305, and a gate electrode 307 is formed in the groove 305. N-type turn-off channel layers 308 and p-type drain layers 309, and an n-type emitter layer 310 are formed between the electrodes 307, in the same way as in the thyristor of FIG. 181.

An n-type source layer 311 is formed in one edge portion of the p-type base layer 304 which in turn is formed in an n-type base layer 301. That surface portion of the base layer 304 which is interposed between the source layer 311 and the n-type base layer 301 functions as a turn-on channel region. An insulated gate electrode 307 is formed on the turn-on channel region.

A low-impurity p-type resurf layer 321 is formed in the n-type base layer 301. As is shown in FIG. 185, this layer 321 contacts the other edge of the p-type base layer 304. A high-impurity n-type layer 322 is formed in the n-type base layer 301 and located at a predetermined distance from the layer 321. An insulting film 323 is formed on the p-type resurf layer 321, the n-type base layer 301, and the n-type layer 322. A high-resistance film 324 made of, for example, SIPOS, covers the insulating film 323 and connects the p-type base layer 304 to the n-type layer 322. An electrode 325 is formed on the n-type layer 322 and contacts the high-resistance film 324.

In the anode-side surface, a p-type emitter layer 326 is formed. Grooves 327 are formed in the p-type layer 326. A gate-insulating film 328 is formed on the surfaces of each groove 327, and a gate electrode 329 is formed in the groove 327. N-type channel layers 330 are formed among the insulated gate electrodes 239. Two p-type layers 331 are formed on each n-type layer 330. These p-type layers 331 are spaced apart from each other and contact the opposing sides of two adjacent grooves 327. An n-type layer 332 is formed on each n-type layer 330 and sandwiched between the p-type layers 331.

A low-impurity p-type resurf layer 333 is formed in the n-type base layer 301. This layer 333 contacts an edge of the p-type emitter layer 326. A high-impurity n-type layer 334 is formed in the edge portion of the n-type base layer 301. An insulting film 337 is formed on the p-type resurf layer 333, the n-type base layer 301, and the n-type layer 334. A high-resistance film 336 covers the insulating film 337 and connects the p-type emitter layers 326 to the n-type layer 334. An electrode 335 is formed on the n-type layer 334 and contacts the high-resistance film 336.

To turn on the insulated-gate thyristor of FIG. 185, a voltage negative with respect to the anode is applied to the gate electrodes 328. P-type channels are thereby formed in the sides of the n-type layers 330. The p-type channel connect the p-type emitter layer 326 to the anode 314. Thus, the p-type emitter layer actions as an anode layer. To turn off the thyristor, a voltage either zero or positive with respect to the anode 314 is applied to the gate electrodes 328, whereby the p-type emitter layer 326 is electrically disconnected from the anode 314.

The thyristor shown in FIG. 185 achieves the same advantage as the thyristors illustrated in FIGS. 176 and 181.

FIG. 186 shows another insulated-gate thyristor according to the invention, and FIGS. 187 and 188 are sectional views, taken along line A—A' and line B—B' in FIG. 186, respectively. This thyristor is characterized in two respects. First, grooves 305 are formed, extending into an n-type base layer 301. These grooves 305 are arranged in columns as is shown in FIG. 186, and the grooves 305 forming each column are continuous to one another, thus defining stripe-shaped p-type layers 304. Second, a gate-insulating film 306 are formed in the surfaces of each groove 305, and a gate electrode 307 is formed in the groove 305.

As is shown in FIG. 188, an n-type turn-off channel layer 308 is formed in each stripe-shaped p-type base layer 304. P-type drain layers 309 and n-type emitter layers 310 are arranged alternately in the horizontal direction. The p-type drain layers 309 are formed in the surface of the n-type turn-off channel layer 308. The n-type emitter layers 310 are formed by impurity diffusion and extend deeper than the n-type turn-off channel layer 308.

In the thyristor of FIGS. 186 to 188, the sides of each p-type base layer 304 located below the n-type emitter 310, which extend along the gate electrodes 307 serve as turn-on channels. The sides of each n-type turn-off channel layer 308 located below the p-type drain layer 309, which extend along the gate electrodes 307 serve as turn-off channels. Thus, as in the thyristor of FIG. 181, the gate electrodes 307 operates in turning on the thyristor and turning off the thyristor.

When a positive voltage is applied to the insulated gate electrodes 307, n-channels are formed in the p-type base layers 304. These n-channels extend along the gate electrodes 307. The thyristor is, therefore, turned on. When a negative voltage is applied to the gate electrodes 307, p-channel are formed in the n-type turn-off channel layers 308. These p-channels extend along the gate electrodes 307. Hence, the thyristor is turned off.

The thyristor shown in FIGS. 186 to 188 has the same advantage as the thyristor shown in FIGS. 176 and 181. In addition, to maintain high-breakdown voltage by the buried gate electrodes, the p-type base layers 304 can be those having a low impurity concentration. If the p-type base layers 304 have so low a peak impurity concentration as $1\times10^{16}/cm^3$, the n-type turn-off channel layers 308 will have a peak impurity concentration of about $1\times10^{17}/cm^3$. As a result, the threshold voltage for forming p-type channels in the turn-off channel layers 308 can be as low as about 5V. In other words, the thyristor can be turned off with a low gate voltage.

FIG. 189 shows another layout of the insulated-gate thyristor according to this invention, and FIGS. 190 and 191 are sectional views, taken along line A—A' and line B—B' in FIG. 189, respectively.

This thyristor is different from the thyristor shown in FIG. 186, only in that it has no components equivalent to the p-type base layers 304. In other words, the thyristor is a SI thyristor. With the thyristor, it is possible for the buried gate electrodes 307 to control the total potential of the n-type base layers 301 interposed among the electrodes 307, only if the layers 301 have an appropriate impurity concentration and a desirable width. (The width of the n-type base layers 301, shown in FIG. 190, is determined by the gap of the grooves 305.)

when a positive voltage is applied to the gate electrodes 307, thus increasing the potential of each n-type base layer 301 sandwiched between the insulated gate electrodes 307, electrons are injected from n-type emitter layers 310. As a result, the thyristor is turned on. When a negative voltage is applied to the gate electrodes 307, p-type channels extending along the insulated gate electrodes 307 develop in n-type turn-off channel layers 308. Carriers are thereby released from the n-type base layers 301 through p-type drain layers 309 to a cathode 313. Hence, the thyristor is turned off.

FIG. 192 shows still another layout of the insulated-gate thyristor according to this invention, and FIGS. 193 and 194 are sectional views, taken along line A—A' and line B—B' in FIG. 192, respectively. This is a thyristor designed by slightly modifying the embodiment shown in FIG. 186. Namely, grooves 305 are spaced apart from each other, and are surrounded by a deep p-type base layer 304*a*. N-type turn-off channel layers 308, p-type drain layers 309, and n-type emitter layers 310—all formed in those portions of an n-type base layer 301 which are divided by the grooves 305—are located in the same way as in the thyristor of FIG. 186 and have the same depths as those incorporated in therein.

FIG. 195 is shows the layout of the insulated-gate thyristor according to the invention, and FIGS. 196 and 197 are sectional views, taken along line A—A' and line B—B' in FIG. 195, respectively. This thyristor is designed by modifying the embodiment of FIG. 189 in the same manner as the embodiment of FIG. 186 is modified into the thyristor shown in FIG. 192.

The thyristors shown in FIGS. 189,192 and 195 have the same advantage as the thyristors illustrated in FIGS. 176 and 181.

FIG. 198 is shows another layout of the insulated-gate thyristor according to the invention, and FIGS. 199,200, and 201 are sectional views, taken along line A—A', line B—B' and line C—C' in FIG. 198, respectively. This is a thyristor obtained by modifying the embodiment of FIGS. 181 to 184, or making the buried gate electrodes less deep than the p-type base layer 304.

FIG. 202 shows a thyristor designed by simplifying the anode-side structure of the thyristor shown in FIG. 185, and by forming, in the anode-side surface, buried gate electrodes of the type formed in the cathode-side surface of the thyristor shown in FIG. 185. More specifically, insulated gate electrodes 329 of the type shown in FIG. 185 are formed in an n-type buffer layer 302. P-type channel layers 340 are formed among these gate electrodes 329, and $n^+$-type source layers 341 are formed in the surfaces of the p-type channel layers 340. Further, $p^+$-type emitter layers 342 are formed, each extending through the layers 341 and 340 into the n-type buffer layer 302.

The thyristor shown in FIGS. 198 to 201, and the thyristor shown in FIG. 202 attain the same advantage as the thyristors illustrated in FIGS. 176 and 181.

FIG. 203 is a perspective view showing the main part of a turn-off thyristor according to the invention, and FIG. 204 is a plan view representing the layout of cathode electrodes.

As is evident from FIG. 203, a p-type emitter layer 401, an n-type buffer layer 402, an n-type base layer 403, a p-type base layer 404, and an n-type emitter layer 405 constitute a pnpn structure. The p-type base layer 404 is shaped like a stripe and formed by impurity diffusion in a selected portion of the n-type base layer 403. The n-type emitter 405 is formed by impurity diffusion in a selected portion of the p-type base layer 404. A high-impurity n-type layer 406 is formed in the center portion of the n-type emitter layer 405. A cathode 407 is formed on the n-type layer 406. A p-type layer 407 is formed by impurity diffusion in the surface of the n-type emitter layer 405. This layer 407, when projected on a horizontal plane, surrounds the cathode 409. The cathode 409 contacts the p-type layer 407, too.

A first gate-insulating film 410 is formed on the p-type layer 407, the n-type emitter layer 405, the p-type base layer 404, and the n-type base layer 403. A first gate electrode 411 is formed on the first gate-insulating film 410. That portion of the p-type base layer 404 which is sandwiched between the n-type emitter layer 405 and the n-type base layer 403 is a turn-on channel region CH1. That surface region of the n-type emitter layer 405, which contacts the turn-on channel region CH1, is a turn-off channel region CH2. Hence, the first gate electrode 411 functions as a turn-on electrode and a turn-off electrode.

That surface region of the n-type emitter layer 405, which is sandwiched between the p-type layer 407 and the p-type base layer 404, is another channel region CH3. A second gate-insulating film 412 is formed on the p-type layer 407, the channel region CH3, and the p-type base layer 404. A second gate electrode 413 is formed on the second gate-insulating film 412. This electrode 413 functions as a turn-off electrode only.

The second gate-insulating film 412 is thinner than the first gate-insulating film 410. Hence, the channel region CH3 located beneath the film 412 has a threshold voltage lower than that of the channel region CH2 located beneath the first gate-insulating film 410. An anode 408 is formed on the p-type emitter layer 401.

When a positive voltage is applied to the first gate electrode 411, the turn-on channel region CH1 is inverted. Electrons are thereby injected from the n-type emitter layer 405 into the n-type base layer 403. As a result, the thyristor is turned on. When a negative voltage is applied to the first gate electrode 411 and also to the second gate electrode 413, both turn-off channels CH2 and CH3 are inverted, short-circuiting the p-type base layer 404 to the cathode 409. As a result, the thyristor is turned off.

The embodiment of FIG. 203 and 204 has two turn-off gate electrodes, i.e., the first gate electrode 411 functioning as a turn-on electrode, too, and the second gate electrode 413 functioning as a turn-off electrode only. The threshold voltage of the channel region CH3 beneath the second gate electrode 413 can be set independently of that of the channel region CH2 located beneath the first gate electrode 411. Therefore, the thyristor can have high turn-off efficiency. Moreover, the dig/dt can be controlled over a broad range, merely by changing the voltages applied to the first and second gate electrodes 411 and 143.

FIG. 205 is a diagram representing the timing of applying negative voltages VG1 and VG2 to the first and second gate electrodes 411 and 413, in order to turn off the thyristor shown in FIGS. 203 and 204. As can be understood from FIG. 205, the voltage VG1 is applied to the first gate electrode 411, and the voltage VG2 is applied to the second gate electrode 413 some time later. This two-step control of the gate electrodes helps to reduce power loss in turning off the thyristor.

Some other embodiments of the invention will now be described, with reference to FIG. 206 through FIG. 217, wherein the components identical to those shown in FIG. 203 are denoted at the same reference numerals.

FIG. 206 shows another turn-off thyristor having insulated gate electrodes. The p-type emitter layer 401 has an opening 421, through which a portion of the n-type buffer layer 402 extends and is short-circuited to the anode 408. This is a thyristor generally known as "emitter short-circuited thyristor."

The thyristor of FIG. 206 achieves the same advantage as the embodiments shown in FIG. 203. Further, since the emitter is short-circuited, this thyristor has higher turn-off efficiency. When the two-step control of the electrodes is performed, the power loss is reduced as in the embodiment of FIG. 203.

FIG. 207 shows another turn-off thyristor having insulated gate electrodes. This thyristor is characterized in that a p-type emitter layer 401 is formed in a selected surface region of the n-type buffer layer 402, and a portion 422 of the layer 402 is exposed. Also, a high-impurity n-type layer 423 is formed in the surface of the p-type emitter layer 401. That surface region of the p-type emitter layer 401 which is sandwiched between the n-type layer 423 and the exposed portion 422 of the n-type buffer layer 4-2 is used as a channel region CH4. A gate-insulating film 424 is formed on the channel region CH4, and a third gate electrode 425 is formed on this insulating film 424 to turn off the thyristor. An anode 408 is formed, contacting both the p-type emitter layer 401 and the high-impurity n-type layer 423.

The turn-off thyristor shown in FIG. 207 has the same advantage as the embodiment of FIG. 203. It has higher turn-off efficiency since the gate electrode 425 is formed on the anode-side surface, in addition to the first and second gate electrodes 411 and 413 formed on the cathode-side surface.

FIG. 208 shows still another turn-off thyristor according to the present invention. This thyristor has a low carrier-lifetime region 426 formed in the n-type base layer 403 and located near the p-type emitter layer 401. This region 426 is formed by either impurity diffusion or application of radiations. This turn-off thyristor has the same advantage as the embodiment of FIG. 203. The thyristor can be turned off at higher speed than the thyristor of FIG. 203. This is because the low carrier-lifetime region 426 formed in the n-type base layer 403 releases excessive carriers from the n-type base layer 403 at high rate when the thyristor is turned off.

FIG. 209 illustrates an insulated-gate turn-off thyristor of the invention. Although this thyristor is identical in basic structure to the embodiment of FIG. 207, it is characterized in that the second and third gate electrodes 413 and 424 formed at the cathode side and the anode side, respectively, have trench structure. In other words, the electrode 413 controls a channel region CH3 which extends along the side of a trench formed in the cathode-side surface, and the electrode 424 controls a channel region CH4 which extends along the side of a trench formed in the anode side surface.

The thyristor shown in FIG. 209 achieves the same advantage as the thyristor of FIG. 203. In addition, it can be turned off at higher speed. This is because the channel regions CH3 and CH4 are formed in the relatively deep portions of the n-type emitter layer 405 and the p-type emitter layer 401, respectively, which have comparatively low impurity concentrations, and the channel regions CH3 and CH4 therefore have lower threshold voltages than in the case they are formed closer to the major surfaces of the device.

FIG. 210 shows an insulated-gate turn-off thyristor which is a modification of the embodiment shown in FIG. 209. This thyristor is characterized in that, in the cathode-side surface, a first gate electrode 411 is formed on an n-type emitter layer 405 only, for turning off the thyristor, and no gate electrodes are provided for turning on the thyristor. Instead, the turn-on channel region CH1, i.e., the upper portion of a p-type base layer 404, is used as light-triggered gate section 427.

The thyristor of FIG. 210 achieves the same advantage as the thyristor of FIG. 209. In particular, it can have a very high turn-off efficiency since the first, second and third gate electrodes 411,413 and 424 all work for the tuning-off of the thyristor.

FIG. 211 shows an insulated-gate turn-off thyristor of the invention. Although this thyristor is identical in basic structure to the embodiment of FIG. 206, it is characterized in that an anti-parallel diode is provided. As is evident from FIG. 211, a high-impurity p-type anode layer 428 is formed in an n-type base layer 403. This layer 428 is separated from a p-type base layer 404 formed in the n-type base layer 403, too. An anode 429 is formed, contacting the high-impurity p-type anode layer 428. A p-type emitter layer 401 has an opening 421, exposing a portion of the n-type base layer 402. Hence, this portion of the layer 402 is connected to an anode 408, forming the pn junction of the anti-parallel diode.

The turn-off thyristor of FIG. 211 has the same advantage as the embodiment shown in FIG. 206. Further, this thyristor helps to provide a compact system since it has a diode, simplifying an external circuit connected to it.

FIG. 212 illustrates still another insulated-gate turn-off thyristor of the invention which is basically the same as the thyristor shown in FIG. 203. In this thyristor, a resistor 430 connects the first and second gate electrodes 411 and 413, and the first gate electrode 411 is connected to a gate-voltage source. The resistor 430, represented as an equivalent-circuit element, can be provide within or outside the turn-off thyristor.

The turn-off thyristor of FIG. 212 attains the same advantage as the embodiment of FIG. 203. In addition, it is possible to apply voltages to the first and second gate electrodes 411 and 413 at different times during turn-off operation, thereby controlling the channel regions CH2 and CH3 at different timings. This two-step gate control reduces the power loss involved when the thyristor is turned off.

FIG. 213 is a diagram showing a system having a turn-off thyristor of the type shown in FIG. 207, particularly explaining the thyristor control section incorporated in this system. A detection circuit 432 for detecting the current or voltage of the main circuit 431 is connected to a main circuit 431 which is controlled by the turn-off thyristor. The output of the detection circuit 432 is supplied to a gate circuit 433, thereby controlling the gate circuit 433. The detection circuit 432 and the gate circuit 433 can be formed separately from, or integral with, the turn-off thyristor. Further, either component can be formed integral with the thyristor, either in part or in its entirety.

In operation, the gate circuit 433 supplies an off-control signal to one or two of the gate electrodes 411, 413 and 424, thus starting turning off the thyristor. Then, the detection circuit 432 detects changes in the current or voltage applied to the main circuit 431. Based on the current or voltage change, thus detected, the gate circuit 433 supplies an off-control signal to the remaining gate electrode or electrodes, thus controlling the same. In this system, the timings of supplying the off-control signal to the gate electrodes are automatically determined by the changes in the current or voltage applied to the main circuit 431. Therefore, the thyristor can be turned off under the best possible control.

FIG. 214 shows a perspective view showing a turn-off thyristor of this invention, which has a plurality of gate electrodes provided exclusively for turning off the thyristor, and FIG. 215 is a plan view of the cathode side of the thyristor, representing the layout of the turn-off gate electrodes. As is shown in FIG. 214, this thyristor has a stripe-shaped n-type emitter layer 405. That surface region of a p-type base layer 404 which is located at one end of the n-type emitter layer 405 functions as a turn-on channel region CH1. A gate-insulating film is formed on the turn-on channel region CH1, and a first gate electrode 411 is formed on this film. That surface region of the layer 405 which extends lengthwise and sandwiched between the p-type base layer 404 and the p-type layer 407 formed in a selected portion of the layer 405 functions as a turn-off channel region CH3. A gate-insulating film 412 is formed on the turn-off channel region CH3, and three second gate electrodes 413 are formed on the insulating film 412 and spaced apart along the turn-off channel region CH3.

Since the turn-on channel region CH1 and the turn-off channel region CH3 are separated from each other, their characteristics can be set independently. This is the advantage of the turn-off thyristor of FIGS. 214 and 215.

FIG. 216 illustrates another turn-off insulated-gate thyristor according to the present invention, and FIG. 217 is a plan view of this thyristor. Like the embodiment of FIG. 209, this thyristor has turn-off gate electrodes of trench structure. As is evident from FIG. 216, the thyristor has turn-off channel region CH1 and turn-off channel regions CH2—all controlled by a first gate electrode 411. It has other turn-off channel regions CH3 controlled by a second gate electrode 413. The regions CH2 and the regions CH3 are alternately arranged.

Since the turn-off channel regions CH2 and the turn-off channel regions CH3 are formed in trench structure and are alternately arranged, the thyristor can be made compact and can, therefore, have a greatly improved turn-off efficiency.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An insulated-gate thyristor comprising:

a first base layer of a first conductivity type, having first and second major surfaces;

a second base layer of a second conductivity type, formed in a selected portion of the first major surface of said first base layer;

a first emitter layer of the second conductivity type, formed in the second major surface of said first base layer;

a second emitter layer of the first conductivity type, formed in a selected portion of said second base layer;

a high concentration layer of the second conductivity type, formed in the first major surface of said first base layer and being located apart form said second base layer;

a source layer of the first conductivity type, formed in the surface of said high concentration layer of the second conductivity type;

an insulated gate electrode formed over a portion between said second emitter layer and said source layer through a gate insulation film;

a first main electrode contacting both said source layer and said high concentration layer of the second conductivity type, without contacting said second emitter layer;

a second main electrode formed on said first emitter layer; and a high-resistance well layer of the second conductivity type formed in said first base layer interposed between said second base layer and said high concentration layer so as to connect said second base layer with said high concentration layer.

2. The insulated-gate thyristor according to claim 1, wherein said source layer consists of discrete layers.

3. The insulated-gate thyristor according to claim 1, wherein said second emitter layer includes a first diffusion region and a second diffusion region which is more shallow than said first diffusion region, a portion of said second diffusion region overlapping a portion of said first diffusion region.

4. The insulated-gate thyristor according to claim 1, wherein said second base layer includes a third diffusion region and a fourth diffusion region which is more shallow than said third diffusion region, a portion of said fourth diffusion region overlapping a portion of said third diffusion region.

5. The insulated-gate thyristor according to claim 1, wherein said high concentration layer includes a fifth diffusion region and a sixth diffusion region which is more shallow than said fifth diffusion region, a portion of said sixth diffusion region overlapping a portion of said fifth diffusion region.

6. The insulated-gate thyristor according to claim 1, further comprising a buffer layer of said first conductivity type provided between said first base layer and said first emitter layer.

7. The insulated-gate thyristor according to claim 1, wherein said first base layer extends through said well layer, reaching the surface thereof.

8. The insulated-gate thyristor according to claim 7, wherein said source layer consists of discrete layers.

* * * * *